United States Patent
Yokokawa et al.

(10) Patent No.: US 8,489,955 B2
(45) Date of Patent: Jul. 16, 2013

(54) DATA PROCESSING APPARATUS, DATA PROCESSING METHOD AND PROGRAM

(75) Inventors: Takashi Yokokawa, Kanagawa (JP); Makiko Yamamoto, Tokyo (JP); Satoshi Okada, Tokyo (JP); Lui Sakai, Kanagawa (JP); Ryoji Ikegaya, Kanagawa (JP)

(73) Assignee: Sony Corporation, Tokyo (JP)

( * ) Notice: Subject to any disclaimer, the term of this patent is extended or adjusted under 35 U.S.C. 154(b) by 426 days.

(21) Appl. No.: 12/743,487

(22) PCT Filed: Nov. 26, 2008

(86) PCT No.: PCT/JP2008/071399
§ 371 (c)(1),
(2), (4) Date: May 18, 2010

(87) PCT Pub. No.: WO2009/069628
PCT Pub. Date: Jun. 4, 2009

(65) Prior Publication Data
US 2010/0281329 A1 Nov. 4, 2010

(30) Foreign Application Priority Data

Nov. 26, 2007 (JP) .................. 2007-304690
Mar. 18, 2008 (JP) .................. 2008-070467
Oct. 6, 2008 (JP) .................. 2008-259466

(51) Int. Cl.
*H03M 13/00* (2006.01)

(52) U.S. Cl.
USPC ......................................... 714/752

(58) Field of Classification Search
USPC ........................................... 714/752
See application file for complete search history.

(56) References Cited

U.S. PATENT DOCUMENTS

| 6,353,900 | B1 | 3/2002 | Sindhushayana et al. | |
|---|---|---|---|---|
| 7,805,652 | B1* | 9/2010 | Varnica | 714/752 |
| 2005/0008084 | A1 | 1/2005 | Zhidkov | |
| 2005/0251724 | A1* | 11/2005 | Matsumoto | 714/752 |
| 2005/0283703 | A1* | 12/2005 | Urard et al. | 714/752 |
| 2006/0218461 | A1 | 9/2006 | Kyung et al. | |
| 2008/0104474 | A1* | 5/2008 | Gao et al. | 714/752 |
| 2008/0163024 | A1* | 7/2008 | Lakkis | 714/752 |
| 2009/0125780 | A1 | 5/2009 | Taylor et al. | |
| 2009/0259915 | A1* | 10/2009 | Livshitz et al. | 714/758 |
| 2010/0153812 | A1* | 6/2010 | Jin et al. | 714/752 |

FOREIGN PATENT DOCUMENTS

| EP | 1 463 255 | 9/2004 |
|---|---|---|
| EP | 1 463 256 | 9/2004 |

(Continued)

OTHER PUBLICATIONS

Maddock, D. Robert et al., Reliability-Based Coded Modulation With Low-Density Parity-Check Codes, IEEE Transactions on Communications, vol. 54, No. 3, pp. 403-406, (Mar. 2006).

(Continued)

*Primary Examiner* — Yolanda L Wilson
(74) *Attorney, Agent, or Firm* — Oblon, Spivak, McClelland, Maier & Neustadt, L.L.P.

(57) ABSTRACT

The present invention relates to a data processing apparatus, a data processing method and a program which can improve the tolerance of code bits of an LDPC code to errors.
Where two or more bits of an LDPC (Low Density Parity Check) code are set as one symbol and are mapped to $2^{14}$ or $2^{16}$ signal points, a column twist interleaver 24 carries out, as a re-arrangement process for re-arranging code bits of an LDPC code such that a plurality of code bits corresponding to the value 1 included in one arbitrary row of a parity check matrix are not included in one symbol, column twist interleave of changing the writing starting position when code bits are written in a column direction of a memory for each column of the memory. The present invention can be applied, for example, to a transmission apparatus for transmitting an LDPC code.

14 Claims, 105 Drawing Sheets

FOREIGN PATENT DOCUMENTS

| | | |
|---|---|---|
| JP | 2001-352252 | 12/2001 |
| JP | 2005-51469 | 2/2005 |
| JP | 2006 254466 | 9/2006 |
| JP | 2007-36676 | 2/2007 |
| JP | 2007-96658 | 4/2007 |
| JP | 5048620 | 7/2012 |

OTHER PUBLICATIONS

Le Goff, Y. Stephane Signal Constellations for Bit-Interleaved Coded Modulation, IEEE Transactions on Information Theory, vol. 49, No. 1, pp. 307-313, (Jan. 2003).

Digital Video Broadcasting (DVB); Second generation framing structure, channel coding and modulation systems for Broadcasting, Interactive Services, News Gathering and other broadband satellite applications, DVB-S.2: ETSI EN 302 307 V1.1.2 pp. 1-74, (Jun. 2006).

U.S. Appl. No. 12/743,454, filed May 18, 2010, Yokokawa, et al.

Office Action issued May 9, 2013 in Japanese Patent Application No. 2009-543804 with English translation, 14 pages.

Yoichi Suzuki et al., "Design of LDPC codes for the Advanced Satellite Broadcasting System", vol. 62, No. 12, (2008), pp. 1997-2004.

Takashi Yokokawa, et al., "Parity and Column Twist Bit Interleaver for DVB-T2 LDPC Codes", 2008 $5^{th}$ International Symposium on Turbo Codes and Related Topics, 2008 IEEE, pp. 7.

DVB-S.2, Feb. 24, 2006, 20 pages.

Satoshi Gounai, et al., MIMO LDPC-MMSE-SIC Turbo-MMSSE-SIC, NII-Electronic Library Service, 8 pages.

Yoichi Suzuki et al., "BS LPDC—Design of LDPC codes for the Advanced Satellite Broadcasting System", vol. 62, No. 12, pp. 1997-2004, (2008).

DVB-S.2, Feb. 24, 2006, 21 pages.

Robert D. Maddock et al., "Reliability-Based Coded Modulation With Low-Density Parity-Check Codes", IEEE Transactions on Communication, vol. 54, No. 3, Mar. 2006.

Takashi Yokokawa et al., Parity and Column Twist Bit Interleaver, 2008 $5^{th}$ International Symposium on Turbo Codes and Related Topics, 2008 IEEE, 7 pages.

\* cited by examiner

FIG.3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 & 0 \\ 0 & 0 & 0 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG.10

$$H_T = \begin{pmatrix} 1 & & & & & 0 \\ 1\,1 & & & & & \\ & 1\,1 & & & & \\ & & \ddots & & & \\ & & & 1\,1 & & \\ 0 & & & & 1\,1 & \\ & & & & & 1\,1 \end{pmatrix}$$

PARITY MATRIX $H_T$

FIG. 23

| REQUIRED MEMORY COLUMN NUMBER mb | b=1 (FIRST TO THIRD REPLACEMENT METHODS) | b=2 (FOURTH REPLACEMENT METHOD) | WRITING STARTING POSITION IN mb COLUMNS | | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 2 | 3 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 27 | 27 | 28 | 32 | | | | | | | | | |
| 20 | | 1024QAM | 0 | 1 | 3 | 4 | 5 | 6 | 6 | 9 | 13 | 14 | 16 | 21 | 21 | 23 | 25 | 25 | 26 | 28 | 30 | | | | | |
| 24 | | 4096QAM | 0 | 5 | 8 | 8 | 8 | 8 | 10 | 10 | 12 | 13 | 16 | 17 | 19 | 21 | 22 | 23 | 25 | 26 | 26 | 28 | 37 | 39 | 40 | 41 | 41 |

FIG. 24

| REQUIRED MEMORY COLUMN NUMBER mb | b=1 (FIRST TO THIRD REPLACEMENT METHODS) | b=2 (FOURTH REPLACEMENT METHOD) | WRITING STARTING POSITION IN mb COLUMNS | | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | | |
| 4 | 16QAM | QPSK | 0 | 2 | 3 | 3 | | | | | | | | | | | | | | | | | | | | | |
| 6 | 64QAM | | 0 | 0 | 2 | 3 | 7 | 7 | | | | | | | | | | | | | | | | | | | |
| 8 | 256QAM | 16QAM | 0 | 0 | 0 | 1 | 7 | 20 | 20 | 21 | | | | | | | | | | | | | | | | | |
| 10 | 1024QAM | | 0 | 1 | 2 | 2 | 3 | 3 | 4 | 4 | 5 | 7 | | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | | |
| 24 | | 4096QAM | 0 | 0 | 0 | 2 | 2 | 2 | 3 | 3 | 3 | 5 | 5 | 5 | 5 | 7 | 7 | 7 | 9 | 9 | 9 | 10 | 10 | 10 | 10 | 10 | 11 |

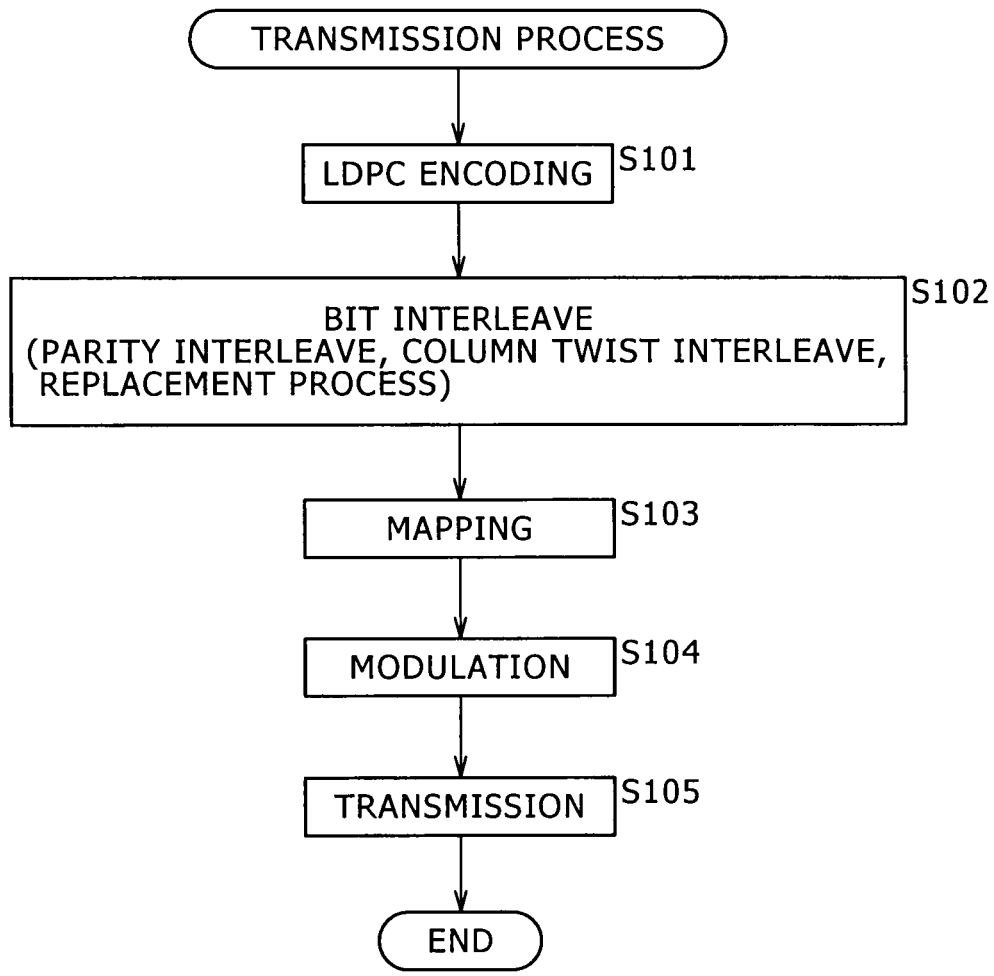

FIG. 26

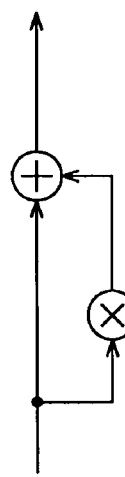
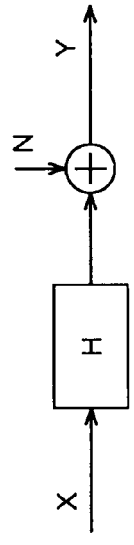

A

EQUIVALENT REDUCTION MODE OF Flutter $\alpha \cdot e^{j(2\pi \cdot f_d \cdot t)}$ $1/\alpha^2 = D/U$
$f_d$: doppler freq.
$t$: time OFDM SYMBOL WAS SENT IN THIS CHANNEL, AND simulation WAS CARRIED OUT WITH MODEL FROM WHICH 1-carrier WAS EXTRACTED AFTER FFT ON RECEPTION SIDE

B $$Y = \underbrace{\left[ 1 + \alpha \cdot \exp\left( j2\pi \cdot m \cdot f_d \cdot T_s + j2\pi \cdot \frac{(N_u-1) \cdot f_d \cdot T_u}{N_u} \right) \cdot \frac{\text{sinc}(\pi \cdot f_d \cdot T_u)}{\text{sinc}(\pi \cdot f_d \cdot T_u/N_u)} \right]}_{H} \cdot X + N$$

$$E[N^2] = \alpha^2 \cdot \left\{ 1 - \left| \frac{\text{sinc}(\pi \cdot f_d \cdot T_u)}{\text{sinc}(\pi \cdot f_d \cdot T_u/N_u)} \right|^2 \right\}$$

|C| OF POWER: APPROXIMATION WITH AWGN $m$: symbol number
$T_s$: symbol length (sec)
$T_u$: effective symbol length (sec)
$N_u$: number of OFDM carriers

CODE LENGTH: 64800, MODULATION METHOD: 16kQAM

| COLUMN | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 |
|---|---|---|---|---|---|---|---|---|---|---|---|---|---|---|---|---|---|---|---|---|---|---|---|---|---|---|---|---|
| b=1 | 0 | 2 | 4 | 5 | 5 | 6 | 11 | 14 | 14 | 14 | 14 | 19 | 23 | 24 | — | — | — | — | — | — | — | — | — | — | — | — | — | — |
| b=2 | 0 | 0 | 2 | 4 | 4 | 6 | 7 | 12 | 14 | 17 | 17 | 20 | 21 | 27 | 28 | 29 | 29 | 33 | 34 | 38 | 52 | 65 | 66 | 66 | 70 | 72 |

B

CODE LENGTH: 16200, MODULATION METHOD: 16kQAM

| COLUMN | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 |
|---|---|---|---|---|---|---|---|---|---|---|---|---|---|---|---|---|---|---|---|---|---|---|---|---|---|---|---|---|
| b=1 | 0 | 0 | 1 | 5 | 7 | 8 | 10 | 16 | 16 | 25 | 30 | 32 | 32 | 33 | — | — | — | — | — | — | — | — | — | — | — | — | — | — |
| b=2 | 0 | 0 | 0 | 0 | 1 | 1 | 1 | 5 | 5 | 9 | 12 | 17 | 17 | 34 | 38 | 40 | 40 | 51 | 51 | 52 | 62 | 65 | 65 | 74 | 76 |

C

CODE LENGTH: 64800, MODULATION METHOD: 64kQAM

| COLUMN | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| b=1 | 0 | 0 | 2 | 2 | 2 | 3 | 6 | 8 | 8 | 12 | 12 | 12 | 17 | 14 | 15 | 15 | 16 | 25 | 25 | 25 | 25 | 31 | 32 | 32 | 47 | 48 | 50 | 50 | 54 | 55 | 57 | 58 |
| b=2 | 0 | 1 | 6 | 2 | 2 | 3 | 6 | 8 | 8 | 12 | 12 | 12 | 17 | 17 | 17 | 17 | 22 | 28 | 28 | 28 | 38 | 40 | 40 | 40 | 48 | 50 | 51 | 51 | 52 | 62 | 65 | 74 | 76 |

(wait — this row actually spans 32 columns; see image)

D

CODE LENGTH: 16200, MODULATION METHOD: 64kQAM

| COLUMN | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| b=1 | 0 | 1 | 2 | 2 | 3 | 6 | 7 | 8 | 9 | 9 | 12 | 12 | 12 | 17 | 17 | 17 | 17 | 22 | 28 | 28 | 28 | 28 | 38 | 40 | 48 | 56 | 58 | 64 | 67 | 70 | 76 | 84 | 86 | 91 | 92 | 94 |
| b=2 | 0 | 2 | 3 | 3 | 3 | 6 | 6 | 6 | 6 | 6 | — | — | — | — | — | — | — | — | — | — | — | — | — | — | — | — | — | — | — | — | — | — |

FIG. 38

| CODE LENGTH | MODULATION METHOD | b | COLUMN NUMBER mb | BIT NUMBER OF ONE COLUMN B=ceil (N/(mb)) | STORAGE CAPACITY mb | BIT NUMBER OF INVALID DATA | BIT NUMBER OF VALID DATA |
|---|---|---|---|---|---|---|---|
| 64800 | 16kQAM | 1 | 14 | 4629 | 64806 | 6 | 4623 |
| 64800 | 16kQAM | 2 | 28 | 2315 | 64820 | 20 | 2295 |
| 16200 | 16kQAM | 1 | 14 | 1158 | 16212 | 12 | 1146 |
| 16200 | 16kQAM | 2 | 28 | 579 | 16212 | 12 | 567 |
| 16200 | 64kQAM | 1 | 16 | 1013 | 16208 | 8 | 1005 |
| 16200 | 64kQAM | 2 | 32 | 507 | 16224 | 24 | 483 |

PARITY CHECK MATRIX INITIAL VALUE TABLE WHERE $r=\frac{2}{3}$, N=16200

FIG.42

PARITY CHECK MATRIX INITIAL VALUE TABLE WHERE $r=\frac{2}{3}$, N=64800

PARITY CHECK MATRIX INITIAL VALUE TABLE WHERE $r=\frac{3}{4}$, N=16200

FIG.46

PARITY CHECK MATRIX INITIAL VALUE TABLE WHERE $r=\frac{3}{4}$, N=64800

PARITY CHECK MATRIX INITIAL VALUE TABLE WHERE $r=\frac{4}{5}$, N=16200

FIG.51

PARITY CHECK MATRIX INITIAL VALUE TABLE WHERE $r=\frac{4}{5}$, $N=64800$

PARITY CHECK MATRIX INITIAL VALUE TABLE WHERE $r=\frac{5}{6}$, N=16200

FIG.56

PARITY CHECK MATRIX INITIAL VALUE TABLE WHERE $r=\frac{5}{6}$, N=64800

PARITY CHECK MATRIX INITIAL VALUE TABLE WHERE $r=\frac{8}{9}$, N=16200

PARITY CHECK MATRIX INITIAL VALUE TABLE WHERE $r=\frac{8}{9}$, N=64800

PARITY CHECK MATRIX INITIAL VALUE TABLE WHERE $r=\frac{9}{10}$, N=64800

ROW NUMBERS OF PARITY CHECK MATRIX (INFORMATION MATRIX $H_A$) OF EVERY 360 COLUMNS BEGINNING WITH FIRST COLUMN ARE INDICATED

ROW NUMBERS OF PARITY CHECK MATRIX

```
0  2084 1613 1548 1286 1460 3196 4297 2481 3369 3451 4620 2622
1  122 1516 3448 2880 1407 1847 3799 3529 373 971 4358 3108
2  259 3399 929 2650 864 3996 3833 107 5287 164 3125 2350
3  342 3529                    └h₃,₅
4  4198 2147
5  1880 4836
6  3864 4910
7  243 1542
8  3011 1436
9  2167 2512
10 4606 1003
11 2835 705
12 3426 2365
13 3848 2474
14 1360 1743
0  163 2536
1  2583 1180
2  1542 509
3  4418 1005
4  5212 5117
5  2155 2922
6  347 2696
7  226 4296
8  1560 487
9  3926 1640
10 149 2928
11 2364 563
12 635 688
13 231 1684
14 1129 3894
```

FIRST COLUMN OF $H_A$
361ST COLUMN OF $H_A$
721ST COLUMN OF $H_A$
1081ST COLUMN OF $H_A$

PARITY CHECK MATRIX INITIAL VALUE TABLE

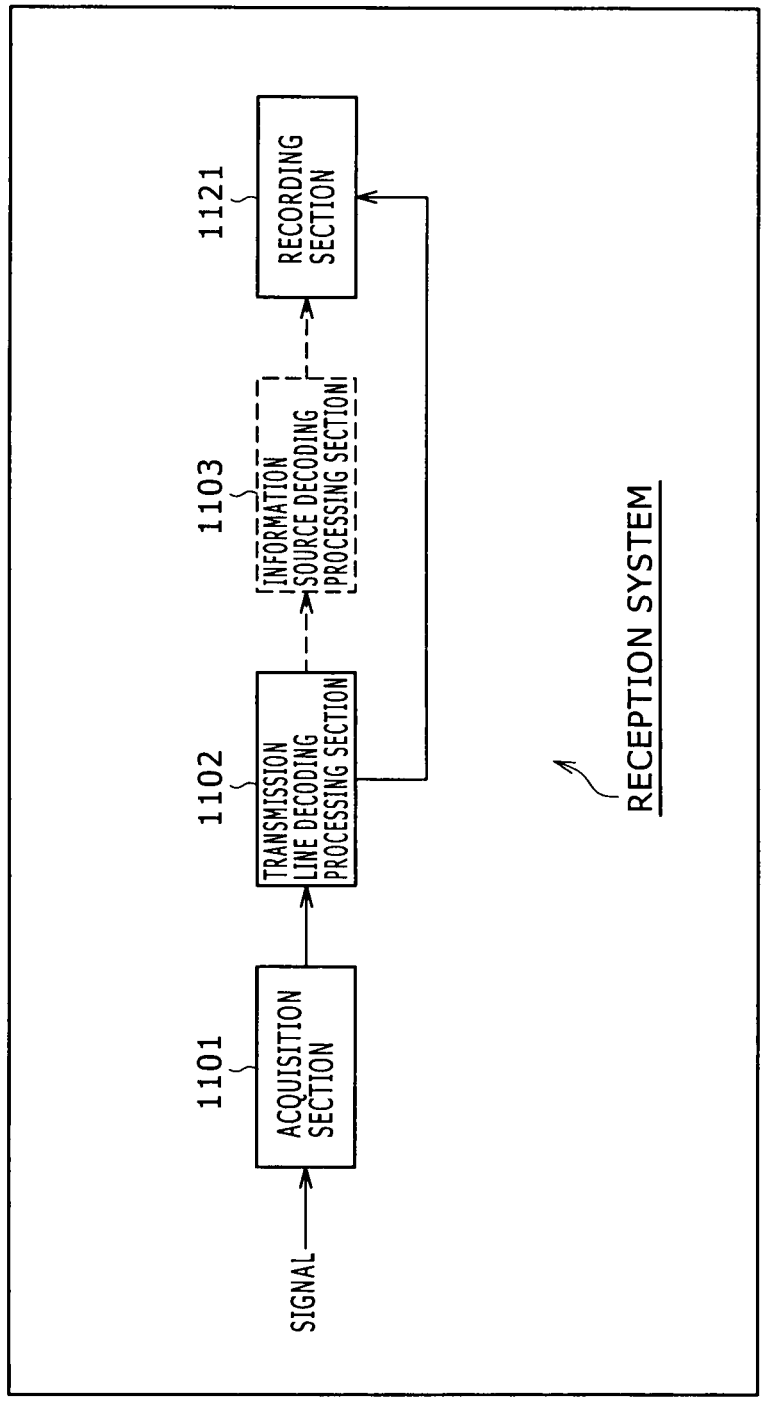

DATA PROCESSING APPARATUS, DATA PROCESSING METHOD AND PROGRAM

TECHNICAL FIELD

This invention relates to a data processing apparatus, a data processing method and a program and particularly to a data processing apparatus, a data processing method and a program which make it possible to improve the tolerance to burst errors or erasure of, for example, an LDPC (Low Density Parity Check) code.

BACKGROUND ART

The LDPC code has a high error correction capacity and, in recent years, begins to be adopted widely in transmission systems including satellite digital broadcasting systems such as, for example, the DVB-S.2 system used in Europe (refer to, for example, Non-Patent Document 1). Further, it is investigated to adopt the LDPC code also in terrestrial digital broadcasting of the next generation.

It is being found by recent research that a performance proximate to the Shannon limit is provided by the LDPC code as the code length is increased similarly to a turbo code and so forth. Further, since the LDPC code has a property that the minimum distance increases in proportion to the code length, it has a characteristic that it has a superior block error probability characteristic. Also it is advantageous that a so-called error floor phenomenon which is observed in a decoding characteristic of the turbo code and so forth little occurs.

In the following, such an LDPC code as described above is described particularly. It is to be noted that the LDPC code is a linear code, and although it is not necessarily be a two-dimensional code, the following description is given under the assumption that it is a two-dimensional code.

The LDPC code has the most significant characteristic in that a parity check matrix which defines the LDPC code is a sparse matrix. Here, the sparse matrix is a matrix in which the number of those elements whose value is "1" is very small (matrix in which almost all elements are 0).

FIG. 1 shows an example of a parity check matrix H of an LDPC code.

In the parity check matrix H of FIG. 1, the weight of each column (column weight) (number of "1") (weight) is "3" and the weight of each row (row weight) is "6."

In encoding by LDPC codes (LDPC encoding), for example, a generator matrix G is produced based on a parity check matrix H and this generator matrix G is multiplied by two-dimensional information bits to produce a codeword (LDPC code).

In particular, an encoding apparatus which carries out LDPC encoding first calculates a generator matrix G which satisfies an expression $GH^T = 0$ together with a transposed matrix $H^T$ of a parity check matrix H. Here, if the generator matrix G is a K×N matrix, then the encoding apparatus multiplies the generator matrix G by a bit string (vector u) of K information bits to produce a codeword c (=uG) of N bits. The codeword (LDPC code) produced by the encoding apparatus is received by the reception side through a predetermined communication path.

Decoding of the LDPC code can be carried out using an algorithm proposed as probabilistic decoding (Probabilistic Decoding) by the Gallager, that is, a message passing algorithm) by belief propagation on a so-called Tanner graph including a variable node (also called message node) and a check node. In the following description, each of the variable node and the check node is suitably referred to simply as node.

FIG. 2 illustrates a procedure of decoding of an LDPC code.

It is to be noted that, in the following description, a real number value where the "0" likelihood in the value of the nth code bit of an LDPC code (one codeword) received by the reception side is represented in a log likelihood ratio is suitably referred to as reception value $u_{oi}$. Further, a message outputted from a check node is represented by $u_j$ and a message outputted from a variable node is represented by $v_i$.

First, in decoding of an LDPC code, as seen in FIG. 2, an LDPC code is received and a message (check node message) $u_j$ is initialized to "0" and besides a variable k which assumes an integer as a counter of repeated processes is initialized to "0" at step S11, whereafter the processing advances to step S12. At step S12, mathematical operation represented by an expression (1) (variable node mathematical operation) is carried out based on the reception value $u_{oi}$ obtained by the reception of the LDPC code to determine a message (variable node message) $v_i$. Further, mathematical operation represented by an expression (2) (check node mathematical operation) is carried out based on the message $v_i$ to determine the message $u_j$.

[Expression 1]

$$v_i = u_{oi} + \sum_{j=1}^{d_v-1} u_j \qquad (1)$$

[Expression 2]

$$\tanh\left(\frac{u_j}{2}\right) = \prod_{i=1}^{d_c-1} \tanh\left(\frac{v_i}{2}\right) \qquad (2)$$

Here, $d_v$ and $d_c$ in the expression (1) and the expression (2) are parameters which can be selected arbitrarily and represent the number of "1s" in a vertical direction (column) and a horizontal direction (row) of the parity check matrix H. For example, in the case of a (3, 6) code, $d_v=3$ and $d_c=6$.

It is to be noted that, in the variable node mathematical operation of the expression (1) and the check node mathematical operation of the expression (2), the range of the mathematical operation is 1 to $d_v-1$ or 1 to $d_c-1$ because a massage inputted from an edge (line interconnecting a variable node and a check node) from which a message is to be outputted is not made an object of the mathematical operation. Meanwhile, the check node mathematical operation of the expression (2) is carried out by producing in advance a table of a function $R(v_1, v_2)$ represented by an expression (3) defined by one output with respect to two inputs $v_1$ and $v_2$ and using the table successively (recursively) as represented by an expression (4).

[Expression 3]

$$x = 2 \tan h^{-1}\{\tan h(v_1/2)\tan h(v_2/2)\} = R(v_1, v_2) \qquad (3)$$

[Expression 4]

$$u_j = R(v_1, R(v_2, R(v_3, \ldots R(v_{dc-2}, v_{dc-1})))) \qquad (4)$$

At step S12, the variable k is incremented by "1" further, and the processing advances to step S13. At step S13, it is decided whether or not the variable k is higher than a predetermined repeated decoding time number C. If it is decided at step S13 that the variable k is not higher than C, then the processing returns to step S12, and similar processing is repeated thereafter.

On the other hand, if it is decided at step S13 that the variable k is higher than C, then the processing advances to step S14, at which a message $v_i$ as a decoding result to be outputted finally by carrying out mathematical operation represented by an expression (5) is determined and outputted, thereby ending the decoding process of the LDPC code.

[Expression 5]

$$v_i = u_{oi} + \sum_{j=1}^{d_v} u_j \quad (5)$$

Here, the mathematical operation of the expression (5) is carried out, different from the variable node mathematical operation of the expression (1), using messages $u_j$ from all edges connecting to the variable node.

FIG. 3 illustrates an example of the parity check matrix H of a (3, 6) LDPC code (encoding rate: 1/2, code length: 12).

In the parity check matrix H of FIG. 3, the weight of a column is 3 and the weight of a row is 6 similarly as in FIG. 1.

FIG. 4 shows a Tanner graph of the parity check matrix H of FIG. 3.

Here, in FIG. 4, a check node is represented by "+," and a variable node is represented by "=." A check node and a variable node correspond to a row and a column of the parity check matrix H, respectively. A connection between a check node and a variable node is an edge and corresponds to "1" of an element of the parity check matrix.

In particular, where the element in the jth row of the ith column of the parity check matrix is 1, the ith variable node (node of "=") from above and the jth check node (node of "+") from above are connected by an edge. The edge represents that a code bit corresponding to the variable node has a constraint condition corresponding to the check node.

In the sum product algorithm (Sum Product Algorithm) which is a decoding method for LDPC codes, variable node mathematical operation and check node mathematical cooperation are carried out repetitively.

FIG. 5 illustrates the variable node mathematical operation carried out with regard to a variable node.

With regard to the variable node, a message $v_i$ corresponding to an edge to be calculated is determined by variable node mathematical operation of the expression (1) which uses messages $u_1$ and $u_2$ from the remaining edges connecting to the variable node and the reception value $u_{oi}$. Also a message corresponding to any other edge is determined similarly.

FIG. 6 illustrates the check node mathematical operation carried out at a check node.

Here, the check node mathematical operation of the expression (2) can be carried out by rewriting the expression (2) into an expression (6) using the relationship of an expression $a \times b = \exp\{\ln(|a|) + \ln(|b|)\} \times \text{sign}(a) \times \text{sign}(b)$. It is to be noted that $\text{sign}(x)$ is 1 where $x \geq 0$ but is $-1$ where $x < 0$.

[Expression 6]

$$u_j = 2\tanh^{-1}\left(\prod_{i=1}^{d_c-1} \tanh\left(\frac{v_i}{2}\right)\right) \quad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

Further, if, where $x \geq 0$, a function $\phi(x)$ is defined as an expression $\phi(x) = \ln(\tan h(x/2))$, then since an expression $\phi^{-1}(x) = 2\tan h^{-1}(e^{-x})$ is satisfied, the expression (6) can be transformed into an expression (7).

[Expression 7]

$$u_j = \phi^{-1}\left(\sum_{i=1}^{d_c-1} \phi(|v_i|)\right) \times \prod_{i=1}^{d_c-1} \text{sign}(vi) \quad (7)$$

At the check node, the check node mathematical operation of the expression (2) is carried out in accordance with the expression (7).

In particular, at the check node, the message $u_j$ corresponding to the edge to be calculated is determined by check node mathematical operation of the expression (7) using messages $v_1, v_2, v_3, v_4$ and $v_5$ from the remaining edges connecting to the check node. Also a message corresponding to any other edge is determined in a similar manner.

It is to be noted that the function $\phi(x)$ of the expression (7) can be represented also as $\phi(x) = \ln((e^x+1)/(e^x-1))$, and where $x > 0$, $\phi(x) = \phi^{-1}(x)$. When the functions $\phi(x)$ and $\phi^{-1}(x)$ are incorporated in hardware, while they are sometimes incorporated using an LUT (Look Up Table), such LUTs become the same LUT.

Non-Patent Document 1: DVB-S.2: ETSI EN 302 307 V1.1.2 (2006-06)

DISCLOSURE OF INVENTION

Technical Problem

Although it has been known that LDPC codes exhibit a very high capacity in an AWGN (Additive White Gaussian Noise) communication path, in recent years it has become clear that even in the other communication paths they have a higher error correction capacity than conventional convolution codes or connection codes of convolution codes and RS (Reed Solomon) codes.

In short, if a code having a good performance in an AWGN communication path is selected, then the code frequently has a better performance than the other codes also in other communication paths.

Incidentally, it has been proposed that, for example, where LDPC codes are applied to terrestrial digital broadcasting, LDPC codes perceived in the DVB-S.2 standards and a modulation system prescribed in the DVB-T standards are combined and an interleaver (bitinterleaver) for interleaving code bits of an LDPC code is provided between the LDPC encoding and modulation to improve the performance of LDPC codes in an AWGN communication path.

However, in a communication path supposed with regard to ground waves, burst errors or erasure sometimes occurs. For example, in an OFDM (Orthogonal Frequency Division Multiplexing) system, in a multi-path environment wherein the D/U (Desired to Undesired Ratio) is 0 dB (power of Undesired=echo is equal to the power of Desired=main path), the power of a particular symbol becomes zero (erasure) in response to a delay of an echo (paths other than the main path).

Further, also in a flutter (communication path in which an echo whose delay is zero and to which a Doppler (dopper) frequency is applied is added), where the D/U is 0 dB, a case wherein the power of an entire OFDM symbol at a specific point of time is reduced to zero by the Doppler frequency occurs.

Furthermore, burst errors sometimes arise from a situation of a wiring line from an antenna to a reception apparatus or instability of the power supply.

Conventionally, also in a communication path in which such burst errors or erasure occurs as described above, an error correction code of a high performance is used in an AWGN communication path.

Meanwhile, in decoding of LDPC codes, since variable node mathematical operation of the expression (1) wherein addition of (reception values $u_{oi}$ of) code bits of an LDPC code as seen in FIG. 5 is carried out in a column of the parity check matrix H and hence a variable node corresponding to a code bit of the LDPC code, if an error occurs with the code bit used for the variable node mathematical operation, then the accuracy of a message to be determined drops.

Then, since, in decoding of the LDPC code, the message determined at the variable node connecting to the check node is used to carry out check node mathematical operation of the expression (7) at the check node, if the number of check nodes where (code bits of the LDPC code corresponding to) a plurality of variable nodes connected thereto exhibit an error (including erasure) at the same time becomes great, then the performance of the decoding deteriorates.

For example, if two or more of the variable nodes connected to the check node suffer from erasure at the same time, then the check node returns a message that the probability that the value may be 0 and the probability that the value may be 1 are equal to each other to all variable nodes. In this instance, those check nodes to which the message of the equal probabilities does not contribute to one cycle of decoding processing (one set of variable node mathematical operation and check node mathematical operation), and as a result, an increased number of times of repetition of decoding processing are required. Consequently, the performance of the decoding deteriorates. Further, the power consumption of a reception apparatus which carries out decoding of the LDPC code increases.

Accordingly, at present, a technique for improving the tolerance to burst errors or erasure while the performance in an AWGN communication path is maintained is demanded.

Here, it has been proposed that the performance of LDPC codes in an AWGN communication path is improved by providing an interleaver for interleaving code bits of an LDPC code between LDPC encoding and modulation as described hereinabove, and if the interleaver can carry out interleave of lowering the probability that a plurality of ones of (code bits of LDPC codes corresponding to) variable nodes connected to a check node may exhibit an error, then the performance of decoding can be improved.

The present invention has been made in view of such a situation as described above and makes it possible to improve the tolerance to errors of code bits of an LDPC code such as burst errors or erasure.

Technical Solution

According to a first aspect of the present invention, there is provided a data processing apparatus, including:
re-arrangement means for carrying out,
where code bits of an LDPC (Low Density Parity Check) code are written in a column direction of storage means for storing the code bits of the LDPC code in a row direction and the column direction and read out in the row direction are set as a symbol whereas
m code bits equal to or more than 2 bits of the LDPC code are transmitted as one symbol,
column twist interleave of changing the writing starting position when the code bits of the LDPC code are to be written in the column direction of the storage means for each column of the storage means as a re-arrangement process for re-arranging the code bits of the LDPC code;
the storage means storing,
where the code length of the LDPC code is represented as N bits, a predetermined positive integer as b and a minimum integer equal to or greater than N/(mb) as B,
mb bits in the row direction and B bits in the column direction;
when mb bits read out in the row direction of the storage means are set as b symbols,
the LDPC code being any of LDPC codes which are prescribed in the DVB-S.2 or DVB-T.2 standard and have 11 different encoding rates and a code length N of 64,800 bits;
the m bits being 14 bits while the integer b is 1;
the 14 code bits of the LDPC code being mapped to ones of $2^{14}$ signal points prescribed in a predetermined modulation method;
the storage means having 14 columns for storing 14×1 bits in the row direction;
the re-arrangement means setting,
where the address of the top position of the storage means in the column direction is 0 and the addresses of the positions of the storage means in the column direction are represented by integers of an ascending order,
the writing starting position for the first column from among the 14 columns of the storage means to the position whose address is 0,
the writing starting position for the second column from among the 14 columns of the storage means to the position whose address is 2,
the writing starting position for the third column from among the 14 columns of the storage means to the position whose address is 4,
the writing starting position for the fourth column from among the 14 columns of the storage means to the position whose address is 5,
the writing starting position for the fifth column from among the 14 columns of the storage means to the position whose address is 5,
the writing starting position for the sixth column from among the 14 columns of the storage means to the position whose address is 6,
the writing starting position for the seventh column from among the 14 columns of the storage means to the position whose address is 11, the writing starting position for the eighth column from among the 14 columns of the storage means to the position whose address is 14, the writing starting position for the ninth column from among the 14 columns of the storage means to the position whose address is 14, the writing starting position for the tenth column from among the 14 columns of the storage means to the position whose address is 14, the writing starting position for the eleventh column from among the 14 columns of the storage means to the position whose address is 14, the writing starting position for the twelfth column from among the 14 columns of the storage means to the position whose address is 19, the writing starting position for the thirteenth column from among the 14 columns of the storage means to the position whose address is 23, and the writing starting position for the fourteenth column from among the 14 columns of the storage means to the position whose address is 24, and a data processing method for the data processing apparatus as well as a program for making a computer function as the data processing apparatus.

In the first aspect of the present invention, the code bits are to be written wherein: the writing starting position for the first column from among the 14 columns of the storage means is set to the position whose address is 0; the writing starting position for the second column to the position whose address is 2; the writing starting position for the third column to the position whose address is 4; the writing starting position for the fourth column to the position whose address is 5; the writing starting position for the fifth column to the position whose address is 5; the writing starting position for the sixth column to the position whose address is 6; the writing starting position for the seventh column to the position whose address is 11; the writing starting position for the eighth column to the position whose address is 14; the writing starting position for the ninth column to the position whose address is 14; the writing starting position for the tenth column to the position whose address is 14; the writing starting position for the eleventh column to the position whose address is 14; the writing starting position for the twelfth column to the position whose address is 19; the writing starting position for the thirteenth column to the position whose address is 23; and the writing starting position for the fourteenth column to the position whose address is 24.

According to a second aspect of the present invention, there is provided a data processing apparatus, including:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of the storage means for each column of the storage means as a re-arrangement process for re-arranging the code bits of the LDPC code;

the storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of the storage means are set as b symbols, the LDPC code being any of LDPC codes which are prescribed in the DVB-S.2 or DVB-T.2 standard and have 11 different encoding rates and a code length N of 64,800 bits;

the m bits being 14 bits while the integer b is 2;

the 14 code bits of the LDPC code being mapped to ones of $2^{14}$ signal points prescribed in a predetermined modulation method;

the storage means having 28 columns for storing 14×2 bits in the row direction;

the re-arrangement means setting, where the address of the top position of the storage means in the column direction is 0 and the addresses of the positions of the storage means in the column direction are represented by integers of an ascending order, the writing starting position for the first column from among the 28 columns of the storage means to the position whose address is 0, the writing starting position for the second column from among the 28 columns of the storage means to the position whose address is 0, the writing starting position for the third column from among the 28 columns of the storage means to the position whose address is 2, the writing starting position for the fourth column from among the 28 columns of the storage means to the position whose address is 4, the writing starting position for the fifth column from among the 28 columns of the storage means to the position whose address is 5, the writing starting position for the sixth column from among the 28 columns of the storage means to the position whose address is 6, the writing starting position for the seventh column from among the 28 columns of the storage means to the position whose address is 7, the writing starting position for the eighth column from among the 28 columns of the storage means to the position whose address is 12, the writing starting position for the ninth column from among the 28 columns of the storage means to the position whose address is 14, the writing starting position for the tenth column from among the 28 columns of the storage means to the position whose address is 17, the writing starting position for the eleventh column from among the 28 columns of the storage means to the position whose address is 17, the writing starting position for the twelfth column from among the 28 columns of the storage means to the position whose address is 20, the writing starting position for the thirteenth column from among the 28 columns of the storage means to the position whose address is 21, the writing starting position for the fourteenth column from among the 28 columns of the storage means to the position whose address is 27, the writing starting position for the fifteenth column from among the 28 columns of the storage means to the position whose address is 28, the writing starting position for the sixteenth column from among the 28 columns of the storage means to the position whose address is 28, the writing starting position for the seventeenth column from among the 28 columns of the storage means to the position whose address is 29, the writing starting position for the eighteenth column from among the 28 columns of the storage means to the position whose address is 29, the writing starting position for the nineteenth column from among the 28 columns of the storage means to the position whose address is 29, the writing starting position for the twentieth column from among the 28 columns of the storage means to the position whose address is 33, the writing starting position for the twenty-first column from among the 28 columns of the storage means to the position whose address is 34, the writing starting position for the twenty-second column from among the 28 columns of the storage means to the position whose address is 38, the writing starting position for the twenty-third column from among the 28 columns of the storage means to the position whose address is 52, the writing starting position for the twenty-fourth column from among the 28 columns of the storage means to the position whose address is 65, the writing starting position for the twenty-fifth column from among the 28 columns of the storage means to the position whose address is 66, the writing starting position for the twenty-sixth column from among the 28 columns of the storage means to the position whose address is 66, the writing starting position for the twenty-seventh column from among the 28 columns of the storage means to the position whose address is 70, and the writing starting position for the twenty-eighth column from among the 28 columns of the storage means to the position whose address is 72, and a data processing method for the data processing apparatus as well as a program for making a computer function as the data processing apparatus.

In the second aspect of the present invention, the code bits are to be written wherein: the writing starting position for the first column from among the 28 columns of the storage means is set to the position whose address is 0; the writing starting position for the second column to the position whose address is 0; the writing starting position for the third column to the position whose address is 2; the writing starting position for the fourth column to the position whose address is 4; the writing starting position for the fifth column to the position whose address is 5; the writing starting position for the sixth column to the position whose address is 6; the writing starting position for the seventh column to the position whose address is 7; the writing starting position for the eighth column to the position whose address is 12; the writing starting position for the ninth column to the position whose address is 14; the writing starting position for the tenth column to the position whose address is 17; the writing starting position for the eleventh column to the position whose address is 17; the writing starting position for the twelfth column to the position whose address is 20; the writing starting position for the thirteenth column to the position whose address is 21; the writing starting position for the fourteenth column to the position whose address is 27; the writing starting position for the fifteenth column to the position whose address is 28; the writing starting position for the sixteenth column to the position whose address is 28; the writing starting position for the seventeenth column to the position whose address is 29; the writing starting position for the eighteenth column to the position whose address is 29; the writing starting position for the nineteenth column to the position whose address is 29; the writing starting position for the twentieth column to the position whose address is 33; the writing starting position for the twenty-first column to the position whose address is 34; the writing starting position for the twenty-second column to the position whose address is 38; the writing starting position for the twenty-third column to the position whose address is 52; the writing starting position for the twenty-fourth column to the position whose address is 65; the writing starting position for the twenty-fifth column to the position whose address is 66; the writing starting position for the twenty-sixth column to the position whose address is 66; the writing starting position for the twenty-seventh column to the position whose address is 70; and the writing starting position for the twenty-eighth column to the position whose address is 72.

According to a third aspect of the present invention, there is provided a data processing apparatus, including:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of the storage means for each column of the storage means as a re-arrangement process for re-arranging the code bits of the LDPC code;

the storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of the storage means are set as b symbols, the LDPC code being any of LDPC codes which are prescribed in the DVB-S.2 or DVB-T.2 standard and have 10 different encoding rates and a code length N of 16,200 bits;

the m bits being 14 bits while the integer b is 1;

the 14 code bits of the LDPC code being mapped to ones of $2^{14}$ signal points prescribed in a predetermined modulation method;

the storage means having 14 columns for storing 14×1 bits in the row direction;

the re-arrangement means setting, where the address of the top position of the storage means in the column direction is 0 and the addresses of the positions of the storage means in the column direction are represented by integers of an ascending order, the writing starting position for the first column from among the 14 columns of the storage means to the position whose address is 0, the writing starting position for the second column from among the 14 columns of the storage means to the position whose address is 0, the writing starting position for the third column from among the 14 columns of the storage means to the position whose address is 1, the writing starting position for the fourth column from among the 14 columns of the storage means to the position whose address is 5, the writing starting position for the fifth column from among the 14 columns of the storage means to the position whose address is 7, the writing starting position for the sixth column from among the 14 columns of the storage means to the position whose address is 8, the writing starting position for the seventh column from among the 14 columns of the storage means to the position whose address is 10, the writing starting position for the eighth column from among the 14 columns of the storage means to the position whose address is 16, the writing starting position for the ninth column from among the 14 columns of the storage means to the position whose address is 16, the writing starting position for the tenth column from among the 14 columns of the storage means to the position whose address is 25, the writing starting position for the eleventh column from among the 14 columns of the storage means to the position whose address is 30, the writing starting position for the twelfth column from among the 14 columns of the storage means to the position whose address is 32, the writing starting position for the thirteenth column from among the 14 columns of the storage means to the position whose address is 32, and the writing starting position for the fourteenth column from among the 14 columns of the storage means to the position whose address is 33, and a data processing method for the data processing apparatus as well as a program for making a computer function as the data processing apparatus.

In the third aspect of the present invention, the code bits are to be written wherein: the writing starting position for the first column from among the 14 columns of the storage means is set to the position whose address is 0; the writing starting position for the second column to the position whose address is 0; the writing starting position for the third column to the position whose address is 1; the writing starting position for the fourth column to the position whose address is 5; the writing starting position for the fifth column to the position whose address is 7; the writing starting position for the sixth column to the position whose address is 8; the writing starting position for the seventh column to the position whose address is 10; the writing starting position for the eighth column to the position whose address is 16; the writing starting position for the ninth column to the position whose address is 16; the writing starting position for the tenth column to the position whose address is 25; the writing starting position for the eleventh column to the position whose address is 30; the writing starting position for the twelfth column to the position whose address is 32; the writing starting position for the thirteenth column to the position whose address is 32; and the writing starting position for the fourteenth column to the position whose address is 33.

According to a fourth aspect of the present invention, there is provided a data processing apparatus, including:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of the storage means for each column of the storage means as a re-arrangement process for re-arranging the code bits of the LDPC code;

the storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of the storage means are set as b symbols, the LDPC code being any of LDPC codes which are prescribed in the DVB-S.2 or DVB-T.2 standard and have 10 different encoding rates and a code length N of 16,200 bits;

the m bits being 14 bits while the integer b is 2;

the 14 code bits of the LDPC code being mapped to ones of $2^{14}$ signal points prescribed in a predetermined modulation method;

the storage means having 28 columns for storing 14×2 bits in the row direction;

the re-arrangement means setting, where the address of the top position of the storage means in the column direction is 0 and the addresses of the positions of the storage means in the column direction are represented by integers of an ascending order, the writing starting position for the first column from among the 28 columns of the storage means to the position whose address is 0, the writing starting position for the second column from among the 28 columns of the storage means to the position whose address is 0, the writing starting position for the third column from among the 28 columns of the storage means to the position whose address is 0, the writing starting position for the fourth column from among the 28 columns of the storage means to the position whose address is 0, the writing starting position for the fifth column from among the 28 columns of the storage means to the position whose address is 1, the writing starting position for the sixth column from among the 28 columns of the storage means to the position whose address is 1, the writing starting position for the seventh column from among the 28 columns of the storage means to the position whose address is 1, the writing starting position for the eighth column from among the 28 columns of the storage means to the position whose address is 5, the writing starting position for the ninth column from among the 28 columns of the storage means to the position whose address is 5, the writing starting position for the tenth column from among the 28 columns of the storage means to the position whose address is 9, the writing starting position for the eleventh column from among the 28 columns of the storage means to the position whose address is 12, the writing starting position for the twelfth column from among the 28 columns of the storage means to the position whose address is 17, the writing starting position for the thirteenth column from among the 28 columns of the storage means to the position whose address is 17, the writing starting position for the fourteenth column from among the 28 columns of the storage means to the position whose address is 17, the writing starting position for the fifteenth column from among the 28 columns of the storage means to the position whose address is 34, the writing starting position for the sixteenth column from among the 28 columns of the storage means to the position whose address is 38, the writing starting position for the seventeenth column from among the 28 columns of the storage means to the position whose address is 40, the writing starting position for the eighteenth column from among the 28 columns of the storage means to the position whose address is 40, the writing starting position for the nineteenth column from among the 28 columns of the storage means to the position whose address is 50, the writing starting position for the twentieth column from among the 28 columns of the storage means to the position whose address is 51, the writing starting position for the twenty-first column from among the 28 columns of the storage means to the position whose address is 51, the writing starting position for the twenty-second column from among the 28 columns of the storage means to the position whose address is 51, the writing starting position for the twenty-third column from among the 28 columns of the storage means to the position whose address is 52, the writing starting position for the twenty-fourth column from among the 28 columns of the storage means to the position whose address is 62, the writing starting position for the twenty-fifth column from among the 28 columns of the storage means to the position whose address is 65, the writing starting position for the twenty-sixth column from among the 28 columns of the storage means to the position whose address is 65, the writing starting position for the twenty-seventh column from among the 28 columns of the storage means to the position whose address is 74, and the writing starting position for the twenty-eighth column from among the 28 columns of the storage means to the position whose address is 76,
and a data processing method for the data processing apparatus as well as a program for making a computer function as the data processing apparatus.

In the fourth aspect of the present invention, the code bits are to be written wherein: the writing starting position for the first column from among the 28 columns of the storage means is set to the position whose address is 0; the writing starting position for the second column to the position whose address is 0; the writing starting position for the third column to the position whose address is 0; the writing starting position for the fourth column to the position whose address is 0; the writing starting position for the fifth column to the position whose address is 1; the writing starting position for the sixth column to the position whose address is 1; the writing starting position for the seventh column to the position whose address is 1; the writing starting position for the eighth column to the position whose address is 5; the writing starting position for the ninth column to the position whose address is 5; the writing starting position for the tenth column to the position whose address is 9; the writing starting position for the eleventh column to the position whose address is 12; the writing starting position for the twelfth column to the position whose address is 17; the writing starting position for the thirteenth column to the position whose address is 17; the writing starting position for the fourteenth column to the position whose address is 17; the writing starting position for the fifteenth column to the position whose address is 34; the writing starting position for the sixteenth column to the position whose address is 38; the writing starting position for the seventeenth column to the position whose address is 40; the writing starting position for the eighteenth column to the position whose address is 40; the writing starting position for the nineteenth column to the position whose address is 50; the writing starting position for the twentieth column to the position whose address is 51; the writing starting position for the twenty-first column to the position whose address is 51; the writing starting position for the twenty-second column to the position whose address is 51; the writing starting position for the twenty-third column to the position whose address is 52; the writing starting position for the twenty-fourth column to the position whose address is 62; the writing starting position for the twenty-fifth column to the position whose address is 65; the writing starting position for the twenty-sixth column to the position whose address is 65; the writing starting position for the twenty-seventh column to the position whose address is 74; and the writing starting position for the twenty-eighth column to the position whose address is 76.

According to a fifth aspect of the present invention, there is provided a data processing apparatus, including:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of the storage means for each column of the storage means as a re-arrangement process for re-arranging the code bits of the LDPC code;

the storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of the storage means are set as b symbols, the LDPC code being any of LDPC codes which are prescribed in the DVB-S.2 or DVB-T.2 standard and have 11 different encoding rates and a code length N of 64,800 bits;

the m bits being 16 bits while the integer b is 1;

the 16 code bits of the LDPC code being mapped to ones of $2^{16}$ signal points prescribed in a predetermined modulation method;

the storage means having 16 columns for storing 16×1 bits in the row direction;

the re-arrangement means setting, where the address of the top position of the storage means in the column direction is 0 and the addresses of the positions of the storage means in the column direction are represented by integers of an ascending order, the writing starting position for the first column from among the 16 columns of the storage means to the position whose address is 0, the writing starting position for the second column from among the 16 columns of the storage means to the position whose address is 2, the writing starting position for the third column from among the 16 columns of the storage means to the position whose address is 2, the writing starting position for the fourth column from among the 16 columns of the storage means to the position whose address is 2, the writing starting position for the fifth column from among the 16 columns of the storage means to the position whose address is 2, the writing starting position for the sixth column from among the 16 columns of the storage means to the position whose address is 3, the writing starting position for the seventh column from among the 16 columns of the storage means to the position whose address is 7, the writing starting position for the eighth column from among the 16 columns of the storage means to the position whose address is 15, the writing starting position for the ninth column from among the 16 columns of the storage means to the position whose address is 16, the writing starting position for the tenth column from among the 16 columns of the storage means to the position whose address is 20, the writing starting position for the eleventh column from among the 16 columns of the storage means to the position whose address is 22, the writing starting position for the twelfth column from among the 16 columns of the storage means to the position whose address is 22, the writing starting position for the thirteenth column from among the 16 columns of the storage means to the position whose address is 27, the writing starting position for the fourteenth column from among the 16 columns of the storage means to the position whose address is 27, the writing starting position for the fifteenth column from among the 16 columns of the storage means to the position whose address is 28, and the writing starting position for the sixteenth column from among the 16 columns of the storage means to the position whose address is 32,
and a data processing method for the data processing apparatus as well as a program for making a computer function as the data processing apparatus.

In the fifth aspect of the present invention, the code bits are to be written wherein: the writing starting position for the first column from among the 16 columns of the storage means is set to the position whose address is 0; the writing starting position for the second column to the position whose address is 2; the writing starting position for the third column to the position whose address is 2; the writing starting position for the fourth column to the position whose address is 2; the writing starting position for the fifth column to the position whose address is 2; the writing starting position for the sixth column to the position whose address is 3; the writing starting position for the seventh column to the position whose address is 7; the writing starting position for the eighth column to the position whose address is 15; the writing starting position for the ninth column to the position whose address is 16; the writing starting position for the tenth column to the position whose address is 20; the writing starting position for the eleventh column to the position whose address is 22; the writing starting position for the twelfth column to the position whose address is 22; the writing starting position for the thirteenth column to the position whose address is 27; the writing starting position for the fourteenth column to the position whose address is 27; the writing starting position for the fifteenth column to the position whose address is 28; and the writing starting position for the sixteenth column to the position whose address is 32.

According to a sixth aspect of the present invention, there is provided a data processing apparatus, including:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of the storage means for each column of the storage means as a re-arrangement process for re-arranging the code bits of the LDPC code;

the storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of the storage means are set as b symbols, the LDPC code being any of LDPC codes which are prescribed in the DVB-S.2 or DVB-T.2 standard and have 11 different encoding rates and a code length N of 64,800 bits;

the m bits being 16 bits while the integer b is 2;

the 16 code bits of the LDPC code being mapped to ones of $2^{16}$ signal points prescribed in a predetermined modulation method;

the storage means having 32 columns for storing 16×2 bits in the row direction;

the re-arrangement means setting, where the address of the top position of the storage means in the column direction is 0 and the addresses of the positions of the storage means in the column direction are represented by integers of an ascending order, the writing starting position for the first column from among the 32 columns of the storage means to the position whose address is 0, the writing starting position for the second column from among the 32 columns of the storage means to the position whose address is 2, the writing starting position for the third column from among the 32 columns of the storage means to the position whose address is 6, the writing starting position for the fourth column from among the 32 columns of the storage means to the position whose address is 7, the writing starting position for the fifth column from among the 32 columns of the storage means to the position whose address is 7, the writing starting position for the sixth column from among the 32 columns of the storage means to the position whose address is 7, the writing starting position for the seventh column from among the 32 columns of the storage means to the position whose address is 10, the writing starting position for the eighth column from among the 32 columns of the storage means to the position whose address is 11, the writing starting position for the ninth column from among the 32 columns of the storage means to the position whose address is 11, the writing starting position for the tenth column from among the 32 columns of the storage means to the position whose address is 14, the writing starting position for the eleventh column from among the 32 columns of the storage means to the position whose address is 14, the writing starting position for the twelfth column from among the 32 columns of the storage means to the position whose address is 15, the writing starting position for the thirteenth column from among the 32 columns of the storage means to the position whose address is 15, the writing starting position for the fourteenth column from among the 32 columns of the storage means to the position whose address is 16, the writing starting position for the fifteenth column from among the 32 columns of the storage means to the position whose address is 25, the writing starting position for the sixteenth column from among the 32 columns of the storage means to the position whose address is 25, the writing starting position for the seventeenth column from among the 32 columns of the storage means to the position whose address is 25, the writing starting position for the eighteenth column from among the 32 columns of the storage means to the position whose address is 25, the writing starting position for the nineteenth column from among the 32 columns of the storage means to the position whose address is 25, the writing starting position for the twentieth column from among the 32 columns of the storage means to the position whose address is 31, the writing starting position for the twenty-first column from among the 32 columns of the storage means to the position whose address is 32, the writing starting position for the twenty-second column from among the 32 columns of the storage means to the position whose address is 32, the writing starting position for the twenty-third column from among the 32 columns of the storage means to the position whose address is 47, the writing starting position for the twenty-fourth column from among the 32 columns of the storage means to the position whose address is 48, the writing starting position for the twenty-fifth column from among the 32 columns of the storage means to the position whose address is 50, the writing starting position for the twenty-sixth column from among the 32 columns of the storage means to the position whose address is 50, the writing starting position for the twenty-seventh column from among the 32 columns of the storage means to the position whose address is 54, the writing starting position for the twenty-eighth column from among the 32 columns of the storage means to the position whose address is 55, the writing starting position for the twenty-ninth column from among the 32 columns of the storage means to the position whose address is 57, the writing starting position for the thirtieth column from among the 32 columns of the storage means to the position whose address is 57, the writing starting position for the thirty-first column from among the 32 columns of the storage means to the position whose address is 58, and the writing starting position for the thirty-second column from among the 32 columns of the storage means to the position whose address is 58, and a data processing method for the data processing apparatus as well as a program for making a computer function as the data processing apparatus.

In the sixth aspect of the present invention, the code bits are to be written wherein: the writing starting position for the first column from among the 32 columns of the storage means is set to the position whose address is 0; the writing starting position for the second column to the position whose address is 2; the writing starting position for the third column to the position whose address is 6; the writing starting position for the fourth column to the position whose address is 7; the writing starting position for the fifth column to the position whose address is 7; the writing starting position for the sixth column to the position whose address is 7; the writing starting position for the seventh column to the position whose address is 10; the writing starting position for the eighth column to the position whose address is 11; the writing starting position for the ninth column to the position whose address is 11; the writing starting position for the tenth column to the position whose address is 14; the writing starting position for the eleventh column to the position whose address is 14; the writing starting position for the twelfth column to the position whose address is 15; the writing starting position for the thirteenth column to the position whose address is 15; the writing starting position for the fourteenth column to the position whose address is 16; the writing starting position for the fifteenth column to the position whose address is 25; the writing starting position for the sixteenth column to the position whose address is 25; the writing starting position for the seventeenth column to the position whose address is 25; the writing starting position for the eighteenth column to the position whose address is 25; the writing starting position for the nineteenth column to the position whose address is 25; the writing starting position for the twentieth column to the position whose address is 31; the writing starting position for the twenty-first column to the position whose address is 32; the writing starting position for the twenty-second column to the position whose address is 32; the writing starting position for the twenty-third column to the position whose address is 47; the writing starting position for the twenty-fourth column to the position whose address is 48; the writing starting position for the twenty-fifth column to the position whose address is 50; the writing starting position for the twenty-sixth column to the position whose address is 50; the writing starting position for the twenty-seventh column to the position whose address is 54; the writing starting position for the twenty-eighth column to the position whose address is 55; the writing starting position for the twenty-ninth column to the position whose address is 57; the writing starting position for the thirtieth column to the position whose address is 57; the writing starting position for the thirty-first column to the position whose address is 58; and the writing starting position for the thirty-second column to the position whose address is 58.

According to a seventh aspect of the present invention, there is provided a data processing apparatus, including:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of the storage means for each column of the storage means as a re-arrangement process for re-arranging the code bits of the LDPC code;

the storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of the storage means are set as b symbols, the LDPC code being any of LDPC codes which are prescribed in the DVB-S.2 or DVB-T.2 standard and have 10 different encoding rates and a code length N of 16,200 bits;

the m bits being 16 bits while the integer b is 1;

the 16 code bits of the LDPC code being mapped to ones of $2^{16}$ signal points prescribed in a predetermined modulation method;

the storage means having 16 columns for storing 16×1 bits in the row direction;

the re-arrangement means setting, where the address of the top position of the storage means in the column direction is 0 and the addresses of the positions of the storage means in the column direction are represented by integers of an ascending order, the writing starting position for the first column from among the 16 columns of the storage means to the position whose address is 0, the writing starting position for the second column from among the 16 columns of the storage means to the position whose address is 1, the writing starting position for the third column from among the 16 columns of the storage means to the position whose address is 1, the writing starting position for the fourth column from among the 16 columns of the storage means to the position whose address is 2, the writing starting position for the fifth column from among the 16 columns of the storage means to the position whose address is 2, the writing starting position for the sixth column from among the 16 columns of the storage means to the position whose address is 3, the writing starting position for the seventh column from among the 16 columns of the storage means to the position whose address is 6, the writing starting position for the eighth column from among the 16 columns of the storage means to the position whose address is 8, the writing starting position for the ninth column from among the 16 columns of the storage means to the position whose address is 12, the writing starting position for the tenth column from among the 16 columns of the storage means to the position whose address is 12, the writing starting position for the eleventh column from among the 16 columns of the storage means to the position whose address is 12, the writing starting position for the twelfth column from among the 16 columns of the storage means to the position whose address is 12, the writing starting position for the thirteenth column from among the 16 columns of the storage means to the position whose address is 17, the writing starting position for the fourteenth column from among the 16 columns of the storage means to the position whose address is 17, the writing starting position for the fifteenth column from among the 16 columns of the storage means to the position whose address is 17, and the writing starting position for the sixteenth column from among the 16 columns of the storage means to the position whose address is 17, and a data processing method for the data processing apparatus as well as a program for making a computer function as the data processing apparatus.

In the seventh aspect of the present invention, the code bits are to be written wherein: the writing starting position for the first column from among the 16 columns of the storage means is set to the position whose address is 0; the writing starting position for the second column to the position whose address is 1; the writing starting position for the third column to the position whose address is 1; the writing starting position for the fourth column to the position whose address is 2; the writing starting position for the fifth column to the position whose address is 2; the writing starting position for the sixth column to the position whose address is 3; the writing starting position for the seventh column to the position whose address is 6; the writing starting position for the eighth column to the position whose address is 8; the writing starting position for the ninth column to the position whose address is 12; the writing starting position for the tenth column to the position whose address is 12; the writing starting position for the eleventh column to the position whose address is 12; the writing starting position for the twelfth column to the position whose address is 12; the writing starting position for the thirteenth column to the position whose address is 17; the writing starting position for the fourteenth column to the position whose address is 17; the writing starting position for the fifteenth column to the position whose address is 17; and the writing starting position for the sixteenth column to the position whose address is 17.

According to a eighth aspect of the present invention, there is provided a data processing apparatus, including:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of the storage means for each column of the storage means as a re-arrangement process for re-arranging the code bits of the LDPC code;

the storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of the storage means are set as b symbols, the LDPC code being any of LDPC codes which are prescribed in the DVB-S.2 or DVB-T.2 standard and have 10 different encoding rates and a code length N of 16,200 bits;

the m bits being 16 bits while the integer b is 2;

the 16 code bits of the LDPC code being mapped to ones of $2^{16}$ signal points prescribed in a predetermined modulation method;

the storage means having 32 columns for storing 16×2 bits in the row direction;

the re-arrangement means setting, where the address of the top position of the storage means in the column direction is 0 and the addresses of the positions of the storage means in the column direction are represented by integers of an ascending order, the writing starting position for the first column from among the 32 columns of the storage means to the position whose address is 0, the writing starting position for the second column from among the 32 columns of the storage means to the position whose address is 0, the writing starting position for the third column from among the 32 columns of the storage means to the position whose address is 2, the writing starting position for the fourth column from among the 32 columns of the storage means to the position whose address is 3, the writing starting position for the fifth column from among the 32 columns of the storage means to the position whose address is 3, the writing starting position for the sixth column from among the 32 columns of the storage means to the position whose address is 6, the writing starting position for the seventh column from among the 32 columns of the storage means to the position whose address is 6, the writing starting position for the eighth column from among the 32 columns of the storage means to the position whose address is 9, the writing starting position for the ninth column from among the 32 columns of the storage means to the position whose address is 12, the writing starting position for the tenth column from among the 32 columns of the storage means to the position whose address is 17, the writing starting position for the eleventh column from among the 32 columns of the storage means to the position whose address is 17, the writing starting position for the twelfth column from among the 32 columns of the storage means to the position whose address is 17, the writing starting position for the thirteenth column from among the 32 columns of the storage means to the position whose address is 22, the writing starting position for the fourteenth column from among the 32 columns of the storage means to the position whose address is 28, the writing starting position for the fifteenth column from among the 32 columns of the storage means to the position whose address is 28, the writing starting position for the sixteenth column from among the 32 columns of the storage means to the position whose address is 28, the writing starting position for the seventeenth column from among the 32 columns of the storage means to the position whose address is 38, the writing starting position for the eighteenth column from among the 32 columns of the storage means to the position whose address is 40, the writing starting position for the nineteenth column from among the 32 columns of the storage means to the position whose address is 40, the writing starting position for the twentieth column from among the 32 columns of the storage means to the position whose address is 48, the writing starting position for the twenty-first column from among the 32 columns of the storage means to the position whose address is 56, the writing starting position for the twenty-second column from among the 32 columns of the storage means to the position whose address is 58, the writing starting position for the twenty-third column from among the 32 columns of the storage means to the position whose address is 64, the writing starting position for the twenty-fourth column from among the 32 columns of the storage means to the position whose address is 67, the writing starting position for the twenty-fifth column from among the 32 columns of the storage means to the position whose address is 67, the writing starting position for the twenty-sixth column from among the 32 columns of the storage means to the position whose address is 70, the writing starting position for the twenty-seventh column from among the 32 columns of the storage means to the position whose address is 76, the writing starting position for the twenty-eighth column from among the 32 columns of the storage means to the position whose address is 84, the writing starting position for the twenty-ninth column from among the 32 columns of the storage means to the position whose address is 86, the writing starting position for the thirtieth column from among the 32 columns of the storage means to the position whose address is 91, the writing starting position for the thirty-first column from among the 32 columns of the storage means to the position whose address is 92, and the writing starting position for the thirty-second column from among the 32 columns of the storage means to the position whose address is 94, and a data processing method for the data processing apparatus as well as a program for making a computer function as the data processing apparatus.

In the eighth aspect of the present invention, the code bits are to be written wherein: the writing starting position for the first column from among the 32 columns of the storage means is set to the position whose address is 0; the writing starting position for the second column to the position whose address is 0; the writing starting position for the third column to the position whose address is 2; the writing starting position for the fourth column to the position whose address is 3; the writing starting position for the fifth column to the position whose address is 3; the writing starting position for the sixth column to the position whose address is 6; the writing starting position for the seventh column to the position whose address is 6; the writing starting position for the eighth column to the position whose address is 9; the writing starting position for the ninth column to the position whose address is 12; the writing starting position for the tenth column to the position whose address is 17; the writing starting position for the eleventh column to the position whose address is 17; the writing starting position for the twelfth column to the position whose address is 17; the writing starting position for the thirteenth column to the position whose address is 22; the writing starting position for the fourteenth column to the position whose address is 28; the writing starting position for the fifteenth column to the position whose address is 28; the writing starting position for the sixteenth column to the position whose address is 28; the writing starting position for the seventeenth column to the position whose address is 38; the writing starting position for the eighteenth column to the position whose address is 40; the writing starting position for the nineteenth column to the position whose address is 40; the writing starting position for the twentieth column to the position whose address is 48; the writing starting position for the twenty-first column to the position whose address is 56; the writing starting position for the twenty-second column to the position whose address is 58; the writing starting position for the twenty-third column to the position whose address is 64; the writing starting position for the twenty-fourth column to the position whose address is 67; the writing starting position for the twenty-fifth column to the position whose address is 67; the writing starting position for the twenty-sixth column to the position whose address is 70; the writing starting position for the twenty-seventh column to the position whose address is 76; the writing starting position for the twenty-eighth column to the position whose address is 84; the writing starting position for the twenty-ninth column to the position whose address is 86; the writing starting position for the thirtieth column to the position whose address is 91; the writing starting position for the thirty-first column to the position whose address is 92; and the writing starting position for the thirty-second column to the position whose address is 94.

It is to be noted that the data processing apparatus may be an independent apparatus or may be an internal block which composes one apparatus.

Meanwhile, the program can be provided by transmission by a transmission medium or by recording on a recording medium.

Advantageous Effect

According to the first to eighth aspects of the present invention, the tolerance of code bits of an LDPC code to errors can be improved.

BRIEF DESCRIPTION OF DRAWINGS

FIG. 3 is a view illustrating an example of a parity error matrix of an LDPC code.

FIG. 10 is a view illustrating a parity matrix.

FIG. 23 is a view illustrating column numbers of a memory 31 necessary for the column twist interleaving and addresses of writing starting positions.

FIG. 24 is a view illustrating column numbers of the memory 31 necessary for the column twist interleaving and addresses of writing starting positions.

FIG. 25 is a flow chart illustrating a transmission process.

FIG. 26 is a view showing a model of a communication path adopted in a simulation.

FIG. 31 is a view illustrating an example of a parity check matrix of an LDPC code.

FIG. 32 is a view illustrating a matrix (conversion parity check matrix) obtained by applying row replacement and column replacement to a parity check matrix.

FIG. 33 is a view illustrating a conversion parity check matrix divided into a unit of 5×5 bits.

FIG. 36 is a view illustrating column twist interleave where 16kQAM and 64kQAM are adopted as the modulation method.

FIG. 38 is a view illustrating examples of a bit number of an unused region where the unused region appears (the bit number of invalid data).

FIG. 41 is a view illustrating an example of a parity check matrix initial value table of an encoding rate of 2/3 and a code length of 16,200.

FIG. 42 is a view illustrating an example of a parity check matrix initial value table of an encoding rate of 2/3 and a code length of 64,800.

FIG. 43 is a view illustrating the example of the parity check matrix initial value table of the encoding rate of 2/3 and the code length of 64,800.

FIG. 44 is a view illustrating the example of the parity check matrix initial value table of the encoding rate of 2/3 and the code length of 64,800.

FIG. 45 is a view illustrating an example of a parity check matrix initial value table of an encoding rate of 3/4 and a code length of 16,200.

FIG. 46 is a view illustrating an example of a parity check matrix initial value table of an encoding rate of 3/4 and a code length of 64,800.

FIG. 47 is a view illustrating the example of the parity check matrix initial value table of the encoding rate of 3/4 and the code length of 64,800.

FIG. 48 is a view illustrating the example of the parity check matrix initial value table of the encoding rate of 3/4 and the code length of 64,800.

FIG. 49 is a view illustrating the example of the parity check matrix initial value table of the encoding rate of 3/4 and the code length of 64,800.

FIG. 50 is a view illustrating an example of a parity check matrix initial value table of an encoding rate of 4/5 and a code length of 16,200.

FIG. 51 is a view illustrating an example of a parity check matrix initial value table of an encoding rate of 4/5 and a code length of 64,800.

FIG. 52 is a view illustrating the example of the parity check matrix initial value table of the encoding rate of 4/5 and the code length of 64,800.

FIG. 53 is a view illustrating the example of the parity check matrix initial value table of the encoding rate of 4/5 and the code length of 64,800.

FIG. 54 is a view illustrating the example of the parity check matrix initial value table of the encoding rate of 4/5 and the code length of 64,800.

FIG. 55 is a view illustrating an example of a parity check matrix initial value table of an encoding rate of 5/6 and a code length of 16,200.

FIG. 56 is a view illustrating an example of a parity check matrix initial value table of an encoding rate of 5/6 and a code length of 64,800.

FIG. 57 is a view illustrating the example of the parity check matrix initial value table of the encoding rate of 5/6 and the code length of 64,800.

FIG. 58 is a view illustrating the example of the parity check matrix initial value table of the encoding rate of 5/6 and the code length of 64,800.

FIG. 59 is a view illustrating the example of the parity check matrix initial value table of the encoding rate of 5/6 and the code length of 64,800.

FIG. 60 is a view illustrating an example of a parity check matrix initial value table of an encoding rate of 8/9 and a code length of 16,200.

FIG. 61 is a view illustrating the example of the parity check matrix initial value table of the encoding rate of 8/9 and the code length of 64,800.

FIG. 62 is a view illustrating the example of the parity check matrix initial value table of the encoding rate of 8/9 and the code length of 64,800.

FIG. 63 is a view illustrating the example of the parity check matrix initial value table of the encoding rate of 8/9 and the code length of 64,800.

FIG. 64 is a view illustrating the example of the parity check matrix initial value table of the encoding rate of 8/9 and the code length of 64,800.

FIG. 65 is a view illustrating an example of a parity check matrix initial value table of an encoding rate of 9/10 and a code length of 64,800.

FIG. 66 is a view illustrating the example of the parity check matrix initial value table of the encoding rate of 9/10 and the code length of 64,800.

FIG. 67 is a view illustrating the example of the parity check matrix initial value table of the encoding rate of 9/10 and the code length of 64,800.

FIG. 68 is a view illustrating the example of the parity check matrix initial value table of the encoding rate of 9/10 and the code length of 64,800.

FIG. 69 is a view illustrating an example of a parity check matrix initial value table of an encoding rate of 1/4 and a code length of 64,800.

FIG. 70 is a view illustrating the example of the parity check matrix initial value table of the encoding rate of 1/4 and the code length of 64,800.

FIG. 71 is a view illustrating an example of a parity check matrix initial value table of an encoding rate of 1/3 and a code length of 64,800.

FIG. 72 is a view illustrating the example of the parity check matrix initial value table of the encoding rate of 1/3 and the code length of 64,800.

FIG. 73 is a view illustrating an example of a parity check matrix initial value table of an encoding rate of 2/5 and a code length of 64,800.

FIG. 74 is a view illustrating the example of the parity check matrix initial value table of the encoding rate of 2/5 and the code length of 64,800.

FIG. 75 is a view illustrating an example of a parity check matrix initial value table of an encoding rate of 1/2 and a code length of 64,800.

FIG. 76 is a view illustrating the example of the parity check matrix initial value table of the encoding rate of 1/2 and the code length of 64,800.

FIG. 77 is a view illustrating the example of the parity check matrix initial value table of the encoding rate of 1/2 and the code length of 64,800.

FIG. 78 is a view illustrating an example of a parity check matrix initial value table of an encoding rate of 3/5 and a code length of 64,800.

FIG. 79 is a view illustrating the example of the parity check matrix initial value table of the encoding rate of 3/5 and the code length of 64,800.

FIG. 80 is a view illustrating the example of the parity check matrix initial value table of the encoding rate of 3/5 and the code length of 64,800.

FIG. 81 is a view illustrating an example of a parity check matrix initial value table of an encoding rate of 1/4 and a code length of 16,200.

FIG. 82 is a view illustrating an example of a parity check matrix initial value table of an encoding rate of 1/3 and a code length of 16,200.

FIG. 83 is a view illustrating an example of a parity check matrix initial value table of an encoding rate of 2/5 and a code length of 16,200.

FIG. 84 is a view illustrating an example of a parity check matrix initial value table of an encoding rate of 1/2 and a code length of 16,200.

FIG. 85 is a view illustrating an example of a parity check matrix initial value table of an encoding rate of 3/5 and a code length of 16,200.

FIG. 86 is a view illustrating another example of the parity check matrix initial value table of the encoding rate of 3/5 and the code length of 16,200.

FIG. 87 is a view illustrating a method of determining a parity check matrix H from a parity check matrix initial table.

FIG. 113 is a block diagram showing a third example of the configuration of the reception system which can be applied to the reception apparatus 12.

EXPLANATION OF REFERENCE SYMBOLS

11 Transmission apparatus, 12 Reception apparatus, 21 LDPC encoding section, 22 Bit interleaver, 23 Parity interleaver, 24 Column twist interleaver, 25 Demultiplexer, 26 Mapping section, 27 Orthogonal modulation section, 31 Memory, 32 Replacement section, 51 Orthogonal demodulation section, 52 Demapping section, 53 Deinterleaver, 54 Multiplexer, 55 Column twist interleaver, 56 LDPC decoding section, 300 Edge data storage memory, 301 Selector, 302 Check node calculation section, 303 Cyclic shift circuit, 304 Edge data storage memory, 305 Selector, 306 Reception data memory, 307 Variable node calculation section, 308 Cyclic shift circuit, 309 Decoded word calculation section, 310 Reception data re-arrangement section, 311 Decoded data re-arrangement section, 401 Bus, 402 CPU, 403 ROM, 404 RAM, 405 Hard disk, 406 Outputting section, 407 Inputting section, 408 Communication section, 409 Drive, 410 Input/output interface, 411 Removable recording medium, 1001 Reverse replacement section, 1002 Memory, 1011 Parity deinterleaver, 1021 LDPC decoding section, 1101 Acquisition section, 1101 Transmission line decoding processing section, 1103 Information source decoding processing section, 1111 Outputting section, 1121 Recording section

BEST MODE FOR CARRYING OUT THE INVENTION

Figure 1:
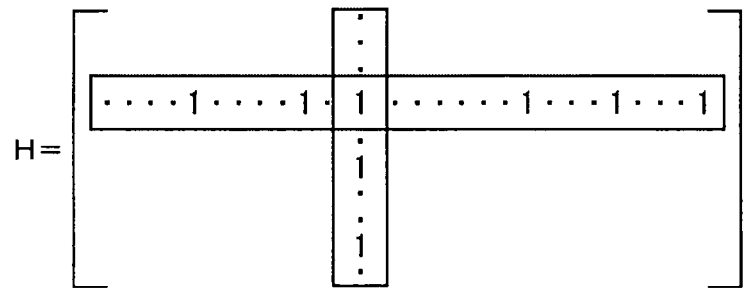
FIG. 1 is a view illustrating a parity check matrix H of an LDPC code.
Figure 2:
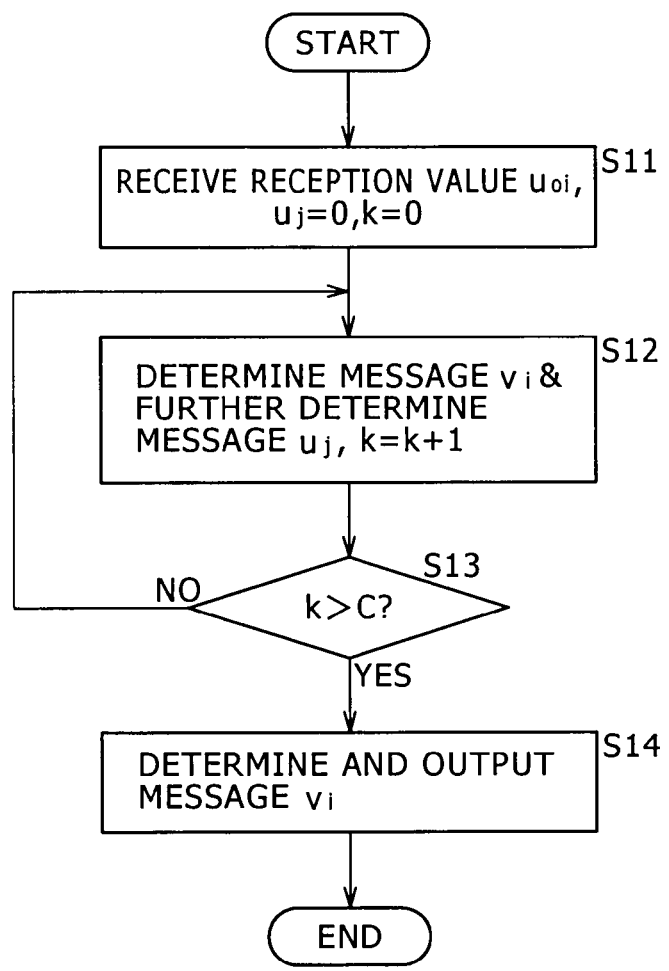
FIG. 2 is a flow chart illustrating a decoding procedure of an LDPC code.
Figure 4:
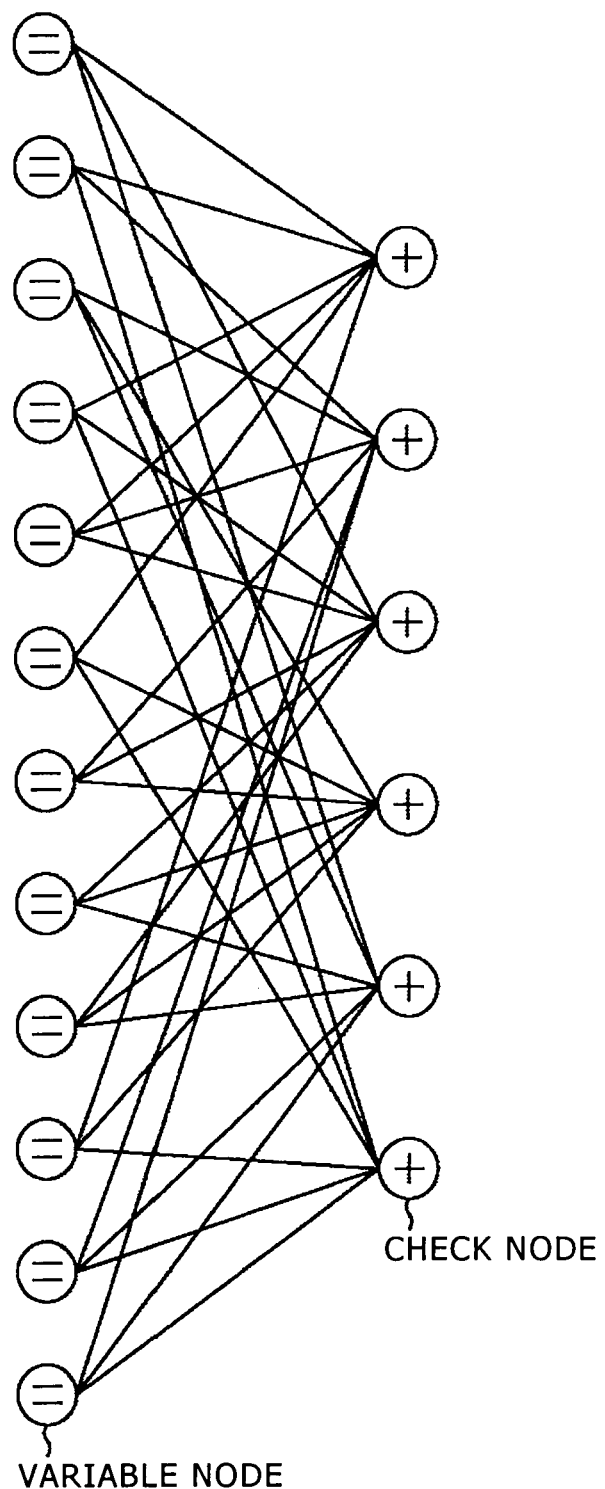
FIG. 4 is a view showing a Tanner graph of a parity check matrix.
Figure 5:
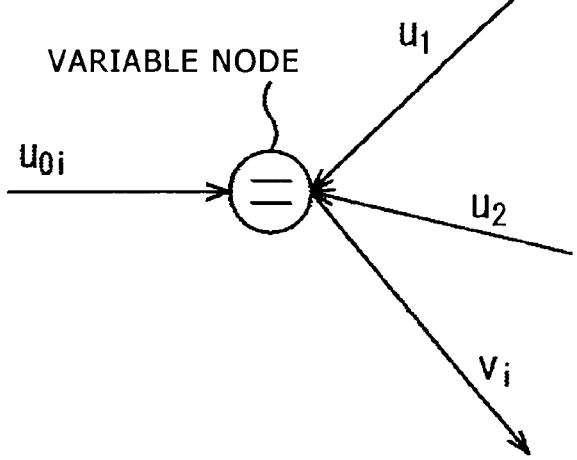
FIG. 5 is a view showing a variable node.
Figure 6:
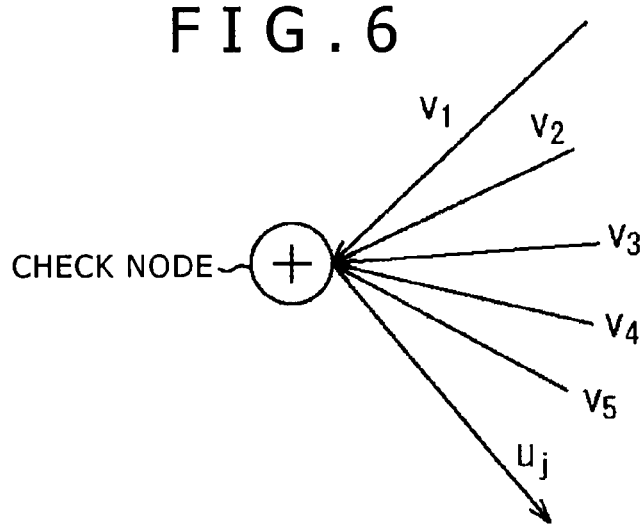
FIG. 6 is a view showing a check node.
Figure 7:
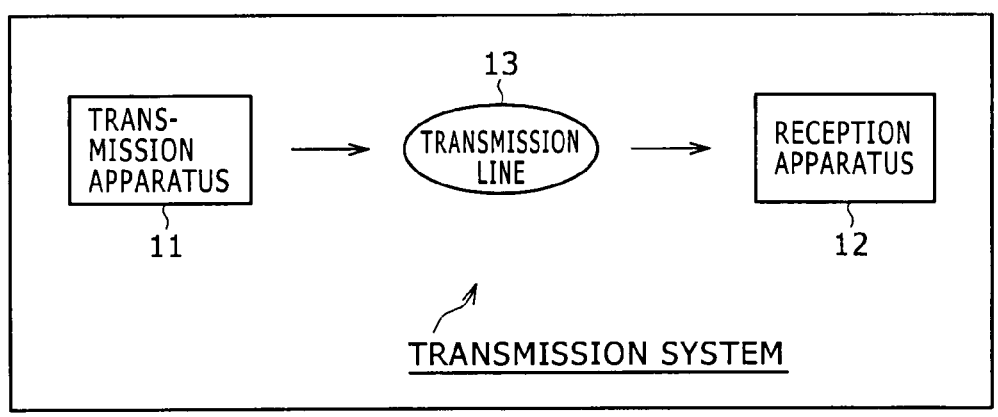
FIG. 7 is a view showing an example of a configuration of an embodiment of a transmission system to which the present invention is applied.

FIG. 7 shows an example of a configuration of an embodiment of a transmission system to which the present invention is applied (the term system signifies a logical aggregate of a plurality of apparatus irrespective of whether or not the individual component apparatus are included in the same housing).

Referring to FIG. 7, the transmission system includes a transmission apparatus 11 and a reception apparatus 12.

The transmission apparatus 11 is, for example, an apparatus which carries out transmission of a television broadcasting program and encodes object data which are an object of transmission such as image data, sound data and so forth as a television broadcasting program into an LDPC code and transmits the resultant data through, for example, a communication path 13 such as a satellite channel, ground waves and CATV (Cable Television) network.

The reception apparatus 12 is, for example, a tuner, a television receiver, a recorder or a STB (Set Top Box) for receiving a television broadcasting program or apparatuses for receiving IPTV (Internet Protocol Television), and receives LDPC codes transmitted thereto from the transmission apparatus 11, decodes the LDPC codes into object data and outputs the object data.

Figure 8:
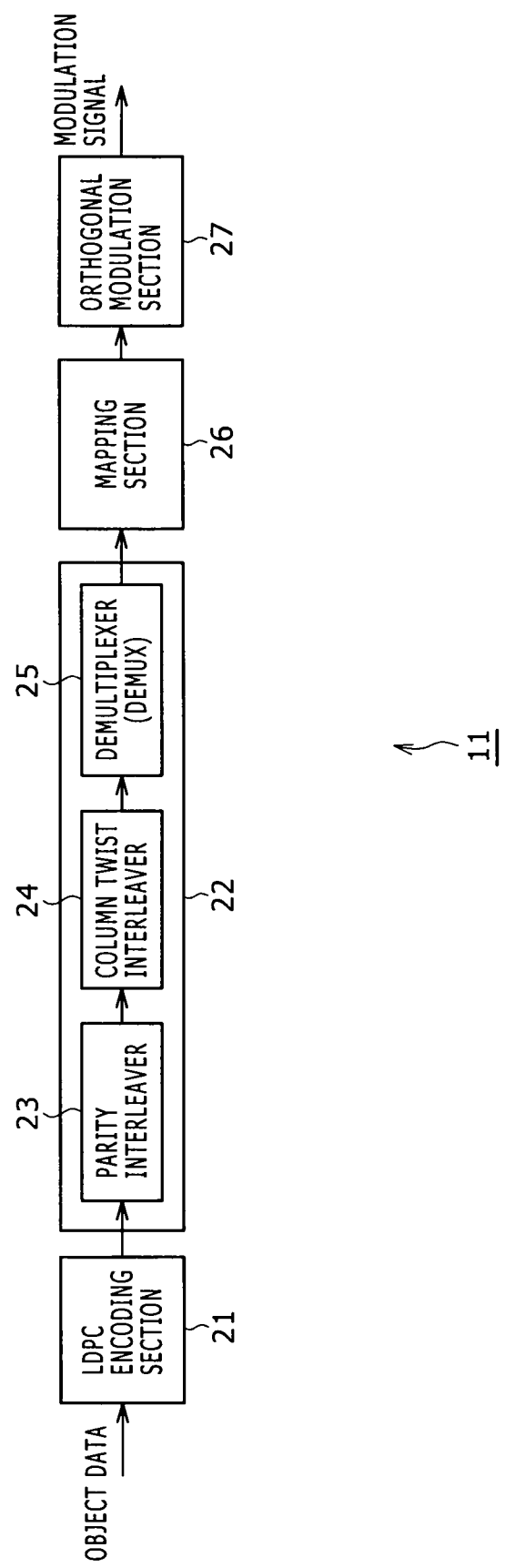
FIG. 8 is a block diagram showing an example of a configuration of a transmission apparatus 11.

FIG. 8 shows an example of a configuration of the transmission apparatus 11 of FIG. 7.

Referring to FIG. 8, the transmission apparatus 11 includes an LDPC encoding section 21, a bit interleaver 22, a mapping section 26 and an orthogonal modulation section 27.

To the LDPC encoding section 21, object data are supplied.

The LDPC encoding section 21 carries out LDPC encoding of the object data supplied thereto in accordance with a parity check matrix in which a parity matrix which is a portion corresponding to parity bits of an LDPC code has a staircase structure and outputs an LDPC code wherein the object data are information bits.

In particular, the LDPC encoding section 21 carries out LDPC encoding of encoding the object data into an LDPC code prescribed, for example, in the DVB-S.2 standards and outputs an LDPC code obtained as a result of the LDPC encoding.

Here, the LDPC code prescribed in the DVB-S.2 standard is an IRA (Irregular Repeat Accumulate) code, and the parity matrix in the parity check matrix of the LDPC code has a staircase structure. The parity matrix and the staircase structure are hereinafter described. Further, the IRA code is described, for example, in "Irregular Repeat-Accumulate Codes," H. Jin., A. Khandekar, and R. J. McEliece, in Proceedings of 2nd International Symposium on Turbo codes and Related Topics, pp. 1-8, September 2000.

The LDPC code outputted from the LDPC encoding section 21 is supplied to the bit interleaver 22.

The bit interleaver 22 is a data processing apparatus for interleaving data and includes a parity interleaver 23, a column twist interleaver 24 and a demultiplexer (DEMUX) 25.

The parity interleaver 23 carries out parity interleave of interleaving parity bits of the LDPC code from the LDPC encoding section 21 to positions of other parity bits and supplies the LDPC code after the parity interleave to the column twist interleaver 24.

The column twist interleaver 24 carries out column twist interleave for the LDPC code from the parity interleaver 23 and supplies the LDPC code after the column twist interleave to the demultiplexer 25.

In particular, the LDPC code is transmitted after two or more code bits thereof are mapped, as one symbol, to signal points of orthogonal modulation in accordance with the one symbol by the mapping section 26 hereinafter described.

The column twist interleaver 24 carries out, for example, such column twist interleave as hereinafter described as a re-arranging process of re-arranging code bits of the LDPC code from the parity interleaver 23 such that a plurality of code bits of the LDPC code corresponding to the value 1 included in one arbitrary row of the parity check matrix used in the LDPC encoding section 21 are not included in one symbol.

The demultiplexer 25 carries out a replacing process of replacing the positions of two or more code bits of the LDPC code (which are to be a symbol) from the column twist interleaver 24 to obtain an LDPC code whose tolerance to AWGN is reinforced. Then, the demultiplexer 25 supplies two or more code bits of an LDPC code obtained by the replacement process as a symbol to the mapping section 26.

The mapping section 26 maps the symbol from the demultiplexer 25 to signal points determined by a modulation method of orthogonal modulation (multi-value modulation) carried out by the orthogonal modulation section 27.

In particular, the mapping section 26 maps the LDPC code from the demultiplexer 25 into a signal point determined by the modulation system, on an IQ plane (IQ constellation) defined by an I axis representative of an I component which is in phase with a carrier and a Q axis representative of a Q component which is orthogonal to the carrier wave.

Here, as the modulation method of orthogonal modulation carried out by the orthogonal modulation section 27, modulation methods including, for example, a modulation method defined in the DVB-T standards, that is, for example, QPSK (Quadrature Phase Shift Keying), 16QAM (Quadrature Amplitude Modulation), 64QAM, 256QAM, 1024QAM, 4096QAM and so forth are available. What modulation method should be used for orthogonal modulation to be carried out by the orthogonal modulation section 27 is set in advance, for example, in accordance with an operation of the transmission apparatus 11 by an operator. It is to be noted that the orthogonal modulation section 27 can carry out some other orthogonal modulation such as, for example, PAM (Pulse Amplitude Modulation) or APSK (Amplitude-Phase-Shift Keying).

The symbol mapped to a signal point by the mapping section 26 is supplied to the orthogonal modulation section 27.

The orthogonal modulation section 27 carries out orthogonal modulation of a carrier in accordance with (the symbol mapped to) the signal point from the mapping section 26 and transmits a modulation signal obtained by the orthogonal modulation.

Figure 9:
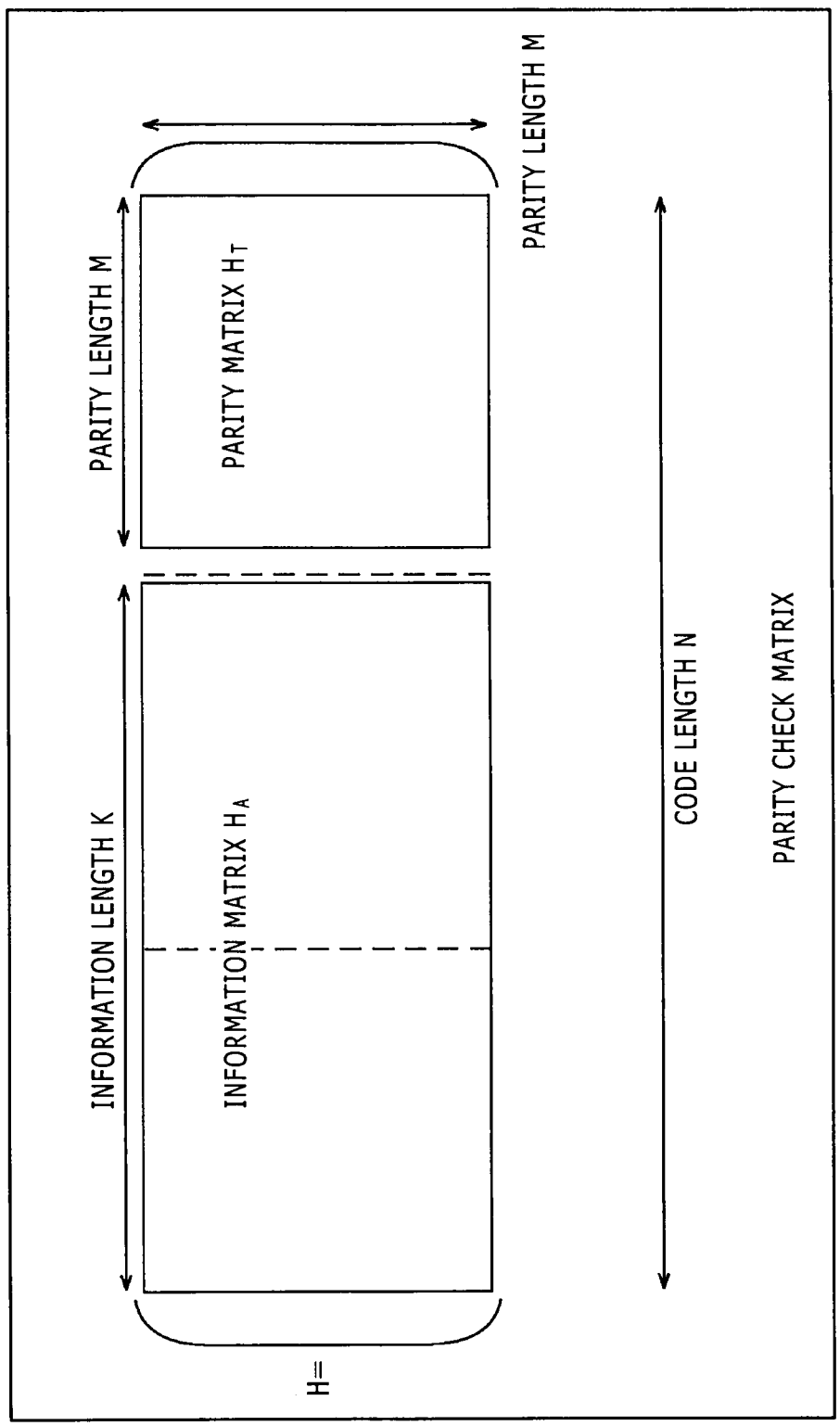
FIG. 9 is a view illustrating a parity check matrix.

Now, FIG. 9 illustrates a parity check matrix H used in LDPC encoding by the LDPC encoding section 21 of FIG. 8.

The parity check matrix H has an LDGM (Low-Density Generation Matrix) structure and can be represented by an expression $H=[H_A|H_T]$ from an information matrix $H_A$ of a portion corresponding to information bits and a parity matrix $H_T$ corresponding to parity bits from among code bits of the LDPC code (matrix in which elements of the information matrix $H_A$ are elements on the left side and elements of the parity matrix $H_T$ are elements on the right side).

Here, the bit number of information bits and the bit number of parity bits from among code bits of one LDPC code (one codeword) are referred to as information length K and parity length M, and the bit number of code bits of one LDPC code is referred to as code length N (=K+M).

The information length K and the parity length M regarding an LDPC code of a certain code length N depend upon the encoding rate. Meanwhile, the parity check matrix H is a matrix whose rows×columns are M×N. Then, the information matrix $H_A$ is an M×K matrix and the parity matrix $H_T$ is an M×M matrix.

FIG. 10 illustrates the parity matrix $H_T$ of the parity check matrix H of an LDPC code prescribed in the DVB-S.2 standard.

The parity matrix $H_T$ of the parity check matrix H of the LDPC code prescribed in the DVB-S.2 standard has a staircase structure wherein elements of the value 1 are arranged like a staircase as seen in FIG. 10. The row weight of the parity matrix $H_T$ is 1 with regard to the first row but is 2 with regard to all of the remaining rows. Meanwhile, the column weight is 1 with regard to the last column but is 2 with regard to all of the remaining columns.

As described above, the LDPC code of the parity check matrix H wherein the parity matrix $H_T$ has a staircase structure can be produced readily using the parity check matrix H.

In particular, an LDPC code (one codeword) is represented by a row vector c and a column vector obtained by transposing the row vector is represented by $C^T$. Further, a portion of information bits from within the row vector c which is an LDPC code is represented by a row vector A and a portion of parity bits is represented by a row vector T.

Here, in this instance, the row vector c can be presented by an expression c=[A|T] from the row vector A as information bits and the row vector T as parity bits (row vector wherein the elements of the row vector A are elements on the left side and the elements of the row vector T are elements on the right side).

It is necessary for the parity check matrix H and the row vector c=[A|T] as the LDPC code to satisfy an expression $Hc^T=0$, and where the parity matrix $H_T$ of the parity check matrix $H=[H_A|H_T]$ has such a staircase structure as shown in FIG. 10, the row vector T as parity bits which forms the row vector c=[A|T] which satisfies the expression $Hc^T=0$ can be determined sequentially by successively setting the elements in the rows beginning with the elements in the first row of the column vector $Hc^T$ in the expression $Hc^T=0$ to zero.

Figure 11:
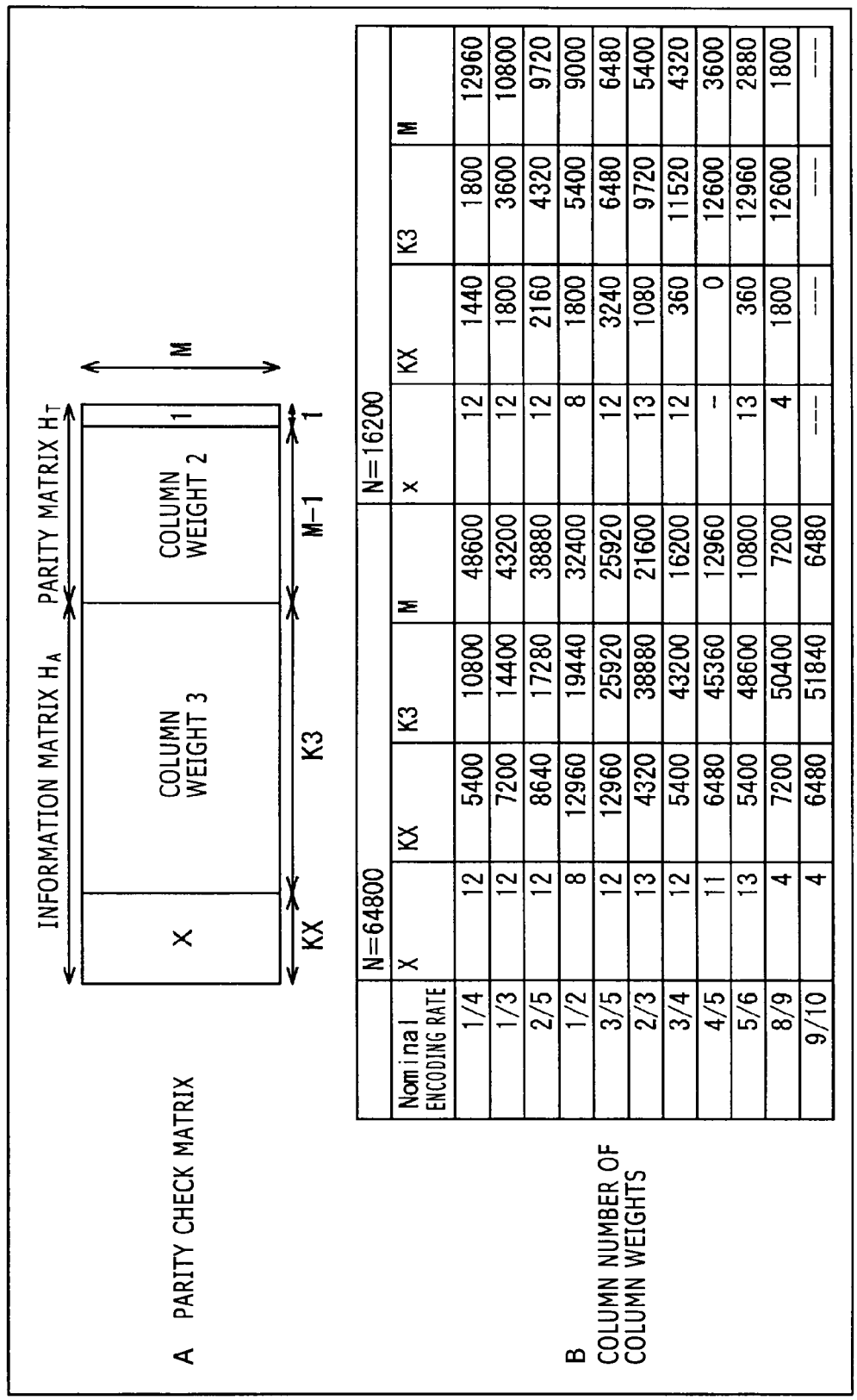
FIG. 11 is a view illustrating a parity check matrix of an LDPC code and column weights prescribed in the DVB-S.2 standard.

FIG. 11 illustrates the parity check matrix H of an LDPC code and column weights defined in the DVB-S.2 standard.

It is to be noted that the same LDPC codes are adopted by DVB-S.2 and DVB-T.2.

A of FIG. 11 illustrates the parity check matrix H of an LDPC code defined in the DVB-S.2 standard.

With regard to KX columns from the first column of the parity check matrix H, the column weight is X; with regard to succeeding K3 columns, the column weight is 3; with regard to succeeding M−1 rows, the column weight is 2; and with regard to the last one column, the column weight is 1.

Here, KX+K3+M−1+1 is equal to the code length N.

In the DVB-S.2 standard, the column numbers KX, K3 and M (parity length) as well as the column weight X are prescribed in such a manner as seen in B of FIG. 11.

In particular, B of FIG. 11 illustrates the column numbers KX, K3 and M as well as the column weight X regarding different encoding rates of LDPC codes prescribed in the DVB-S.2 standard.

In the DVB-S.2 standard, LDPC codes of the code lengths N of 64,800 bits and 16,200 bits are prescribed.

And as seen in B of FIG. 11, for the LDPC code whose code length N is 64,800 bits, 11 encoding rates (nominal rates) 1/4, 1/3, 2/5, 1/2, 3/5, 2/3, 3/4, 4/5, 5/6, 8/9 and 9/10 are prescribed, and for the LDPC code whose code length N is 16,200 bits, 10 encoding rates 1/4, 1/3, 2/5, 1/2, 3/5, 2/3, 3/4, 4/5, 5/6 and 8/9 are prescribed.

Regarding LDPC codes, it is known that code bits corresponding to a column of the parity check matrix H which has a higher column weight exhibits a lower error rate.

The parity check matrix H prescribed in the DVB-S.2 standard and illustrated in FIG. 11 has a tendency that a column nearer to the head side (left side) has a higher column weight. Accordingly, the LDPC code corresponding to the parity check matrix H has a tendency that a code bit nearer to the head is higher in tolerance to an error (has a higher tolerance to an error) and a code bit nearer to the tail is lower in tolerance to an error.

Figure 12:
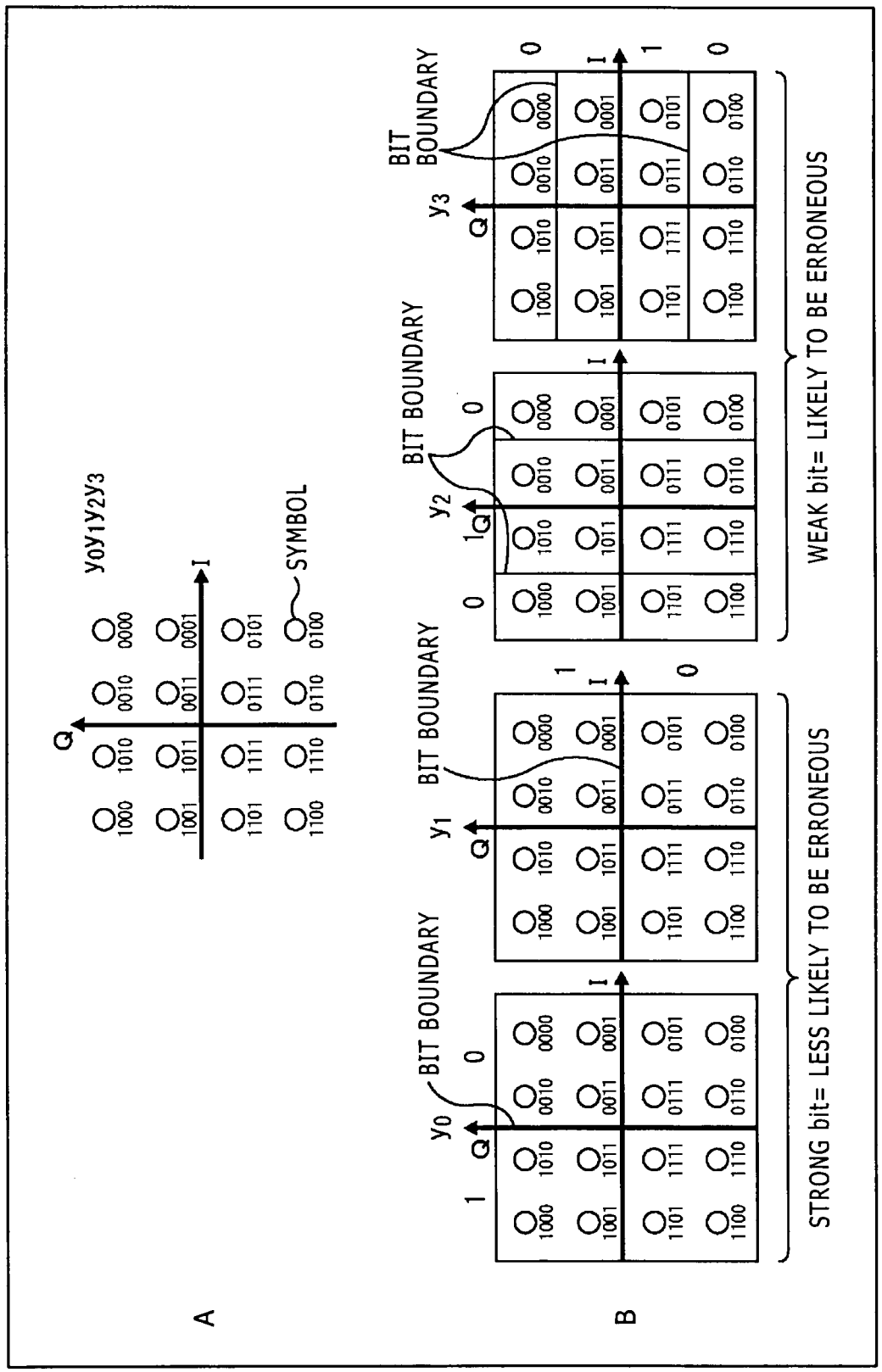
FIG. 12 is a view illustrating a signal point arrangement of 16QAM.

FIG. 12 illustrates an arrangement of (signal points corresponding to) 16 symbols on the IQ plane where 16QAM is carried out by the orthogonal modulation section 27 of FIG. 8.

In particular, A of FIG. 12 illustrates symbols of 16QAM.

In 16QAM, one symbol represents 4 bits, and 16 (=$2^4$) symbols exist. Then, the 16 symbols are disposed such that they form a square shape of 4×4 symbols in the I direction×Q direction centered at the origin of the IQ plane.

Now, if 4 bits represented by one symbol of 16QAM are represented by $y_0$, $y_1$, $y_2$ and $y_3$ in order from the most significant bit, then where the modulation system is the 16QAM, 4 code bits of the LDPC code are mapped to (signal points corresponding to) a symbol of the 4 bits $y_0$ to $y_3$ which coincide with the 4 bits by the mapping section 26 (FIG. 8).

B of FIG. 12 indicates bit boundaries regarding the 4 bits $y_0$ to $y_3$ represented by the symbol of the 16QAM.

Here, a bit boundary regarding a bit $y_i$ (in FIG. 12, i=0, 1, 2, 3) signifies a boundary between a symbol whose bit $y_i$ is 0 and another symbol whose bit $y_i$ is 1.

As seen in B of FIG. 12, as regards the most significant bit $y_0$ from among the 4 bits $y_0$ to $y_3$ represented by the symbol of 16QAM, only one location of the Q axis on the IQ plane makes a bit boundary, and as regards the second bit $y_1$ (second from the most significant bit), only one location of the I axis on the IQ plane makes a bit boundary.

Further, as regards the third bit $y_2$, each of two locations between the first and second columns and between the third and fourth columns from the left of (signal points corresponding to) the 4×4 symbols makes a boundary.

Furthermore, as regards the fourth bit $y_3$, each of two locations between the first and second rows and between the third and fourth rows of the 4×4 symbols makes a boundary.

The bit $y_i$ represented by a symbol is less likely to become erroneous as the number of symbols spaced away from a bit boundary increases but is more likely to become erroneous as the number of symbols positioned nearer to a bit boundary increases.

If a bit which is less likely to become erroneous (is tolerant to an error) is referred to as "strong bit" but a bit which is more likely to become erroneous (is less tolerant to an error) is referred to as "weak bit," then as regards the 4 bits $y_0$ to $y_3$ represented by symbols of 16QAM, the most significant bit $y_0$ and the second bit $y_1$ are strong bits and the third bit $y_2$ and the fourth bit $y_3$ are weak bits.

Figure 13:
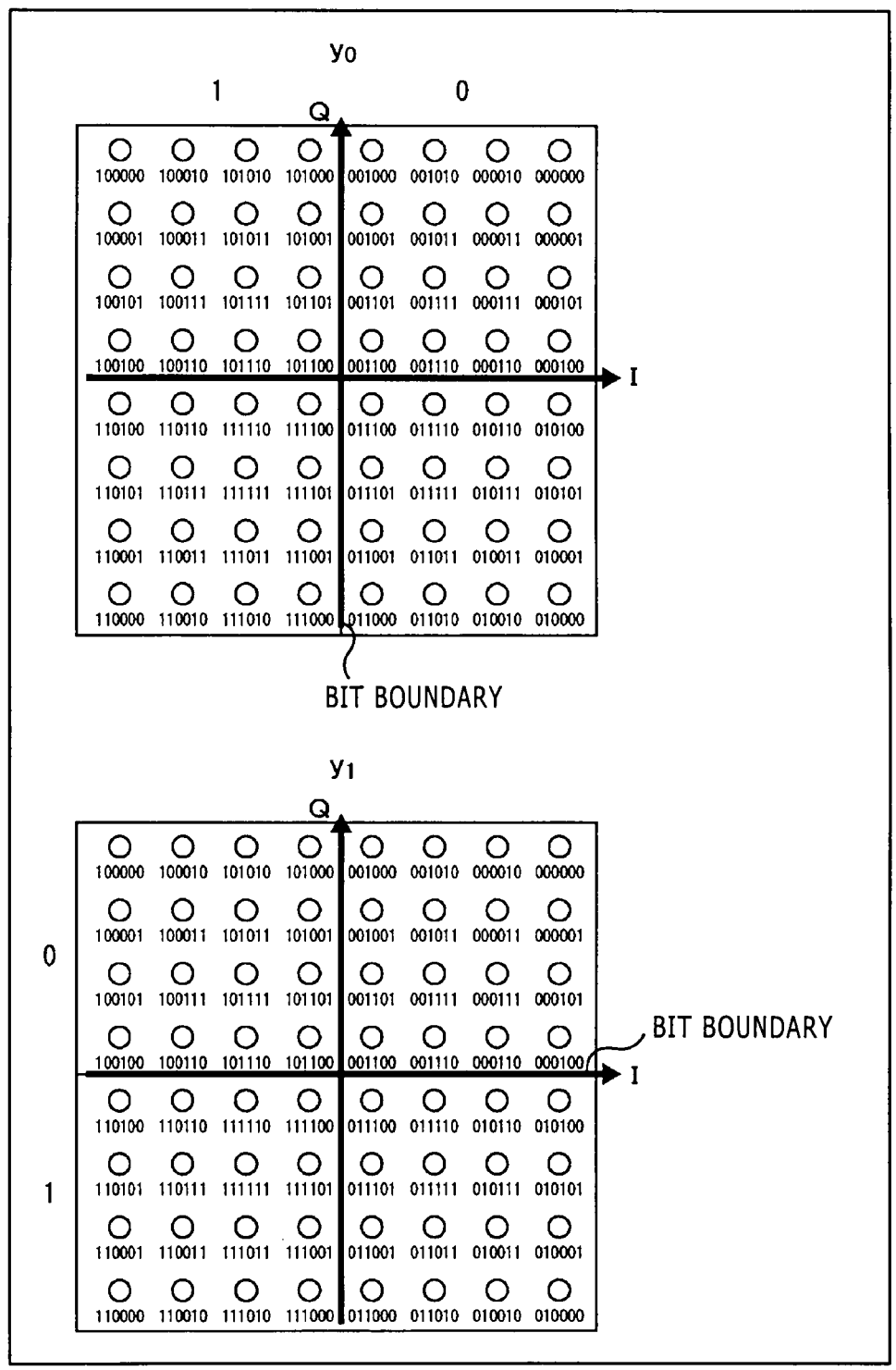
FIG. 13 is a view illustrating a signal point arrangement of 64QAM.
Figure 14:
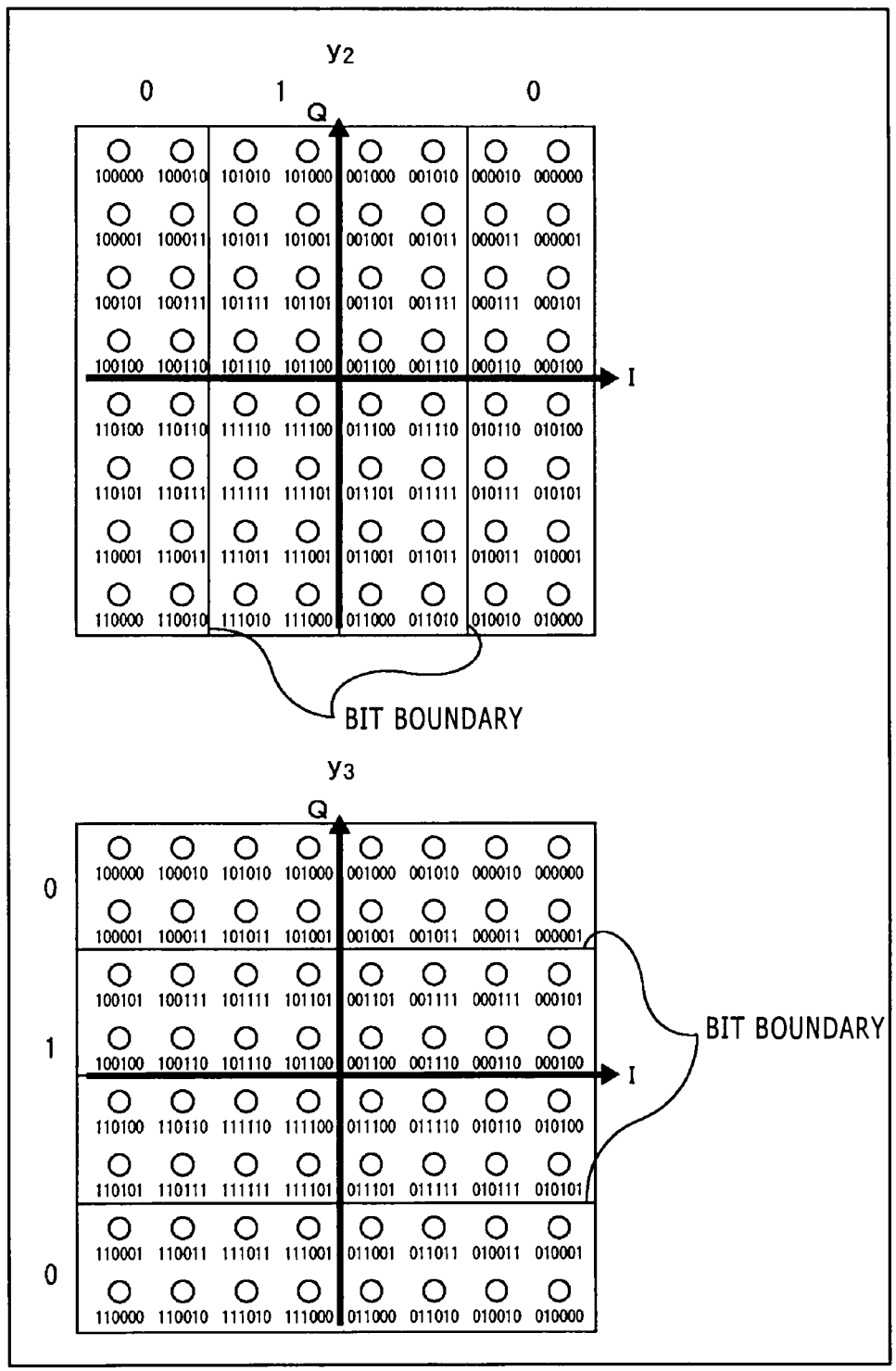
FIG. 14 is a view illustrating a signal point arrangement of 64QAM.
Figure 15:
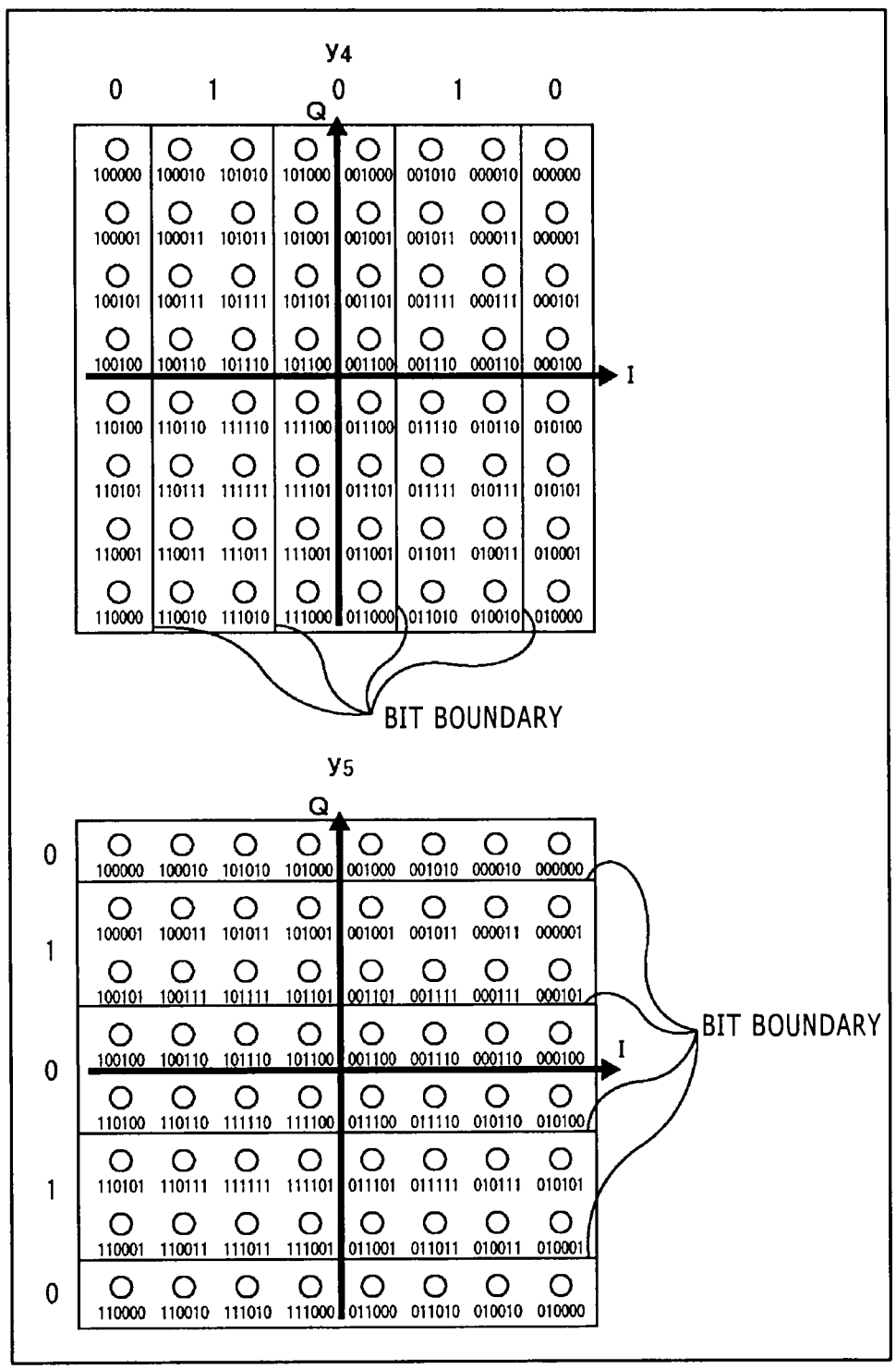
FIG. 15 is a view illustrating a signal point arrangement of 64QAM.

FIGS. 13 to 15 illustrate arrangements of (signal points corresponding to) 64 symbols on the IQ plane where 64QAM is carried out by the orthogonal modulation section 27 of FIG. 8.

In 64QAM, one symbol represents 6 bits, and 64 (=$2^6$) symbols exist. Then, the 64 symbols are arranged such that they make a square of 8×8 symbols in the I direction×Q direction centered at the origin of the IQ plane.

Now, if it is assumed that the 6 bits represented by one symbol of 64QAM are represented as $y_0$, $y_1$, $y_2$, $y_3$, $y_4$ and $y_5$ in order from the most significant bit, then where the modulation system is 64QAM, 6 code bits of the LDPC code are mapped to a symbol of 6 bits $y_0$ to $y_5$ coincident to the 6 bits.

Here, FIG. 13 indicates bit boundaries regarding the most significant bit $y_0$ and the second bit $y_1$ from among the 6 bits $y_0$ to $y_5$ represented by symbols of 64QAM; FIG. 14 indicates bit boundaries regarding the third bit $y_2$ and the fourth bit $y_3$; and FIG. 15 indicates bit boundaries regarding the fifth bit $y_4$ and the sixth bit $y_5$.

As seen in FIG. 13, the number of bit boundaries with regard to each of the most significant bit $y_0$ and the second bit $y_1$ is one. Meanwhile, as seen in FIG. 14, the number of bit boundaries with regard to each of the third bit $y_2$ and the fourth bit $y_3$ is two, and as seen in FIG. 15, the number of bit boundaries with regard to each of the fifth bit $y_4$ and the sixth bit $y_5$ is four.

Accordingly, among the 6 bits $y_0$ to $y_5$ represented by symbols of 64QAM, the most significant bit $y_0$ and the second bit $y_1$ are the strongest bits, and the third bit $y_2$ and the fourth bit $y_3$ are the second strongest bits. Then, the fifth bit $y_4$ and the sixth bit $y_5$ are the weakest bits.

From FIG. 12 and further from FIGS. 13 to 15, it can be seen that, as regards bits of symbols of orthogonal modulation, there is a tendency that a high-order bit is a strong bit and a low-order bit is a weak bit.

Here, as described hereinabove with reference to FIG. 11, an LDPC code outputted from the LDPC encoding section 21 (FIG. 8) includes code bits which are tolerant to errors and code bits which are less tolerant to errors.

Meanwhile, as described hereinabove with reference to FIGS. 12 to 15, bits of symbols of orthogonal modulation carried out by the orthogonal modulation section 27 include strong bits and weak bits.

Accordingly, if allocating a code bit of the LDPC code which is low in tolerance to an error to a weak bit of a symbol of orthogonal modulation is carried, then the tolerance to an error drops as a whole.

Therefore, an interleaver has been proposed which interleaves code bits of an LDPC code such that allocating code bits of the LDPC code which are low in tolerance to an error to strong bits of a symbol of orthogonal modulation is carried out.

The demultiplexer 25 of FIG. 8 carries out processing of the interleaver.

Figure 16:
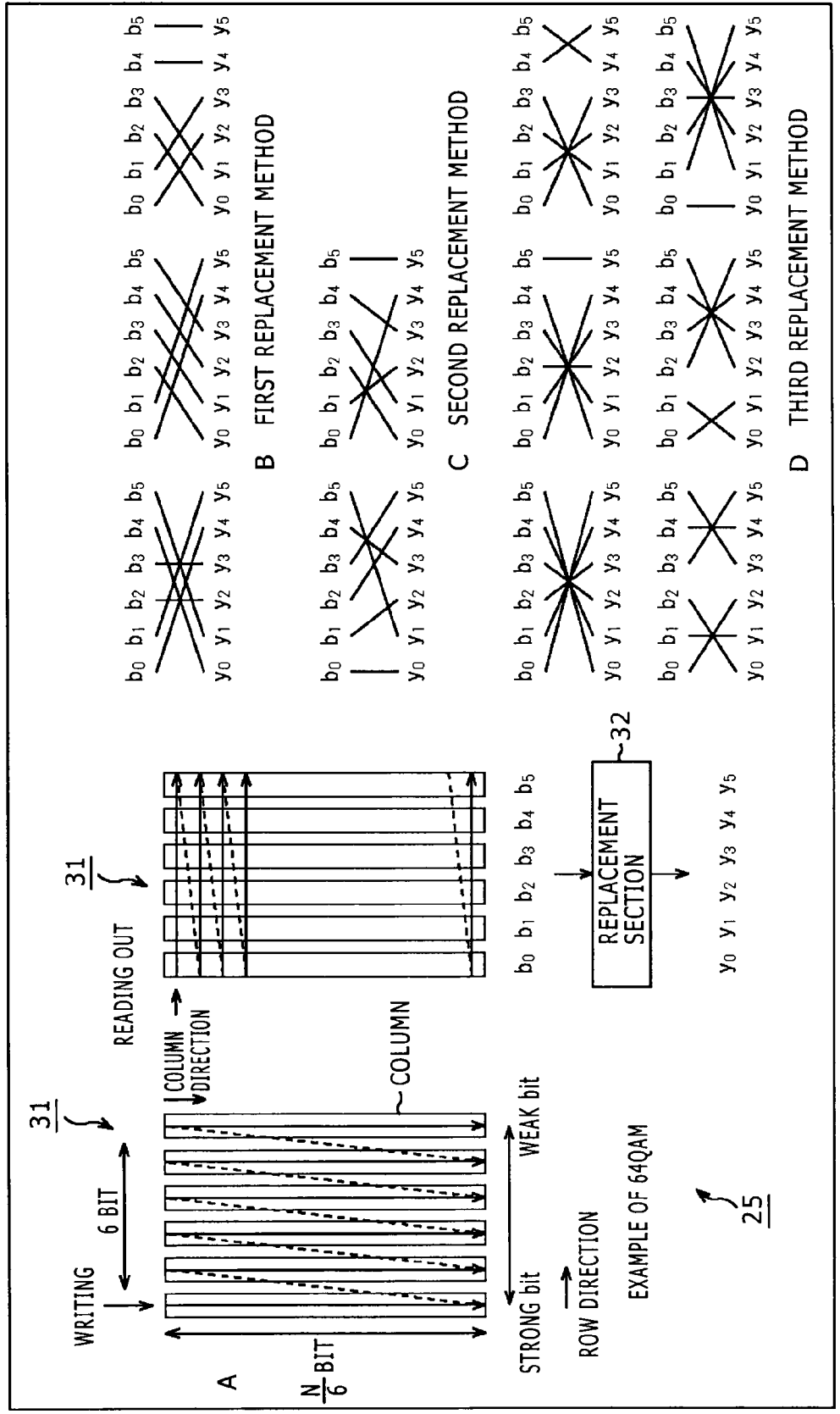
FIG. 16 is a view illustrating processing of a demultiplexer 25.

FIG. 16 is a view illustrating processing of the demultiplexer 25 of FIG. 8.

In particular, A of FIG. 16 shows an example of a functional configuration of the demultiplexer 25.

The demultiplexer 25 includes a memory 31 and a replacement section 32.

To the memory 31, an LDPC code is supplied.

The memory 31 has a storage capacity for storing mb bits in the (horizontal) direction of a row and storing N/(mb) bits in the (vertical) direction of a column. The memory 31 writes code bits of the LDPC code supplied thereto into the column direction and reads out the code bits in the row direction and then supplies the read out code bits to the replacement section 32.

Here, m represents the bit number of code bits of an LDPC code to be one symbol, and b is a predetermined positive integer and is a multiple to be used for multiplying m by the integer. The multiplexer 25 converts (symbolizes) the code bits of the LDPC code into symbols as described above, and the multiple b represents the number of symbols obtained in a way by single time symbolization by the multiplexer 25 (number of symbols obtained from code bits read out by one cycle of reading out in the row direction of the memory 31). Meanwhile, N (=information length K+parity length M) represents the code length of the LDPC code as described hereinabove.

A of FIG. 16 shows an example of a configuration of the demultiplexer 25 where the modulation system is 64QAM, and accordingly, the bit number m of code bits of the LDPC code to be one symbol is 6 bits.

Further, in A of FIG. 16, the multiple b is 1, and accordingly, the memory 31 has a storage capacity of N/(6×1)×(6×1) bits in the column direction×row direction.

Here, a storage region of the memory 31 which extends in the column direction and includes one bit in the row direction is hereinafter referred to suitably as column. In A of FIG. 16, the memory 31 includes six (=6×1) columns.

The demultiplexer 25 carries out writing of the code bits of the LDPC code in a downward direction from above of a column which forms the memory 31 (in a column direction) beginning with a left side column toward a right side column.

Then, if the writing of the code bits for one code length ends with the lowermost bit in the rightmost column (here, it is assumed that N can be divided by mb), then the code bits are read out and supplied to the replacement section 32 in a unit of 6 bits (mb bits) in the row direction beginning with the first row of all of the columns which form the memory 31.

The replacement section 32 carries out a replacement process of replacing the position of code bits of 6 bits from the memory 31 and outputs the 6 bits obtained by the replacement as 6 bits $y_0$, $y_1$, $y_2$, $y_3$, $y_4$ and $y_5$ representative of one symbol of 64QAM.

In particular, if the 6 code bits read out in the row direction from the memory 31 are represented as $b_0$, $b_1$, $b_2$, $b_3$, $b_4$ and $b_5$ in order from the most significant bit, then from a relationship of the column weight described hereinabove with reference to FIG. 11, the code bit positioned in the direction of the bit $b_0$ is a code bit high in tolerance to an error while the code bit in the direction of the bit $b_5$ is a code bit low in tolerance to an error.

The replacement section 32 carries out a replacement process of replacing the position of the 6 code bits $b_0$ to $b_5$ from the memory 31 such that a code bit which is low in tolerance to an error from among the 6 code bits $b_0$ to $b_5$ from the memory 31 may be allocated to a bit which is high in tolerance from among the 6 bits $y_0$ to $y_5$ representative of one symbol of 64QAM.

Here, for a replacement method for replacing the 6 code bits $b_0$ to $b_5$ from the memory 31 so as to be allocated to the 6 bits $y_0$ to $y_5$ representative of one symbol of 64QAM, various systems have been proposed.

B of FIG. 16 illustrates a first replacement method; C of FIG. 16 illustrates a second replacement method; and D of FIG. 16 illustrates a third replacement method.

In B of FIG. 16 to D of FIG. 16 (similarly also in FIG. 17 hereinafter described), a line segment interconnecting the bits $b_i$ and $y_j$ signifies that the code bit $b_i$ is allocated to the bit $y_j$ of the symbol (is replaced into the position of the bit $y_j$).

As the first replacement method, it is proposed to adopt one of three kinds shown in B of FIG. 16, and as the second replacement method, it is proposed to adopt one of two kinds shown in C of FIG. 16.

As the third replacement method, it is proposed to select and use six kinds shown in D of FIG. 16 in order.

Figure 17:
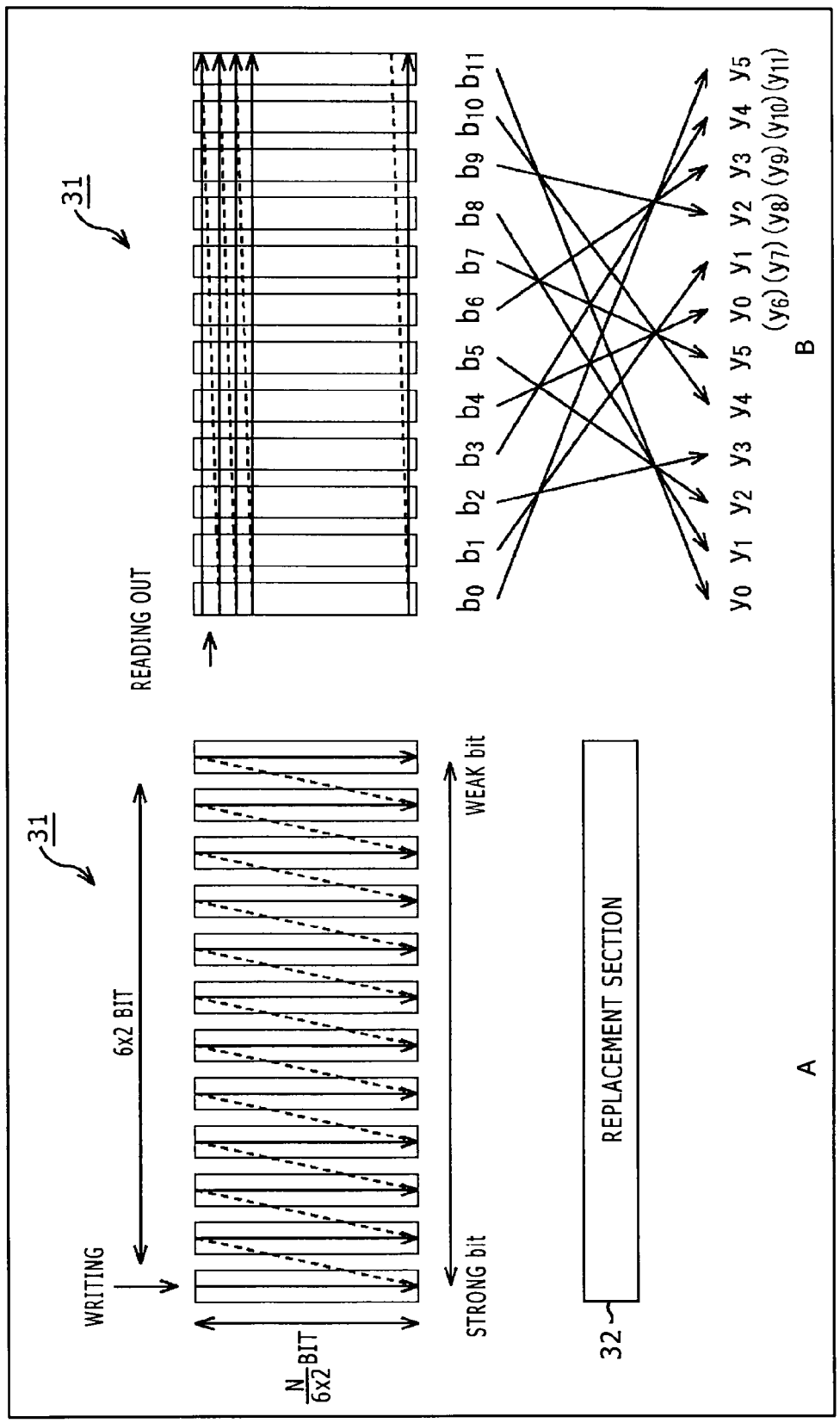
FIG. 17 is a view illustrating processing of the demultiplexer 25.

FIG. 17 illustrates an example of a configuration of the demultiplexer 25 in a case wherein the modulation method is 64QAM (accordingly, the bit number m of code bits of an LDPC code as one symbol is 6 similarly as in FIG. 16) and the multiple b is 2, and a fourth replacement method.

Where the multiple b is 2, the memory 31 has a storage capacity of N/(6×2)×(6×2) bits in the column direction×row direction and includes 12 (=6×2) columns.

A of FIG. 17 illustrates a writing order of an LDPC code into the memory 31.

The demultiplexer 25 carries out writing of code bits of an LDPC code in a downward direction from above of a column which forms the memory 31 (in the column direction) beginning with a left side column toward a right side column as described hereinabove with reference to FIG. 16.

Then, if the writing of code bits ends with the lowermost bit in the rightmost column, then the code bits are read out and supplied to the replacement section 32 in a unit of 12 bits (mb bits) in the row direction beginning with the first row of all of the columns which form the memory 31.

The replacement section 32 carries out a replacement process of replacing the position of 12 code bits from the memory 31 in accordance with the fourth replacement method and outputs the 12 bits obtained by the replacement as 12 bits representative of two symbols (b symbols) of 64QAM, in particular, as 6 bits $y_0$, $y_1$, $y_2$, $y_3$, $y_4$ and $y_5$ representative of one symbol of 64QAM and 6 bits $y_0$, $y_1$, $y_2$, $y_3$, $y_4$ and $y_5$ ($y_6$, $y_7$, $y_8$, $y_9$, $y_{10}$ and $y_{11}$) representative of a next one symbol.

Here, B of FIG. 17 illustrates the fourth replacement method of the replacement process by the replacement section 32 of A of FIG. 17.

It is to be noted that which replacement method is optimum, that is, which replacement method provides the best error rate in an AWGN communication path, differs depends upon the encoding rate of LDPC coded and so forth.

Now, parity interleave by the parity interleaver 23 of FIG. 8 is described with reference to FIGS. 18 to 20.

Figure 18:
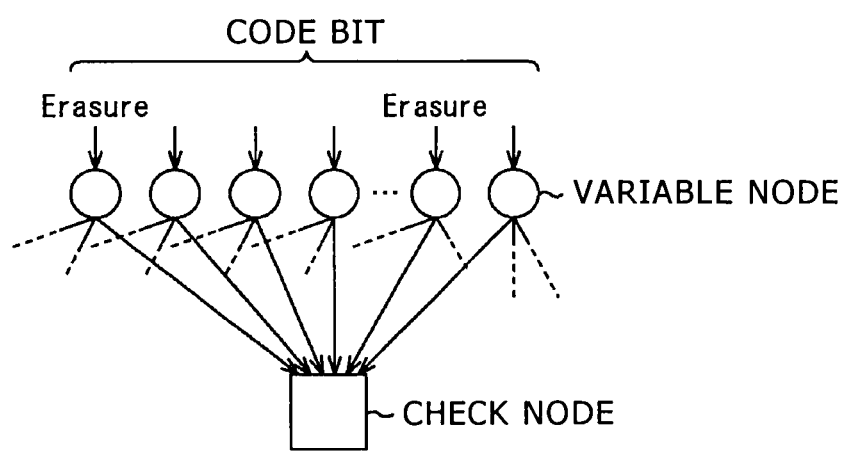
FIG. 18 is a view showing a Tanner graph regarding decoding of an LDPC code.

FIG. 18 shows (part of) a Tanner graph of the parity check matrix of the LDPC code.

If a plurality of (code bits corresponding to) variable nodes connecting to a check node such as two variable nodes suffer from an error such as erasure at the same time as shown in FIG. 18, then the check node returns a message of an equal probability representing that the probability that the value may be 0 and the probability that the value may be 1 are equal to each other to all variable nodes connecting to the check node. Therefore, if a plurality of variable nodes connecting to the same check node are placed into an erasure state or the like at the same time, then the performance in decoding is deteriorated.

Incidentally, an LDPC code outputted from the LDPC encoding section 21 of FIG. 8 and prescribed in the DVB-S.2 standard is an IRA code, and the parity matrix $H_T$ of the parity check matrix H has a staircase structure as shown in FIG. 10.

Figure 19:
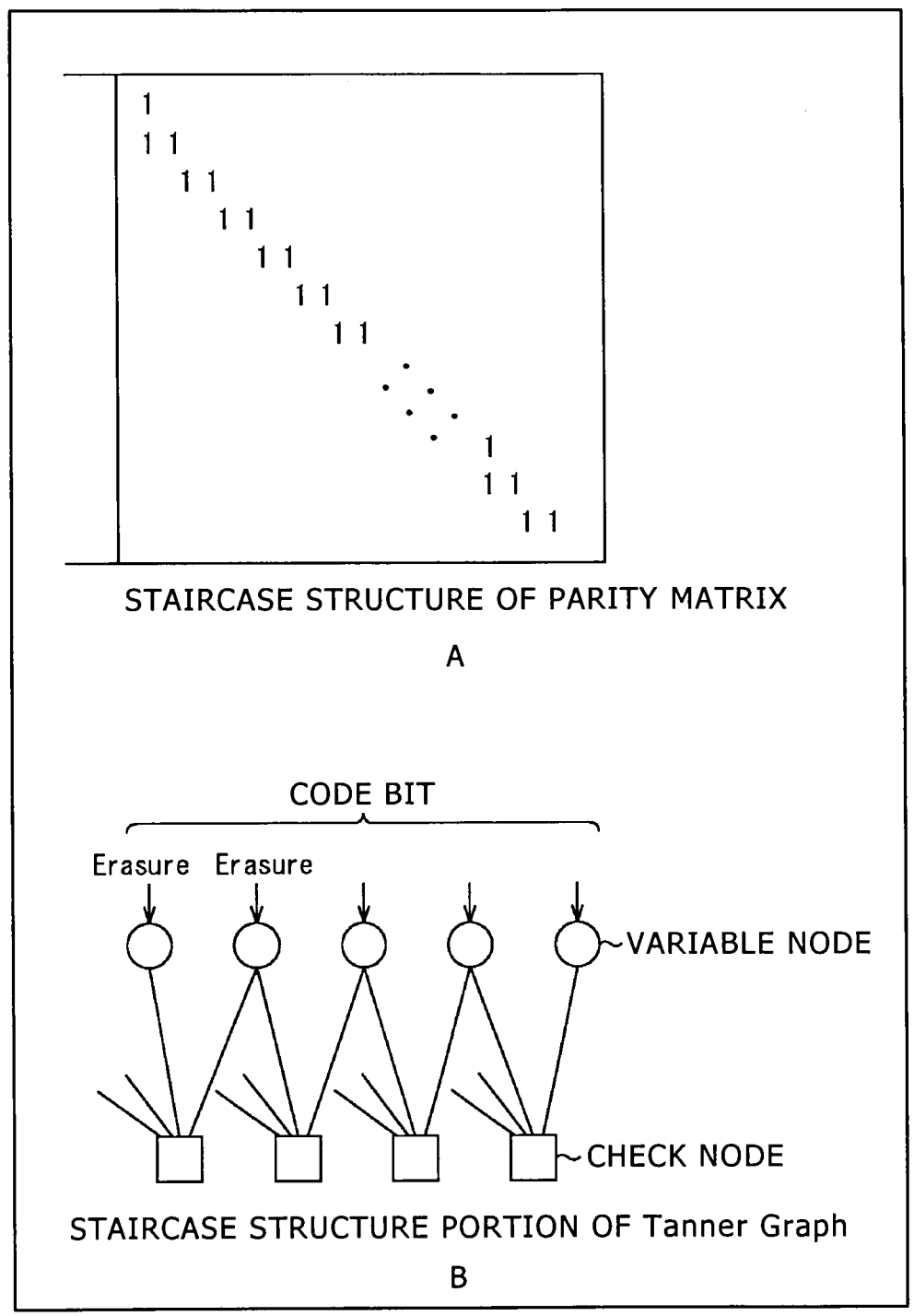
FIG. 19 is a view showing a parity matrix $H_T$ having a staircase structure and a Tanner graph corresponding to the parity matrix $H_T$.

FIG. 19 illustrates a parity matrix $H_T$ having a staircase structure and a Tanner graph corresponding to the parity matrix $H_T$.

In particular, A of FIG. 19 illustrates a parity matrix $H_T$ having a staircase structure and B of FIG. 19 shows a Tanner graph corresponding to the parity matrix $H_T$ of A of FIG. 19.

Where the parity matrix $H_T$ has a staircase structure, in the Tanner graph of the parity matrix $H_T$, adjacent variable nodes of the LDPC code which correspond to a column of an element of the parity matrix $H_T$ having the value of 1 are connected to the same check node.

If the code bits corresponding to the adjacent variable nodes (parity bits) described above are placed into an error state by burst errors, erasure or the like, then since a check node connecting to adjacent variable nodes returns a message of an equal probability representing that the probability that the value may be 0 and the probability that the value is 1 may be equal to each other to the variable nodes connecting to the check node, the performance of the decoding deteriorates. Then, where the burst length (number of bits which are made an error by a burst) is great, the performance of the decoding further deteriorates.

Therefore, in order to prevent the deterioration in performance of decoding described above, the parity interleaver 23 (FIG. 8) carries out interleave of interleaving parity bits of the LDPC code from the LDPC encoding section 21 to positions of other parity bits.

Figure 20:
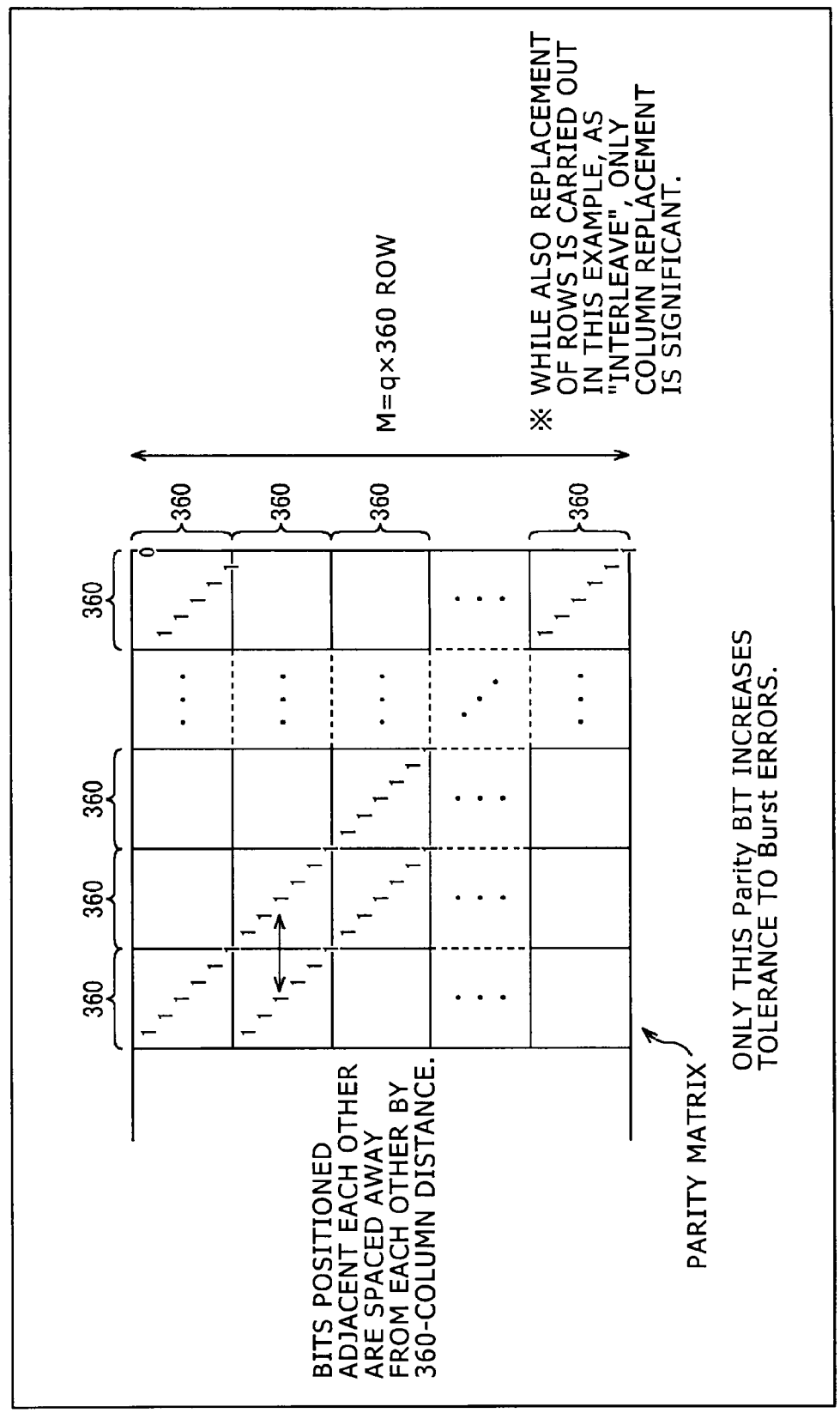
FIG. 20 is a view showing the parity matrix $H_T$ of a parity check matrix H corresponding to the LDPC code after parity interleaving.

FIG. 20 illustrates a parity matrix $H_T$ of a parity check matrix H corresponding to the LDPC code after the parity interleave carried out by the parity interleaver 23 of FIG. 8.

Here, the information matrix $H_A$ of the parity check matrix H corresponding to the LDPC code prescribed in the DVB-S.2 standard and outputted from the LDPC encoding section 21 has a cyclic structure.

The cyclic structure signifies a structure wherein a certain column coincides with another column in a cyclically shifted state and includes, for example, a structure wherein, for every P columns, the positions of the value 1 in the rows of the P columns coincide with positions to which the first one of the P columns is cyclically shifted in the column direction by a value which increases in proportion to a value q obtained by dividing the parity length M. In the following, the number of P columns in a cyclic structure is hereinafter referred to suitably as a unit column number of the cyclic structure.

As an LDPC code prescribed in the DVB-S.2 standard and outputted from the LDPC encoding section 21, two LDPC codes are available including those whose code length N is 64,800 bits and 16,200 bits as described hereinabove with reference to FIG. 11.

Now, if attention is paid to the LDPC code whose code length N is 64,800 bits from the two different LDPC codes whose code length N is 64,800 bits and 16,200 bits, then eleven different encoding rates are available as the encoding rate of the LDPC code whose code length N is 64,800 bits as described hereinabove with reference to FIG. 11.

With regard to LDPC codes whose code length N is 64,800 bits and which have the eleven different encoding rates, it is prescribed in the DVB-S.2 standard that the column number P of the cyclic structure is prescribed to 360 which is one of divisors of the parity length M except 1 and M.

Further, with regard to LDPC codes whose code length N is 64,800 bits and which have the eleven different encoding rates, the parity length M has a value other than prime numbers and represented by an expression $M=q\times P=q\times 360$ using the value q which is different depending upon the encoding rate. Accordingly, also the value q is one of the divisors of the parity length M except 1 and M similarly to the column number P of the cyclic structure and is obtained by dividing the parity length M by the column number P of the cyclic structure (the product of P and q which are divisors of the parity length M is the parity length M).

Where the information length is represented by K and an integer higher than 0 but lower than P is represented by x while an integer higher than 0 but lower than q is represented by y, the parity interleaver 23 interleaves, as parity interleave, the K+qx+y+1th code bit from among parity bits which are K+1th to K+Mth (K+M=N) bits of the LDPC code from the LDPC encoding section 21 to the position of the K+Py+x+1th code bit.

According to such parity interleave, since the (parity bits corresponding to) variable nodes connecting to the same check node are spaced by a distance corresponding to the column number P of the cyclic structure, here, by 360 bits, where the burst length is smaller than 360 bits, such a situation that a plurality of variable nodes connecting to the same check node are rendered erroneous at the same time can be prevented. As a result, the tolerance to a burst error can be improved.

It is to be noted that the LDPC code after the parity interleave by which the K+qx+y+1th code bit is interleaved to the position of the K+Py+x+1th code bit coincides with the LDPC code of a parity check matrix (hereinafter referred to also as conversion parity check matrix) obtained by column replacement of replacing the K+qx+y+1th column of the original parity check matrix H into the K+Py+x+1th column.

Further, in the parity matrix of the conversion parity check matrix, a pseudo cyclic structure whose unit is P columns (in FIG. 20, 360 columns) appears as seen in FIG. 20.

Here, the pseudo cyclic structure signifies a structure which has a portion having a cyclic structure except part thereof. In a conversion parity check column obtained by applying column replacement corresponding to parity interleave to the parity check matrix of the LDPC code prescribed in the DVB-S.2 standard, a portion of 360 rows×360 columns at a right corner portion is short of one element of 1 (which has the value of 0) (which is a shift matrix hereinafter described). Therefore, the conversion parity check matrix does not have a (complete) cyclic structure but has a pseudo cyclic structure.

It is to be noted that the conversion parity check matrix of FIG. 20 is a matrix to which also replacement of rows (row replacement) for configuring the conversion parity check matrix from a configuration matrix hereinafter described is applied to the original parity check matrix H in addition to the column replacement which corresponds to parity interleave.

Now, column twist interleave as a re-arrangement process by the column twist interleaver 24 of FIG. 8 is described with reference to FIGS. 21 to 24.

In the transmission apparatus 11 of FIG. 8, two or more of the code bits of the LDPC code are transmitted as one symbol as described hereinabove in order to improve the utilization efficiency of frequencies. In addition, for example, where 2 bits of the code bits are used to form one symbol, for example, QPSK of $2^2$ signal points is used as the modulation method, but where 4 bits of the code bits are used to form one symbol, for example, 16QAM of $2^4$ signal points is used as the modulation method.

Where two or more ones of the code bits are transmitted as one symbol in this manner, if erasure or the like occurs with a certain symbol, the all of the code bits of the symbol become an error (erasure).

Accordingly, in order to lower the probability that a plurality of (code bits corresponding to) variable nodes connecting to the same check node may suffer from erasure at the same time to improve the performance in decoding, it is necessary to avoid the variable nodes corresponding to code bits of one symbol from connecting to the same check node.

Meanwhile, in the parity check matrix H of an LDPC code prescribed in the DVB-S.2 standard and outputted from the LDPC encoding section 21, the information matrix $H_A$ has a cyclic structure and the parity matrix $H_T$ has a staircase structure as described hereinabove. Then, in a conversion parity check matrix which is a parity check matrix of the LDPC code after parity interleave, a cyclic structure (accurately, a pseudo cyclic structure as described hereinabove) appears also in the parity matrix as described in FIG. 20.

Figure 21:
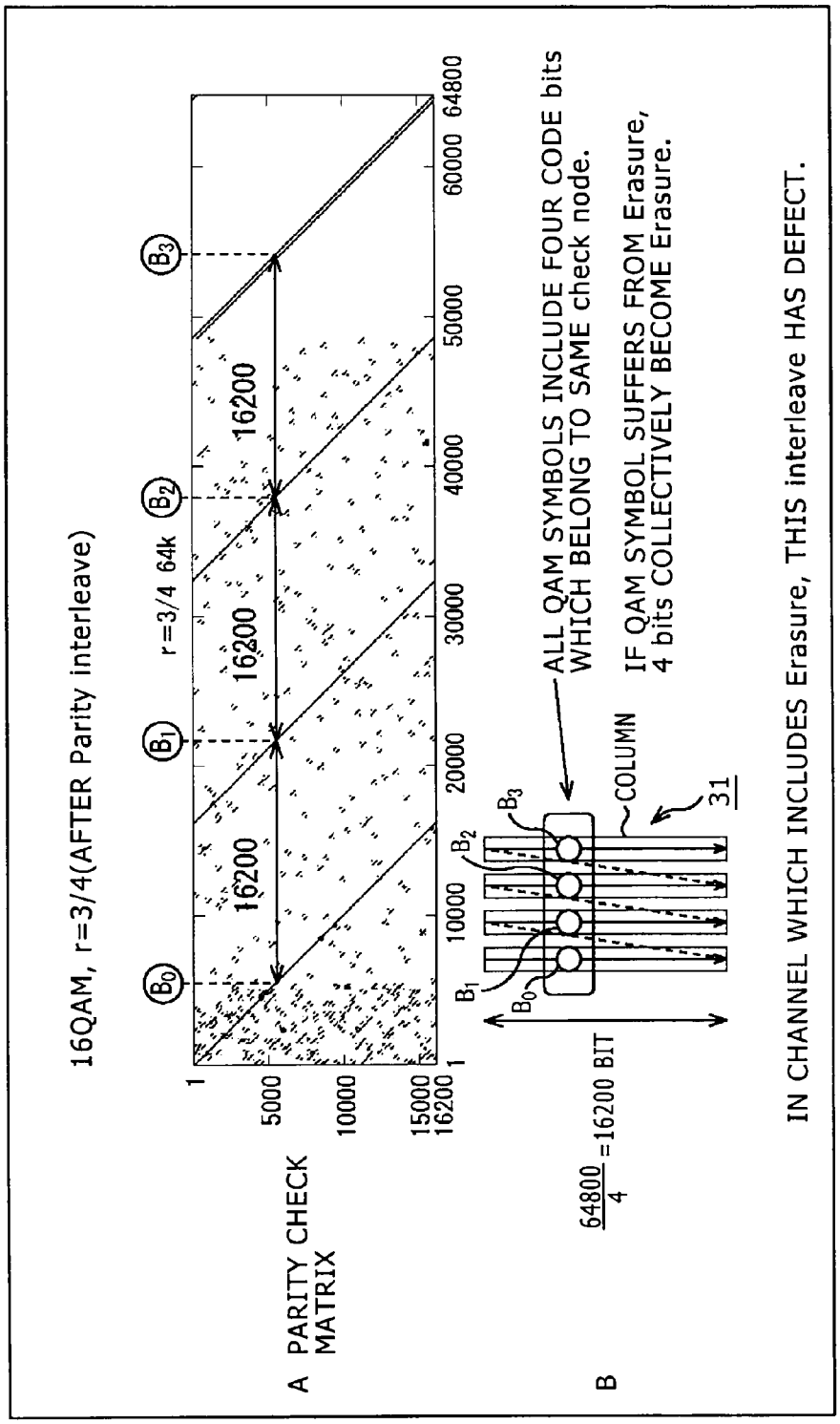
FIG. 21 is a view illustrating a conversion parity check matrix.

FIG. 21 shows a conversion parity check matrix.

In particular, A of FIG. 21 illustrates a conversion parity check matrix of a parity check matrix H which has a code length N of 64,800 bits and an encoding rate (r) of 3/4.

In A of FIG. 21, the position of an element having the value of 1 in the conversion parity check matrix is indicated by a dot (•).

In B of FIG. 21, a process carried out by the demultiplexer 25 (FIG. 8) for the LDPC code of the conversion parity matrix of A of FIG. 21, that is, the LDPC code after the parity interleave.

In B of FIG. 21, the code bits of the LDPC code after the parity interleave are written in the column direction in four columns which form the memory 31 of the demultiplexer 25 using 16QAM of $2^4$ signal points as the modulation method.

The code bits written in the column direction in the four columns which form the memory 31 are read out in the row direction in a unit of 4 bits which make one symbol.

In this instance, the 4 code bits $B_0$, $B_1$, $B_2$ and $B_3$ which make one symbol sometimes make code bits corresponding to 1 and included in one arbitrary row of the parity check matrix after the conversion of A of FIG. 21, and in this instance, variable nodes corresponding to the code bits $B_0$, $B_1$, $B_2$ and $B_3$ are connected to the same check node.

Accordingly, where the 4 code bits $B_0$, $B_1$, $B_2$ and $B_3$ of one symbol become code bits corresponding to 1 and included in one arbitrary row, if erasure occurs with the symbol, then the same check node to which the variable nodes corresponding to the code bits $B_0$, $B_1$, $B_2$ and $B_3$ are connected cannot determine an appropriate message. As a result, the performance in decoding deteriorates.

Also with regard to the encoding rates other than the encoding rate of 3/4 or the modulation method of a number other than $2^4$ signal points, a plurality of code bits corresponding to a plurality of variable nodes connecting to the same check node sometimes make one symbol similarly.

Therefore, the column twist interleaver 24 carries out column twist interleave wherein the code bits of the LDPC code after the parity interleave from the parity interleaver 23 are interleaved such that a plurality of code bits corresponding to 1 and included in one arbitrary row of the conversion parity check matrix are not mapped to one symbol.

Figure 22:
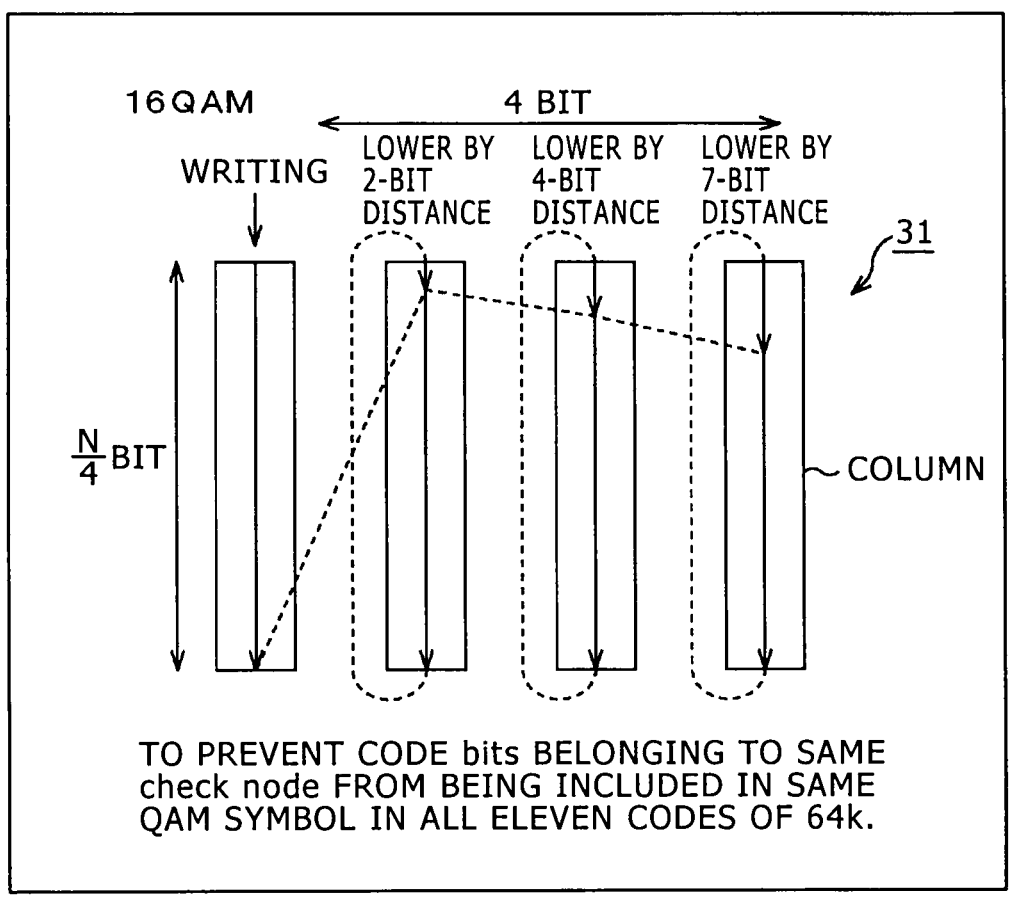
FIG. 22 is a view illustrating processing of a column twist interleaver 24.

FIG. 22 is a view illustrating the column twist interleave.

In particular, FIG. 22 illustrates the memory 31 (FIGS. 16 and 17) of the demultiplexer 25.

The memory 31 has a storage capacity for storing mb bits in the column (vertical) direction and stores N/(mb) bits in the row (horizontal) direction and includes mb columns as described in FIG. 16. Then, the column twist interleaver 24 writes the code bits of the LDPC code in the column direction into the memory 31 and controls the writing starting position when the code bits are read out in the row direction to carry out column twist interleave.

In particular, the column twist interleaver 24 suitably changes the writing starting position at which writing of code bits is to be started for each of a plurality of columns so that a plurality of code bits read out in the row direction and used to make one symbol may not become code bits corresponding to 1 and included in one arbitrary row of the conversion parity check matrix (re-arranges the code bits of the LDPC code such that a plurality of code bits corresponding to 1 and included in one arbitrary row of the parity check matrix may not be included in the same symbol).

Here, FIG. 22 shows an example of a configuration of the memory 31 where the modulation method is 16QAM and besides the multiple b described hereinabove with reference to FIG. 16 is 1. Accordingly, the bit number m of code bits of an LDPC code to be one symbol is 4 bits, and the memory 31 is formed from four (=mb) columns.

The column twist interleaver 24 (instead of the demultiplexer 25 shown in FIG. 16) carries out writing of the code bits of the LDPC code in a downward direction (column direction) from above into the four columns which form the memory 31 beginning with a left side column towards a right side column.

Then, when the writing of code bits ends to the rightmost column, the column twist interleaver 24 reads out the code bits in a unit of 4 bits (mb bits) in the row direction beginning with the first row of all columns which form the memory 31 and outputs the code bits as an LDPC code after the column twist interleave to the replacement section 32 (FIGS. 16 and 17) of the demultiplexer 25.

However, if the address of the head (uppermost) position of each column is represented by 0 and the addresses of the positions in the column direction are represented by integers of an ascending order, then the column twist interleaver 24 sets, for the leftmost column, the writing starting position to the position whose address is 0; sets, for the second column (from the left), the writing starting position to the position whose address is 2; sets, for the third column, the writing starting position to the position whose address is 4; and sets, for the fourth column, the writing starting position to the position whose address is 7.

It is to be noted that, with regard to the columns for which the writing starting position is any other position than the position whose address is 0, after the code bits are written down to the lowermost position, the writing position returns to the top (position whose address is 0) and writing down to a position immediately preceding to the writing starting position is carried out (here, it is assumed that N can be divided by mb). Thereafter, writing into the next (right) column is carried out.

By carrying out such column twist interleave as described above, such a situation that a plurality of code bits corresponding to a plurality of variable nodes connecting to the same check node are made one symbol of 16QAM (included into the same symbol) with regard to LDPC codes of all encoding rates whose code length N is 64,800 as prescribed in the DVB-S.2 standard can be prevented, and as a result, the performance in decoding in a communication path which provides erasure can be improved.

FIG. 23 illustrates the number of columns of the memory 31 necessary for column twist interleave and the address of the writing starting position for each modulation method with regard to LDPC codes of the eleven different encoding rates having the code length N of 64,800 as prescribed in the DVB-S.2 standard.

Where the multiple b is 1 and besides, since, for example, QPSK is adopted as the modulation method, the bit number m of one symbol is 2 bits, according to FIG. 23, the memory 31 has two columns for storing 2×1 (=mb) bits in the row direction and stores 64,800/(2×1) bits in the column direction.

Then, the writing starting position for the first one of the two columns of the memory 31 is set to the position whose address is 0, and the writing starting position for the second column is set to the position whose address is 2.

It is to be noted that the multiple b is 1, for example, where one of the first to third replacement methods of FIG. 16 is adopted as the replacement method of the replacement process of the demultiplexer 25 (FIG. 8) or in a like case.

Where the multiple b is 2 and besides, since, for example, QPSK is adopted as the modulation method, the bit number m of one symbol is 2 bits, according to FIG. 23, the memory 31 has four columns for storing 2×2 bits in the row direction and stores 64,800/(2×2) bits in the column direction.

Then, the writing starting position for the first one of the four columns of the memory 31 is set to the position whose address is 0, the writing starting position for the second column is set to the position whose address is 2, the writing starting position for the third column is set to the position whose address is 4, and the writing starting position for the fourth column is set to the position whose address is 7.

It is to be noted that the multiple b is 2, for example, where fourth replacement method of FIG. 17 is adopted as the replacement method of the replacement process of the demultiplexer 25 (FIG. 8).

Where the multiple b is 1 and besides, since, for example, 16QAM is adopted as the modulation method, the bit number m of one symbol is 4 bits, according to FIG. 23, the memory 31 has four columns for storing 4×1 bits in the row direction and stores 64,800/(4×1) bits in the column direction.

Then, the writing starting position for the first one of the four columns of the memory 31 is set to the position whose address is 0, the writing starting position for the second column is set to the position whose address is 2, the writing starting position for the third column is set to the position whose address is 4, and the writing starting position for the fourth column is set to the position whose address is 7.

Where the multiple b is 2 and besides, since, for example, 16QAM is adopted as the modulation method, the bit number m of one symbol is 4 bits, according to FIG. 23, the memory 31 has eight columns for storing 4×2 bits in the row direction and stores 64,800/(4×2) bits in the column direction.

Then, the writing starting position for the first one of the eight columns of the memory 31 is set to the position whose address is 0, the writing starting position for the second column is set to the position whose address is 0, the writing starting position for the third column is set to the position whose address is 2, the writing starting position for the fourth column is set to the position whose address is 4, the writing starting position for the fifth column is set to the position whose address is 4, the writing starting position for the sixth column is set to the position whose address is 5, the writing starting position for the seventh column is set to the position whose address is 7, and the writing starting position for the eighth column is set to the position whose address is 7.

Where the multiple b is 1 and besides, since, for example, 64QAM is adopted as the modulation method, the bit number m of one symbol is 6 bits, according to FIG. 23, the memory 31 has six columns for storing 6×1 bits in the row direction and stores 64,800/(6×1) bits in the column direction.

Then, the writing starting position for the first one of the six columns of the memory 31 is set to the position whose address is 0, the writing starting position for the second column is set to the position whose address is 2, the writing starting position for the third column is set to the position whose address is 5, the writing starting position for the fourth column is set to the position whose address is 9 the writing starting position for the fifth column is set to the position whose address is 10, and the writing starting position for the sixth column is set to the position whose address is 13.

Where the multiple b is 2 and besides, since, for example, 64QAM is adopted as the modulation method, the bit number m of one symbol is 6 bits, according to FIG. 23, the memory 31 has twelve columns for storing 6×2 bits in the row direction and stores 64,800/(6×2) bits in the column direction.

Then, the writing starting position for the first one of the twelve columns of the memory 31 is set to the position whose address is 0, the writing starting position for the second column is set to the position whose address is 0, the writing starting position for the third column is set to the position whose address is 2, the writing starting position for the fourth column is set to the position whose address is 2, the writing starting position for the fifth column is set to the position whose address is 3, the writing starting position for the sixth column is set to the position whose address is 4, the writing starting position for the seventh column is set to the position whose address is 4, the writing starting position for the eighth column is set to the position whose address is 5, the writing starting position for the ninth column is set to the position whose address is 5, the writing starting position for the tenth column is set to the position whose address is 7, the writing starting position for the eleventh column is set to the position whose address is 8, and the writing starting position for the twelfth column is set to the position whose address is 9.

Where the multiple b is 1 and besides, since, for example, 256QAM is adopted as the modulation method, the bit number m of one symbol is 8 bits, according to FIG. 23, the memory 31 has eight columns for storing 8×1 bits in the row direction and stores 64,800/(8×1) bits in the column direction.

Then, the writing starting position for the first one of the eight columns of the memory 31 is set to the position whose address is 0, the writing starting position for the second column is set to the position whose address is 0, the writing starting position for the third column is set to the position whose address is 2, the writing starting position for the fourth column is set to the position whose address is 4, the writing starting position for the fifth column is set to the position whose address is 4, the writing starting position for the sixth column is set to the position whose address is 5, the writing starting position for the seventh column is set to the position whose address is 7, and the writing starting position for the eighth column is set to the position whose address is 7.

Where the multiple b is 2 and besides, since, for example, 256QAM is adopted as the modulation method, the bit number m of one symbol is 8 bits, according to FIG. 23, the memory 31 has sixteenth columns for storing 8×2 bits in the row direction and stores 64,800/(8×2) bits in the column direction.

Then, the writing starting position for the first one of the sixteen columns of the memory 31 is set to the position whose address is 0, the writing starting position for the second column is set to the position whose address is 2, the writing starting position for the third column is set to the position whose address is 2, the writing starting position for the fourth column is set to the position whose address is 2, the writing starting position for the fifth column is set to the position whose address is 2, the writing starting position for the sixth column is set to the position whose address is 3, the writing starting position for the seventh column is set to the position whose address is 7, the writing starting position for the eighth column is set to the position whose address is 15, the writing starting position for the ninth column is set to the position whose address is 16, the writing starting position for the tenth column is set to the position whose address is 20, the writing starting position for the eleventh column is set to the position whose address is 22, the writing starting position for the twelfth column is set to the position whose address is 22, the writing starting position for the thirteenth column is set to the position whose address is 27, the writing starting position for the fourteenth column is set to the position whose address is 27, the writing starting position for the fifteenth column is set to the position whose address is 28, and the writing starting position for the sixteenth column is set to the position whose address is 32.

Where the multiple b is 1 and besides, since, for example, 1024QAM is adopted as the modulation method, the bit number m of one symbol is 10 bits, according to FIG. 23, the memory 31 has ten columns for storing 10×1 bits in the row direction and stores 64,800/(10×1) bits in the column direction.

Then, the writing starting position for the first one of the ten columns of the memory 31 is set to the position whose address is 0, the writing starting position for the second column is set to the position whose address is 3, the writing starting position for the third column is set to the position whose address is 6, the writing starting position for the fourth column is set to the position whose address is 8, the writing starting position for the fifth column is set to the position whose address is 11, the writing starting position for the sixth column is set to the position whose address is 13, the writing starting position for the seventh column is set to the position whose address is 15, the writing starting position for the eighth column is set to the position whose address is 17, the writing starting position for the ninth column is set to the position whose address is 18, and the writing starting position for the tenth column is set to the position whose address is 20.

Where the multiple b is 2 and besides, since, for example, 1024QAM is adopted as the modulation method, the bit number m of one symbol is 10 bits, according to FIG. 23, the memory 31 has twenty columns for storing 10×2 bits in the row direction and stores 64,800/(10×2) bits in the column direction.

Then, the writing starting position for the first one of the twenty columns of the memory 31 is set to the position whose address is 0, the writing starting position for the second column is set to the position whose address is 1, the writing starting position for the third column is set to the position whose address is 3, the writing starting position for the fourth column is set to the position whose address is 4, the writing starting position for the fifth column is set to the position whose address is 5, the writing starting position for the sixth column is set to the position whose address is 6, the writing starting position for the seventh column is set to the position whose address is 6, the writing starting position for the eighth column is set to the position whose address is 9, the writing starting position for the ninth column is set to the position whose address is 13, the writing starting position for the tenth column is set to the position whose address is 14, the writing starting position for the eleventh column is set to the position whose address is 14, the writing starting position for the twelfth column is set to the position whose address is 16, the writing starting position for the thirteenth column is set to the position whose address is 21, the writing starting position for the fourteenth column is set to the position whose address is 21, the writing starting position for the fifteenth column is set to the position whose address is 23, the writing starting position for the sixteenth column is set to the position whose address is 25, the writing starting position for the seventeenth column is set to the position whose address is 25, the writing starting position for the eighteenth column is set to the position whose address is 26, the writing starting position for the nineteenth column is set to the position whose address is 28, and the writing starting position for the twentieth column is set to the position whose address is 30.

Where the multiple b is 1 and besides, since, for example, 4096QAM is adopted as the modulation method, the bit number m of one symbol is 12 bits, according to FIG. 23, the memory 31 has twelve columns for storing 12×1 bits in the row direction and stores 64,800/(12×1) bits in the column direction.

Then, the writing starting position for the first one of the twelve columns of the memory 31 is set to the position whose address is 0, the writing starting position for the second column is set to the position whose address is 0, the writing starting position for the third column is set to the position whose address is 2, the writing starting position for the fourth column is set to the position whose address is 2, the writing starting position for the fifth column is set to the position whose address is 3, the writing starting position for the sixth column is set to the position whose address is 4, the writing starting position for the seventh column is set to the position whose address is 4, the writing starting position for the eighth column is set to the position whose address is 5, the writing starting position for the ninth column is set to the position whose address is 5, the writing starting position for the tenth column is set to the position whose address is 7, the writing starting position for the eleventh column is set to the position whose address is 8, and the writing starting position for the twelfth column is set to the position whose address is 9.

Where the multiple b is 2 and besides, since, for example, 4096QAM is adopted as the modulation method, the bit number m of one symbol is 12 bits, according to FIG. 23, the memory 31 has twenty-four columns for storing 12×2 bits in the row direction and stores 64,800/(12×2) bits in the column direction.

Then, the writing starting position for the first one of the twenty-four columns of the memory 31 is set to the position whose address is 0, the writing starting position for the second column is set to the position whose address is 5, the writing starting position for the third column is set to the position whose address is 8, the writing starting position for the fourth column is set to the position whose address is 8, the writing starting position for the fifth column is set to the position whose address is 8, the writing starting position for the sixth column is set to the position whose address is 8, the writing starting position for the seventh column is set to the position whose address is 10, the writing starting position for the eighth column is set to the position whose address is 10, the writing starting position for the ninth column is set to the position whose address is 10, the writing starting position for the tenth column is set to the position whose address is 12, the writing starting position for the eleventh column is set to the position whose address is 13, the writing starting position for the twelfth column is set to the position whose address is 16, the writing starting position for the thirteenth column is set to the position whose address is 17, the writing starting position for the fourteenth column is set to the position whose address is 19, the writing starting position for the fifteenth column is set to the position whose address is 21, the writing starting position for the sixteenth column is set to the position whose address is 22, the writing starting position for the seventeenth column is set to the position whose address is 23, the writing starting position for the eighteenth column is set to the position whose address is 26, the writing starting position for the nineteenth column is set to the position whose address is 37, the writing starting position for the twentieth column is set to the position whose address is 39, the writing starting position for the twenty-first column is set to the position whose address is 40, the writing starting position for the twenty-second column is set to the position whose address is 41, the writing starting position for the twenty-third column is set to the position whose address is 41, and the writing starting position for the twenty-fourth column is set to the position whose address is 41.

FIG. 24 indicates the number of columns of the memory 31 necessary for column twist interleave and the address of the writing starting position for each modulation method with regard to the LDPC codes of the 10 different encoding rates having the code length N of 16,200 as prescribed in the DVB-S.2 standard.

Where the multiple b is 1 and besides, since, for example, QPSK is adopted as the modulation method, the bit number m of one symbol is 2 bits, according to FIG. 24, the memory 31 has two columns for storing 2×1 bits in the row direction and stores 16,200/(2×1) bits in the column direction.

Then, the writing starting position for the first one of the two columns of the memory 31 is set to the position whose address is 0, and the writing starting position for the second column is set to the position whose address is 0.

Where the multiple b is 2 and besides, since, for example, QPSK is adopted as the modulation method, the bit number m of one symbol is 2 bits, according to FIG. 24, the memory 31 has four columns for storing 2×2 bits in the row direction and stores 16,200/(2×2) bits in the column direction.

Then, the writing starting position for the first one of the four columns of the memory 31 is set to the position whose address is 0, the writing starting position for the second column is set to the position whose address is 2, the writing starting position for the third column is set to the position whose address is 3, and the writing starting position for the fourth column is set to the position whose address is 3.

Where the multiple b is 1 and besides, since, for example, 16QAM is adopted as the modulation method, the bit number m of one symbol is 4 bits, according to FIG. 24, the memory 31 has four columns for storing 4×1 bits in the row direction and stores 16,200/(4×1) bits in the column direction.

Then, the writing starting position for the first one of the four columns of the memory 31 is set to the position whose address is 0, the writing starting position for the second column is set to the position whose address is 2, the writing starting position for the third column is set to the position whose address is 3, and the writing starting position for the fourth column is set to the position whose address is 3.

Where the multiple b is 2 and besides, since, for example, 16QAM is adopted as the modulation method, the bit number m of one symbol is 4 bits, according to FIG. 24, the memory 31 has eight columns for storing 4×2 bits in the row direction and stores 16,200/(4×2) bits in the column direction.

Then, the writing starting position for the first one of the eight columns of the memory 31 is set to the position whose address is 0, the writing starting position for the second column is set to the position whose address is 0, the writing starting position for the third column is set to the position whose address is 0, the writing starting position for the fourth column is set to the position whose address is 1, the writing starting position for the fifth column is set to the position whose address is 7, the writing starting position for the sixth column is set to the position whose address is 20, the writing starting position for the seventh column is set to the position whose address is 20, and the writing starting position for the eighth column is set to the position whose address is 21.

Where the multiple b is 1 and besides, since, for example, 64QAM is adopted as the modulation method, the bit number m of one symbol is 6 bits, according to FIG. 24, the memory 31 has six columns for storing 6×1 bits in the row direction and stores 16,200/(6×1) bits in the column direction.

Then, the writing starting position for the first one of the six columns of the memory 31 is set to the position whose address is 0, the writing starting position for the second column is set to the position whose address is 0, the writing starting position for the third column is set to the position whose address is 2, the writing starting position for the fourth column is set to the position whose address is 3 the writing starting position for the fifth column is set to the position whose address is 7, and the writing starting position for the sixth column is set to the position whose address is 7.

Where the multiple b is 2 and besides, since, for example, 64QAM is adopted as the modulation method, the bit number m of one symbol is 6 bits, according to FIG. 24, the memory 31 has twelve columns for storing 6×2 bits in the row direction and stores 16,200/(6×2) bits in the column direction.

Then, the writing starting position for the first one of the twelve columns of the memory 31 is set to the position whose address is 0, the writing starting position for the second column is set to the position whose address is 0, the writing starting position for the third column is set to the position whose address is 0, the writing starting position for the fourth column is set to the position whose address is 2, the writing starting position for the fifth column is set to the position whose address is 2, the writing starting position for the sixth column is set to the position whose address is 2, the writing starting position for the seventh column is set to the position whose address is 3, the writing starting position for the eighth column is set to the position whose address is 3, the writing starting position for the ninth column is set to the position whose address is 3, the writing starting position for the tenth column is set to the position whose address is 6, the writing starting position for the eleventh column is set to the position whose address is 7, and the writing starting position for the twelfth column is set to the position whose address is 7.

Where the multiple b is 1 and besides, since, for example, 256QAM is adopted as the modulation method, the bit number m of one symbol is 8 bits, according to FIG. 24, the memory 31 has eight columns for storing 8×1 bits in the row direction and stores 16,200/(8×1) bits in the column direction.

Then, the writing starting position for the first one of the eight columns of the memory 31 is set to the position whose address is 0, the writing starting position for the second column is set to the position whose address is 0, the writing starting position for the third column is set to the position whose address is 0, the writing starting position for the fourth column is set to the position whose address is 1, the writing starting position for the fifth column is set to the position whose address is 7, the writing starting position for the sixth column is set to the position whose address is 20, the writing starting position for the seventh column is set to the position whose address is 20, and the writing starting position for the eighth column is set to the position whose address is 21.

Where the multiple b is 1 and besides, since, for example, 1024QAM is adopted as the modulation method, the bit number m of one symbol is 10 bits, according to FIG. 24, the memory 31 has ten columns for storing 10×1 bits in the row direction and stores 16,200/(10×1) bits in the column direction.

Then, the writing starting position for the first one of the ten columns of the memory 31 is set to the position whose address is 0, the writing starting position for the second column is set to the position whose address is 1, the writing starting position for the third column is set to the position whose address is 2, the writing starting position for the fourth column is set to the position whose address is 2, the writing starting position for the fifth column is set to the position whose address is 3, the writing starting position for the sixth column is set to the position whose address is 3, the writing starting position for the seventh column is set to the position whose address is 4, the writing starting position for the eighth column is set to the position whose address is 4, the writing starting position for the ninth column is set to the position whose address is 5, and the writing starting position for the tenth column is set to the position whose address is 7.

Where the multiple b is 2 and besides, since, for example, 1024QAM is adopted as the modulation method, the bit number m of one symbol is 10 bits, according to FIG. 24, the memory 31 has twenty columns for storing 10×2 bits in the row direction and stores 16,200/(10×2) bits in the column direction.

Then, the writing starting position for the first one of the twenty columns of the memory 31 is set to the position whose address is 0, the writing starting position for the second column is set to the position whose address is 0, the writing starting position for the third column is set to the position whose address is 0, the writing starting position for the fourth column is set to the position whose address is 2, the writing starting position for the fifth column is set to the position whose address is 2, the writing starting position for the sixth column is set to the position whose address is 2, the writing starting position for the seventh column is set to the position whose address is 2, the writing starting position for the eighth column is set to the position whose address is 2, the writing starting position for the ninth column is set to the position whose address is 5, the writing starting position for the tenth column is set to the position whose address is 5, the writing starting position for the eleventh column is set to the position whose address is 5, the writing starting position for the twelfth column is set to the position whose address is 5, the writing starting position for the thirteenth column is set to the position whose address is 5, the writing starting position for the fourteenth column is set to the position whose address is 7, the writing starting position for the fifteenth column is set to the position whose address is 7, the writing starting position for the sixteenth column is set to the position whose address is 7, the writing starting position for the seventeenth column is set to the position whose address is 7, the writing starting position for the eighteenth column is set to the position whose address is 8, the writing starting position for the nineteenth column is set to the position whose address is 8, and the writing starting position for the twentieth column is set to the position whose address is 10.

Where the multiple b is 1 and besides, since, for example, 4096QAM is adopted as the modulation method, the bit number m of one symbol is 12 bits, according to FIG. 24, the memory 31 has twelve columns for storing 12×1 bits in the row direction and stores 16,200/(12×1) bits in the column direction.

Then, the writing starting position for the first one of the twelve columns of the memory 31 is set to the position whose address is 0, the writing starting position for the second column is set to the position whose address is 0, the writing starting position for the third column is set to the position whose address is 0, the writing starting position for the fourth column is set to the position whose address is 2, the writing starting position for the fifth column is set to the position whose address is 2, the writing starting position for the sixth column is set to the position whose address is 2, the writing starting position for the seventh column is set to the position whose address is 3, the writing starting position for the eighth column is set to the position whose address is 3, the writing starting position for the ninth column is set to the position whose address is 3, the writing starting position for the tenth column is set to the position whose address is 6, the writing starting position for the eleventh column is set to the position whose address is 7, and the writing starting position for the twelfth column is set to the position whose address is 7.

Where the multiple b is 2 and besides, since, for example, 4096QAM is adopted as the modulation method, the bit number m of one symbol is 12 bits, according to FIG. 24, the memory 31 has twenty-four columns for storing 12×2 bits in the row direction and stores 16,200/(12×2) bits in the column direction.

Then, the writing starting position for the first one of the twenty-four columns of the memory 31 is set to the position whose address is 0, the writing starting position for the second column is set to the position whose address is 0, the writing starting position for the third column is set to the position whose address is 0, the writing starting position for the fourth column is set to the position whose address is 0, the writing starting position for the fifth column is set to the position whose address is 0, the writing starting position for the sixth column is set to the position whose address is 0, the writing starting position for the seventh column is set to the position whose address is 0, the writing starting position for the eighth column is set to the position whose address is 1, the writing starting position for the ninth column is set to the position whose address is 1, the writing starting position for the tenth column is set to the position whose address is 1, the writing starting position for the eleventh column is set to the position whose address is 2, the writing starting position for the twelfth column is set to the position whose address is 2, the writing starting position for the thirteenth column is set to the position whose address is 2, the writing starting position for the fourteenth column is set to the position whose address is 3, the writing starting position for the fifteenth column is set to the position whose address is 7, the writing starting position for the sixteenth column is set to the position whose address is 9, the writing starting position for the seventeenth column is set to the position whose address is 9, the writing starting position for the eighteenth column is set to the position whose address is 9, the writing starting position for the nineteenth column is set to the position whose address is 10, the writing starting position for the twentieth column is set to the position whose address is 10, the writing starting position for the twenty-first column is set to the position whose address is 10, the writing starting position for the twenty-second column is set to the position whose address is 10, the writing starting position for the twenty-third column is set to the position whose address is 10, and the writing starting position for the twenty-fourth column is set to the position whose address is 11.

Now, a transmission process carried out by the transmission apparatus 11 of FIG. 8 is described with reference to a flow chart of FIG. 25.

The LDPC encoding section 21 waits that object data are supplied thereto and, at step S101, encodes the object data into LDPC codes and supplies the LDCP codes to the bit interleaver 22. Thereafter, the processing advances to step S102.

At step S102, the bit interleaver 22 carries out bit interleave for the LDPC codes from the LDPC encoding section 21 and supplies the LDPC codes after the interleave to the mapping section 26. Thereafter, the processing advances to step S103.

In particular, at step S102, the parity interleaver 23 in the bit interleaver 22 carries out parity interleave for the LDPC codes from the LDPC encoding section 21 and supplies the LDPC codes after the parity interleave to the column twist interleaver 24.

The column twist interleaver 24 carries out column twist interleave for the LDPC codes from the parity interleaver 23 and then the demultiplexer 25 carries out a replacement process for the LDPC codes after the column twist interleave by the column twist interleaver 24. Then, the LDPC codes after the replacement process are supplied, as a symbol, from the demultiplexer 25 to the mapping section 26.

At step S103, the mapping section 26 maps the symbol (code bits of one symbol) from the demultiplexer 25 to signal points defined by the modulation method of orthogonal modulation carried out by the orthogonal modulation section 27 and supplies the mapped symbol to the orthogonal modulation section 27. Then, the processing advances to step S104.

At step S104, the orthogonal modulation section 27 carries out orthogonal modulation of a carrier in accordance with the signal points from the mapping section 26. Then, the processing advances to step S105, at which the modulation signal obtained as a result of the orthogonal modulation is transmitted, whereafter the processing is ended.

It is to be noted that the transmission process of FIG. 25 is carried out repetitively.

By carrying out the parity interleave and the column twist interleave as described above, the tolerance to erasure or burst errors where a plurality of code bits of an LDPC codes are transmitted as one symbol can be improved.

Here, while, in FIG. 8, the parity interleaver 23 which is a block for carrying out parity interleave and the column twist interleaver 24 which is a block for carrying out column twist interleave are configured separately from each other for the convenience of description, the parity interleaver 23 and the column twist interleaver 24 may otherwise be configured integrally with each other.

In particular, both of the parity interleave and the column twist interleave can be carried out by writing and reading out of code bits into and from a memory and can be represented by a matrix for converting addresses (write addresses) into which writing of code bits is to be carried out into addresses (readout addresses) from which reading out of code bits is to be carried out.

Accordingly, if a matrix obtained by multiplying a matrix representative of the parity interleave and a matrix representative of the column twist interleave is determined in advance, then if the matrix is used to convert code bits, then a result when parity interleave is carried out and then LDPC codes after the parity interleave are column twist interleaved can be obtained.

Further, in addition to the parity interleaver 23 and the column twist interleaver 24, also the demultiplexer 25 may be configured integrally.

In particular, also the replacement process carried out by the demultiplexer 25 can be represented by a matrix for converting a write address of the memory 31 for storing an LDPC code into a read address.

Accordingly, if a matrix obtained by multiplication of a matrix representative of the parity interleave, another matrix representative of the column twist interleave and a further matrix representative of the replacement process is determined in advance, then the parity interleave, column twist interleave and replacement process can be carried out collectively by the determined matrix.

It is to be noted that it is possible to carry out only one of the parity interleave and the column twist interleave.

Now, a simulation carried out with regard to the transmission apparatus 11 of FIG. 8 for measuring the error rate (bit error rate) is described with reference to FIGS. 26 to 28.

The simulation was carried out adopting a communication path which has a flutter whose D/U is 0 dB.

FIG. 26 shows a model of the communication path adopted in the simulation.

In particular, A of FIG. 26 shows a model of the flutter adopted in the simulation.

Meanwhile, B of FIG. 26 shows a model of a communication path which has the flutter represented by the model of A of FIG. 26.

It is to be noted that, in B of FIG. 26, H represents the model of the flutter of A of FIG. 26. Further, in B of FIG. 26, N represents ICI (Inter Carrier Interference), and in the simulation, an expected value $E[N^2]$ of the power was approximated by AWGN.

Figure 27:
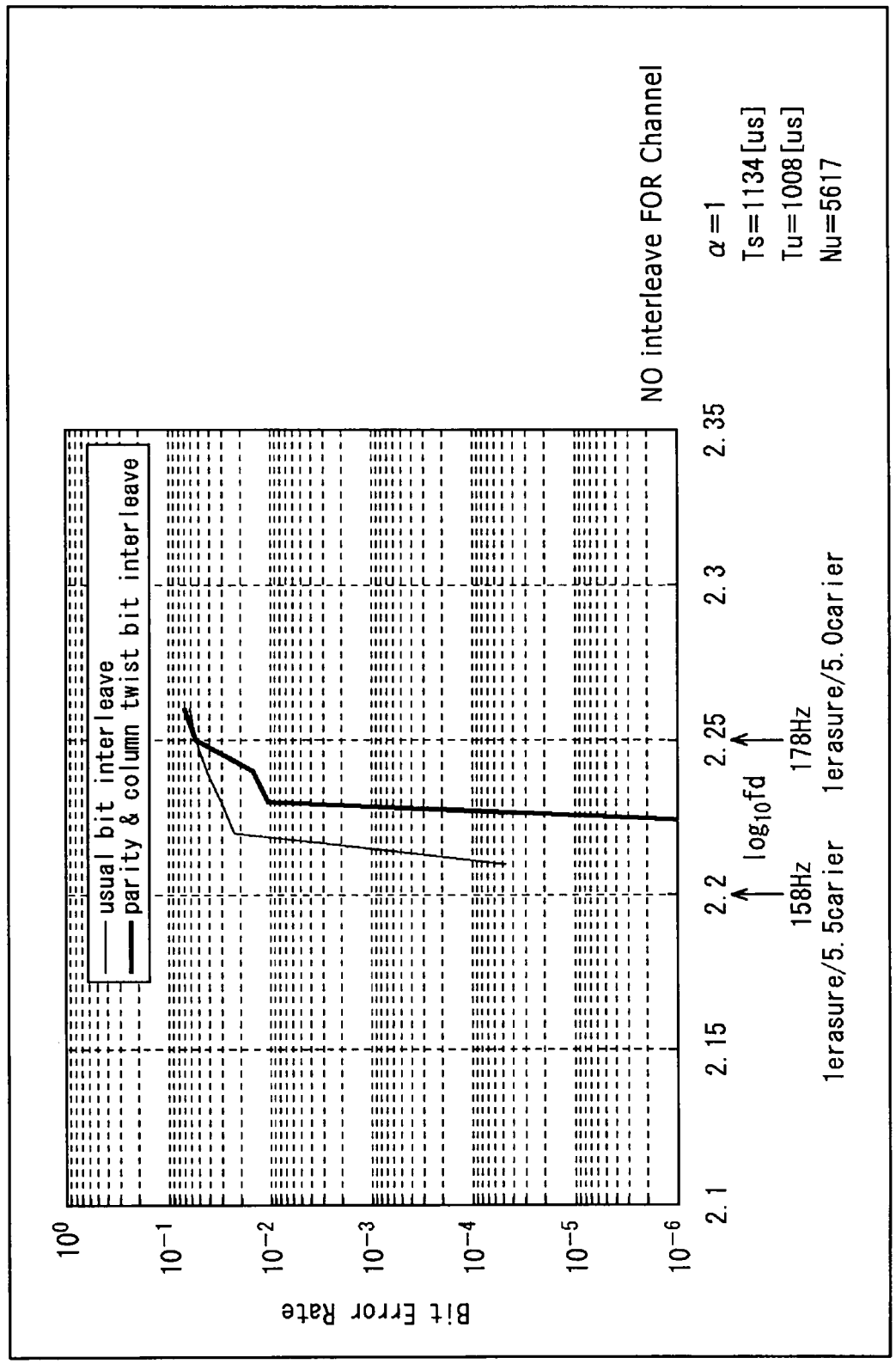
FIG. 27 is a view illustrating a relationship between an error rate obtained by the simulation and a Doppler frequency $f_d$ of a flutter.
Figure 28:
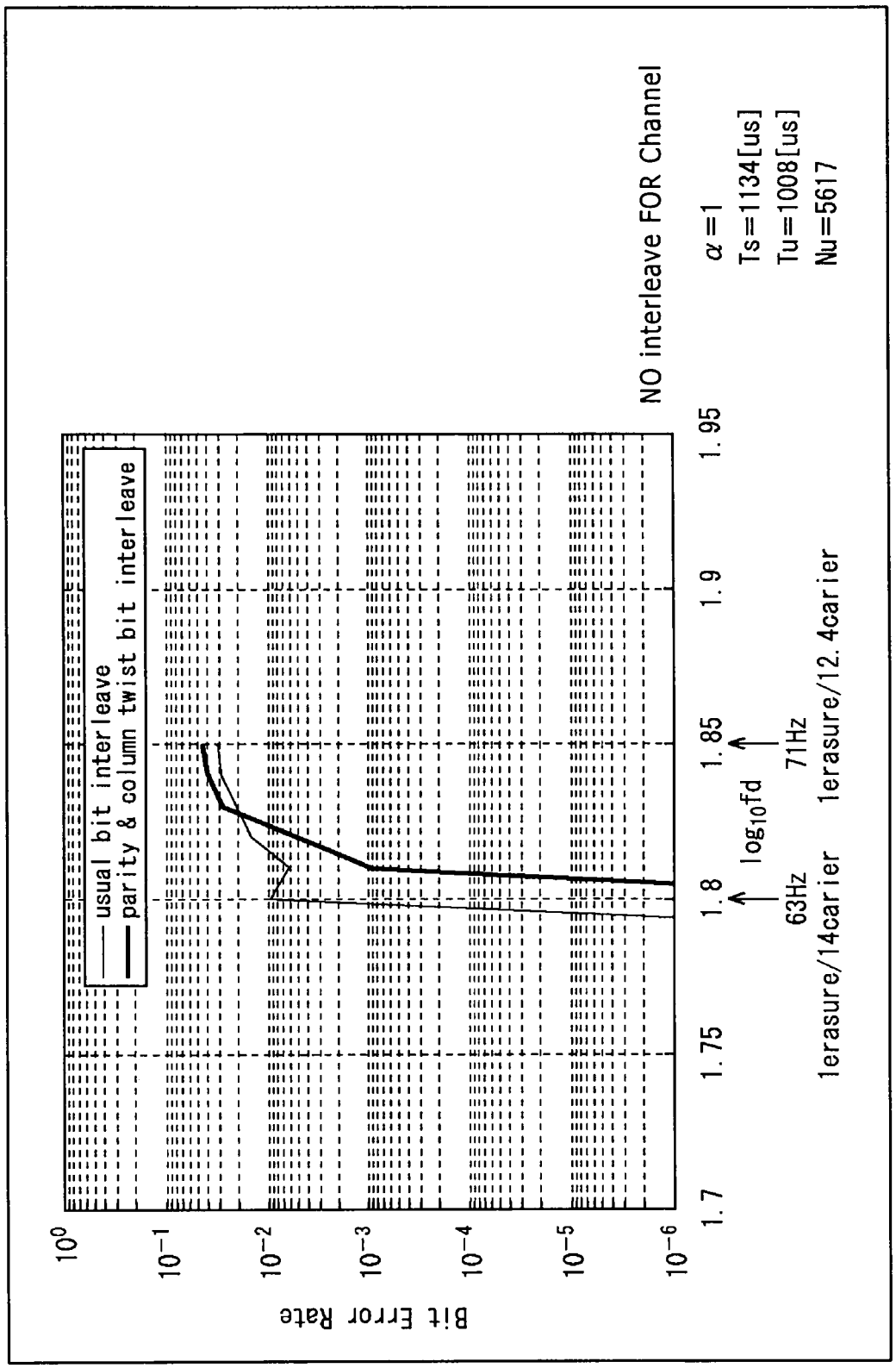
FIG. 28 is a view illustrating a relationship between an error rate obtained by the simulation and a Doppler frequency $f_d$ of a flutter.

FIGS. 27 and 28 illustrate relationships between the error rate obtained by the simulation and the Doppler frequency $f_d$ of the flutter.

It is to be noted that FIG. 27 illustrates a relationship between the error rate and the Doppler frequency $f_d$ where the modulation method is 16QAM and the encoding rate (r) is (3/4) and besides the replacement method is the first replacement method. Meanwhile, FIG. 28 illustrates the relationship between the error rate and the Doppler frequency $f_d$ where the modulation method is 64QAM and the encoding rate (r) is (5/6) and besides the replacement method is the first replacement method.

Further, in FIGS. 27 and 28, a thick line curve indicates the relationship between the error rate and the Doppler frequency $f_d$ where all of the parity interleave, column twist interleave and replacement process were carried out, and a thin line curve indicates the relationship between the error rate and the Doppler frequency $f_d$ where only the replacement process from among the parity interleave, column twist interleave and replacement process was carried out.

In both of FIGS. 27 and 28, it can be recognized that the error rate improves (decreases) where all of the parity interleave, column twist interleave and replacement process are carried out rather than where only the replacement process is carried out.

Figure 29:
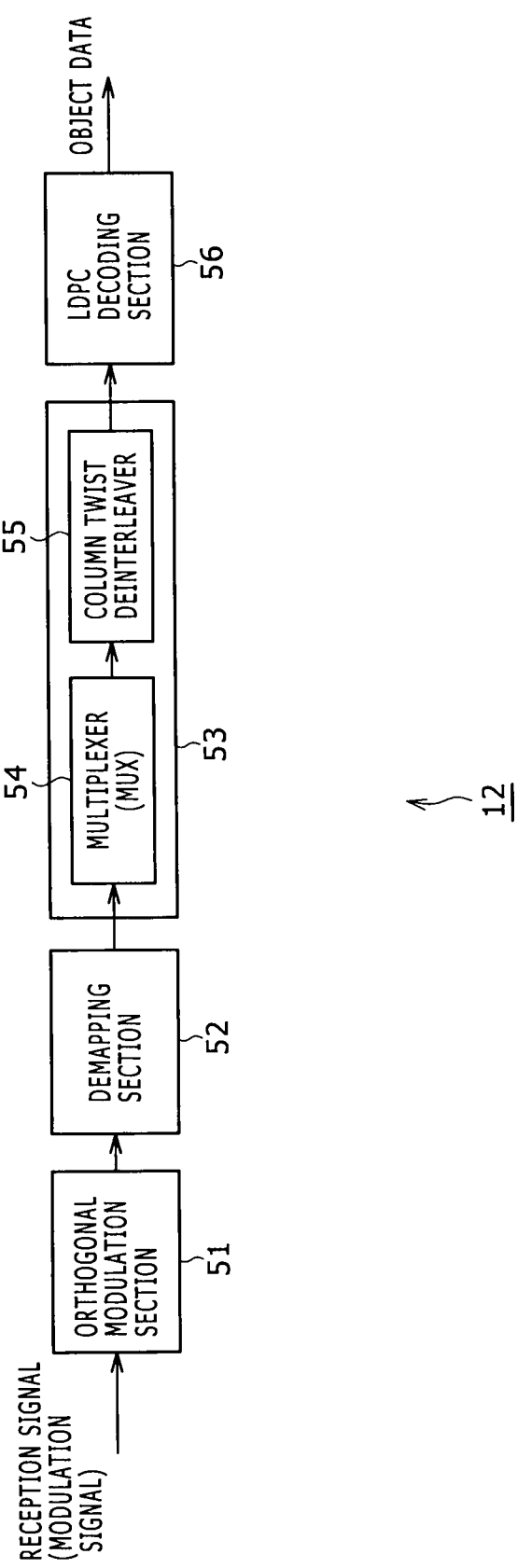
FIG. 29 is a block diagram showing an example of a configuration of a reception apparatus 12.

FIG. 29 is a block diagram showing an example of a configuration of the reception apparatus 12 of FIG. 7.

Referring to FIG. 29, the reception apparatus 12 is a data processing apparatus for receiving a modulation signal from the transmission apparatus 11 (FIG. 7) and includes an orthogonal demodulation section 51, a demapping section 52, a deinterleaver 53 and an LDPC decoding section 56.

The orthogonal demodulation section 51 receives a modulation signal from the transmission apparatus 11, carries out orthogonal modulation and supplies values representative of a point on the IQ constellation as a demodulation signal obtained as a result of the orthogonal demodulation (values in the I- and Q-axis directions) to the demapping section 52.

The demapping section 52 carries out demapping of converting the values from the orthogonal demodulation section 51 into (a value representative of "0" likelihood of) code bits of an LDPC code as a symbol and supplies the values to the deinterleaver 53.

The deinterleaver 53 includes a multiplexer (MUX) 54 and a column twist deinterleaver 55 and carries out deinterleave of the code bits of the LDPC code from the demapping section 52.

In particular, the multiplexer 54 carries out a reverse replacement process (reverse process to the replacement process) corresponding to the replacement process carried out by the demultiplexer 25 of FIG. 8 for the LDPC codes from the demapping section 52, that is, a reverse replacement process of returning the positions of the code bits replaced by the replacement process to the original positions. Then, the multiplexer 54 supplies an LDPC code obtained as a result of the reverse replacement process to the column twist deinterleaver 55.

The column twist deinterleaver 55 carries out column twist deinterleave (reverse process to the column twist interleave) corresponding to the column twist interleave as the re-arrangement process carried out by the column twist interleaver 24 of FIG. 8, that is, for example, column twist deinterleave as a reverse re-arrangement process of returning the arrangement of the code bits of the LDPC code having an arrangement changed by the column twist interleave as the re-arrangement process to the original arrangement, for the LDPC code from the multiplexer 54.

In particular, the column twist deinterleaver 55 carries out column twist deinterleave by writing the code bits of the LDPC code into and reading out the written code bits from the memory for deinterleave, the memory being configured similarly to the memory 31 shown in FIG. 22 and so forth.

It is to be noted that, in the column twist deinterleaver 55, writing of the code bits is carried out in the row direction of the memory for deinterleave using read addresses upon reading out the codes from the memory 31 as write addresses. Meanwhile, readout of the code bits is carried out in the column direction of the memory for deinterleave using the write addresses upon writing of the code bits into the memory 31 as read addresses.

The LDPC codes obtained as a result of the column twist interleave are supplied from the column twist deinterleaver 55 to the LDPC decoding section 56.

Here, while the LDPC code supplied from the demapping section 52 to the deinterleaver 53 has been obtained by the parity interleave, column twist interleave and replacement process carried out in this order therefor, the deinterleaver 53 carries out only a reverse replacement process corresponding to the replacement process and column twist deinterleave corresponding to the column twist interleave. Accordingly, parity deinterleave corresponding to the parity interleave (process reverse to the parity interleave), that is, the parity deinterleave returning the arrangement of the code bits of the LDPC codes, whose arrangement has been varied by the parity interleave, to the original arrangement, is not carried out.

Accordingly, the LDPC code for which the reverse replacement process and the column twist deinterleave have been carried out but the parity deinterleave has not been carried out is supplied from the (column twist deinterleaver 55 of the) deinterleaver 53 to the LDPC decoding section 56.

The LDPC decoding section 56 carries out LDPC decoding of the LDPC code from the deinterleaver 53 using a conversion parity check matrix, obtained by carrying out at least column replacement corresponding to the parity interleave for the parity check matrix H used for the LDPC encoding by the LDPC encoding section 21 of FIG. 8, and outputs data obtained as a result of the LDPC decoding as a decoding result of the object data.

Figure 30:
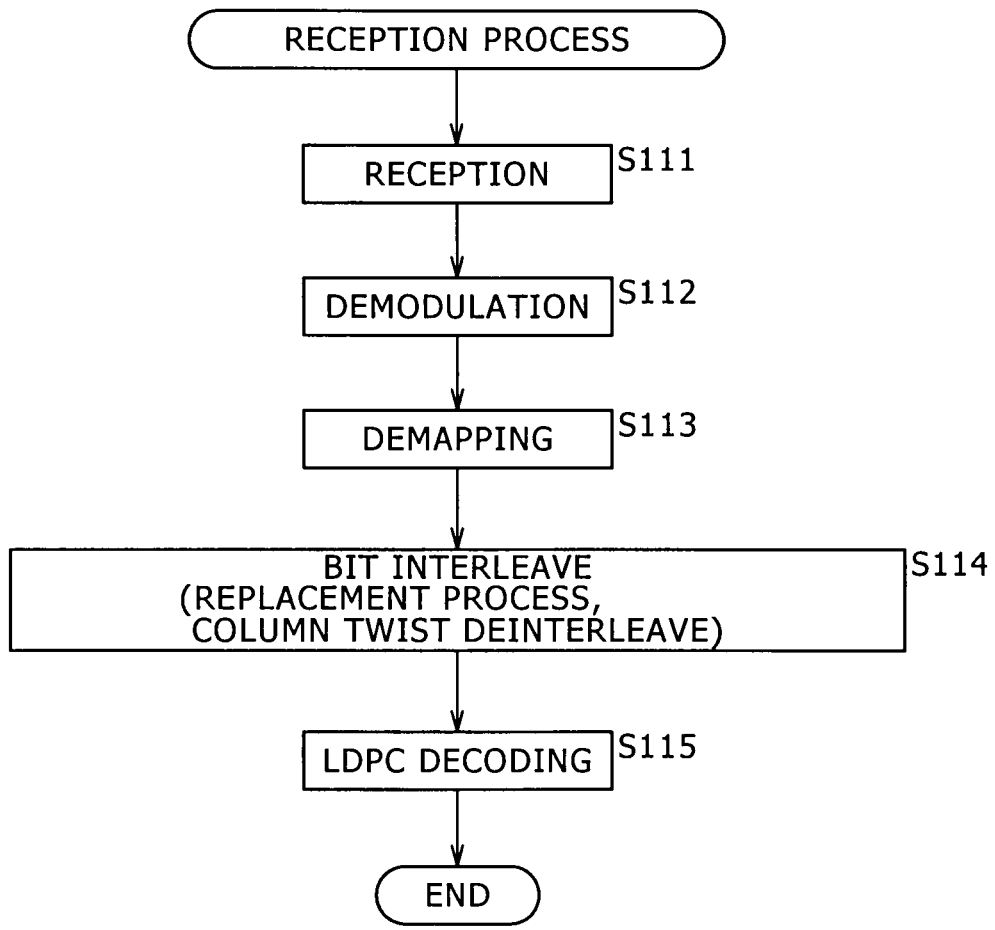
FIG. 30 is a flow chart illustrating a reception process.

FIG. 30 is a flow chart illustrating a reception process carried out by the reception apparatus 12 of FIG. 29.

The orthogonal demodulation section 51 receives a modulation signal from the transmission apparatus 11 at step S111. Then, the processing advances to step S112, at which the orthogonal demodulation section 51 carries out orthogonal demodulation of the modulation signal. The orthogonal demodulation section 51 supplies demodulation signals obtained as a result of the orthogonal demodulation to the demapping section 52, whereafter the processing advances from step S112 to step S113.

At step S113, the demapping section 52 carries out demapping of converting the demodulation signals from the orthogonal demodulation section 51 into code bits of an LDPC code as a symbol and supplies the code bits to the deinterleaver 53, whereafter the processing advances to step S114.

At step S114, the deinterleaver 53 carries out deinterleave of the code bits of the LDPC code from the demapping section 52, whereafter the processing advances to step S115.

In particular, at step S114, the multiplexer 54 in the deinterleaver 53 carries out a reverse replacement process for the LDPC code from the demapping section 52 and supplies LDPC code obtained as a result of the reverse replacement process to the column twist deinterleaver 55.

The column twist deinterleaver 55 carries out column twist deinterleave for the LDPC code from the multiplexer 54 and supplies (a value representative of "0" likelihood of code bits of) an LDPC code obtained as a result of the column twist deinterleave to the LDPC decoding section 56.

At step S115, the LDPC decoding section 56 carries out LDPC decoding of the LDPC code from the column twist deinterleaver 55 using a conversion parity check matrix obtained by carrying out at least column replacement corresponding to the parity interleave for the parity check matrix H used for the LDPC encoding by the LDPC encoding section 21 of FIG. 8, and outputs data obtained by the LDPC decoding as a decoding result of the object data. Thereafter, the processing is ended.

It is to be noted that the reception process of FIG. 30 is carried out repetitively.

Also in FIG. 29, the multiplexer 54 for carrying out the reverse replacement process and the column twist deinterleaver 55 for carrying out the column twist deinterleave are configured separately from each other for the convenience of description similarly as in the case of FIG. 8. However, the multiplexer 54 and the column twist deinterleaver 55 can be configured integrally with each other.

Further, where the transmission apparatus 11 of FIG. 8 does not carry out the column twist interleave, there is no necessity to provide the column twist deinterleaver 55 in the reception apparatus 12 of FIG. 29.

Now, the LDPC decoding carried out by the LDPC decoding section 56 of FIG. 29 is further described.

The LDPC decoding section 56 of FIG. 29 carries out LDPC decoding of an LDPC code, for which the reverse replacement process and the column twist deinterleave have been carried out but the parity deinterleave has not been carried out, from the column twist deinterleaver 55 as described above using a conversion parity check matrix obtained by carrying out at least column replacement corresponding to the parity interleave for the parity check matrix H used for the LDPC encoding by the LDPC encoding section 21 of FIG. 8.

Here, LDPC decoding which can suppress the operation frequency within a sufficiently implementable range while suppressing the circuit scale by carrying out the LDPC decoding using the conversion parity check matrix has been proposed formerly (refer to, for example, Japanese Patent Laid-Open No. 2004-343170).

Thus, the formerly proposed LDPC decoding which uses a conversion parity check matrix is described first with reference to FIGS. 31 to 34.

Figure 31:
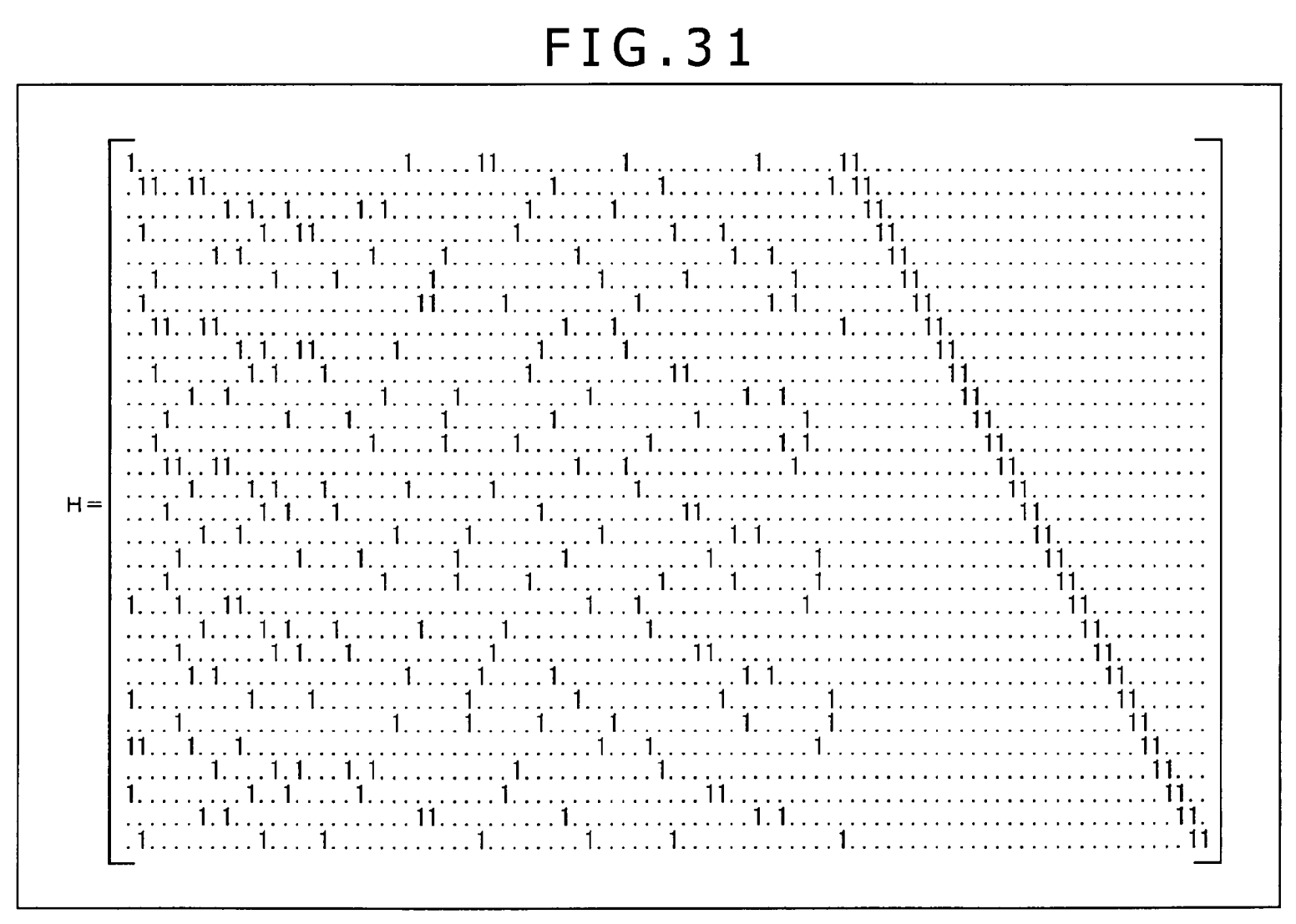

FIG. 31 shows an example of the parity check matrix H of an LDPC code whose code length N is 90 and encoding rate is 2/3.

It is to be noted that, in FIG. 31, 0 is represented by a period (.) (this similarly applies also to FIGS. 32 and 33 hereinafter described).

In the parity check matrix H of FIG. 31, the parity matrix has a staircase structure.

Figure 32:
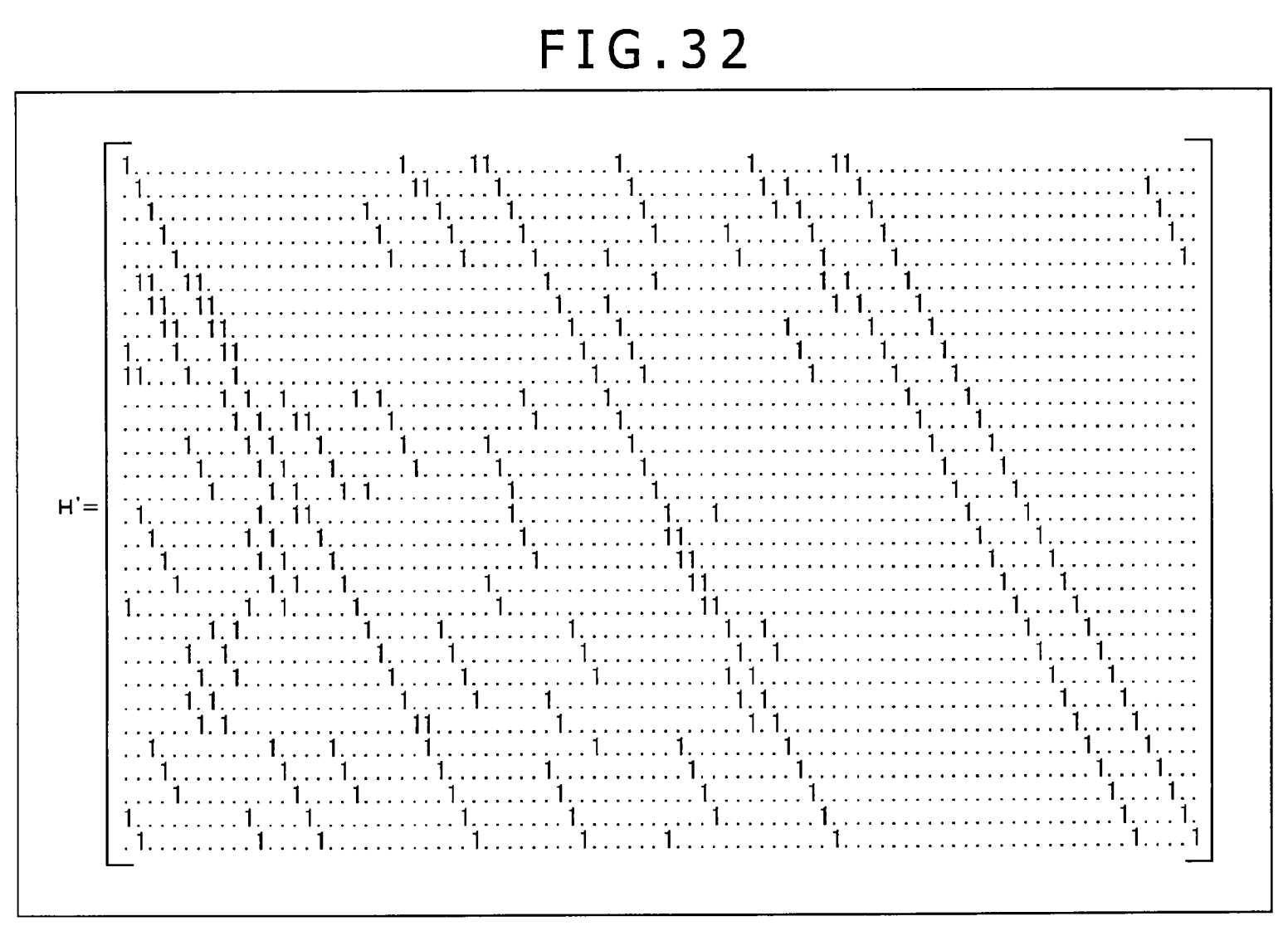

FIG. 32 illustrates a parity check matrix H' obtained by applying row replacement of an expression (8) and column replacement of an expression (9) to the parity check matrix H of FIG. 31.

$$\text{Row replacement: } 6s+t+1th \text{ row} \rightarrow 5t+s+1th \text{ row} \quad (8)$$

$$\text{Column replacement: } 6x+y+61th \text{ column} \rightarrow 5y+x+61th \text{ column} \quad (9)$$

However, in the expressions (8) and (9), s, t, x and y are integers within the ranges of $0 \leq s < 5$, $0 \leq t < 6$, $0 \leq x < 5$ and $0 \leq t < 6$, respectively.

According to the row replacement of the expression (8), the replacement is carried out in such a manner that the 1st, 7th, 13th, 19th and 25th rows each of whose numbers indicates a remainder of 1 where it is divided by 6 are replaced to the 1st, 2nd, 3rd, 4th and 5th rows, and the 2nd, 8th, 14th, 20th and 26th rows each of whose numbers indicates a remainder of 2 where it is divided by 6 are replaced to 6th, 7th, 8th, 9th and 10th rows.

On the other hand, according to the column replacement of the expression (9), the replacement is carried out for the 61st and succeeding columns (parity matrix) such that the 61st, 67th, 73rd, 79th and 85th columns each of whose numbers indicates a remainder of 1 where it is divided by 6 are replaced to 61st, 62nd, 63rd, 64th and 65th columns, and the 62nd, 68th, 74th, 80th and 86th columns each of whose numbers indicates a remainder of 2 where it is divided by 6 are replaced to 66th, 67th, 68th, 69th and 70th columns.

A matrix obtained by carrying out replacement of the rows and the columns for the parity check matrix H of FIG. 31 is a parity check matrix H' of FIG. 32.

Here, even if the row replacement of the parity check matrix H is carried out, this does not have an influence on the arrangement of the code bits of the LDPC code.

Meanwhile, the column replacement of the expression (9) corresponds to parity interleave when the information length K, the unit column number P of the cyclic structure and the devisor q (=M/P) of the parity length M (here, 30) in the parity interleave of interleaving the K+qx+y+1th code bit to the position of the K+Py+x+1th code bit are set to 60, 5 and 6, respectively.

If the parity check matrix H' (hereinafter referred to suitably as replacement parity check matrix) of FIG. 32 is multiplied by a result of replacement same as that of the expression (9) for the LDPC code of the parity check matrix H (hereinafter referred to suitably as original parity check matrix) of FIG. 31, then the 0 vector is outputted. In particular, where a row vector obtained by applying the column replacement of the expression (9) for the row vector c as the LDPC code (one codeword) of the original parity check matrix H is represented by c', since $Hc^T$ becomes the 0 vector on the basis of the characteristic of the parity check matrix, also $H'c'^T$ naturally becomes the 0 vector.

From the foregoing, the conversion parity check matrix H' of FIG. 32 becomes the parity check matrix of an LDPC code c' obtained by carrying out the column replacement of the expression (9) for the LDPC code c of the original parity check matrix H.

Accordingly, by carrying out the column replacement of the expression (9) for the LDPC code c of the original parity check matrix H, decoding (LDPC decoding) the LDPC code c' after the column replacement using the parity check matrix H' of FIG. 32 and then carrying out reverse replacement to the column replacement of the expression (9) for result of decoding, a decoding result similar to that obtained where the LDPC code of the original parity check matrix H is decoded using the parity check matrix H can be obtained.

Figure 33:
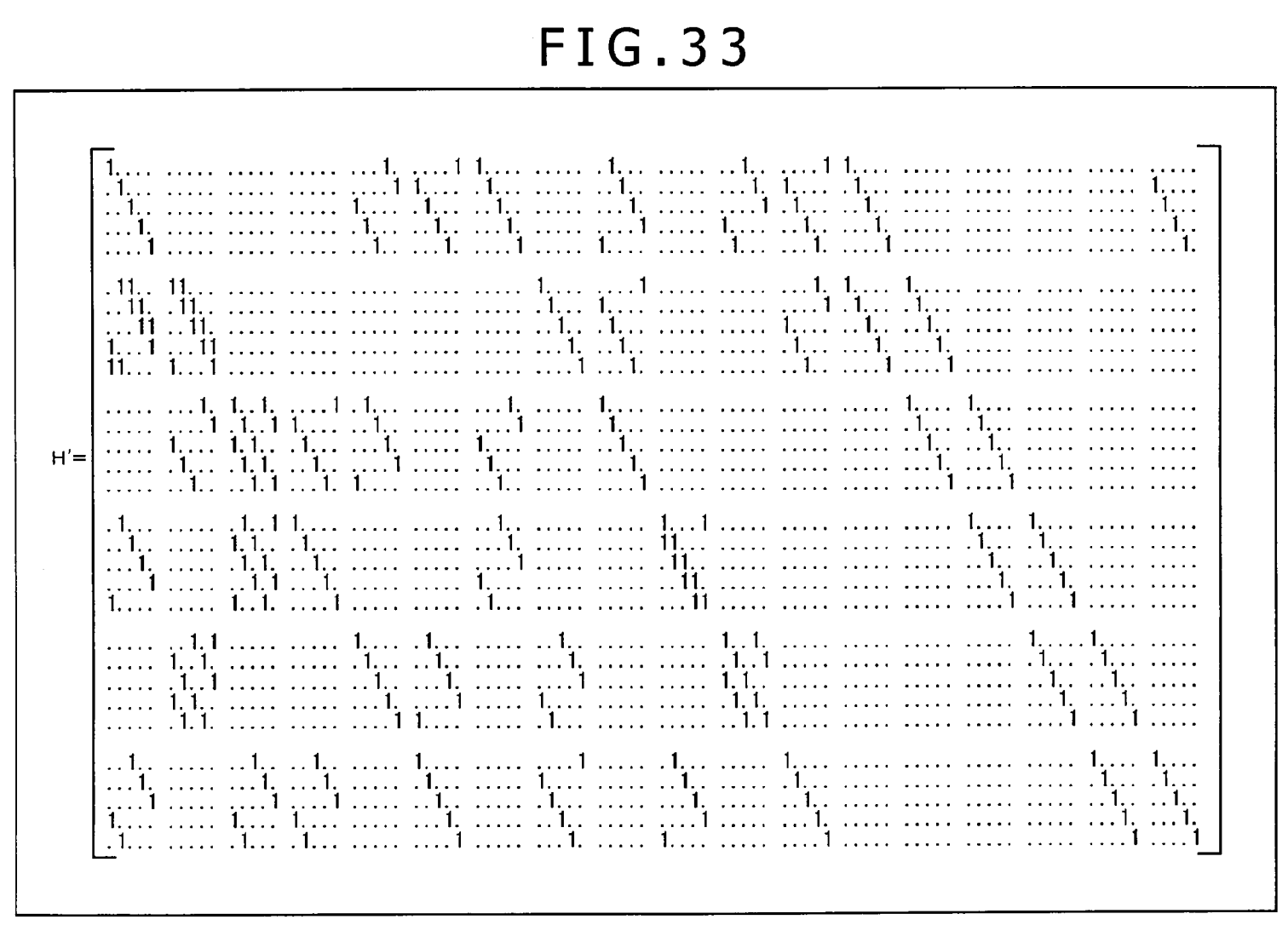

FIG. 33 shows the conversion parity check matrix H' of FIG. 32 wherein a space is provided between units of 5×5 matrices.

In FIG. 33, the conversion parity check matrix H' is represented by a combination of a unit matrix of 5×5 elements, another matrix (hereinafter referred to suitably as quasi unit matrix) which corresponds to the unit matrix whose element or elements of 1 are changed into an element or elements of 0, a further matrix (hereinafter referred to suitably as shift matrix) which corresponds to the unit matrix or quasi unit matrix after it is cyclically shifted (cyclic shift), a still further matrix (hereinafter referred to suitably as sum matrix) of two or more of the unit matrix, quasi unit matrix and shift matrix, and a 0 matrix of 5×5 elements.

It can be regarded that the conversion parity check matrix H' of FIG. 33 is composed of a unit matrix, a quasi unit matrix, a shift matrix, a sum matrix and a 0 matrix of 5×5 elements. Therefor, the matrices of 5×5 elements which compose the conversion parity check matrix H' are hereinafter referred to as component matrices.

For decoding of an LDPC code represented by a parity check matrix represented by a matrix of P×P components, an architecture which carries out check node mathematical operation and variable node mathematical operation simultaneously for P check nodes and P variable nodes can be used.

Figure 34:
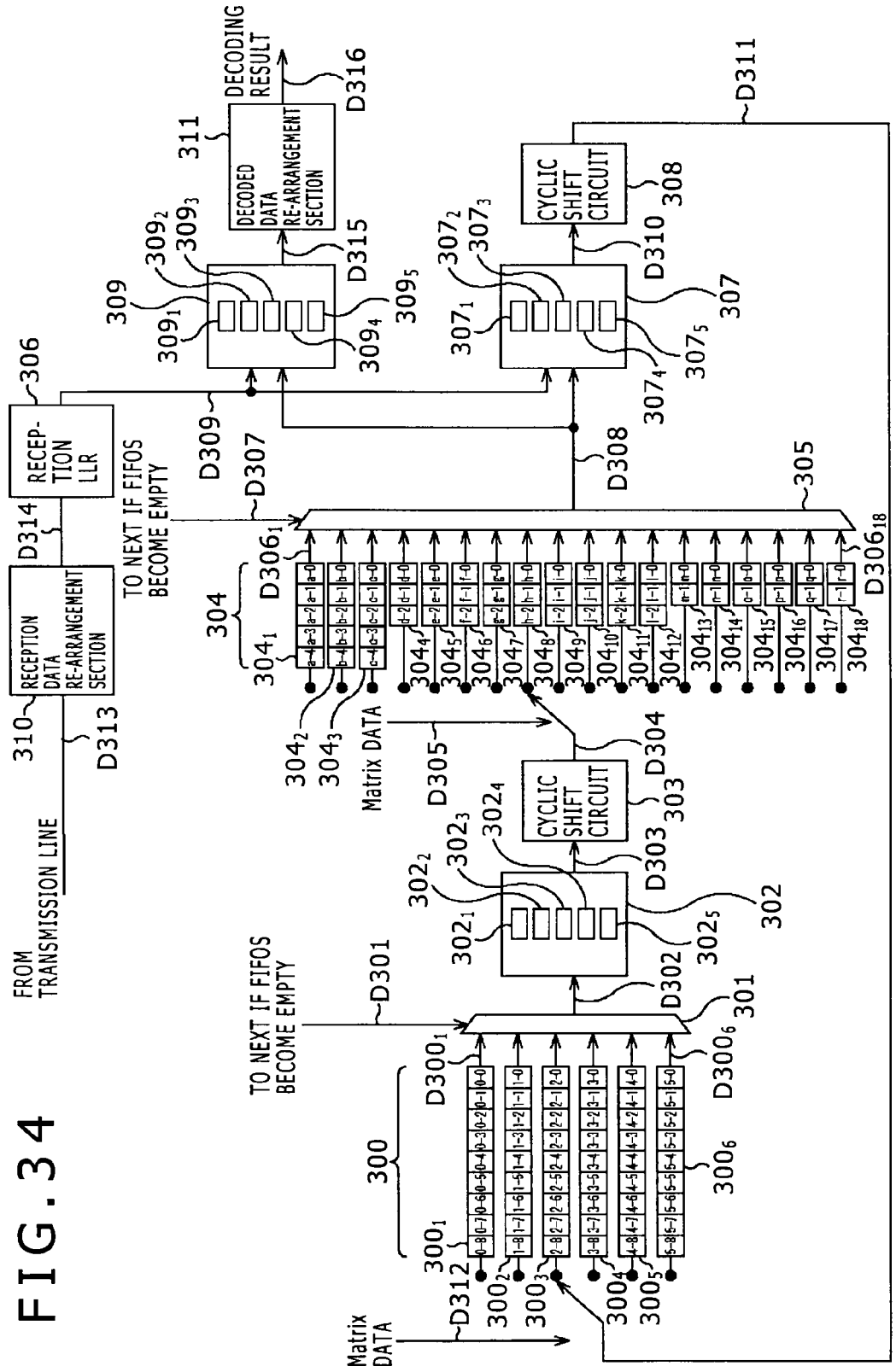
FIG. 34 is a block diagram showing an example of a configuration of a decoding apparatus in which node mathematical operation is carried out collectively for P nodes.

FIG. 34 is a block diagram showing an example of a configuration of a decoding apparatus which carries out such decoding as just described.

In particular, FIG. 34 shows an example of a configuration of a decoding apparatus which carries out decoding of LDPC codes of the original parity check matrix H of FIG. 31 using the conversion parity check matrix H' of FIG. 33 obtained by carrying out at least the column replacement of the expression (9).

The decoding apparatus of FIG. 34 includes an edge data storage memory 300 including six FIFOs $300_1$ to $300_6$, a selector 301 for selecting the FIFOs $300_1$ to $300_6$, a check node calculation section 302, two cyclic shift circuits 303 and 308, an edge data storage memory 304 including 18 FIFOs $304_1$ to $304_{18}$, a selector 305 for selecting the FIFOs $304_1$ to $304_{18}$, a reception data memory 306 for storing reception information, a variable node calculation section 307, a decoded word calculation section 309, a reception data re-arrangement section 310, and a decoded data re-arrangement section 311.

First, a storage method of data into the edge data storage memories 300 and 304 is described.

The edge data storage memory 300 includes the six FIFOs $300_1$ to $300_6$ the number of which is equal to a quotient when the row number 30 of the conversion parity check matrix H' of FIG. 33 is divided by the row number 5 of the component matrices. Each of the FIFOs $300_y$ (y=1, 2, . . . , 6) has a plurality of stages of storage regions such that messages corresponding to five edges whose number is equal to the number of rows and the number of columns of the component matrices can be read out from or written into the storage regions of each stage at the same time. Further, the number of stages of the storage regions of each FIFO $300_y$ is nine which is the maximum number of 1s (Hamming weight) in the row direction of the conversion parity check matrix of FIG. 33.

In the FIFO $300_1$, data (messages $v_i$ from variable nodes) corresponding to the positions of the value 1 in the first to fifth rows of the conversion parity check matrix H' of FIG. 33 are stored in a closed form in the horizontal direction in the individual rows (in the form wherein 0 is ignored). In particular, if an element in the j row of the ith column is represented as (j, i), then in the storage regions at the first stage of the FIFO $300_1$, data corresponding to the positions of the value 1 of the unit matrix of 5×5 elements from (1, 1) to (5, 5) of the conversion parity check matrix H' are stored. In the storage regions at the second stage, data corresponding to the positions of the value 1 of a shift matrix from (1, 21) to (5, 25) of the conversion parity check matrix H' (a shift matrix obtained by cyclically shifting the unit matrix of 5×5 elements by three in the rightward direction). Also in the storage regions at the third to eighth stages, data are stored in an associated relationship with the conversion parity check matrix H'. Then, in the storage regions at the ninth stage, data corresponding to the positions of the value of a shift matrix of (1, 86) to (5, 90) of the conversion parity check matrix H' (a shift matrix obtained by replacing the value 1 in the first row of the unit matrix of 5×5 elements with the value 0 and then cyclically shifting the unit matrix after the replacement by one in the leftward direction) are stored.

In the FIFO $300_2$, data corresponding to the positions of the value 1 from the sixth to tenth rows of the conversion parity check matrix H' of FIG. 33 are stored. In particular, in the storage region at the first stage of the FIFO $300_2$, data corresponding to the positions of the value 1 of a first shift matrix which forms a sum matrix from (6, 1) to (10, 5) of the conversion parity check matrix H' (a sum matrix which is the sum of a first shift matrix obtained by cyclically shifting the unit matrix of 5×5 elements by one in the rightward direction and a second shift matrix obtained by cyclically shifting the unit matrix of 5×5 elements by two in the rightward direction) are stored. Further, in the storage region at the second stage, data corresponding to the positions of the value 1 of the second shift matrix which forms the sum matrix from (6, 1) to (10, 5) of the conversion parity check matrix H' are stored.

In particular, with regard to a component matrix whose weight is 2 or more, where the component matrix is represented in the form of the sum of plural ones from among a unit matrix of P×P elements having the weight 1, a quasi unit matrix which corresponds to the unit matrix whose one or more elements having the value 1 are replaced with 0 and a shift matrix obtained by cyclically shifting the unit matrix or the quasi unit matrix, data corresponding to the positions of the value 1 of the unit matrix, quasi unit matrix or shift matrix whose weight is 1 (messages corresponding to edges belonging to the unit matrix, quasi unit matrix or shift matrix) are stored into the same address (same FIFO from among the FIFOs $300_1$ to $300_6$).

Also in the storage regions at the third to ninth stages, data are stored in an associated relationship with the conversion parity check matrix H'.

Also the FIFOs $300_3$ to $300_6$ store data in an associated relationship with the conversion parity check matrix H'.

The edge data storage memory 304 includes 18 FIFOs $304_1$ to $304_{18}$ the number of which is equal to the quotient when the column number 90 of the conversion parity check matrix H' is divided by the column number 5 of the component matrix.

Each edge data storage memory $304_x$ (x=1, 2, . . . , 18) includes a plurality of stages of storage regions, and messages corresponding to five edges the number of which is equal to the number of rows and the number of columns of the conversion parity check matrix H' can be read out from or written into the storage regions of each stage at the same time.

In the FIFO $304_1$, data corresponding to the positions of the value 1 from the first to fifth columns of the conversion parity check matrix H' of FIG. 33 (messages $u_j$ from the check nodes) are stored in a closed form in the vertical direction in the individual columns (in the form wherein 0 is ignored). In particular, in the storage regions at the first stage of the FIFO $304_1$, data corresponding to the positions of the value 1 of the unit matrix of 5×5 elements from (1, 1) to (5, 5) of the conversion parity check matrix H' are stored. In the storage regions at the second stage, data corresponding to the positions of the value of a first shift matrix which forms a sum matrix from (6, 1) to (10, 5) of the vertical parity check matrix H' (a sum matrix which is the sum of a first shift matrix obtained by cyclically shifting the unit matrix of 5×5 elements by one to the right and a second shift matrix obtained by cyclically shifting the unit matrix of 5×5 elements by two to the right) are stored. Further, in the storage regions at the third stage, data corresponding to the positions of the value 1 of the second shift matrix which forms the sum matrix from (6, 1) to (10, 5) of the vertical parity check matrix H'.

In particular, with regard to a component matrix whose weight is 2 or more, where the component matrix is represented in the form of the sum of plural ones from among a unit matrix of P×P elements having the weight 1, a quasi unit matrix which corresponds to the unit matrix whose one or more elements having the value 1 are replaced with 0 and a shift matrix obtained by cyclically shifting the unit matrix or the quasi unit matrix, data corresponding to the positions of the value 1 of the unit matrix, quasi unit matrix or shift matrix whose weight is 1 (messages corresponding to edges belonging to the unit matrix, quasi unit matrix or shift matrix) are stored into the same address (same FIFO from among the FIFOs $304_1$ to $304_{18}$).

Also with regard to the storage regions at the fourth and fifth stages, data are stored in an associated relationship with the conversion parity check matrix H'. The number of stages of the storage regions of the FIFO $304_1$ is 5 which is a maximum number of the number of is (Hamming weight) in the row direction in the first to fifth columns of the conversion parity check matrix H'.

Also the FIFOs $304_2$ and $304_3$ store data in an associated relationship with the conversion parity check matrix H' similarly, and each length (stage number) of the FIFOs $304_2$ and $304_3$ is 5. Also the FIFOs $304_4$ to $304_{12}$ store data in an associated relationship with the conversion parity check matrix H' similarly, and each length of the FIFOs $304_4$ to $304_{12}$ is 3. Also the FIFOs $304_{13}$ to $304_{18}$ store data in an associated relationship with the conversion parity check matrix H' similarly, and each length of the FIFOs $304_{13}$ to $304_{18}$ is 2.

Now, operation of the decoding apparatus of FIG. 34 is described.

The edge data storage memory 300 includes the six FIFOs $300_1$ to $300_6$, and FIFOs into which data are to be stored are selected from among the FIFOs $300_1$ to $300_6$ in accordance with information (Matrix data) D312 representing to which row of the conversion parity check matrix H' five messages D311 supplied from the cyclic shift circuit 308 at the preceding stage belong. Then, the five messages D311 are stored collectively and in order into the selected FIFOs. Further, when data are to be read out, the edge data storage memory 300 reads out five messages D300$_1$ in order from the FIFO 300$_1$ and supplies the five messages D300$_1$ to the selector 301 at the succeeding stage. After the reading out of the messages from the FIFO 300$_1$ ends, the edge data storage memory 300 reads out the messages in order also from the FIFOs 330$_2$ to 300$_6$ and supplies the read out messages to the selector 301.

The selector 301 selects the five messages from that FIFO from which data are currently read out from among the FIFOs 300$_1$ to 300$_6$ in accordance with a select signal D301 and supplies the five messages as messages D302 to the check node calculation section 302.

The check node calculation section 302 includes five check node calculators 302$_1$ to 302$_5$ and carries out the check node mathematical operation in accordance with the expression (7) using the messages D302 (D302$_1$ to D302$_5$) (messages $v_i$ of the expression (7)) supplied thereto through the selector 301. Then, the check node calculation section 302 supplies five messages D303 (D303$_1$ to D303$_5$) (messages $u_j$ of the expression (7)) obtained as a result of the check node mathematical operation to the cyclic shift circuit 303.

The cyclic shift circuit 303 cyclically shifts the five messages D303$_1$ to 303$_5$ determined by the check node calculation section 302 based on information (Matrix data) D305 regarding by what number of original unit matrices the corresponding edges are cyclically shifted in the conversion parity check matrix H', and supplies a result of the cyclic shift as a message D304 to the edge data storage memory 304.

The edge data storage memory 304 includes 18 FIFOs 304$_1$ to 304$_{18}$. The edge data storage memory 304 selects a FIFO into which data are to be stored from among the FIFOs 304$_1$ to 304$_{18}$ in accordance with the information D305 regarding to which row of the conversion parity check matrix H' the five messages D304 supplied from the cyclic shift circuit 303 at the preceding stage belong and collectively stores the five messages D304 in order into the selected FIFO. On the other hand, when data are to be read out, the edge data storage memory 304 reads out five messages D306$_1$ in order from the FIFO 304$_1$ and supplies the messages D306$_1$ to the selector 305 at the succeeding stage. After the reading out of data from the FIFO 304$_1$ ends, the edge data storage memory 304 reads out messages in order also from the FIFOs 304$_2$ to 304$_{18}$ and supplies the messages to the selector 305.

The selector 305 selects the five messages from the FIFO from which data are currently read out from among the FIFOs 304$_1$ to 304$_{18}$ in accordance with a select signal D307 and supplies the selected messages as messages D308 to the variable node calculation section 307 and the decoded word calculation section 309.

On the other hand, the reception data re-arrangement section 310 carries out the column replacement of the expression (9) to re-arrange an LDPC code D313 received through a communication path and supplies the re-arranged LDPC code D313 as reception data D314 to the reception data memory 306. The reception data memory 306 calculates and stores a reception LLR (logarithmic likelihood ratio) from the reception data D314 supplied thereto from the reception data re-arrangement section 310 and collects and supplies every five ones of the reception LLRs as reception values D309 to the variable node calculation section 307 and the decoded word calculation section 309.

The variable node calculation section 307 includes five variable node calculators 307$_1$ to 307$_5$ and carries out variable node mathematical operation in accordance with the expression (1) using the messages D308 (308$_1$ to 308$_5$) (messages $u_j$ of the expression (1)) supplied thereto through the selector 305 and the five reception values D309 (reception values $u_{oi}$ of the expression (1)) supplied thereto from the reception data memory 306. Then, the variable node calculation section 307 supplies messages D310 (D301$_1$ to D310$_5$) (messages $v_i$ of the expression (1)) obtained as a result of the mathematical operation to the cyclic shift circuit 308.

The cyclic shift circuit 308 cyclically shifts messages D310$_1$ to D310$_5$ calculated by the variable node calculation section 307 based on information regarding by what number of original unit matrices the corresponding edge is cyclically shifted in the conversion parity check matrix H', and supplies a result of the cyclic shifting as a message D311 to the edge data storage memory 300.

By carrying out the sequence of operations described above, decoding in one cycle of an LDPC code can be carried out. In the decoding apparatus of FIG. 34, after an LDPC code is decoded by a predetermined number of times, a final decoding result is determined by the decoded word calculation section 309 and the decoded data re-arrangement section 311 and then outputted.

In particular, the decoded word calculation section 309 includes five decoded word calculators 309$_1$ to 309$_5$ and acts as a final stage in a plurality of cycles of decoding to calculate a decoding result (decoded word) in accordance with the expression (5) using the five messages D308 (D308$_1$ to D308$_5$) (messages $u_j$ of the expression (5)) outputted from the selector 305 and the five reception values D309 (reception values $u_{oi}$ of the expression (5)) outputted from the reception data memory 306. Then, the decoded word calculation section 309 supplies decoded data D315 obtained as a result of the calculation to the decoded data re-arrangement section 311.

The decoded data re-arrangement section 311 carries out reverse replacement to the column replacement of the expression (9) for the decoded data D315 supplied thereto from the decoded word calculation section 309 to re-arrange the order of the decoded data D315 and outputs the re-arranged decoded data D315 as a decoding result D316.

As described above, by applying one or both of row replacement and column replacement to a parity check matrix (original parity check matrix) to convert the parity check matrix into a parity check matrix (conversion parity check matrix) which can be represented by a combination of a unit matrix of P×P elements, a quasi unit matrix which corresponds to the unit matrix whose element or elements of 1 are changed into an element or elements of 0, a shift matrix which corresponds to the unit matrix or quasi unit matrix after it is cyclically shifted, a sum matrix of two or more of the unit matrix, quasi unit matrix and shift matrix, and a 0 matrix of P×P elements as described above, it becomes possible to adopt for LDPC code decoding an architecture which carries out check node mathematical operation and variable node mathematical operation simultaneously for P check nodes and P variable nodes. Consequently, by carrying out the node mathematical operation simultaneously for P nodes, it is possible to suppress the operation frequency within an implementable range to carry out LDPC decoding.

The LDPC decoding section 56 which composes the reception apparatus 12 of FIG. 29 carries out check node mathematical operation and variable node mathematical operation simultaneously for P check nodes and P variable nodes to carry out LDPC decoding similarly to the decoding apparatus of FIG. 34.

In particular, it is assumed now to simplify description that the parity check matrix of an LDPC code outputted from the LDPC encoding section 21 which composes the transmission apparatus 11 of FIG. 8 is, for example, the parity check matrix H wherein the parity matrix has a staircase structure shown in FIG. 31. In this instance, the parity interleaver 23 of the transmission apparatus 11 carries out parity interleave for interleaving the K+qx+y+1th code bit to the position of the K+Py+x+1th code bit with the information length K set to 60, with the unit column number P of the cyclic structure set to 5 and with the devisor q (=M/P) of the parity length M to 6.

Since this parity interleave corresponds to the column replacement of the expression (9), the LDPC decoding section 56 need not carry out the column replacement of the expression (9).

Therefore, in the reception apparatus 12 of FIG. 29, an LDPC code for which parity deinterleave has not been carried out, that is, an LDPC code in a state wherein the column replacement of the expression (9) is carried out, is supplied from the column twist deinterleaver 55 to the LDPC decoding section 56 as described above. The LDPC decoding section 56 carries out processing similar to that of the decoding apparatus of FIG. 34 except that the column replacement of the expression (9) is not carried out.

Figure 35:
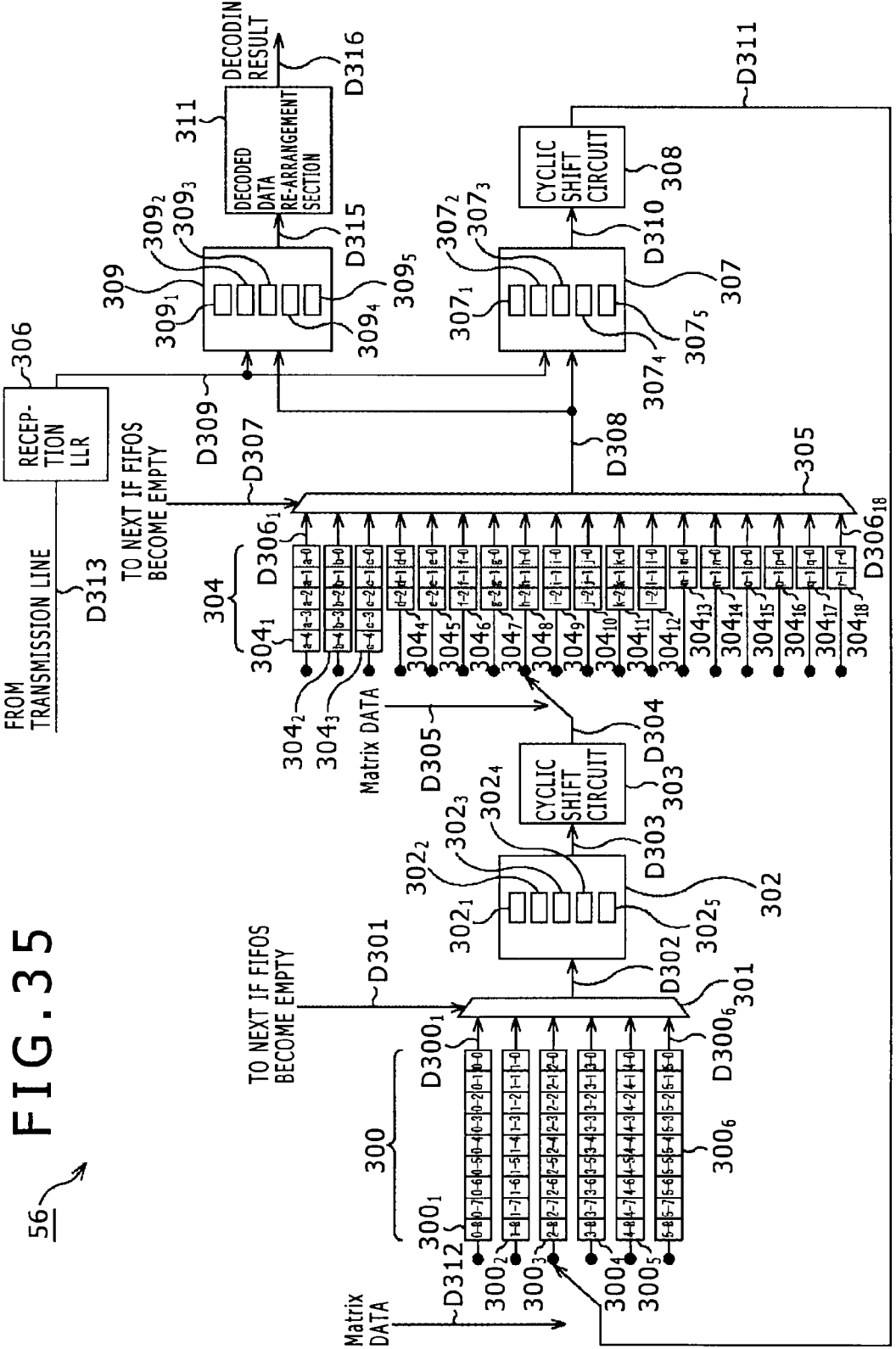
FIG. 35 is a block diagram showing an example of a configuration of a LDPC decoding section 56.

In particular, FIG. 35 shows an example of a configuration of the LDPC decoding section 56 of FIG. 29.

Referring to FIG. 35, the LDPC decoding section 56 is configured similarly to that of the decoding apparatus of FIG. 34 except that the reception data re-arrangement section 310 of FIG. 34 is not provided and carries out processing similar to that of the decoding apparatus of FIG. 34 except that the column replacement of the expression (9) is not carried out. Therefore, description of the LDPC decoding section 56 is omitted herein.

Since the LDPC decoding section 56 can be configured without including the reception data re-arrangement section 310 as described above, it can be reduced in scale in comparison with the decoding apparatus of FIG. 34.

It is to be noted that, while, in FIGS. 31 to 35, it is assumed that the code length N of the LDPC code is 90; the information length K is 60; the unit column number P (row number and column number of a component matrix) of the cyclic structure is 5; and the devisor q (=M/P) of the parity length M is 6, for simplified description, the code length N, information length K, unit column number P of the cyclic structure and the devisor q (=M/P) are not individually limited to the specific values given above.

In particular, while the LDPC encoding section 21 in the transmission apparatus 11 of FIG. 8 outputs an LDPC code wherein, for example, the code length N is 64,800, the information length K is N−Pq (=N−M), the unit column number P of the cyclic structure is 360 and the devisor q is M/P, the LDPC decoding section 56 shown in FIG. 35 can be applied also where LDPC decoding is carried out by carrying out the check node mathematical operation and the variable node mathematical operation simultaneously for P check nodes and P variable nodes in regard to such an LDPC code as just described.

Incidentally, in DVB-C.2 which is a standard of CATV digital broadcasting of the next generation, from a reason that the communication line 13 (FIG. 7) is stable in comparison with ground waves and some other reason, it is expected to adopt, in addition to the modulation methods illustrated in FIGS. 23 and 24, a modulation method having a greater number of signal points.

As a modulation method having many signal points, for example, 16384QAM (hereinafter referred to also as 16kQAM) having 16,834 (=$2^{14}$) signal points and so forth, 65536QAM (hereinafter referred to also as 64kQAM) having 65,536 (=$2^{16}$) signal points and so forth are available.

Thus, column twist interleave where 16kQAM and 64kQAM are adopted as the modulation method is described.

It is to be noted that, where 16kQAM is adopted as the modulation method, 14 (=m) code bits of an LDPC code are transmitted as one symbol. Further, thereupon, the symbol is mapped to signal points corresponding to the symbol value (14 code bits) from among the 16,384 (=$2^{14}$) signal points of 16kQAM.

In addition, where 64kQAM is adopted as the modulation method, 16 (=m) code bits of an LDPC code are transmitted as one symbol. Further, thereupon, the symbol is mapped to signal points corresponding to the symbol value (16 code bits) from among the 65,536 (=$2^{16}$) signal points of 64kQAM.

Column twist interleave where 16kQAM and 64kQAM are adopted as the modulation method is described with reference to FIG. 36.

A of FIG. 36 illustrates writing starting positions of the individual columns of the memory 31 in column twist interleave where 16kQAM is adopted as the modulation method with regard to LDPC codes which are prescribed in the DVB-S.2 (and DVB-T.2) standard and have a code length N of 64,800 and 11 different encoding rates.

Here, the memory 31 has mb columns for storing mb bits in the row direction and stores B=ceil(N/(mb)) bits in the column direction.

It is to be noted that ceil( ) represents a minimum integer higher than the value in the parenthesis. Accordingly, where N/(mb) can be divided (where the quotient is an integer), the memory 31 stores B=N/(mb) bits in the column direction as described hereinabove with reference to FIGS. 22 to 24.

Where the bit number m of one symbol is 14 bits and the multiple b is 1 as a result of adoption of 16kQAM as the modulation method, the memory 31 has 14 (=mb) columns for storing 14×1 (=mb) bits in the row direction (has 14 (=mb) columns so that 14×1 (=mb) bits can be stored in the row direction).

Further, in this instance, when column twist interleave of an LDPC code having a code length N of 64,800 bits is carried out, since 64,800/(14×1) cannot be divided, the memory 31 stores 4,629 (=B) bits, which is a minimum integer higher than 64,800(14×1), in the column direction.

Then, the writing starting position for the first column from among the 14 columns of the memory 31 is set to the position whose address is 0; the writing starting position for the second column to the position whose address is 2; the writing starting position for the third column to the position whose address is 4; the writing starting position for the fourth column to the position whose address is 5; the writing starting position for the fifth column to the position whose address is 5; the writing starting position for the sixth column to the position whose address is 6; the writing starting position for the seventh column to the position whose address is 11; the writing starting position for the eighth column to the position whose address is 14; the writing starting position for the ninth column to the position whose address is 14; the writing starting position for the tenth column to the position whose address is 14; the writing starting position for the eleventh column to the position whose address is 14; the writing starting position for the twelfth column to the position whose address is 19; the writing starting position for the thirteenth column to the position whose address is 23; and the writing starting position for the fourteenth column to the position whose address is 24.

It is to be noted that, as described hereinabove with reference to FIG. 23, for example, where one of the first to third replacement methods of FIG. 16 is adopted as the replacement method for the replacement process of the demultiplexer 25 (FIG. 8) or in a like case, the multiple b is 1.

Where the bit number m of one symbol is 14 bits and the multiple b is 2 as a result of adoption of 16kQAM as the modulation method, the memory 31 has 28 (=mb) columns for storing 14×2 (=mb) bits in the row direction.

Further, in this instance, when column twist interleave of an LDPC code having a code length N of 64,800 bits is carried out, since 64,800/(14×2) cannot be divided, the memory 31 stores 2,315 (=B) bits, which is a minimum integer higher than 64,800(14×2), in the column direction.

Then, the writing starting position for the first column from among the 28 columns of the memory 31 is set to the position whose address is 0; the writing starting position for the second column to the position whose address is 0; the writing starting position for the third column to the position whose address is 2; the writing starting position for the fourth column to the position whose address is 4; the writing starting position for the fifth column to the position whose address is 5; the writing starting position for the sixth column to the position whose address is 6; the writing starting position for the seventh column to the position whose address is 7; the writing starting position for the eighth column to the position whose address is 12; the writing starting position for the ninth column to the position whose address is 14; the writing starting position for the tenth column to the position whose address is 17; the writing starting position for the eleventh column to the position whose address is 17; the writing starting position for the twelfth column to the position whose address is 20; the writing starting position for the thirteenth column to the position whose address is 21; the writing starting position for the fourteenth column to the position whose address is 27; the writing starting position for the fifteenth column to the position whose address is 28; the writing starting position for the sixteenth column to the position whose address is 28; the writing starting position for the seventeenth column to the position whose address is 29; the writing starting position for the eighteenth column to the position whose address is 29; the writing starting position for the nineteenth column to the position whose address is 29; the writing starting position for the twentieth column to the position whose address is 33; the writing starting position for the twenty-first column to the position whose address is 34; the writing starting position for the twenty-second column to the position whose address is 38; the writing starting position for the twenty-third column to the position whose address is 52; the writing starting position for the twenty-fourth column to the position whose address is 65; the writing starting position for the twenty-fifth column to the position whose address is 66; the writing starting position for the twenty-sixth column to the position whose address is 66; the writing starting position for the twenty-seventh column to the position whose address is 70; and the writing starting position for the twenty-eighth column to the position whose address is 72.

It is to be noted that, as described hereinabove with reference to FIG. 23, for example, where the fourth replacement method of FIG. 17 is adopted as the replacement method for the replacement process of the demultiplexer 25 (FIG. 8) or in a like case, the multiple b is 2.

B of FIG. 36 illustrates writing starting positions of the individual columns of the memory 31 in column twist interleave where 16kQAM is adopted as the modulation method with regard to LDPC codes which are prescribed in the DVB-S.2 (and DVB-T.2) standard and have a code length N of 16,200 and 10 different encoding rates.

Where the bit number m of one symbol is 14 bits and the multiple b is 1 as a result of adoption of 16kQAM as the modulation method, the memory 31 has 14 (=mb) columns for storing 14×1 (=mb) bits in the row direction.

Further, in this instance, when column twist interleave of an LDPC code having a code length N of 16,200 bits is carried out, since 16,200/(14×1) cannot be divided, the memory 31 stores 1,158 (=B) bits, which is a minimum integer higher than 16,200(14×1), in the column direction.

Then, the writing starting position for the first column from among the 14 columns of the memory 31 is set to the position whose address is 0; the writing starting position for the second column to the position whose address is 0; the writing starting position for the third column to the position whose address is 1; the writing starting position for the fourth column to the position whose address is 5; the writing starting position for the fifth column to the position whose address is 7; the writing starting position for the sixth column to the position whose address is 8; the writing starting position for the seventh column to the position whose address is 10; the writing starting position for the eighth column to the position whose address is 16; the writing starting position for the ninth column to the position whose address is 16; the writing starting position for the tenth column to the position whose address is 25; the writing starting position for the eleventh column to the position whose address is 30; the writing starting position for the twelfth column to the position whose address is 32; the writing starting position for the thirteenth column to the position whose address is 32; and the writing starting position for the fourteenth column to the position whose address is 33.

Where the bit number m of one symbol is 14 bits and the multiple b is 2 as a result of adoption of 16kQAM as the modulation method, the memory 31 has 28 (=mb) columns for storing 14×2 (=mb) bits in the row direction.

Further, in this instance, when column twist interleave of an LDPC code having a code length N of 16,200 bits is carried out, since 16,200/(14×2) cannot be divided, the memory 31 stores 579 (=B) bits, which is a minimum integer higher than 16,200(14×2), in the column direction.

Then, the writing starting position for the first column from among the 28 columns of the memory 31 is set to the position whose address is 0; the writing starting position for the second column to the position whose address is 0; the writing starting position for the third column to the position whose address is 0; the writing starting position for the fourth column to the position whose address is 0; the writing starting position for the fifth column to the position whose address is 1; the writing starting position for the sixth column to the position whose address is 1; the writing starting position for the seventh column to the position whose address is 1; the writing starting position for the eighth column to the position whose address is 5; the writing starting position for the ninth column to the position whose address is 5; the writing starting position for the tenth column to the position whose address is 9; the writing starting position for the eleventh column to the position whose address is 12; the writing starting position for the twelfth column to the position whose address is 17; the writing starting position for the thirteenth column to the position whose address is 17; the writing starting position for the fourteenth column to the position whose address is 17; the writing starting position for the fifteenth column to the position whose address is 34; the writing starting position for the sixteenth column to the position whose address is 38; the writing starting position for the seventeenth column to the position whose address is 40; the writing starting position for the eighteenth column to the position whose address is 40; the writing starting position for the nineteenth column to the position whose address is 50; the writing starting position for the twentieth column to the position whose address is 51; the writing starting position for the twenty-first column to the position whose address is 51; the writing starting position for the twenty-second column to the position whose address is 51; the writing starting position for the twenty-third column to the position whose address is 52; the writing starting position for the twenty-fourth column to the position whose address is 62; the writing starting position for the twenty-fifth column to the position whose address is 65; the writing starting position for the twenty-sixth column to the position whose address is 65; the writing starting position for the twenty-seventh column to the position whose address is 74; and the writing starting position for the twenty-eighth column to the position whose address is 76.

C of FIG. 36 illustrates writing starting positions of the individual columns of the memory 31 in column twist interleave where 64kQAM is adopted as the modulation method with regard to LDPC codes which are prescribed in the DVB-S.2 (and DVB-T.2) standard and have a code length N of 64,800 and 11 different encoding rates.

Where the bit number m of one symbol is 16 bits and the multiple b is 2 as a result of adoption of 64kQAM as the modulation method, the memory 31 has 32 (=mb) columns for storing 16×2 (=mb) bits in the row direction.

Further, in this instance, when column twist interleave of an LDPC code having a code length N of 64,800 bits is carried out, since 64,800/(16×2) cannot be divided, the memory 31 stores 64,800/(16×2)=2,025 (=B) bits in the column direction.

Then, the writing starting position for the first column from among the 32 columns of the memory 31 is set to the position whose address is 0; the writing starting position for the second column to the position whose address is 2; the writing starting position for the third column to the position whose address is 6; the writing starting position for the fourth column to the position whose address is 7; the writing starting position for the fifth column to the position whose address is 7; the writing starting position for the sixth column to the position whose address is 7; the writing starting position for the seventh column to the position whose address is 10; the writing starting position for the eighth column to the position whose address is 11; the writing starting position for the ninth column to the position whose address is 11; the writing starting position for the tenth column to the position whose address is 14; the writing starting position for the eleventh column to the position whose address is 14; the writing starting position for the twelfth column to the position whose address is 15; the writing starting position for the thirteenth column to the position whose address is 15; the writing starting position for the fourteenth column to the position whose address is 16; the writing starting position for the fifteenth column to the position whose address is 25; the writing starting position for the sixteenth column to the position whose address is 25; the writing starting position for the seventeenth column to the position whose address is 25; the writing starting position for the eighteenth column to the position whose address is 25; the writing starting position for the nineteenth column to the position whose address is 25; the writing starting position for the twentieth column to the position whose address is 31; the writing starting position for the twenty-first column to the position whose address is 32; the writing starting position for the twenty-second column to the position whose address is 32; the writing starting position for the twenty-third column to the position whose address is 47; the writing starting position for the twenty-fourth column to the position whose address is 48; the writing starting position for the twenty-fifth column to the position whose address is 50; the writing starting position for the twenty-sixth column to the position whose address is 50; the writing starting position for the twenty-seventh column to the position whose address is 54; the writing starting position for the twenty-eighth column to the position whose address is 55; the writing starting position for the twenty-ninth column to the position whose address is 57; the writing starting position for the thirtieth column to the position whose address is 57; the writing starting position for the thirty-first column to the position whose address is 58; and the writing starting position for the thirty-second column to the position whose address is 58.

It is to be noted that, although addresses of the writing starting positions of the columns of the memory 31 when column twist interleave of an LDPC code having a code length N of 64,800 bits is carried out where the modulation system is 64kQAM (the bit number m of one symbol is 16 bits) and the multiple b is 1 are not illustrated in C of FIG. 36, this arises from the following reason.

In particular, in column twist interleave of an LDPC code having a code length N of 64,800 bits where the bit number m of one symbol is 16 bits and the multiple b is 1, the memory 31 has 16 (=mb) columns for storing 16×1 (=mb) bits in the row direction and stores 64,800/(16×1)=4,050 (=B) bits in the column direction.

This configuration of the memory 31 is the same as the configuration of the memory 31 when column twist interleave of an LDPC code having a code length N of 64,800 bits where the bit number m of one symbol is 8 bits (the modulation method is 256QAM) and the multiple b is 2 is carried out.

Therefore, where the bit number m of one symbol is 16 bits and the multiple b is 1, the addresses of the writing starting positions of the columns of the memory 31 in column twist interleave of an LDPC code having a code length N of 64,800 bits are the same as those where column twist interleave of an LDPC code having a code length N of 64,800 bits where the bit number m of one symbol is 8 bits and the multiple b is 2 described hereinabove with reference to FIG. 23 is carried out.

Therefore, where the bit number m of one symbol is 16 bits and the multiple b is 1, in column twist interleave of an LDPC code having a code length N of 64,800 bits, similarly as in the case when column twist interleave of an LDPC code having a code length N of 64,800 bits where the bit number m of one symbol is 8 bits (the modulation method is 256QAM) and the multiple b is 2 described hereinabove with reference to FIG. 23, the writing starting position for the first column from among the 16 columns of the memory 31 is set to the position whose address is 1; the writing starting position for the second column to the position whose address is 2; the writing starting position for the third column to the position whose address is 2; the writing starting position for the fourth column to the position whose address is 2; the writing starting position for the fifth column to the position whose address is 2; the writing starting position for the sixth column to the position whose address is 3; the writing starting position for the seventh column to the position whose address is 7; the writing starting position for the eighth column to the position whose address is 15; the writing starting position for the ninth column to the position whose address is 16; the writing starting position for the tenth column to the position whose address is 20; the writing starting position for the eleventh column to the position whose address is 22; the writing starting position for the twelfth column to the position whose address is 22; the writing starting position for the thirteenth column to the position whose address is 27; the writing starting position for the fourteenth column to the position whose address is 27, the writing starting position for the fifteenth column to the position whose address is 28; and the writing starting position for the sixteenth column to the position whose address is 32.

D of FIG. 36 illustrates writing starting positions of the individual columns of the memory 31 in column twist interleave where 64kQAM is adopted as the modulation method with regard to LDPC codes which are prescribed in the DVB-S.2 (and DVB-T.2) standard and have a code length N of 16,200 and 10 different encoding rates.

Where the bit number m of one symbol is 16 bits and the multiple b is 1 as a result of adoption of 64kQAM as the modulation method, the memory 31 has 16 (=mb) columns for storing 16×1 (=mb) bits in the row direction.

Further, in this instance, when column twist interleave of an LDPC code having a code length N of 16,200 bits is carried out, since 16,200/(16×1) cannot be divided, the memory 31 stores 1,013 (=B) bits, which is a minimum integer higher than 16,200(16×1), in the column direction.

Then, the writing starting position for the first column from among the 16 columns of the memory 31 is set to the position whose address is 1; the writing starting position for the second column to the position whose address is 1; the writing starting position for the third column to the position whose address is 1; the writing starting position for the fourth column to the position whose address is 2; the writing starting position for the fifth column to the position whose address is 2; the writing starting position for the sixth column to the position whose address is 3; the writing starting position for the seventh column to the position whose address is 6; the writing starting position for the eighth column to the position whose address is 8; the writing starting position for the ninth column to the position whose address is 12; the writing starting position for the tenth column to the position whose address is 12; the writing starting position for the eleventh column to the position whose address is 12; the writing starting position for the twelfth column to the position whose address is 12; the writing starting position for the thirteenth column to the position whose address is 17; the writing starting position for the fourteenth column to the position whose address is 17; the writing starting position for the fifteenth column to the position whose address is 17; and the writing starting position for the sixteenth column to the position whose address is 17.

Where the bit number m of one symbol is 16 bits and the multiple b is 2 as a result of adoption of 64kQAM as the modulation method, the memory 31 has 32 (=mb) columns for storing 16×2 (=mb) bits in the row direction.

Further, in this instance, when column twist interleave of an LDPC code having a code length N of 16,200 bits is carried out, since 16,200/(16×2) cannot be divided, the memory 31 stores 507 (=B) bits, which is a minimum integer higher than 16,200(16×2), in the column direction.

Then, the writing starting position for the first column from among the 32 columns of the memory 31 is set to the position whose address is l; the writing starting position for the second column to the position whose address is 0; the writing starting position for the third column to the position whose address is 2; the writing starting position for the fourth column to the position whose address is 3; the writing starting position for the fifth column to the position whose address is 3; the writing starting position for the sixth column to the position whose address is 6; the writing starting position for the seventh column to the position whose address is 6; the writing starting position for the eighth column to the position whose address is 9; the writing starting position for the ninth column to the position whose address is 12; the writing starting position for the tenth column to the position whose address is 17; the writing starting position for the eleventh column to the position whose address is 17; the writing starting position for the twelfth column to the position whose address is 17; the writing starting position for the thirteenth column to the position whose address is 22; the writing starting position for the fourteenth column to the position whose address is 28; the writing starting position for the fifteenth column to the position whose address is 28; the writing starting position for the sixteenth column to the position whose address is 28; the writing starting position for the seventeenth column to the position whose address is 38; the writing starting position for the eighteenth column to the position whose address is 38; the writing starting position for the nineteenth column to the position whose address is 38; the writing starting position for the twentieth column to the position whose address is 48; the writing starting position for the twenty-first column to the position whose address is 56; the writing starting position for the twenty-second column to the position whose address is 58; the writing starting position for the twenty-third column to the position whose address is 64 the writing starting position for the twenty-fourth column to the position whose address is 67; the writing starting position for the twenty-fifth column to the position whose address is 67; the writing starting position for the twenty-sixth column to the position whose address is 70; the writing starting position for the twenty-seventh column to the position whose address is 76; the writing starting position for the twenty-eighth column to the position whose address is 84; the writing starting position for the twenty-ninth column to the position whose address is 86; the writing starting position for the thirtieth column to the position whose address is 91; the writing starting position for the thirty-first column to the position whose address is 92; and the writing starting position for the thirty-second column to the position whose address is 94.

Now, details of column twist interleave where N/(mb) cannot be divided are described with reference to FIG. 37.

Since the memory 31 has mb columns for storing mb bits in the column direction and stores B=ceil(N/(mb)) bits in the column direction as described hereinabove, the storage capacity of the memory 31 is mb×B bits.

Where N/(mb) cannot be divided, since B is greater than N/(mb), the mb×B bits which are the storage capacity of the memory 31 are greater than the code length N.

Accordingly, when code bits of the code length N are written into the memory 31, the storage region of the memory 31 remains by mb×B−N bits. However, this storage region of mb×B−N bits is set as an unused region which is not used for writing of code bits in column twist interleave. Then, writing of code bits is carried out into a portion of the storage region of the memory 31 other than the unused region to carry out column twist interleave.

Figure 37:
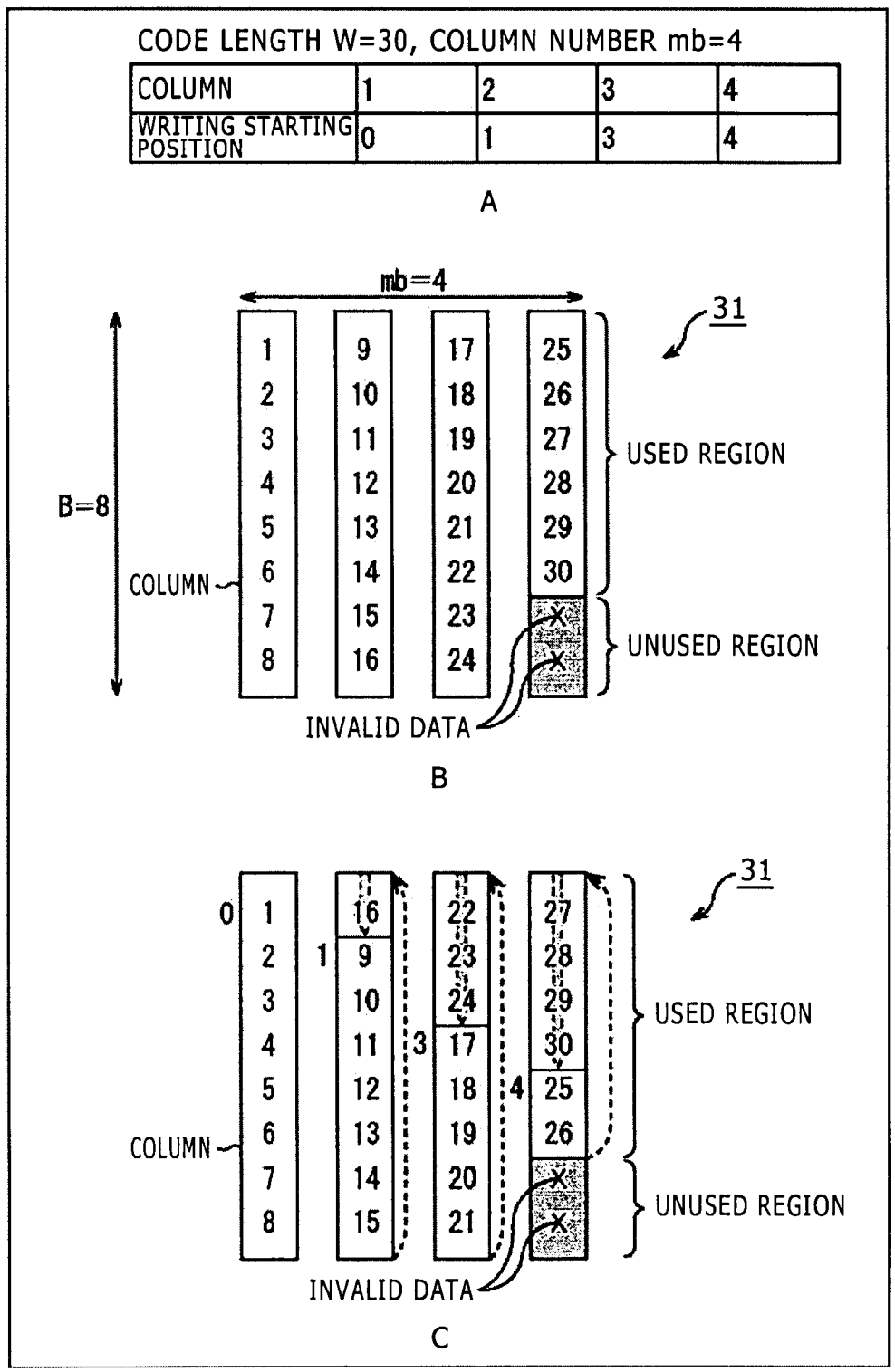
FIG. 37 is a view illustrating details of column twist interleave where N/(mb) cannot be divided.

In particular, A of FIG. 37 illustrates an example of the writing starting potions in column twist interleave where the code length N is 30 bits and the column number mb (bit number of the memory 31 in the row direction) of the memory 31 is 4.

In A of FIG. 37, the writing starting position for the first column from among the 4 (=mb) columns of the memory 31 is set to the position whose address is l; the writing starting position for the second column to the position whose address is 1; the writing starting position for the third column to the position whose address is 3; and the writing starting position for the fourth column to the position whose address is 4.

Where the code length N is 30 bits and the column number mb which the memory 31 has is 4, N/(mb) cannot be divided, and B is 8 which is a minimum number greater than N/(mb)=30/4. In other words, the storage capacity of one column is 8 bits.

If it is assumed now that column twist interleave is not carried out, then writing of code bits into the memory 31 is carried out in such a manner as illustrated in B of FIG. 37.

In particular, B of FIG. 37 illustrates 30 (=N) code bits written into the memory 31 where column twist interleave is not carried out.

Into the first column, the first to eighth code bits #1 to #8 from among the 30 code bits are written in the column direction (downward direction from above) beginning with the top of the column, and into the second column, the ninth to 16th code bits #9 to #16 are written in the column direction beginning with the top of the column. Similarly, into the third column, the 17th to 24th code bits #17 to #24 are written in the column direction beginning with the top of the column.

Then, into the fourth column, the 25th to 30th code bits #25 to #30 from among the 30 code bits are written in the column direction beginning with the top of the column.

Accordingly, when the 30 (=N) code bits for one code length are written in the column direction into the 4 (=mb) columns, in the fourth (=mbth) column which is the last column, the storage region remains by 2 (=mb×B−N) bits from the last end of the column.

In this manner, where the mb×B bits are greater than N bits, when N code bits are written in the column direction into the mb columns, in the mbth column which is the last column, the storage region remains by mb×B−N bits, and in column twist interleave, the remaining storage region is determined as an unused region which is not used for writing of code bits. Thus, into the mbth column, mb bits are written into only a used region which is the storage region other than the unused region.

In particular, C of FIG. 37 illustrates writing of code bits in column twist interleave which is carried out without using the unused region for writing of code bits in accordance with the writing starting positions illustrated in A of FIG. 37.

According to A of FIG. 37, into the first column, the column twist interleaver 24 (FIG. 8) writes the code bits #1 to #8 in order beginning with the position whose address is 0. In this instance, the last code bit #8 from among the code bits #1 to #8 is written into the last end of the first column as seen in C of FIG. 37.

Into the second column, the column twist interleaver 24 writes the code bits #9 to #16 in order beginning with the position whose address is 1. In this instance, the code bit #15 which is not the last bit among the code bits #9 to #16 is written into the last end of the second column as seen in C of FIG. 37, and consequently, the remaining code bit #16 is written into the top of the second column.

Into the third column, the column twist interleaver 24 writes the code bits #17 to #24 in order beginning with the position whose address is 3. In this instance, the code bit #21 which is not the last bit among the code bits #17 to #24 is written into the last end of the second column as seen in C of FIG. 37, and consequently, the remaining code bits #22 to #24 are written into the top of the second column.

Into the fourth column, the column twist interleaver 24 writes the code bits #25 to #30 in order beginning with the position whose address is 4.

It is to be noted, however, that, as regards the fourth (=mbth) column, the storage region of the fourth (=mbth) column which remains when 30 (=N) code bits are written in the column direction into the four (=mb) columns (B of FIG. 37) is set as an unused region which is not used for writing of code bits, and in regard to the fourth (=mbth) column, code bits are written only into the used region which is the storage region other than the unused region.

In FIG. 37, the 2 (=mb×B−N) bits from the last end from within the storage region of the 4th (=mbth) column make the unused region, and the remaining 6 (=B−(mb×B−N) bits, that is, the 6 bits from the top of the fourth column, make the used region.

Therefore, when the code bits #25 to #30 are written in order into the fourth column beginning with the position whose address is 4, since the code bit #26 which is not the last bit from among the code bits #25 to #30 is written into the last end of the used region of 6 bits, the remaining code bits #27 to #30 are written beginning with the top of the fourth column, that is, beginning with the top of the used region.

By carrying out column twist interleave of such writing, a plurality of code bits corresponding to a plurality of variable nodes connecting to the same check node can be prevented from being made one symbol (from being included into the same symbol). As a result, the performance in decoding in a communication path which suffers from an error such as erasure can be improved.

It is to be noted that, while data in the unused region are read out in the row direction in column twist interleave and form a symbol, they in a way become invalid data which are abandoned without being supplied from the deinterleaver 53 of the reception apparatus 12 (FIG. 29) to the LDPC decoding section 56.

If writing of some data is not carried out particularly into the unused region in column twist interleave, then the invalid data are undefined data.

However, into the unused region, 0 or 1 as predetermined data other than the code bits can be written.

FIG. 38 illustrates examples of a bit number of an unused region where the unused region appears, that is, the bit number of invalid data.

For example, where the code length N is 64,800 bits and the bit number m of one symbol is 14 bits (modulation method is 16kQAM) and besides the multiple b is 1 described hereinabove with reference to A of FIG. 36, an unused region appears.

In particular, in this instance, the column number mb of the memory 31 is 14, and the bit number B of one column is B=ceil(N/(mb)) is 4,629 bits. Further, the storage capacity mb×B of the memory 31 is 64,806 bits, and the bit number mb×B−N of the invalid data is 6 bits. It is to be noted that the bit number of the used region of the 14th (=mbth) column, that is, the bit number of code bits written into the 14th (=mbth) column (such code bits are hereinafter referred to also as valid data), is 4,623 (=4,629−6) bits.

Further, for example, where the code length N is 64,800 bits and the bit number m of one symbol is 14 bits (modulation method is 16kQAM) and besides the multiple b is 2 described hereinabove with reference to A of FIG. 36, an unused region appears.

In particular, in this instance, the column number mb of the memory 31 is 28, and the bit number B of one column is B=ceil(N/(mb)) is 2,315 bits. Further, the storage capacity mb×B of the memory 31 is 64,820 bits, and the bit number mb×B−N of the invalid data is 20 bits. It is to be noted that the bit number of the valid data of the 28th (=mbth) column is 2,295 (=2,315−20) bits.

Further, for example, where the code length N is 16,200 bits and the bit number m of one symbol is 14 bits (modulation method is 16kQAM) and besides the multiple b is 1 described hereinabove with reference to B of FIG. 36, an unused region appears.

In particular, in this instance, the column number mb of the memory 31 is 14, and the bit number B of one column is B=ceil(N/(mb)) is 1,158 bits. Further, the storage capacity mb×B of the memory 31 is 16,212 bits, and the bit number mb×B−N of the invalid data is 12 bits. It is to be noted that the bit number of the valid data of the 14th (=mbth) column is 1,146 (=1,158−12) bits.

Further, for example, where the code length N is 16,200 bits and the bit number m of one symbol is 14 bits (modulation method is 16kQAM) and besides the multiple b is 2 described hereinabove with reference to B of FIG. 36, an unused region appears.

In particular, in this instance, the column number mb of the memory 31 is 28, and the bit number B of one column is B=ceil(N/(mb)) is 579 bits. Further, the storage capacity mb×B of the memory 31 is 16,212 bits, and the bit number mb×B−N of the invalid data is 12 bits. It is to be noted that the bit number of the valid data of the 28th (=mbth) column is 567 (=579−12) bits.

Further, for example, where the code length N is 16,200 bits and the bit number m of one symbol is 16 bits (modulation method is 64kQAM) and besides the multiple b is 1 described hereinabove with reference to D of FIG. 36, an unused region appears.

In particular, in this instance, the column number mb of the memory 31 is 16, and the bit number B of one column is B=ceil(N/(mb)) is 1,013 bits. Further, the storage capacity mb×B of the memory 31 is 16,208 bits, and the bit number mb×B−N of the invalid data is 8 bits. It is to be noted that the bit number of the valid data of the 16th (=mbth) column is 1,005 (=1,013−8) bits.

Further, for example, where the code length N is 16,200 bits and the bit number m of one symbol is 16 bits (modulation method is 64kQAM) and besides the multiple b is 2 described hereinabove with reference to D of FIG. 36, an unused region appears.

In particular, in this instance, the column number mb of the memory 31 is 32, and the bit number B of one column is B=ceil(N/(mb)) is 507 bits. Further, the storage capacity mb×B of the memory 31 is 16,224 bits, and the bit number mb×B−N of the invalid data is 24 bits. It is to be noted that the bit number of the valid data of the 32nd (=mbth) column is 483 (=507−24) bits.

Figure 39:
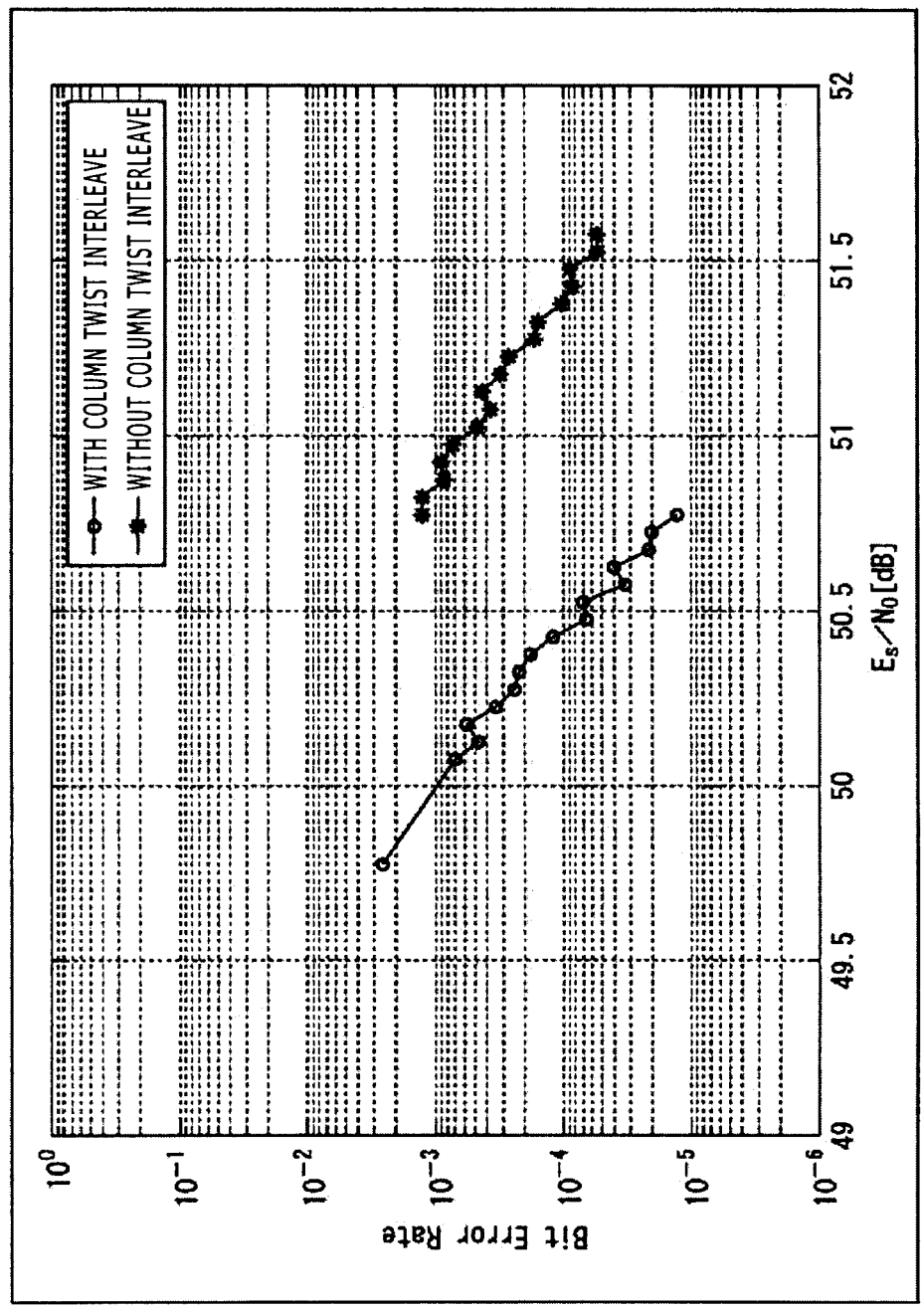
FIG. 39 is a view illustrating an error rate obtained by the simulation.

FIG. 39 illustrates results of a simulation of measuring the BER (Bit Error Rate) in a case wherein column twist interleave is carried out and another case wherein column twist interleave is not carried out.

Referring to FIG. 39, the axis of abscissa indicates $E_s/N_0$ (signal power to noise power ratio per one symbol) and the axis of ordinate indicates the BER.

Further, in FIG. 39, a round mark represents the BER where column twist interleave is carried out and a star mark (asterisk) represents the BER where column twist interleave is not carried out.

From FIG. 39, it can be confirmed that the BER is improved by the column twist interleave, that is, the tolerance to errors is improved.

It is to be noted that, in the simulation, an LDPC code having a code length N of 64,800 bits and an encoding rate of 3/4 was used and 64kQAM was adopted as the modulation method.

Further, in the simulation, not only where the column twist interleave was carried out but also where the column twist interleave was not carried out, parity interleave was carried out.

Further, in the simulation, as a channel (communication line 13 (FIG. 7)), a channel having Rayleigh fading, erasure and AWGN was assumed.

Now, if a symbol (transmission symbol) to be transmitted at time t is represented by x(t) and a symbol (reception symbol) received when the symbol is transmitted through the channel is represented by y(t), then the channel assumed in the simulation (relationship between the transmission symbol x(t) and the reception channel y(t)) is represented by the following expression.

$$y(t)=e(t)c(t)x(t)+w(t) \tag{10}$$

Here, in the expression (10), c(t) represents a probability process as Rayleigh fading. Now, if a complex Gaussian distribution having a mean value of M and a variance of V is represented by CN(M,V), then in the simulation, CN(0,1) was adopted as c(t).

Further, in the expression (10), e(t) represents the loss of the symbol by erasure. In the simulation, a fixed value of 0.05 was adopted as the disappearance probability K in which a symbol disappears, a fixed value of 0.05 was adopted. e(t) exhibits the value 0 in the disappearance probability K and exhibits a value $1/(\sqrt{}/(1-K))$ in the probability of 1−K. Here, the reason why e(t) does not have the value 1 but has the value $1/(\sqrt{(1-K)})$ in the probability of 1−K is that it is intended to normalize the average power of the reception symbol y(t) to 1.

Further, in the expression (10), w(t) represents a probability process as AWGN. In the simulation, $CN(0,\sigma^2)$ was adopted as w(t). By varying the variance $\sigma^2$ which defines w(t), $E_s/N_0$ indicated as the axis of abscissa in FIG. 39 varies.

While the series of processes described above can be executed by hardware, it may otherwise be executed by software. Where the series of processes is executed by software, a program which constructs the software is installed into a computer for universal use or the like.

Figure 40:
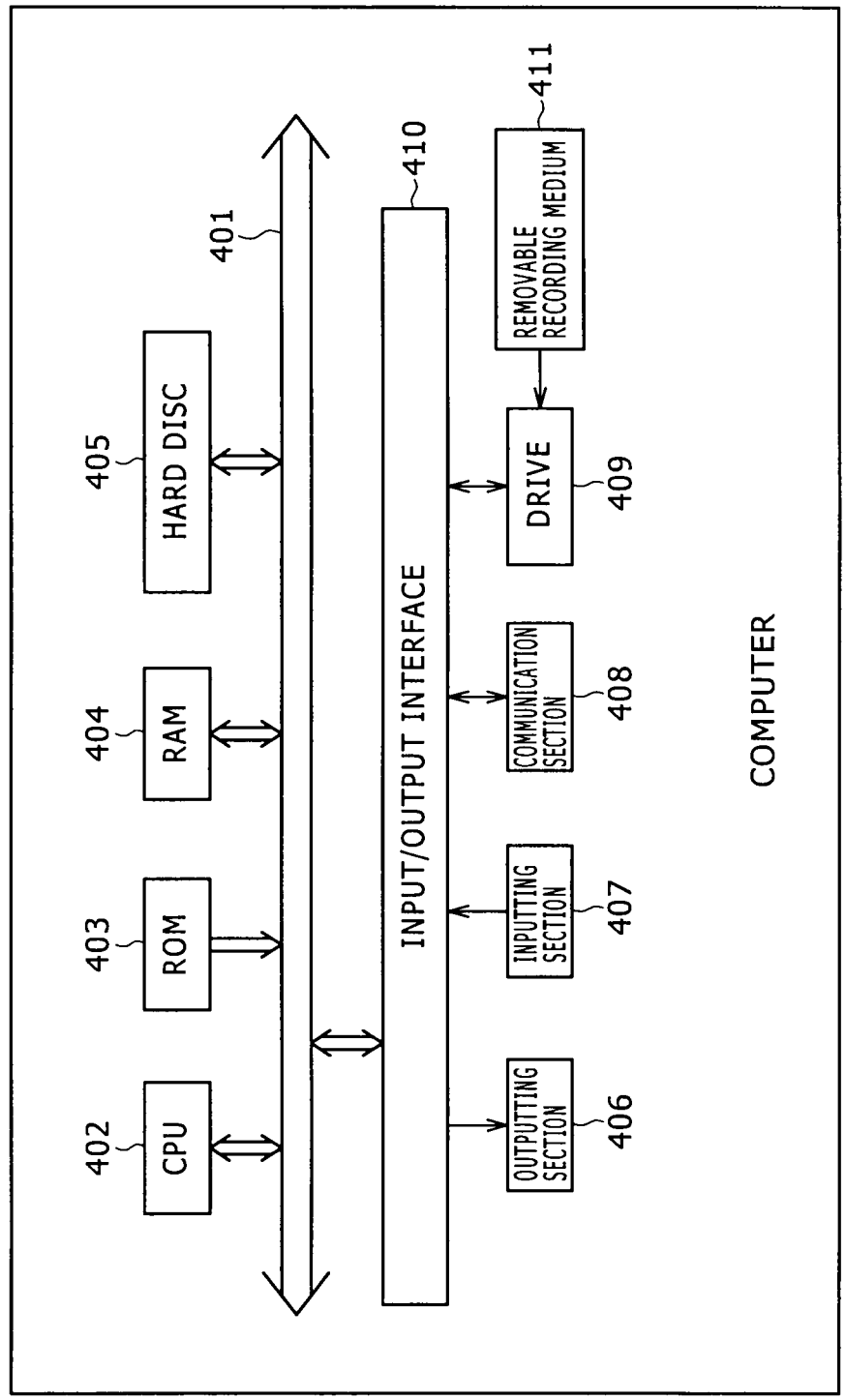
FIG. 40 is a block diagram showing an example of a configuration of an embodiment of a computer to which the present invention is applied.

FIG. 40 shows an example of a configuration of an embodiment of a computer into which a program for executing the series of processes described hereinabove is installed.

The program can be recorded in advance on a hard disk 405 or in a ROM 403 as a recording medium built in the computer.

Or, the program can be stored (recorded) temporarily or permanently on or in a removable recording medium 411 such as a flexible disk, a CD-ROM (Compact Disc Read Only Memory), an MO (Magneto Optical) disc, a DVD (Digital Versatile Disc), a magnetic disc or a semiconductor memory. Such a removable recording medium 411 as just described can be provided as so-called package software.

It is to be noted that the program not only can be installed from such a removable recording medium 411 as described above into the computer but also can be installed into the hard disk 405 built in the computer where it is transferred thereto and received by a communication section 408. In this instance, the program may be transferred to the computer by wireless communication from a download site through an artificial satellite for digital satellite broadcasting or transferred to the computer by wire communication through a network such as a LAN (Local Area Network) or the Internet.

The computer has a CPU (Central Processing Unit) 402 built therein. An input/output interface 410 is connected to the CPU 402 by a bus 401, and if an instruction is inputted to the CPU 402 through the input/output interface 410 when an inputting section 407 configured from a keyboard, a mouse, a microphone and so forth is operated by a user or in a like case, the CPU 402 executes the program stored in the ROM (Read Only Memory) 403. Or, the CPU 402 loads a program stored on the hard disk 405, a program transferred from a satellite or a network, received by the communication section 408 and installed in the hard disk 405 or a program read out from the removable recording medium 411 loaded in a drive 409 and installed in the hard disk 405 into a RAM (Random Access Memory) 404 and executes the program. Consequently, the CPU 402 carries out processing in accordance with the flow chart described hereinabove or processing carried out by the configuration of the block diagram described hereinabove. Then, the CPU 402 outputs a result of the processing from an outputting section 406 configured from an LCD (Liquid Crystal Display), a speaker and so forth and transmits the processing result from the communication section 408 through the input/output interface 410 or records the processing result on the hard disk 405 as occasion demands.

Here, in the present specification, processing steps which describe the program for causing the computer to carry out various processes need not necessarily be processed in a time series in accordance with the order described as a flow chart but include those processes to be executed in parallel or individually (for example, parallel processes or processes by an object).

Further, the program may be processed by a single computer or may be processed by distributed processing by a plurality of computers. Further, the program may be transferred to and executed by a computer at a remote place.

It is to be noted that the embodiment of the present invention is not limited to the specific embodiment described hereinabove but may be altered in various manners without departing from the subject matter of the present invention.

In particular, while, in the present embodiment, parity interleave and column twist interleave as a re-arrangement process are carried out for an LDPC code prescribed in DVB-S.2, the parity interleave can be applied to an LDPC code of a parity check matrix whose information matrix does not have a cyclic structure if the parity matrix has a staircase structure. Meanwhile, the column twist interleave as the re-arrangement process can be applied also to the LDPC code of a parity check matrix which can be varied so as to have a pseudo cyclic structure at least by column replacement, the QC-LDPC code (QC: Quasi-Cyclic) and so forth where the entire parity check matrix has a cyclic structure.

In particular, only it is required for the parity check matrix of LDPC codes which are made an object of parity interleave that the parity matrix thereof has a staircase structure while there is no necessity that the information matrix has a cyclic structure.

Further, the parity check matrix of an LDPC code which is made an object of column twist interleave as the re-arrangement process is not limited particularly in terms of the structure.

It is to be noted that only it is necessary for the re-arrangement process that it can re-arrange code bits of an LDPC code such that a plurality of code bits corresponding to the value 1 included in one arbitrary row of the parity check matrix are not included in the same symbol and can be carried out by a method other than the column twist interleave. In particular, the re-arrangement process may be carried out by using not the memory 31 for storing data in the column direction and the row direction but, for example, a memory for storing data only in one direction and controlling the write address and the read address of the memory.

Now, a process for LDPC encoding by the LDPC encoding section 21 of the transmission apparatus 11 is described further.

For example, in the DVB-S.2 standard, LDPC encoding of the two different code lengths N of 64,800 bits and 16,200 bits are prescribed.

And, for the LDPC code whose code length N is 64,800 bits, the 11 encoding rates 1/4, 1/3, 2/5, 1/2, 3/5, 2/3, 3/4, 4/5, 5/6, 8/9 and 9/10 are prescribed, and for the LDPC code whose code length N is 16,200 bits, the 10 encoding rates 1/4, 1/3, 2/5, 1/2, 3/5, 2/3, 3/4, 4/5, 5/6 and 8/9 are prescribed.

The LDPC encoding section 21 carries out encoding (error correction encoding) into LDPC codes of the different encoding rates whose code length N is 64,800 bits or 16,200 bits in accordance with a parity check matrix H prepared for each code length N and for each encoding rate.

In particular, the LDPC encoding section 21 stores a parity check matrix initial value table hereinafter described for producing a parity check matrix H for each code length N and for each encoding rate.

Here, in the DVB-S.2 standard, LDPC codes of the two different code lengths N of 64,800 bits and 16,200 bits are prescribed as described hereinabove, and the 11 different encoding rates are prescribed for the LDPC code whose code length N is 64,800 bits and the 10 different encoding rates are prescribed for the LDPC code whose code length N is 16,200 bits.

Accordingly, where the transmission apparatus 11 is an apparatus which carries out processing in compliance with the DVB-S.2 standard, parity check matrix initial value tables individually corresponding to the 11 different encoding rates for the LDPC code whose code length N is 64,800 bits and parity check matrix initial value tables individually corresponding to the 10 different encoding rates for the LDPC code whose code length N is 16,200 bits are stored in the LDPC encoding section 21.

The LDPC encoding section 21 sets a code length N and an encoding rate r for LDPC codes, for example, in response to an operation of an operator. The code length N and the encoding rate r set by the LDPC encoding section 21 are hereinafter referred to suitably as set code length N and set encoding rate r, respectively.

The LDPC encoding section 21 places, based on the parity check matrix initial value tables corresponding to the set code length N and the set encoding rate r, elements of the value 1 of an information matrix $H_A$ corresponding to an information length K (=Nr=code length N−parity length M) corresponding to the set code length N and the set encoding rate r in a period of 360 columns (unit column number P of the cyclic structure) in the column direction to produce a parity check matrix H.

Then, the LDPC encoding section 21 extracts information bits for the information length K from object data which are an object of transmission such as image data or sound data supplied from the transmission apparatus 11. Further, the LDPC encoding section 21 calculates parity bits corresponding to the information bits based on the parity check matrix H to produce a codeword (LDPC code) for one code length.

In other words, the LDPC encoding section 21 successively carries out mathematical operation of a parity bit of the codeword c which satisfies the following expression.

$$Hc^T 0$$

Here, in the expression above, c indicates a row vector as the codeword (LDPC code), and $c^T$ indicates inversion of the row vector c.

Where, from within the row vector c as an LDPC code (one codeword), a portion corresponding to the information bits is represented by a row vector A and a portion corresponding to the parity bits is represented by a row vector T, the row vector c can be represented by an expression c=[A|T] from the row vector A as the information bits and the row vector T as the parity bits.

Meanwhile, the parity check matrix H can be represented, from the information matrix $H_A$ of those of the code bits of the LDPC code which correspond to the information bits and the parity matrix $H_T$ of those of the code bits of the LDPC code which correspond to the parity bits by an expression H=[$H_A$|$H_T$] (matrix wherein the elements of the information matrix $H_A$ are elements on the left side and the elements of the parity matrix $H_T$ are elements on the right side).

Further, for example, in the DVB-S.2 standard, the parity check matrix $H_T$ of the parity check matrix $H=[H_A|H_T]$ has a staircase structure.

It is necessary for the parity check matrix H and the row vector c=[A|T] as an LDPC code to satisfy the expression $Hc^T=0$, and where the parity matrix $H_T$ of the parity check matrix $H=[H_A|H_T]$ has a staircase structure, the row vector T as parity bits which configures the row vector c=[A|T] which satisfies the expression $Hc^T=0$ can be determined sequentially by setting the elements of each row to zero in order beginning with the elements in the first row of the column vector $Hc^T$ in the expression $Hc^T=0$.

If the LDPC encoding section 21 determines a parity bit T for an information bit A, then it outputs a codeword c=[A|T] represented by the information bit A and the parity bit T as an LDPC encoding result of the information bit A.

As described above, the LDPC encoding section 21 stores the parity check matrix initial value tables corresponding to the code lengths N and the encoding rates r in advance therein and carries out LDPC encoding of the set code length N and the set encoding rate r using a parity check matrix H produced from the parity check matrix initial value tables corresponding to the set code length N and the set encoding rate r.

Each parity check matrix initial value table is a table which represents the position of elements of the value 1 of the information matrix $H_A$ corresponding to the information length K corresponding to the code length N and the encoding rate r of the LDPC code of the parity check matrix H (LDPC code defined by the parity check matrix H) for every 360 rows (unit column number P of the periodic structure), and is produced in advance for a parity check matrix H for each code length N and each encoding rate r.

FIGS. 41 to 86 illustrate the parity check matrix initial value tables for producing various parity check matrices H including parity check matrix initial value tables prescribed in the DVB-S.2 standard.

In particular, FIG. 41 shows the parity check matrix initial value table for a parity check matrix H prescribed in the DVB-S.2 standard and having a code length N of 16,200 bits and an encoding rate r of 2/3.

Figure 42:
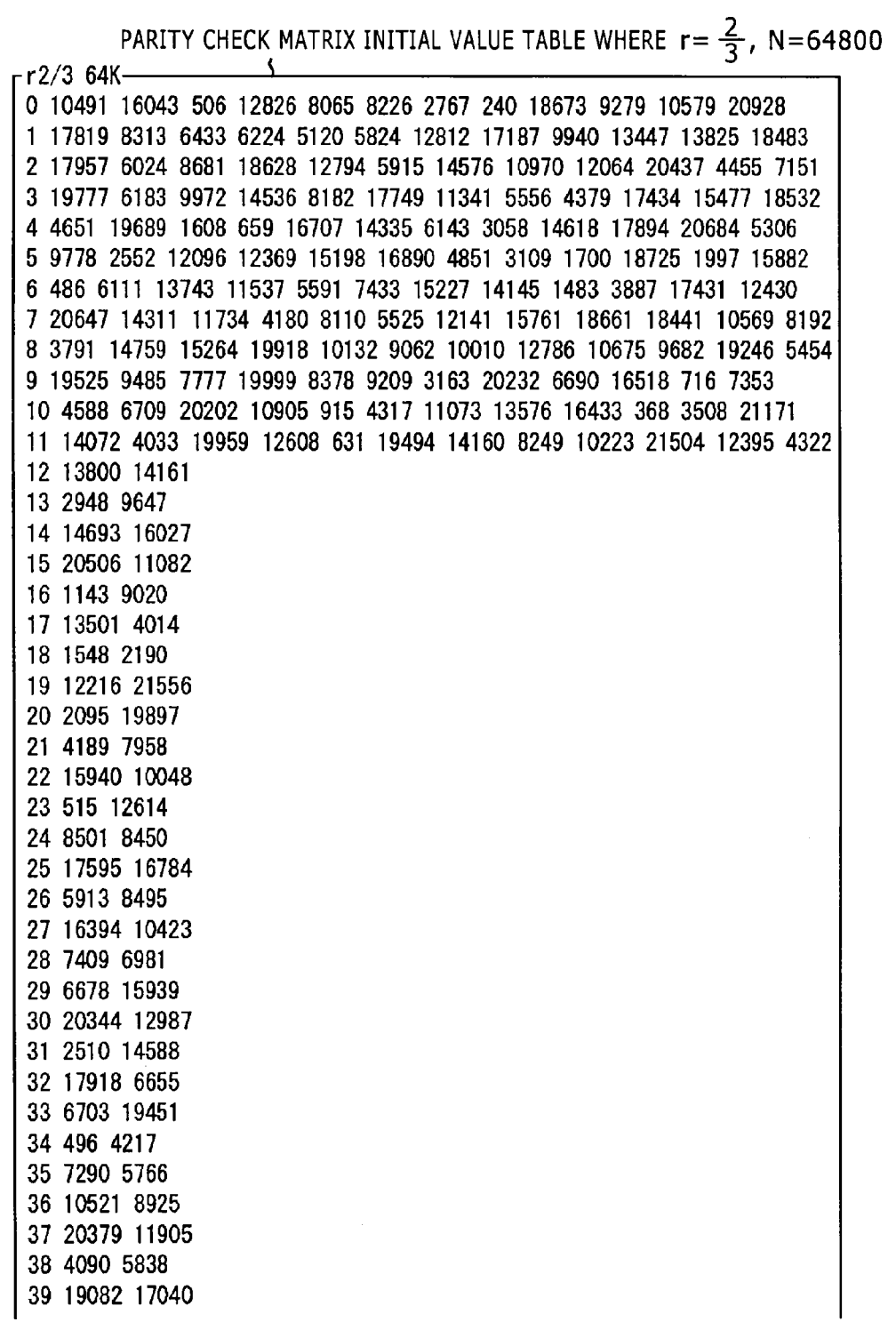
Figure 43:
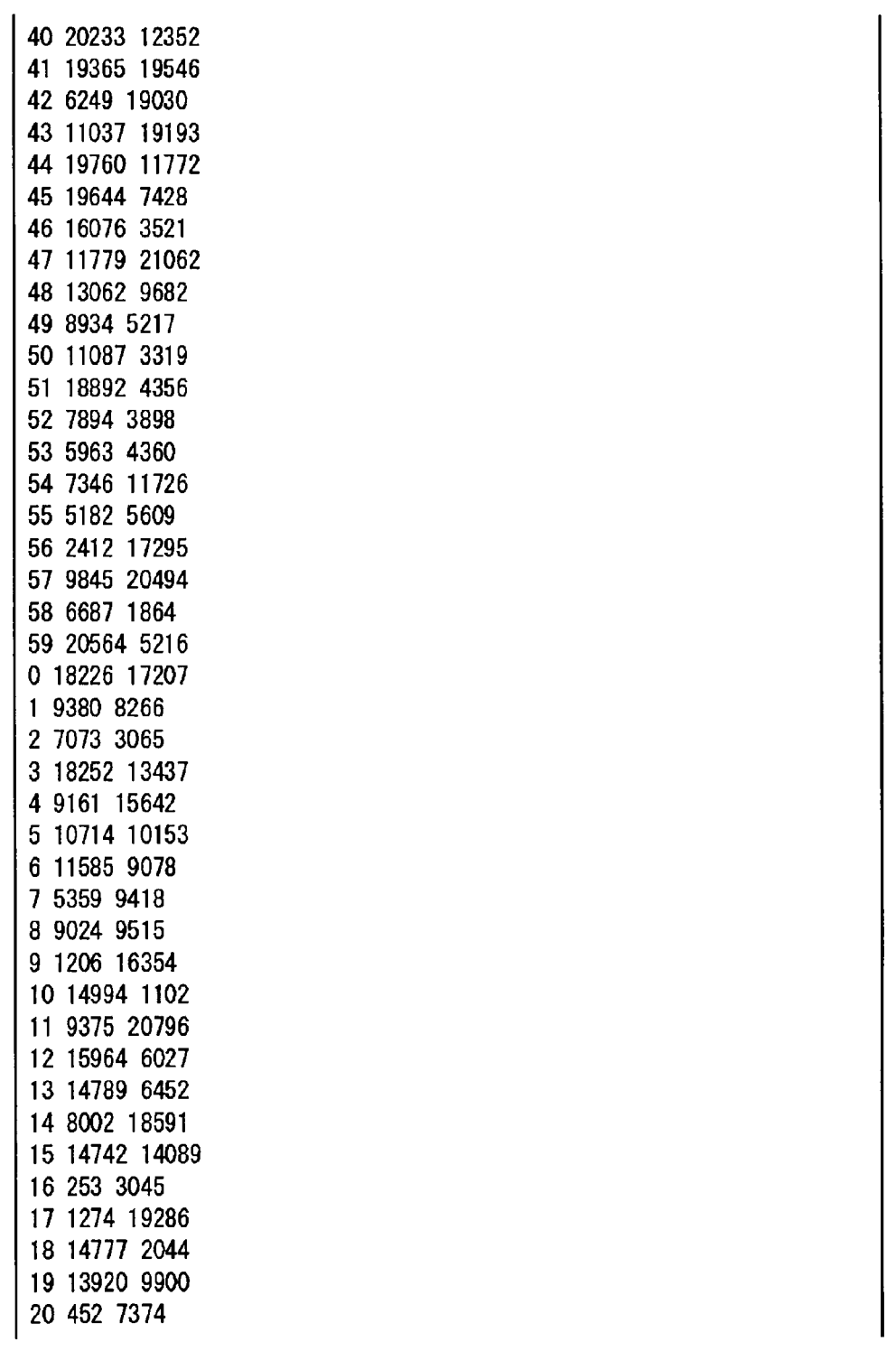
Figure 44:
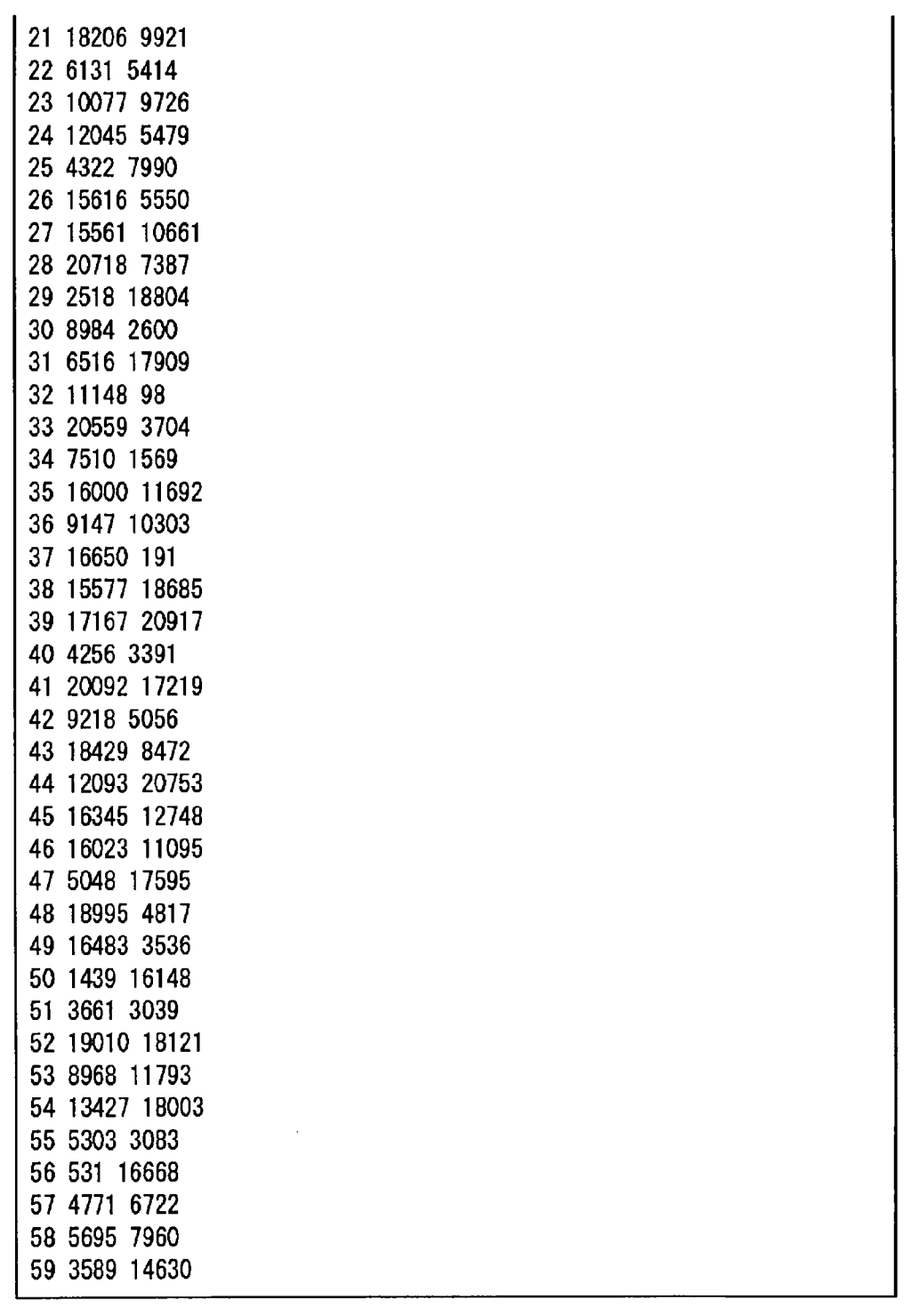

FIGS. 42 to 44 show the parity check matrix initial value table for a parity check matrix H prescribed in the DVB-S.2 standard and having a code length N of 64,800 bits and an encoding rate r of 2/3.

It is to be noted that FIG. 43 is a view continuing from FIG. 42 and FIG. 44 is a view continuing from FIG. 43.

Figure 45:
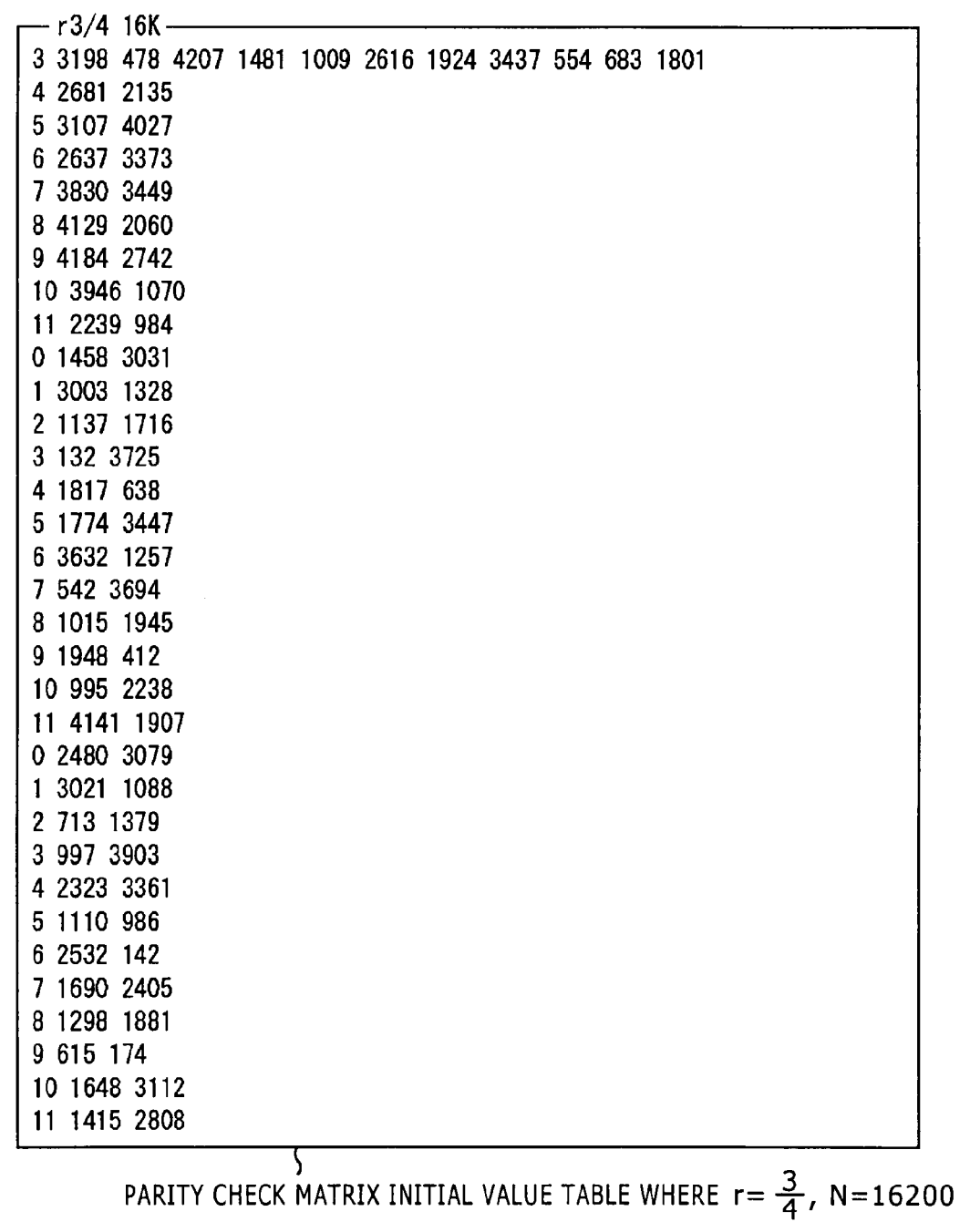

FIG. 45 shows the parity check matrix initial value table for a parity check matrix H prescribed in the DVB-S.2 standard and having a code length N of 16,200 bits and an encoding rate r of 3/4.

FIGS. 46 to 49 show the parity check matrix initial value table for a parity check matrix H prescribed in the DVB-S.2 standard and having a code length N of 64,800 bits and an encoding rate r of 3/4.

Figure 46:
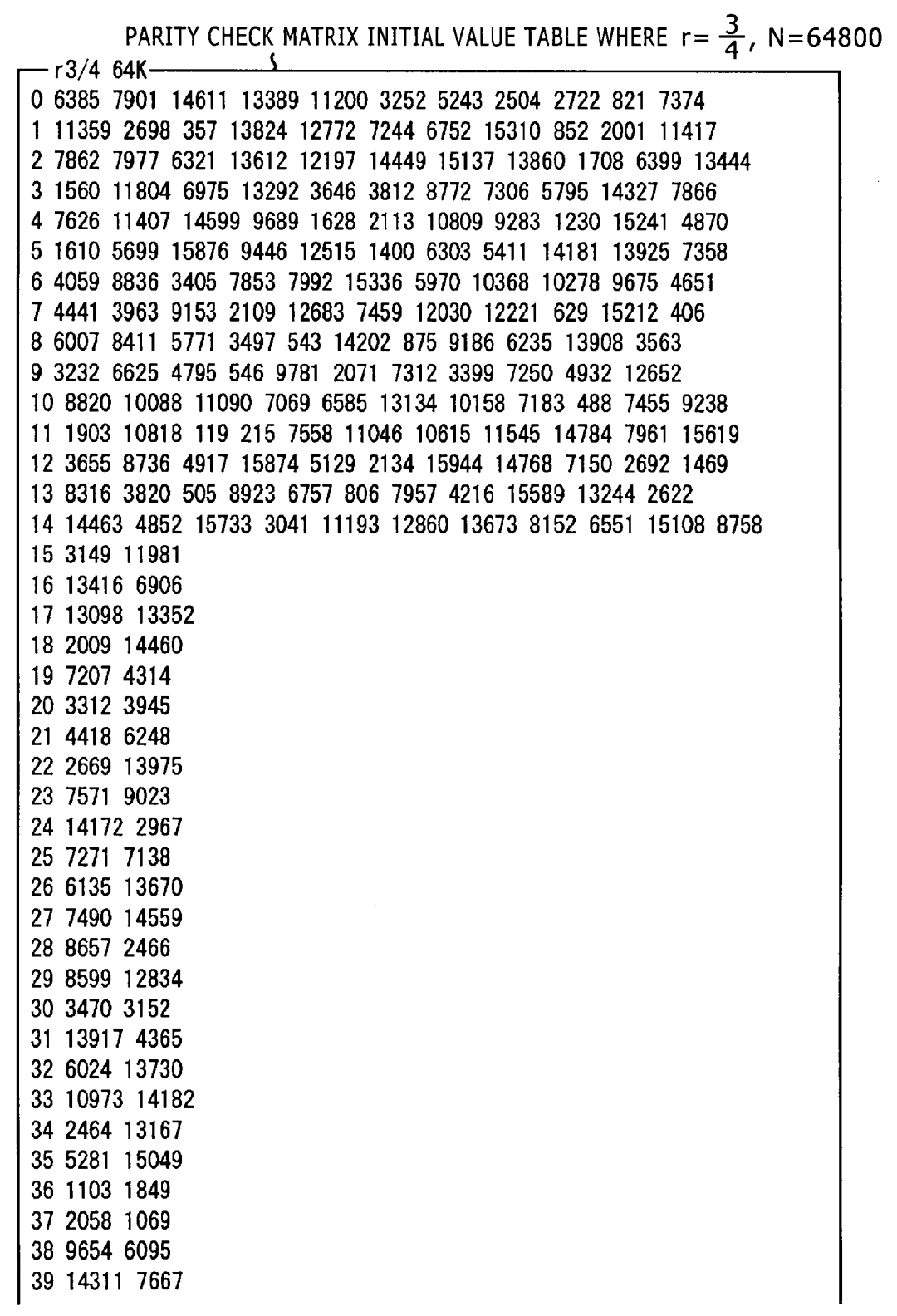
Figure 47:
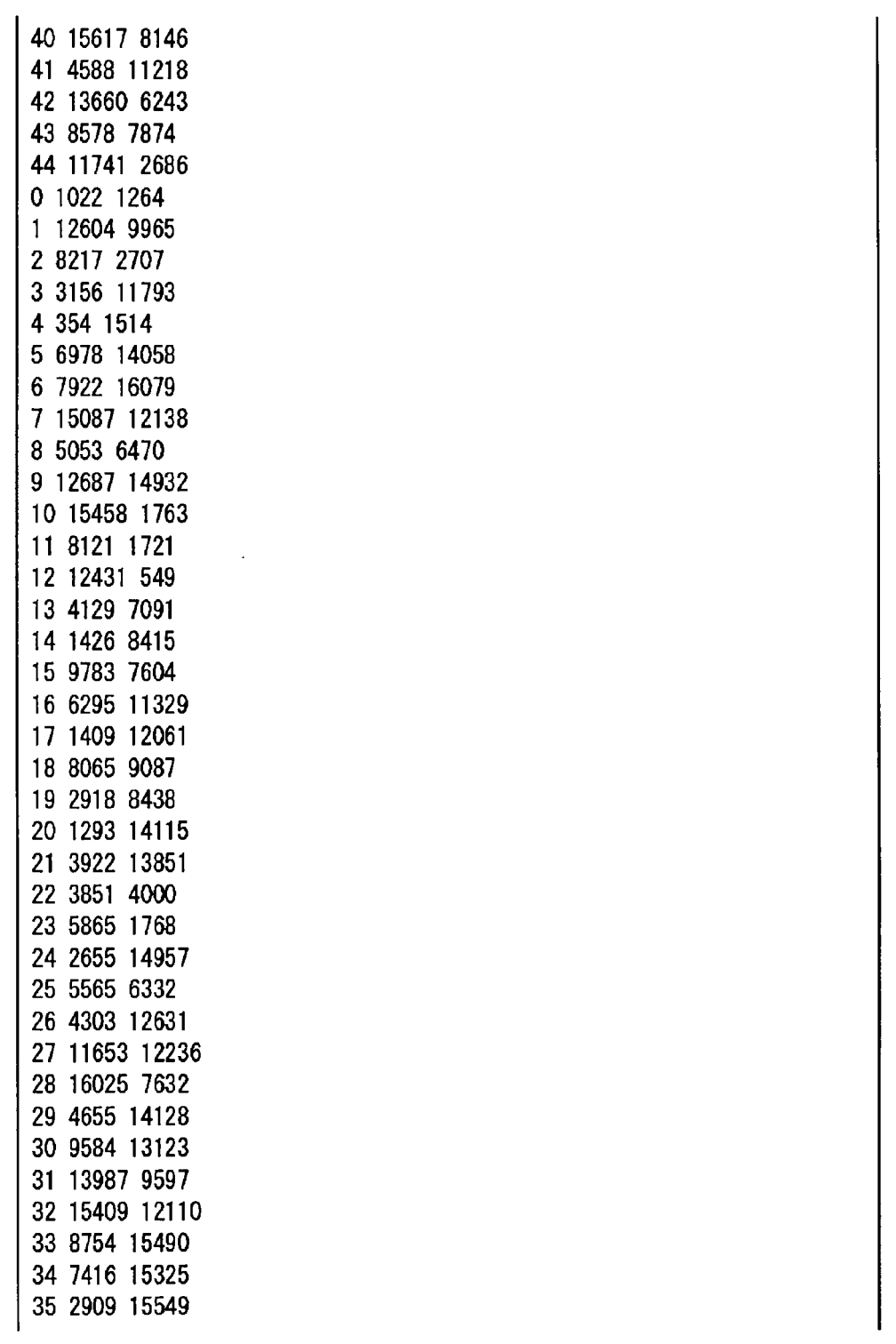
Figure 48:
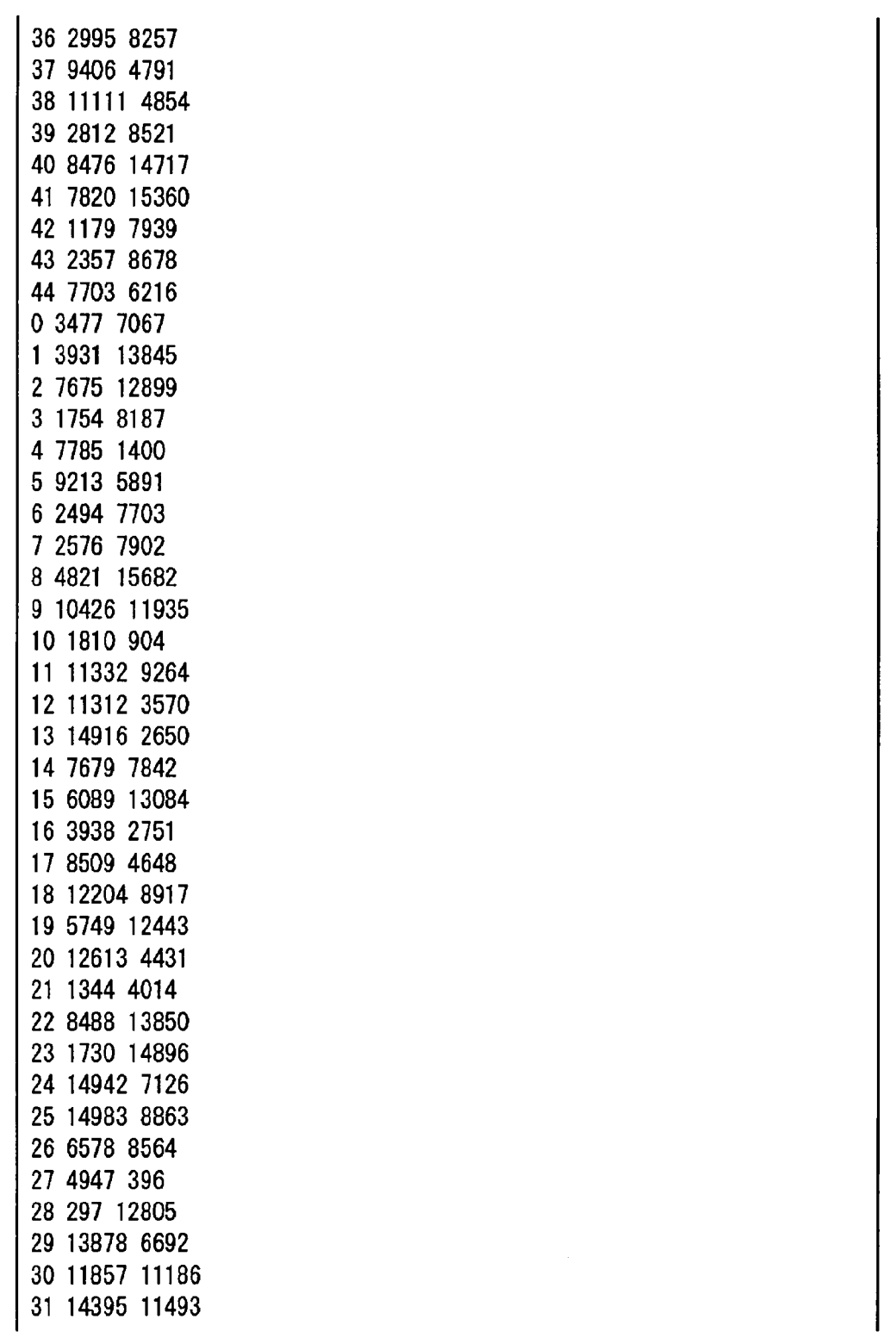
Figure 49:
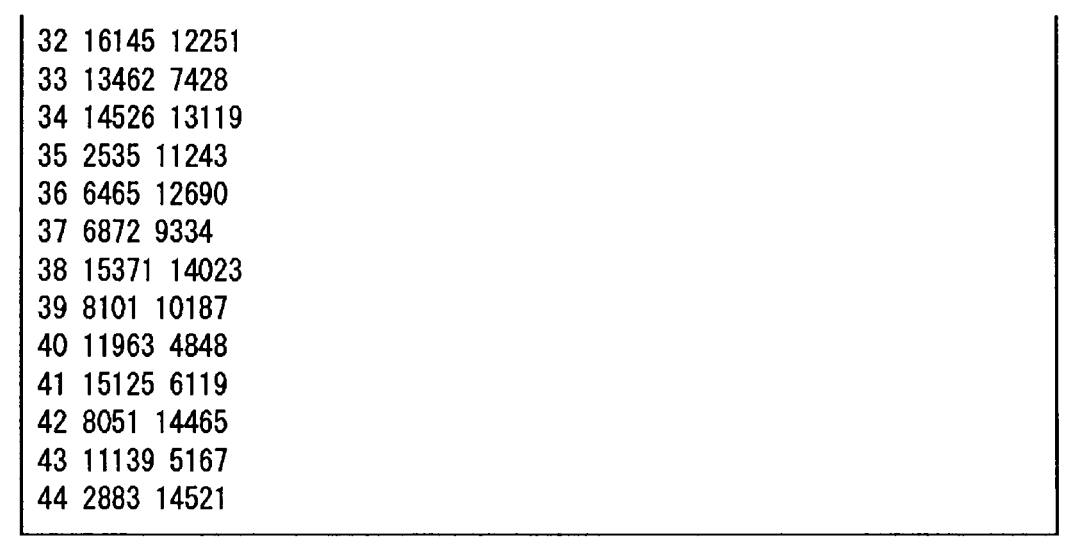

It is to be noted that FIG. 47 is a view continuing from FIG. 46 and FIG. 48 is a view continuing from FIG. 47. Further, FIG. 49 is a view continuing from FIG. 48.

Figure 50:
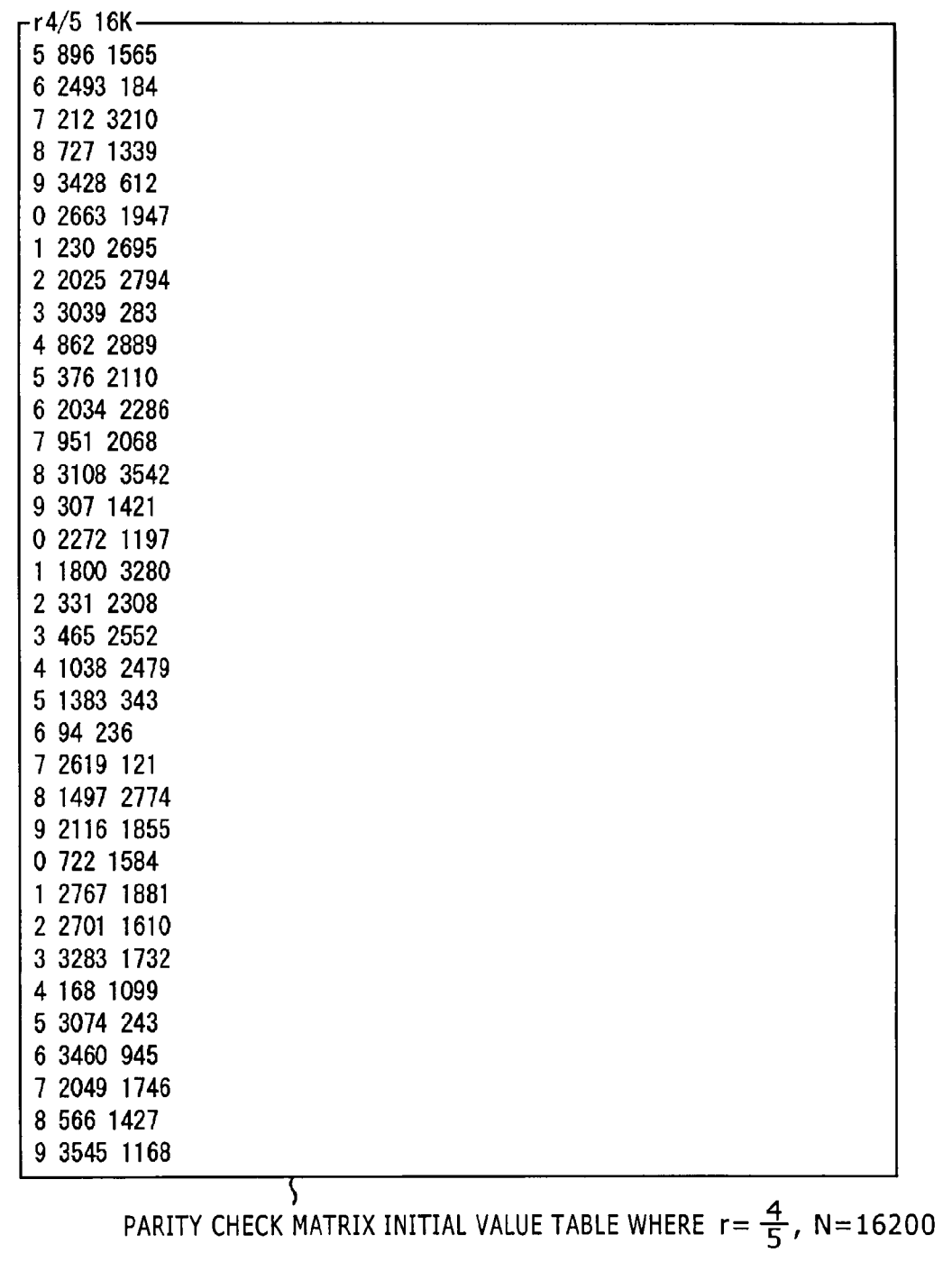

FIG. 50 shows the parity check matrix initial value table for a parity check matrix H prescribed in the DVB-S.2 standard and having a code length N of 16,200 bits and an encoding rate r of 4/5.

FIGS. 51 to 54 show the parity check matrix initial value table for a parity check matrix H prescribed in the DVB-S.2 standard and having a code length N of 64,800 bits and an encoding rate r of 4/5.

Figure 51:
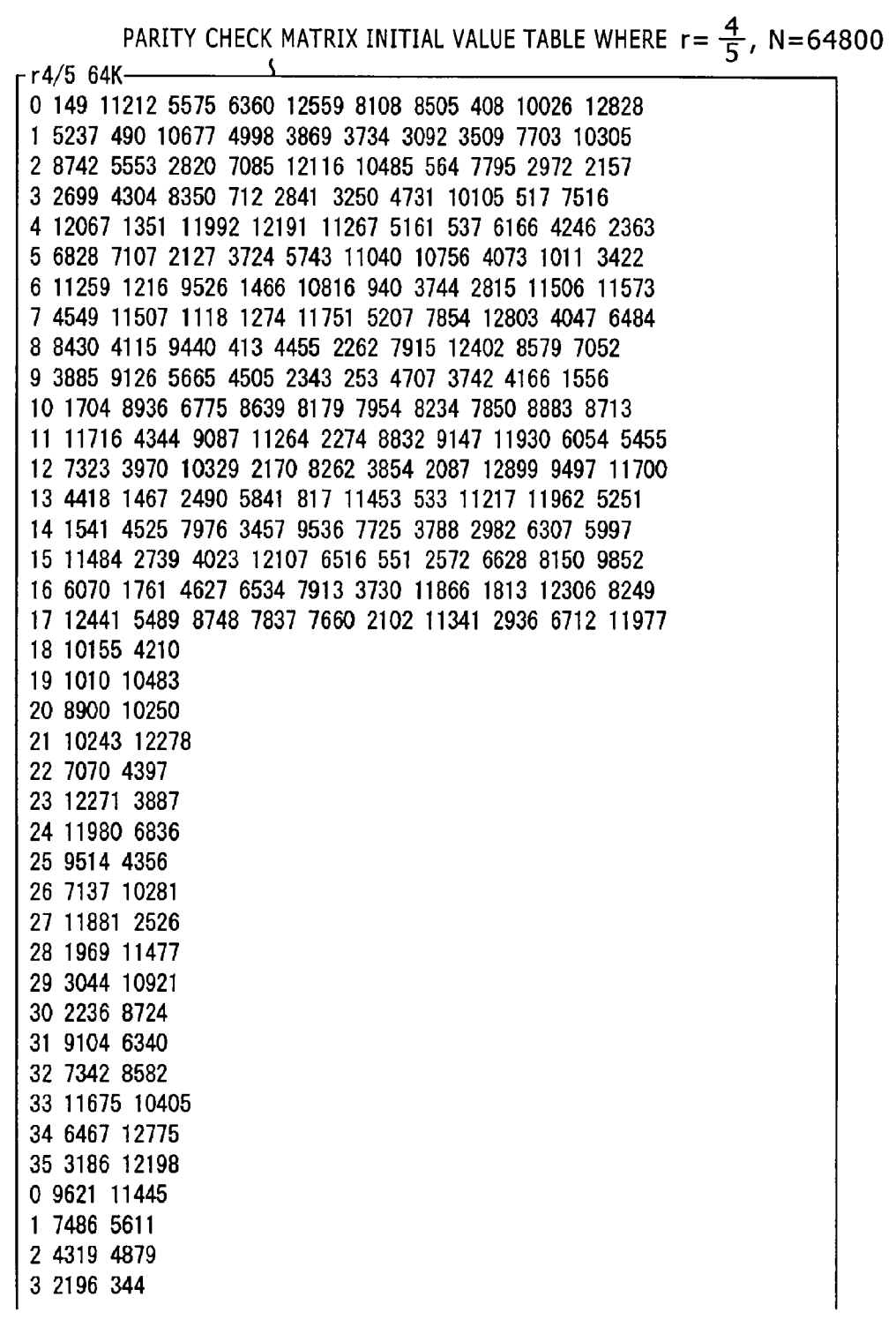
Figure 52:
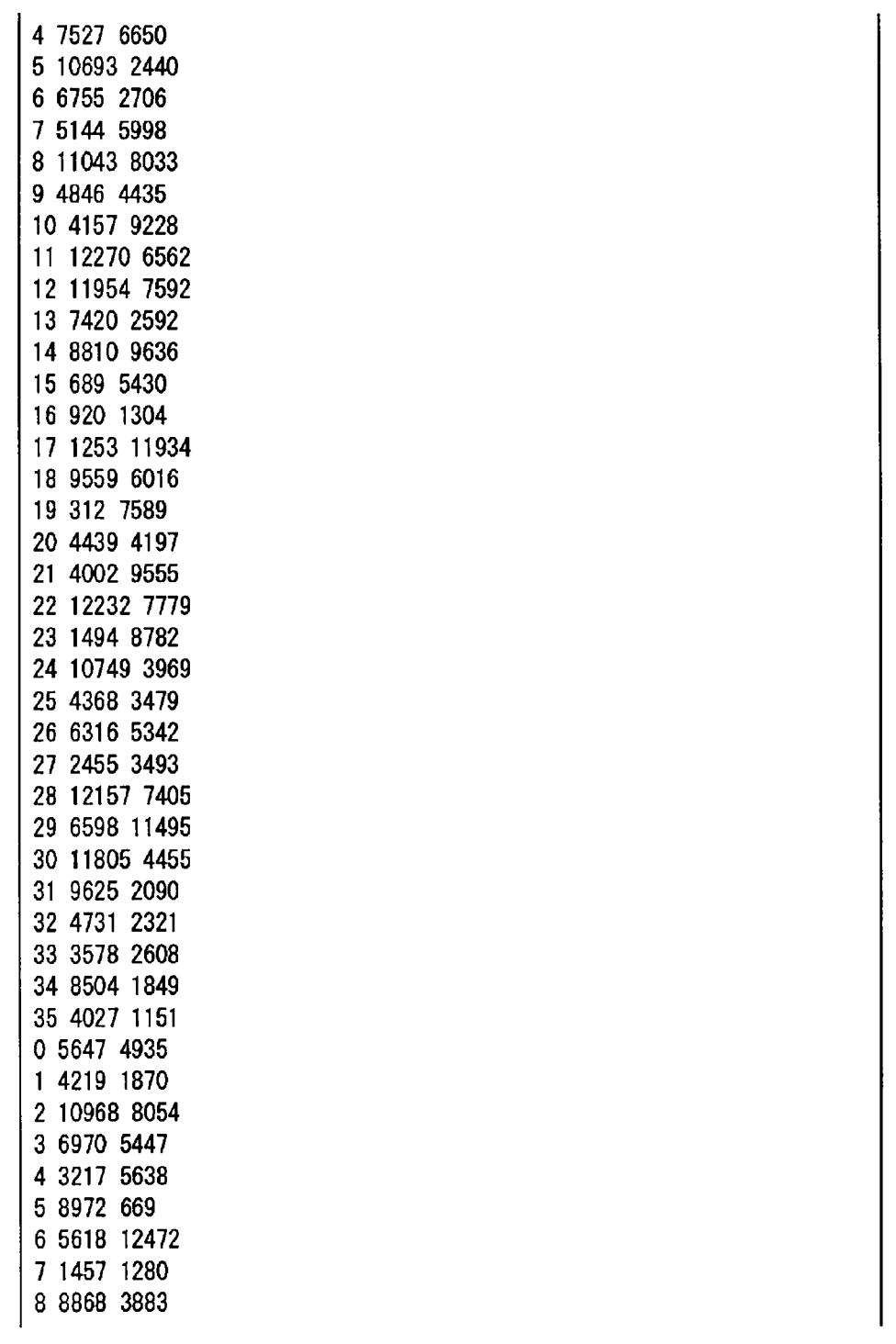
Figure 53:
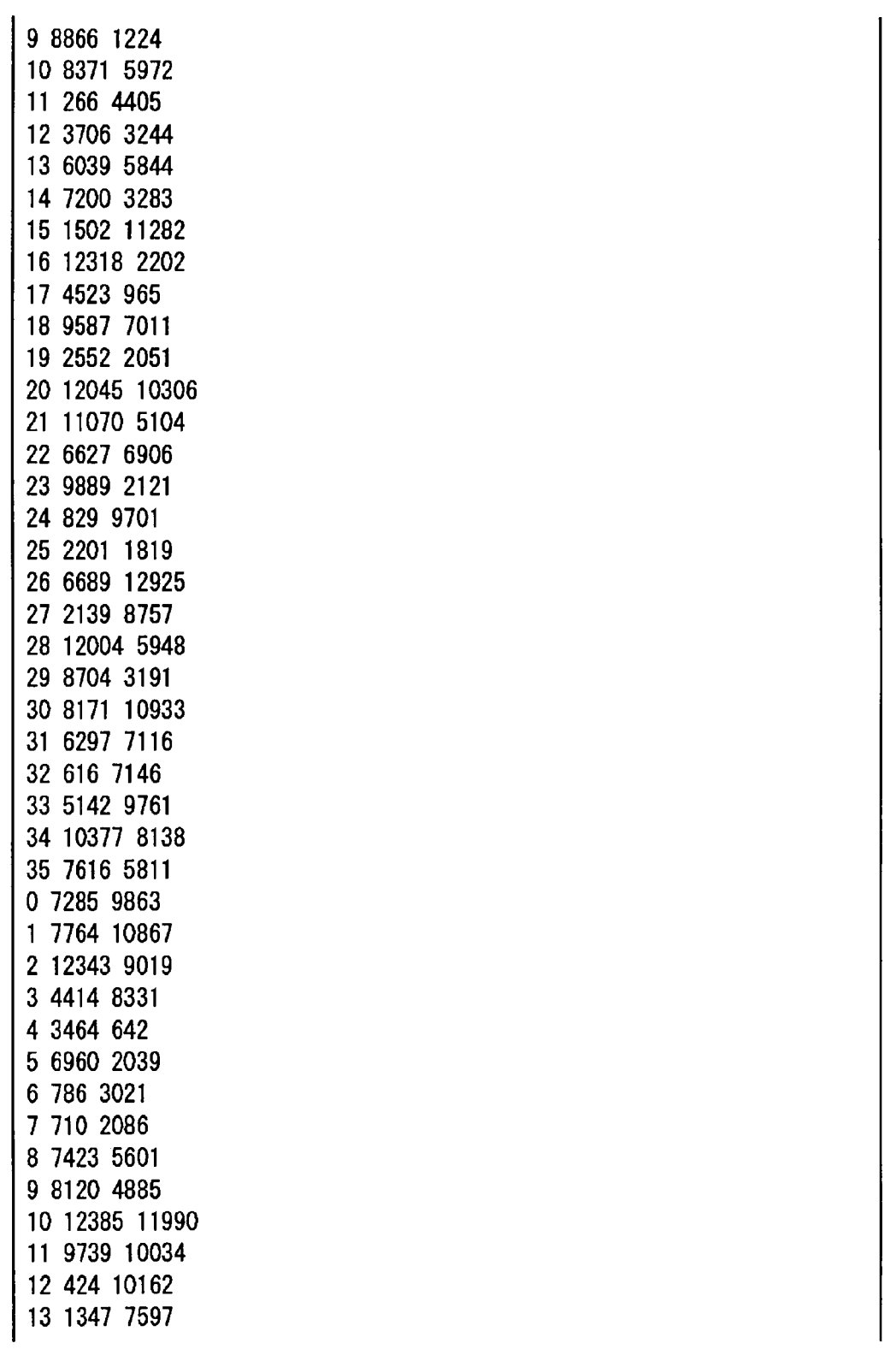
Figure 54:
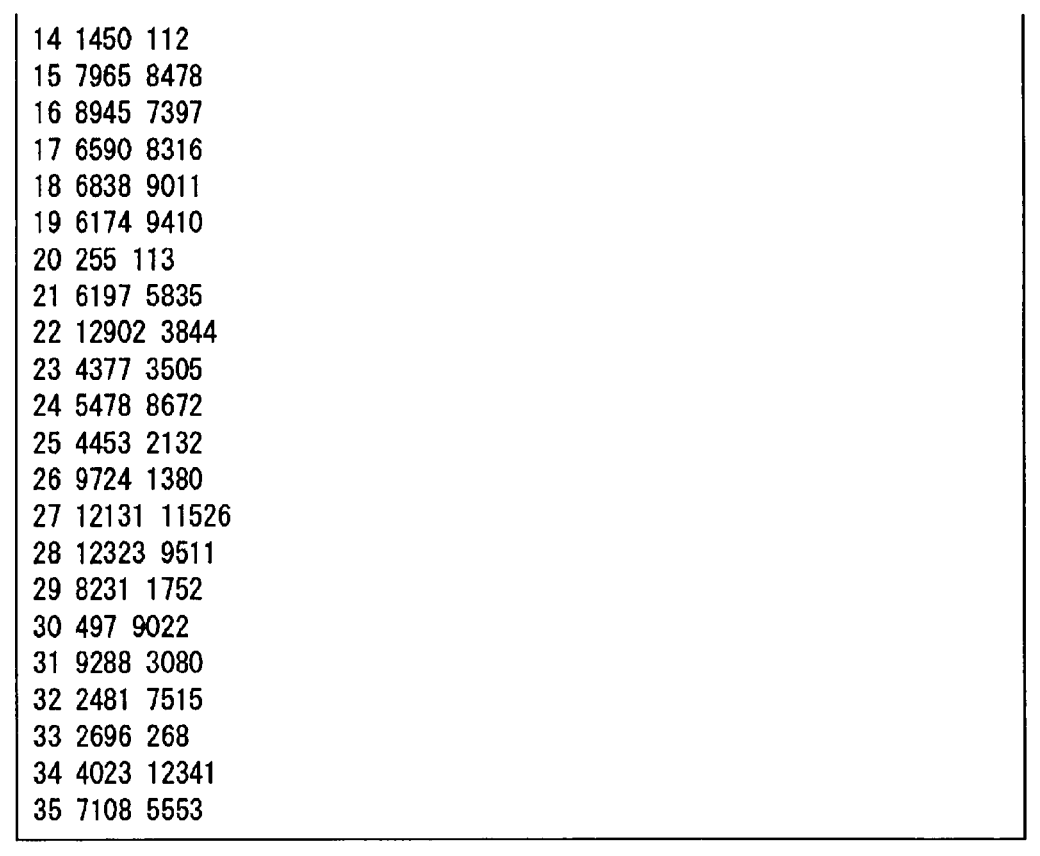

It is to be noted that FIG. 52 is a view continuing from FIG. 51 and FIG. 53 is a view continuing from FIG. 52. Further, FIG. 54 is a view continuing from FIG. 53.

Figure 55:
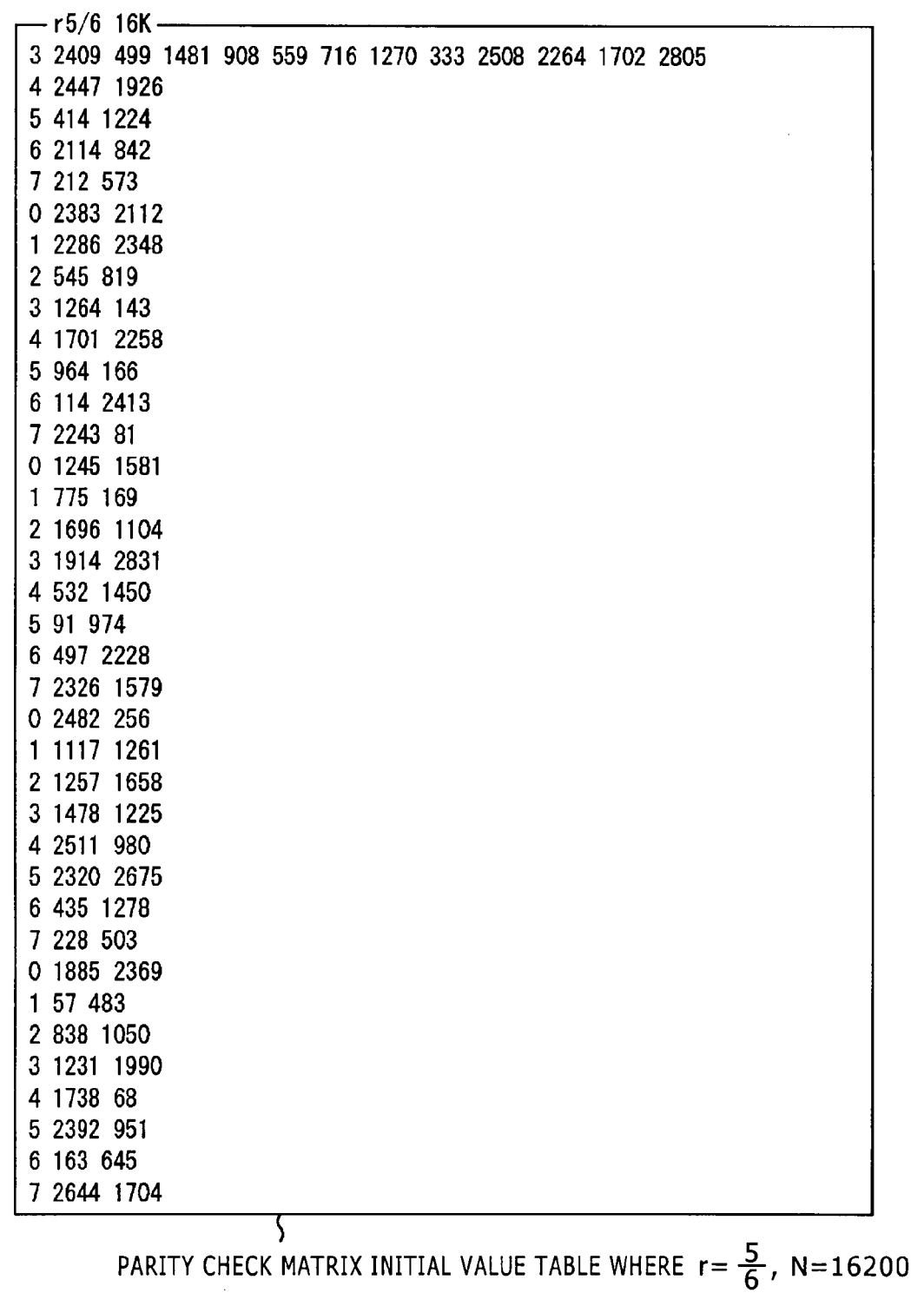

FIG. 55 shows the parity check matrix initial value table for a parity check matrix H prescribed in the DVB-S.2 standard and having a code length N of 16,200 bits and an encoding rate r of 5/6.

FIGS. 56 to 59 show the parity check matrix initial value table for a parity check matrix H prescribed in the DVB-S.2 standard and having a code length N of 64,800 bits and an encoding rate r of 5/6.

Figure 56:
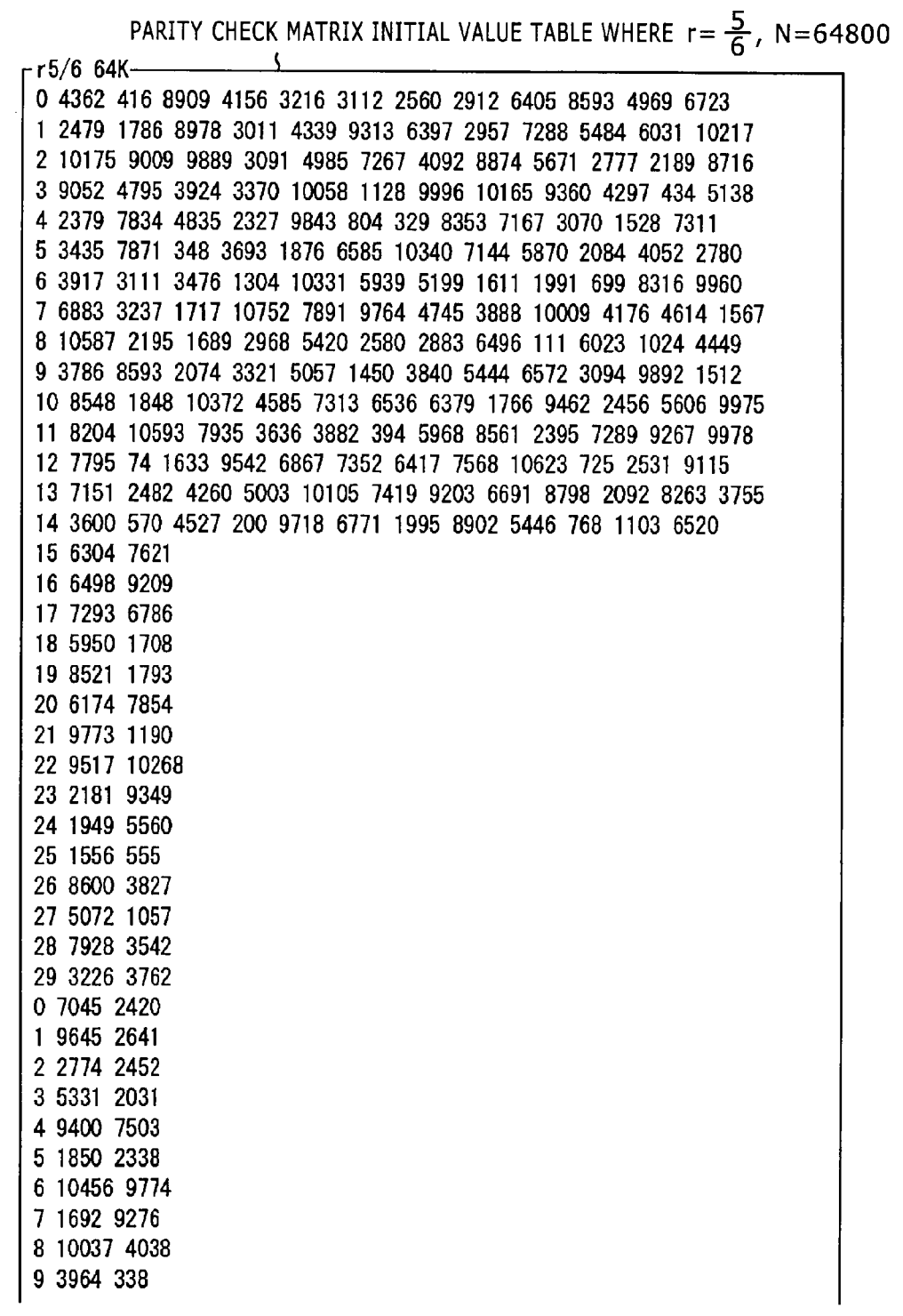
Figure 57:
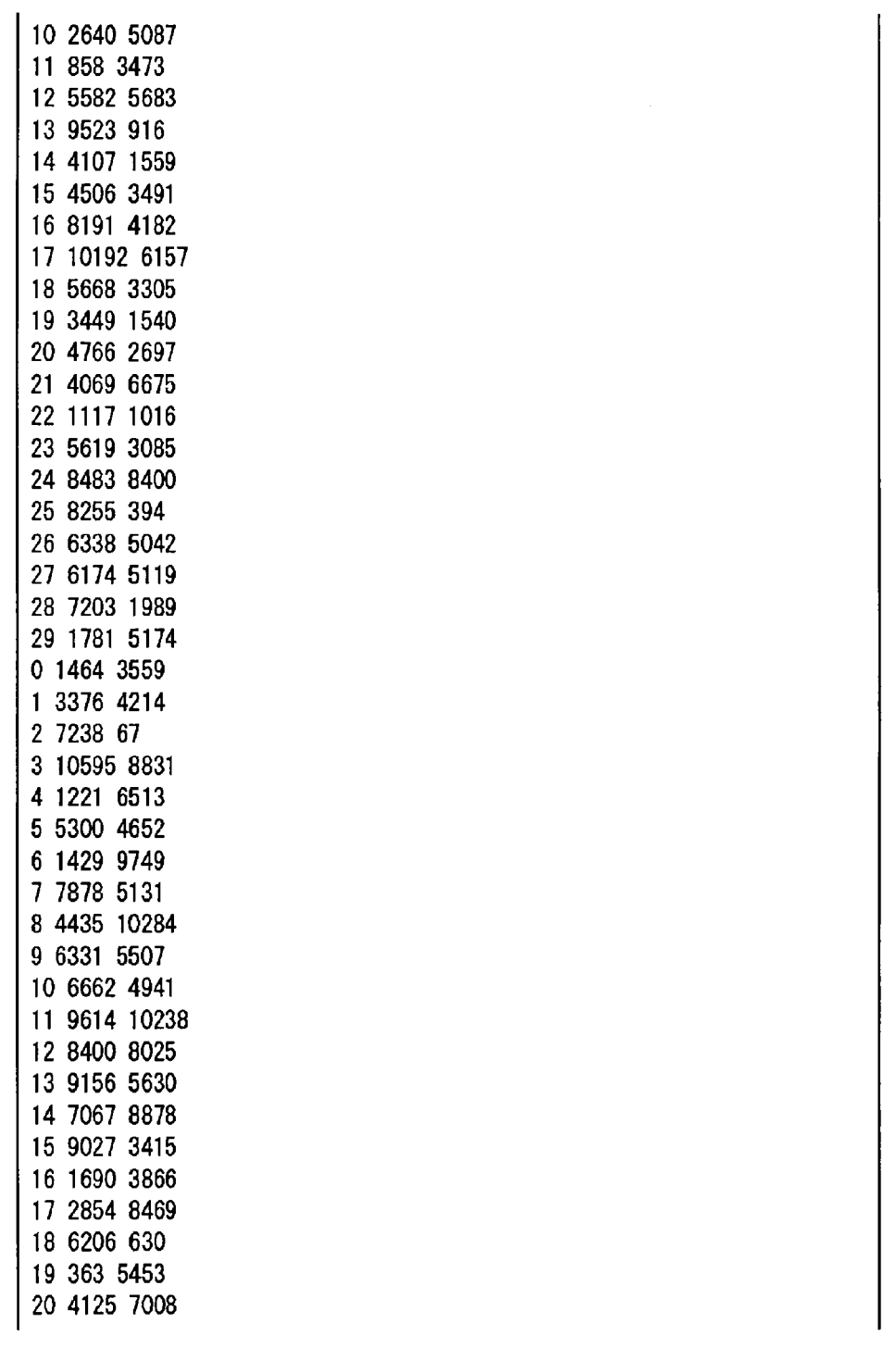
Figure 58:
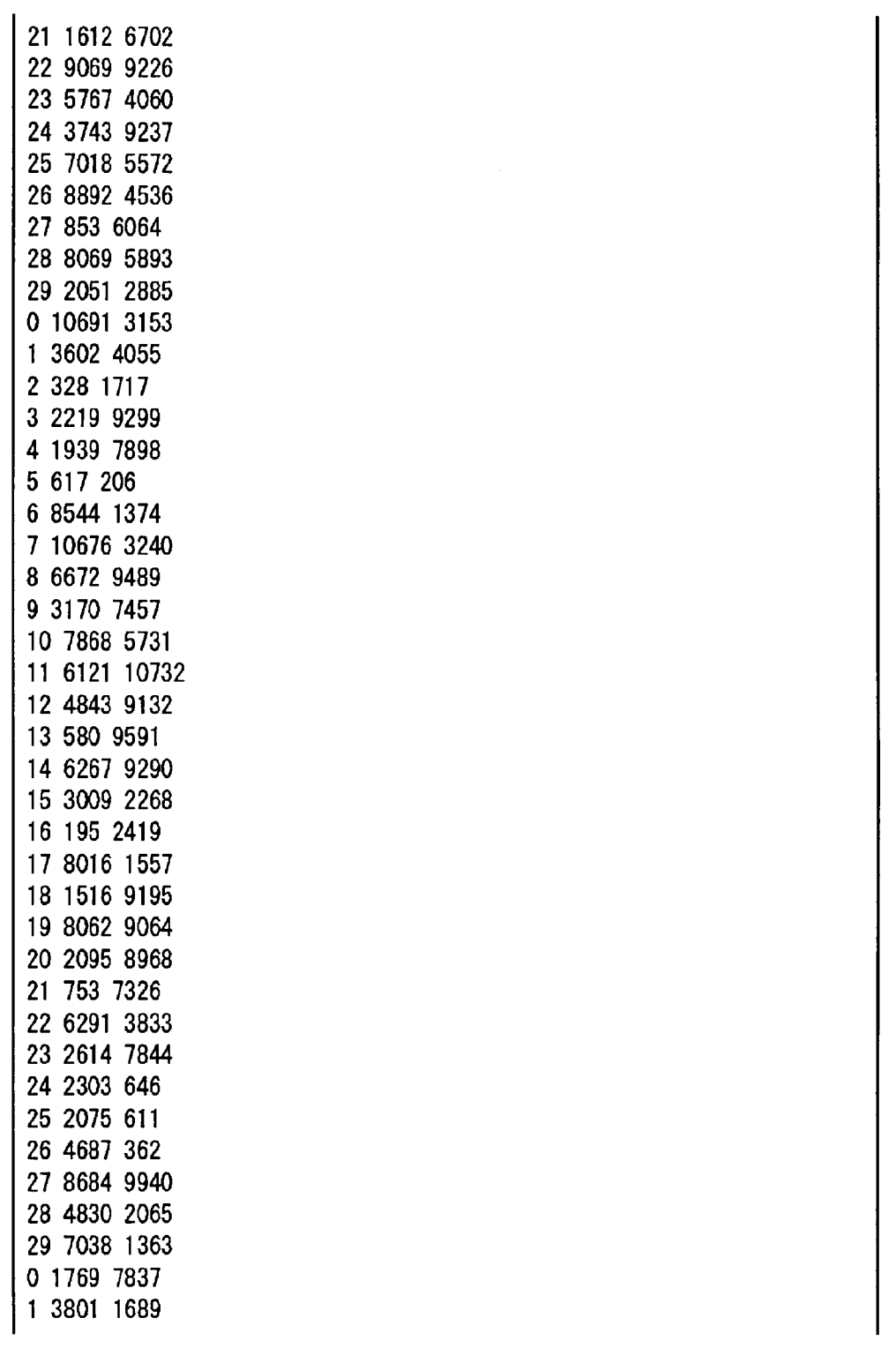
Figure 59:
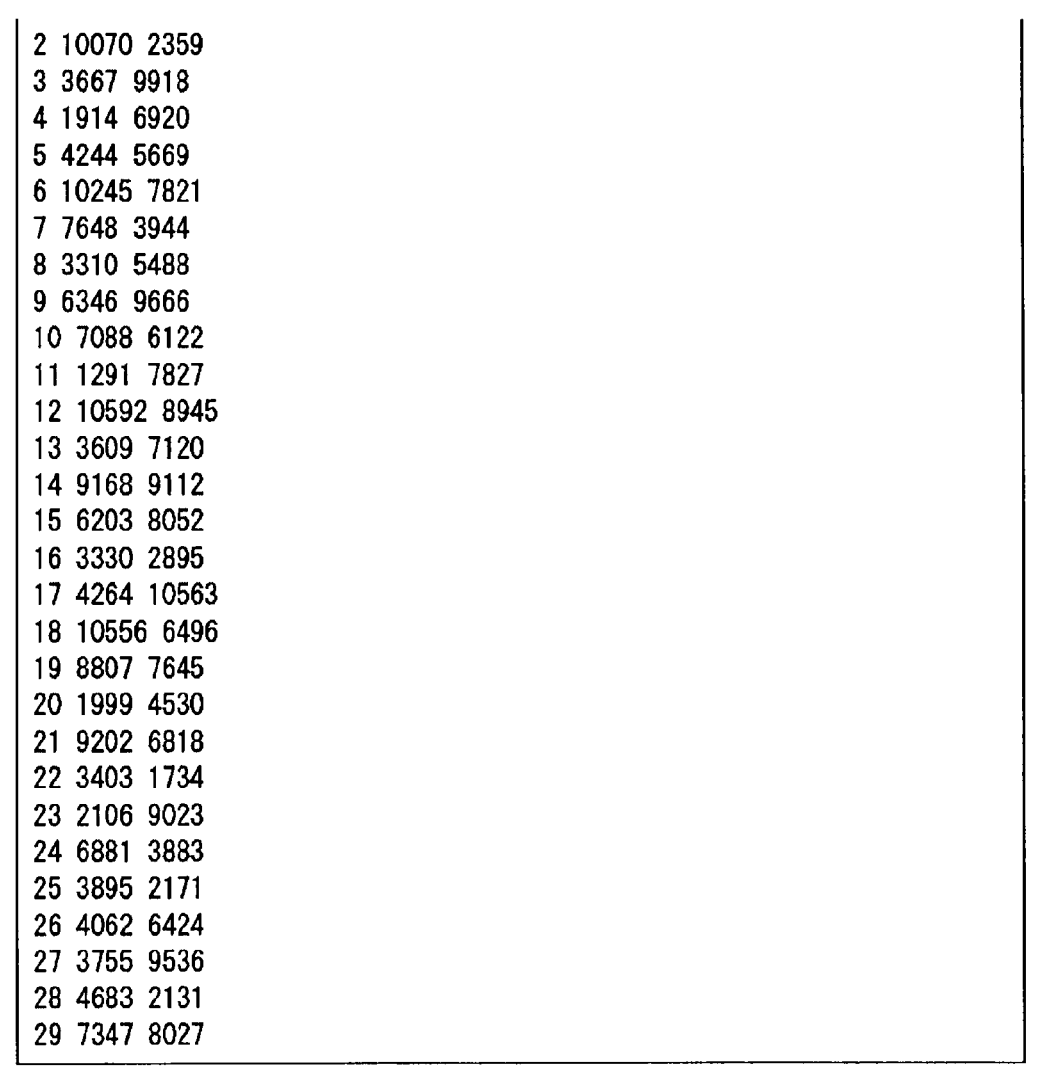

It is to be noted that FIG. 57 is a view continuing from FIG. 56 and FIG. 58 is a view continuing from FIG. 57. Further, FIG. 59 is a view continuing from FIG. 58.

Figure 60:
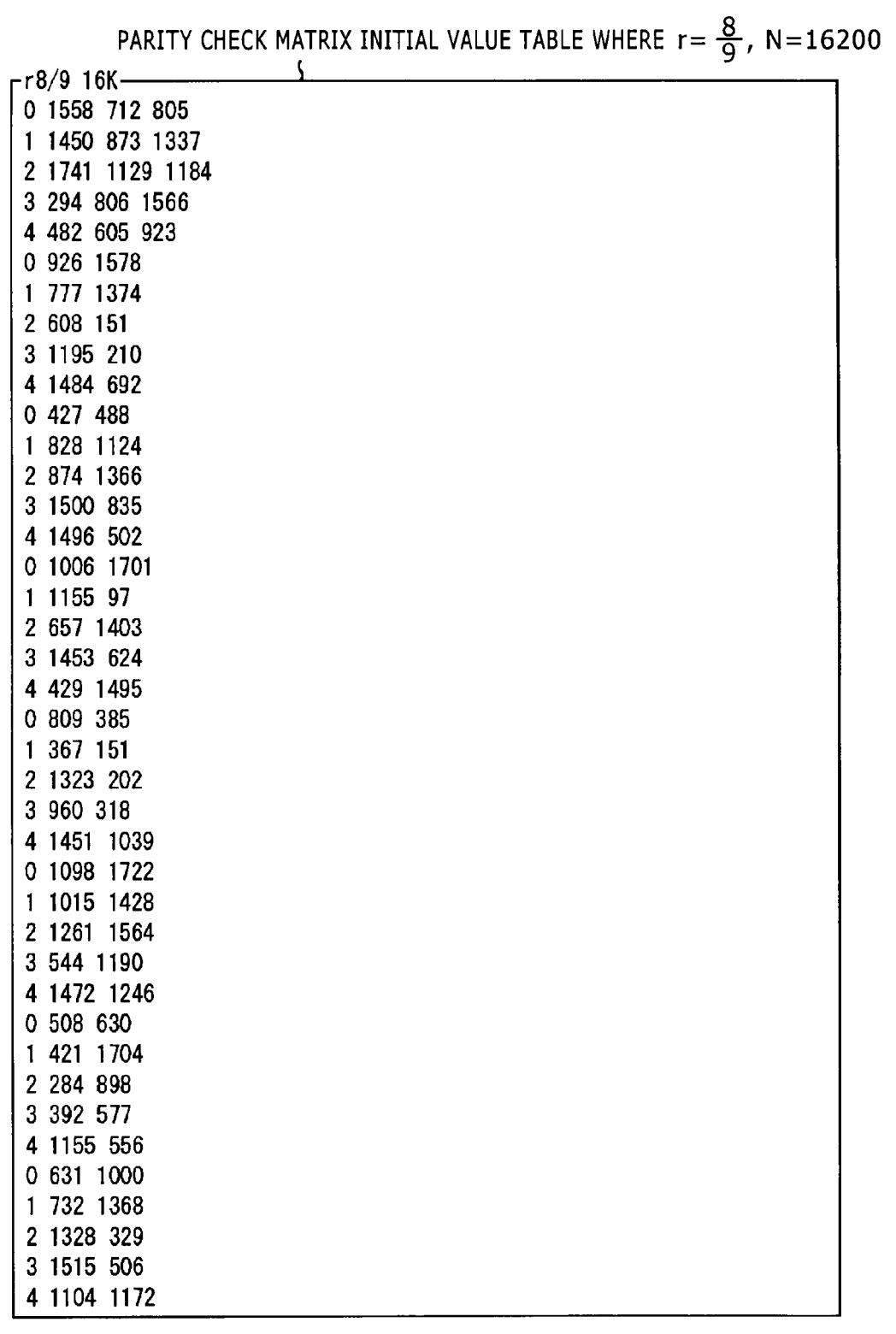

FIG. 60 shows the parity check matrix initial value table for a parity check matrix H prescribed in the DVB-S. 2 standard and having a code length N of 16,200 bits and an encoding rate r of 8/9.

FIGS. 61 to 64 show the parity check matrix initial value table for a parity check matrix H prescribed in the DVB-S.2 standard and having a code length N of 64,800 bits and an encoding rate r of 8/9.

Figure 61:
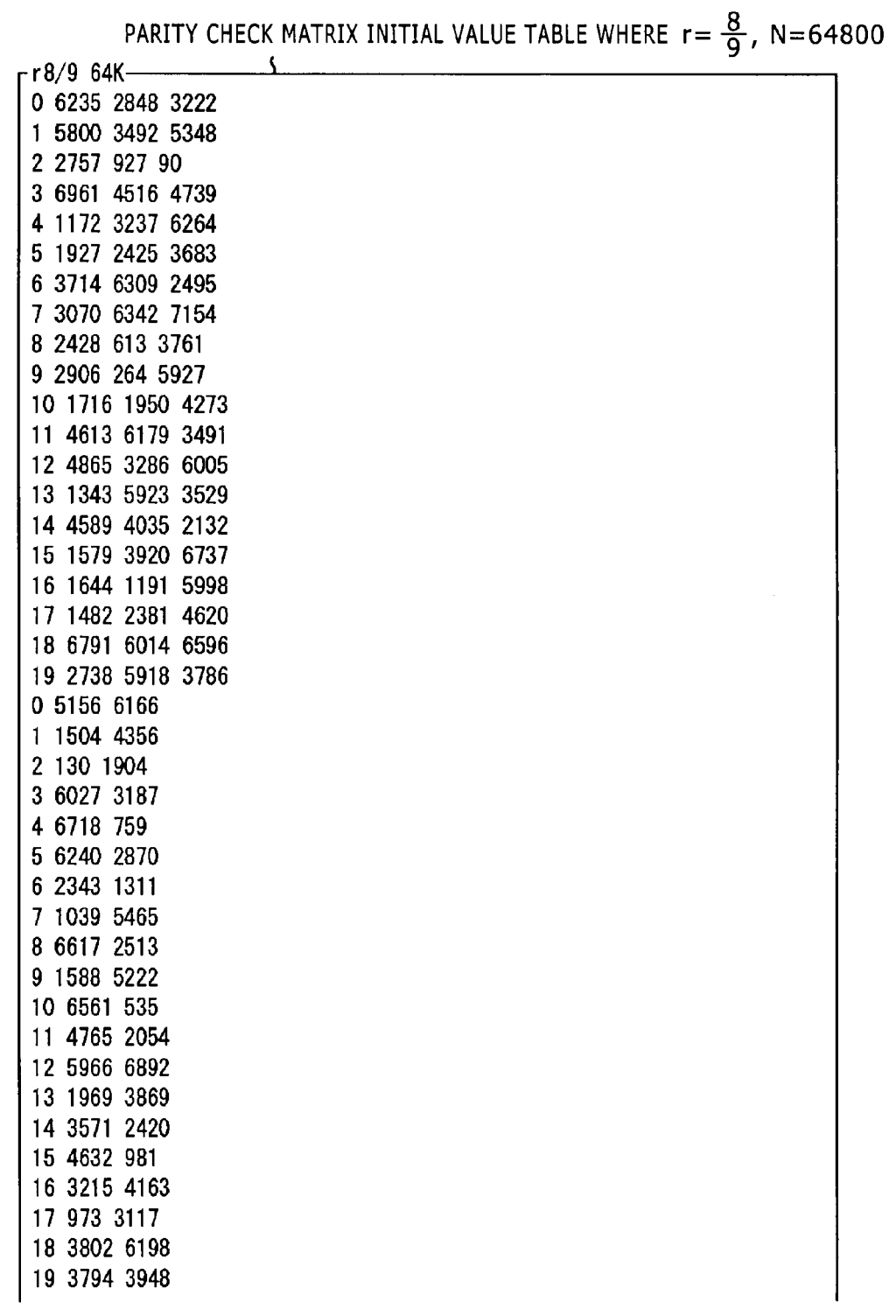
Figure 62:
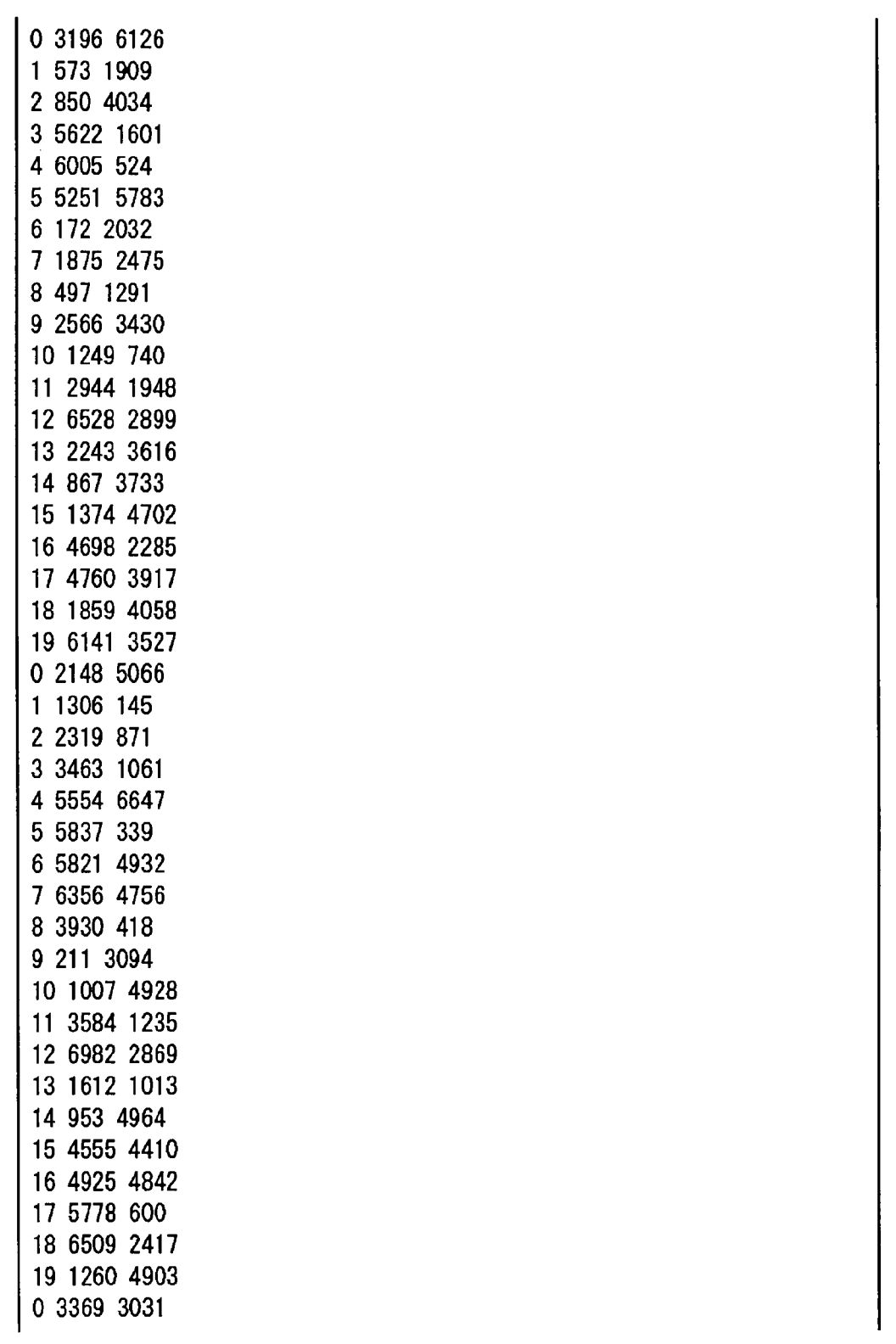
Figure 63:
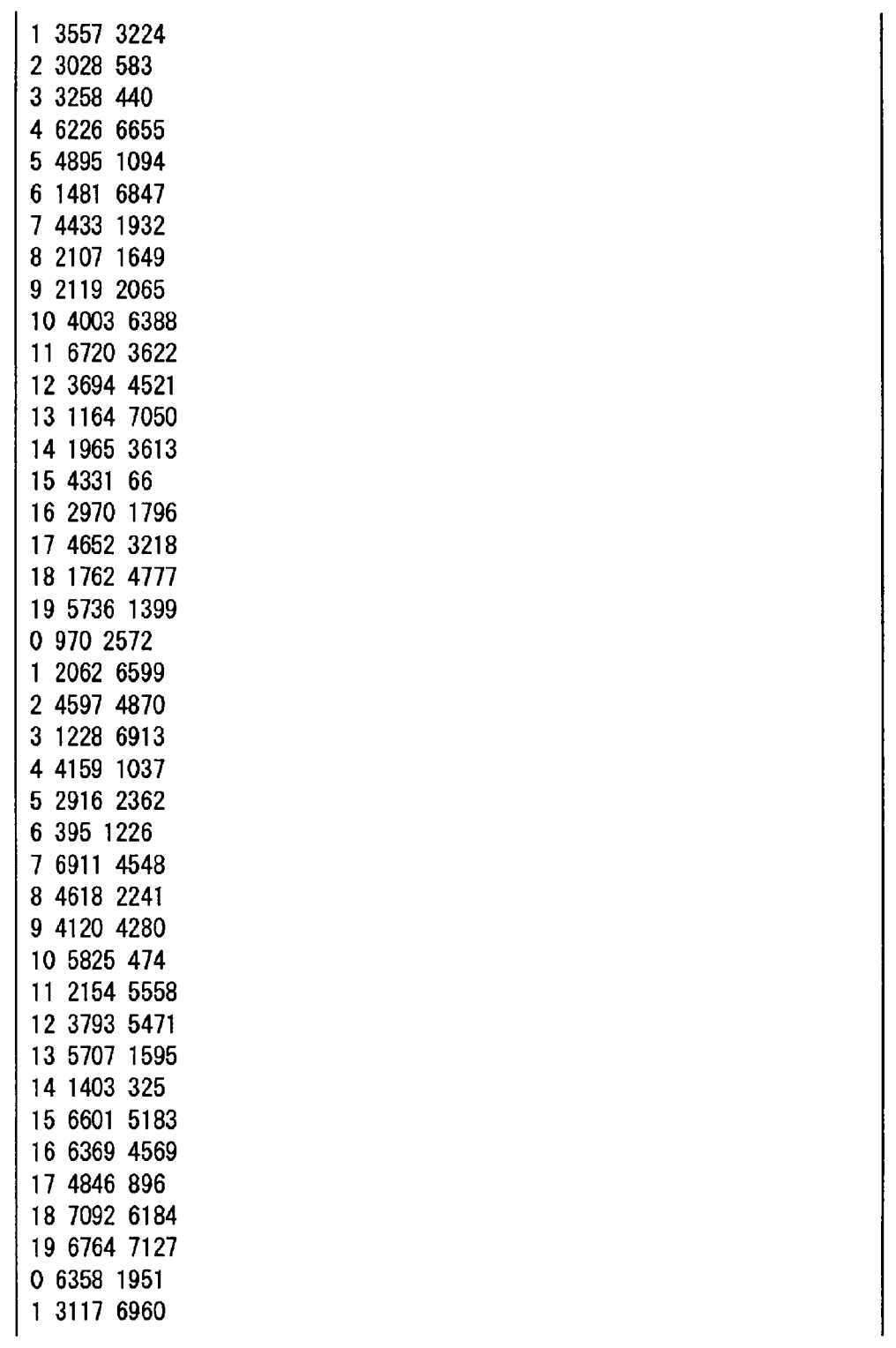
Figure 64:
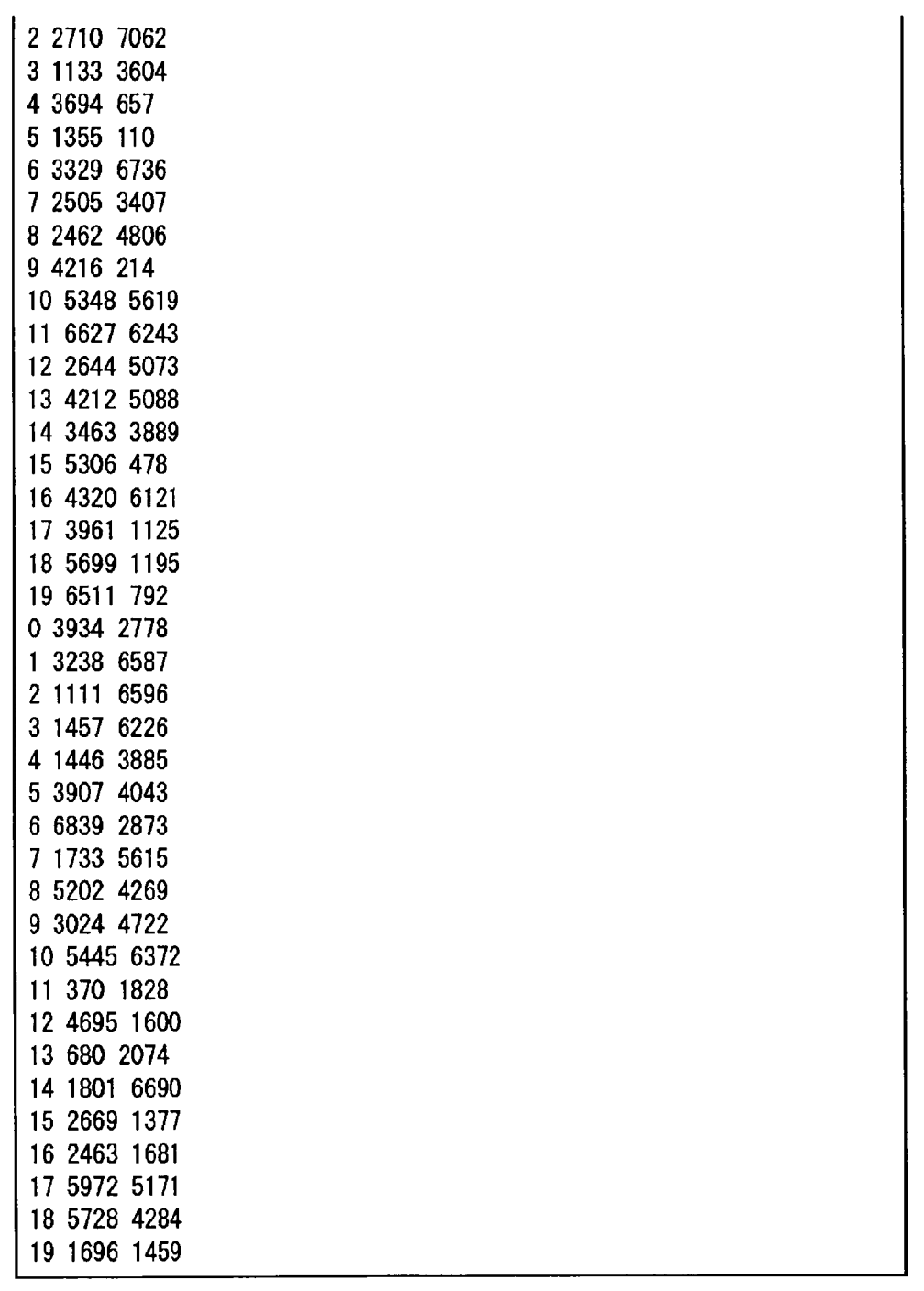

It is to be noted that FIG. 62 is a view continuing from FIG. 61 and FIG. 63 is a view continuing from FIG. 62. Further, FIG. 64 is a view continuing from FIG. 63.

FIGS. 65 to 68 show the parity check matrix initial value table for a parity check matrix H prescribed in the DVB-S.2 standard and having a code length N of 64,800 bits and an encoding rate r of 9/10.

Figure 65:
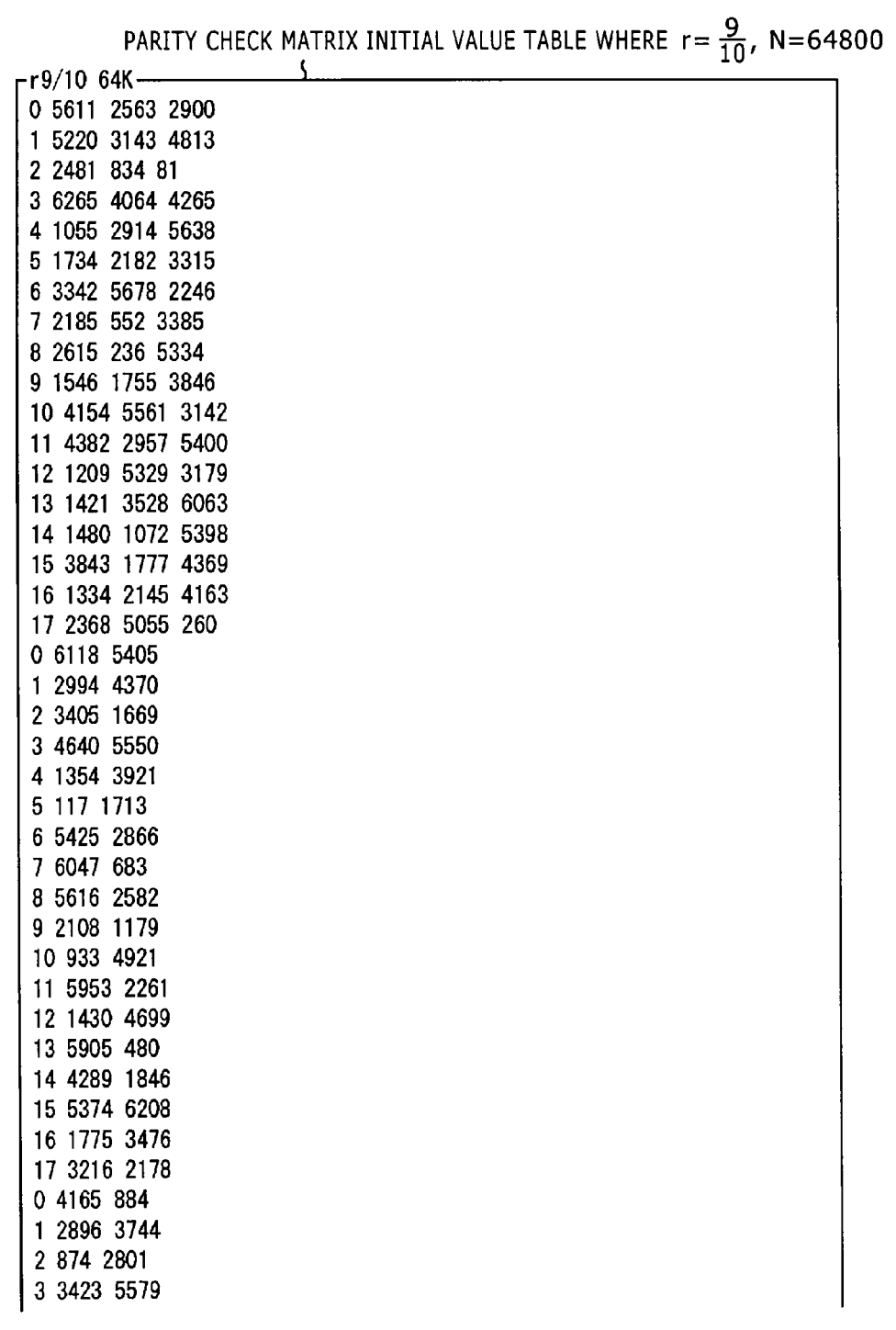
Figure 66:
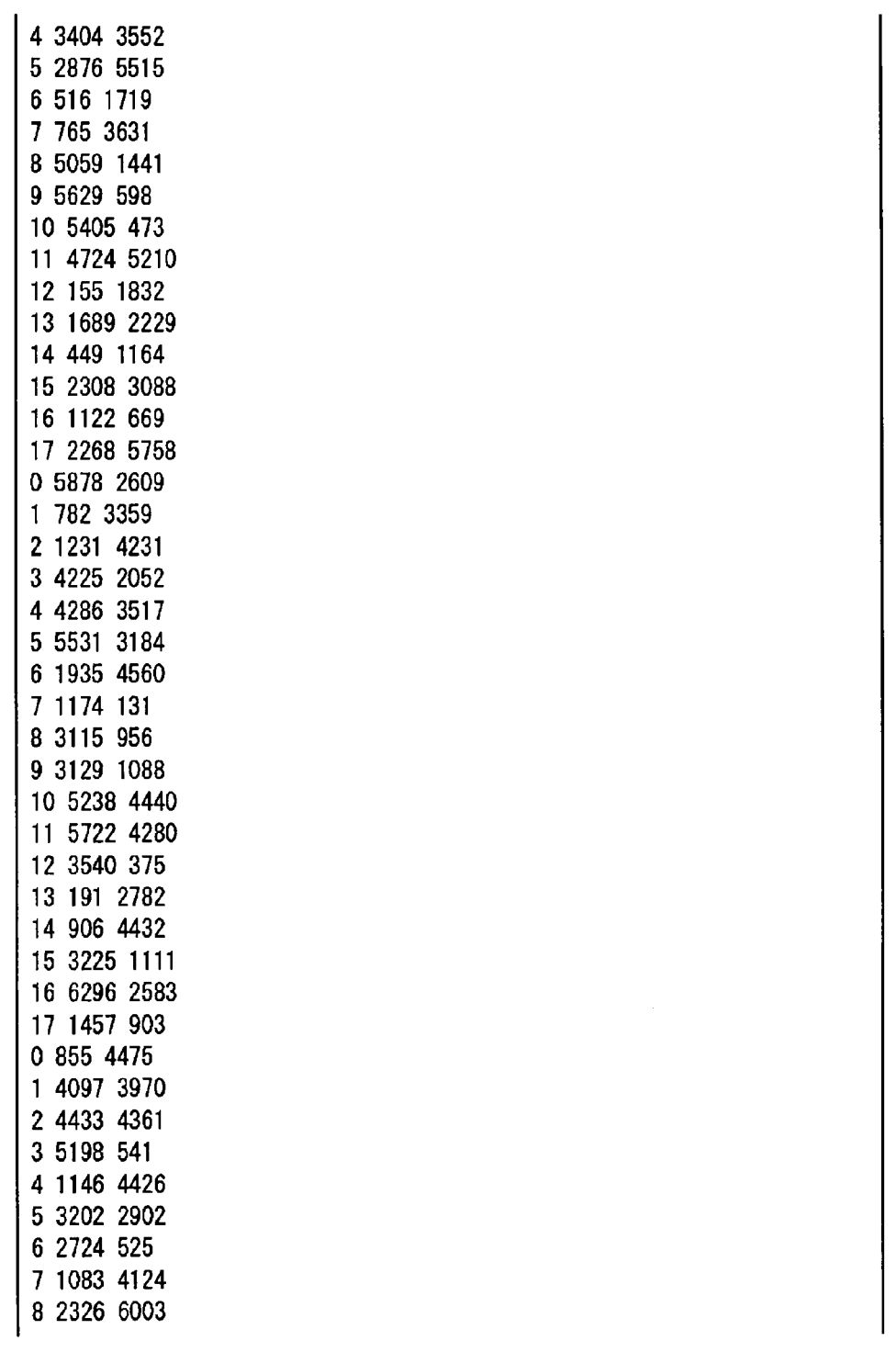
Figure 67:
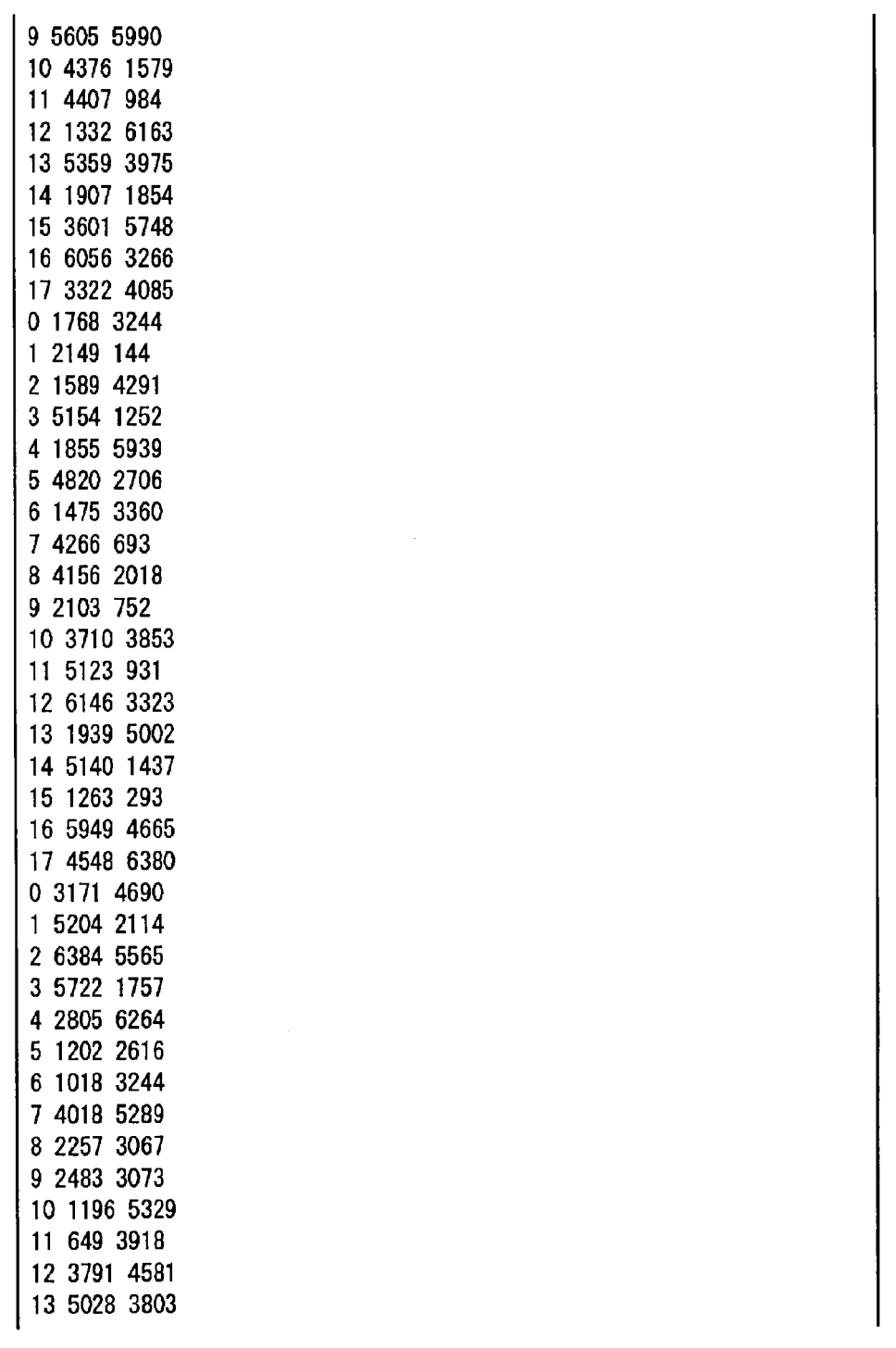
Figure 68:
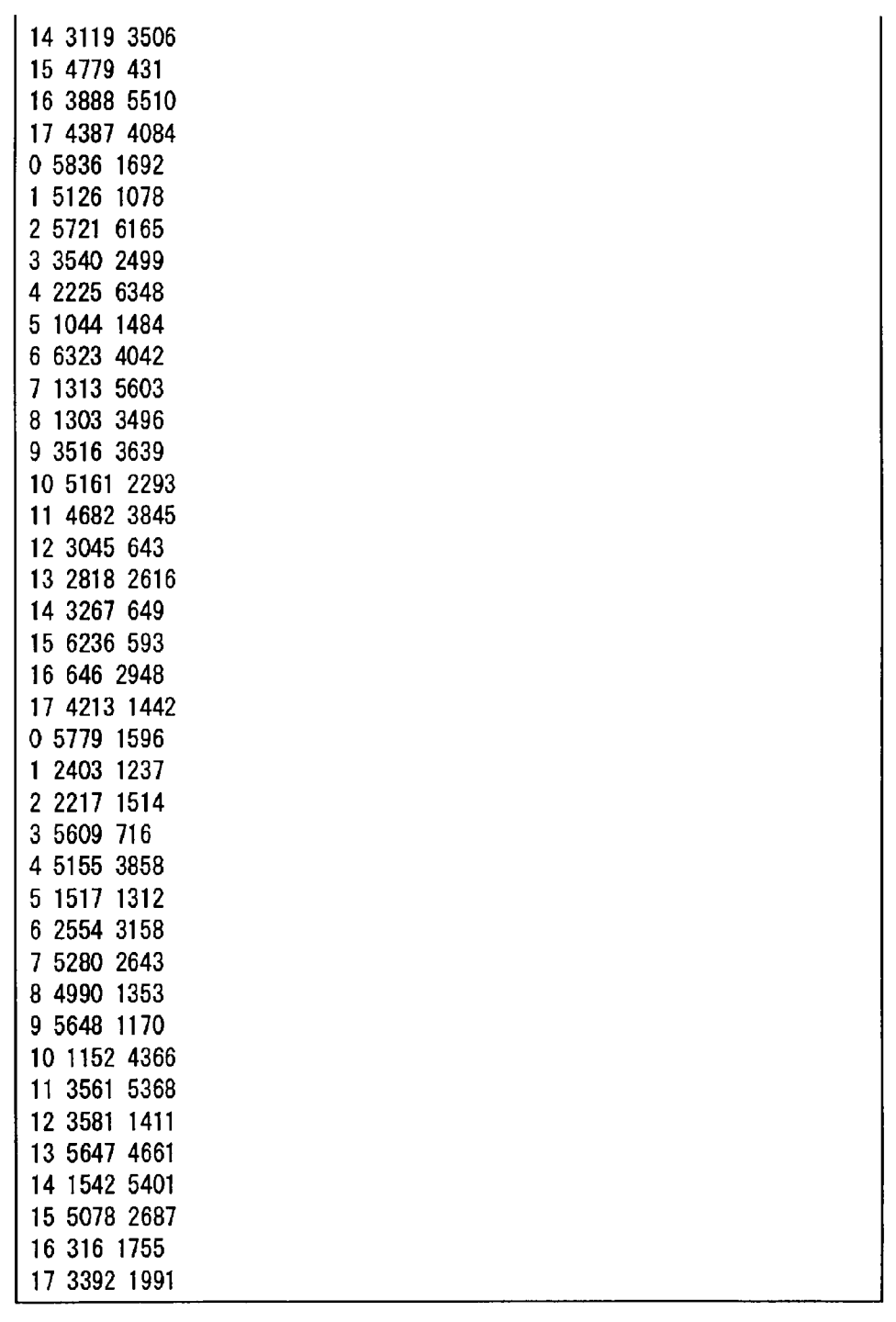

It is to be noted that FIG. 66 is a view continuing from FIG. 65 and FIG. 67 is a view continuing from FIG. 66. Further, FIG. 68 is a view continuing from FIG. 67.

Figure 69:
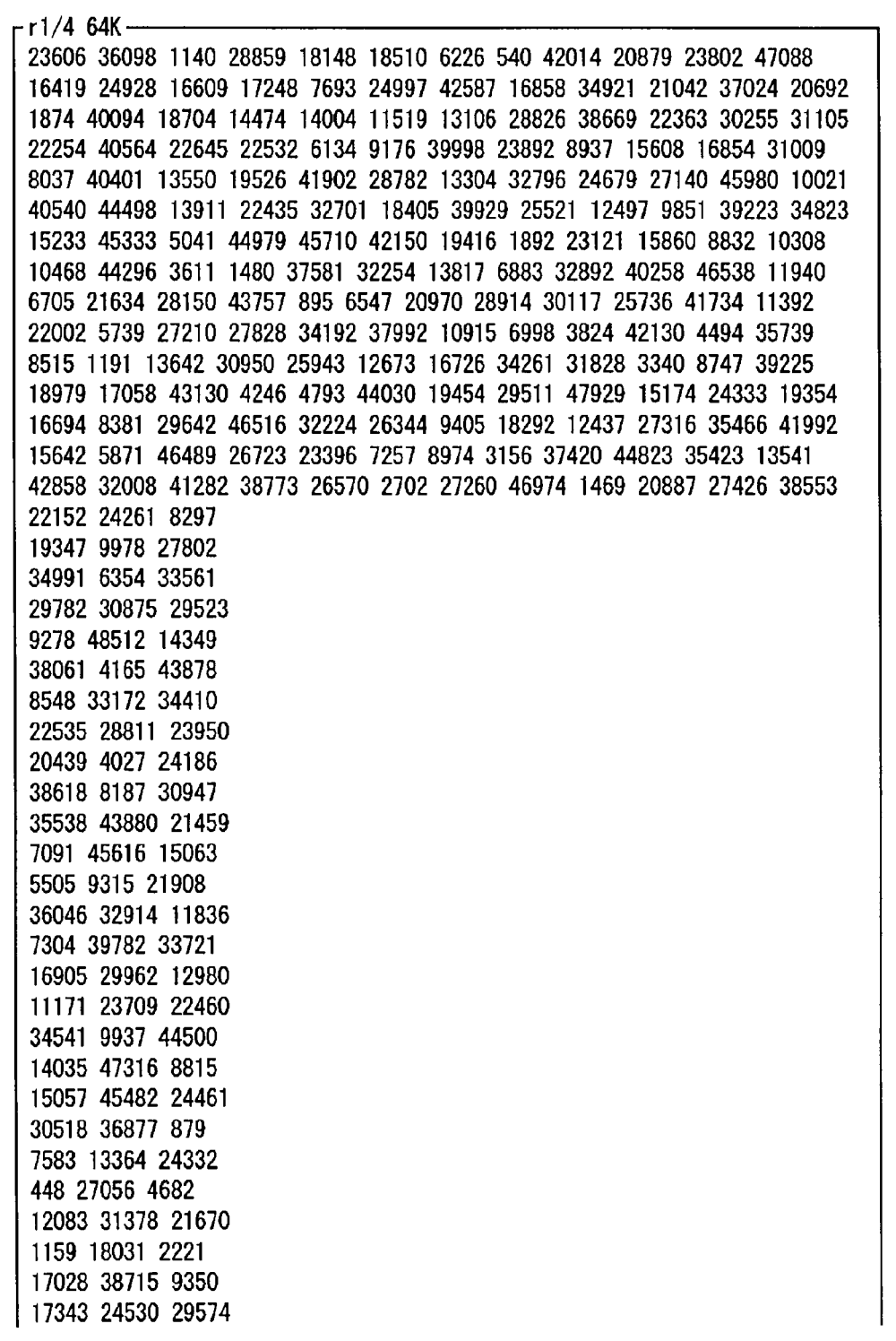

FIGS. 69 and 70 show the parity check matrix initial value table for a parity check matrix H prescribed in the DVB-S.2 standard and having a code length N of 64,800 bits and an encoding rate r of 1/4.

It is to be noted that FIG. 70 is a view continuing from FIG. 69.

Figure 71:
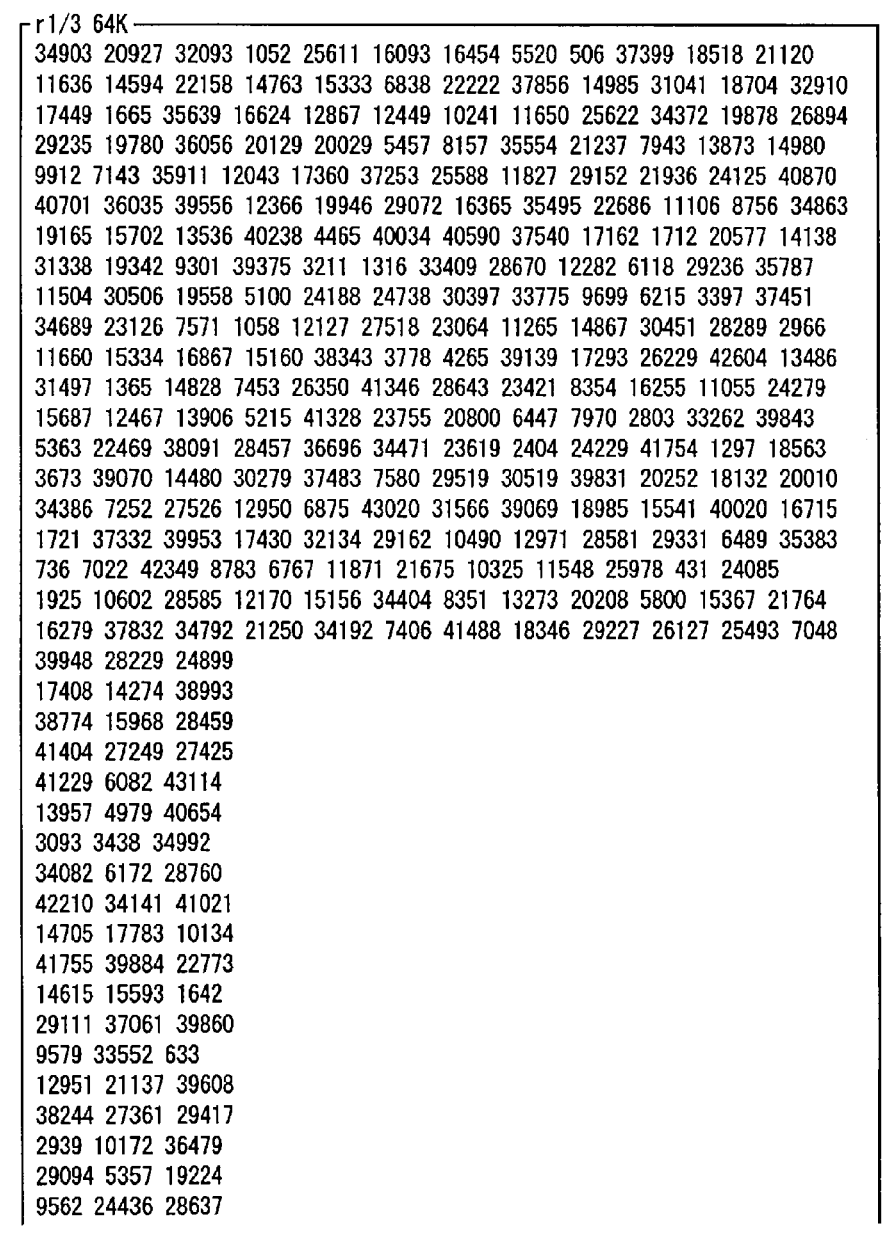
Figure 72:
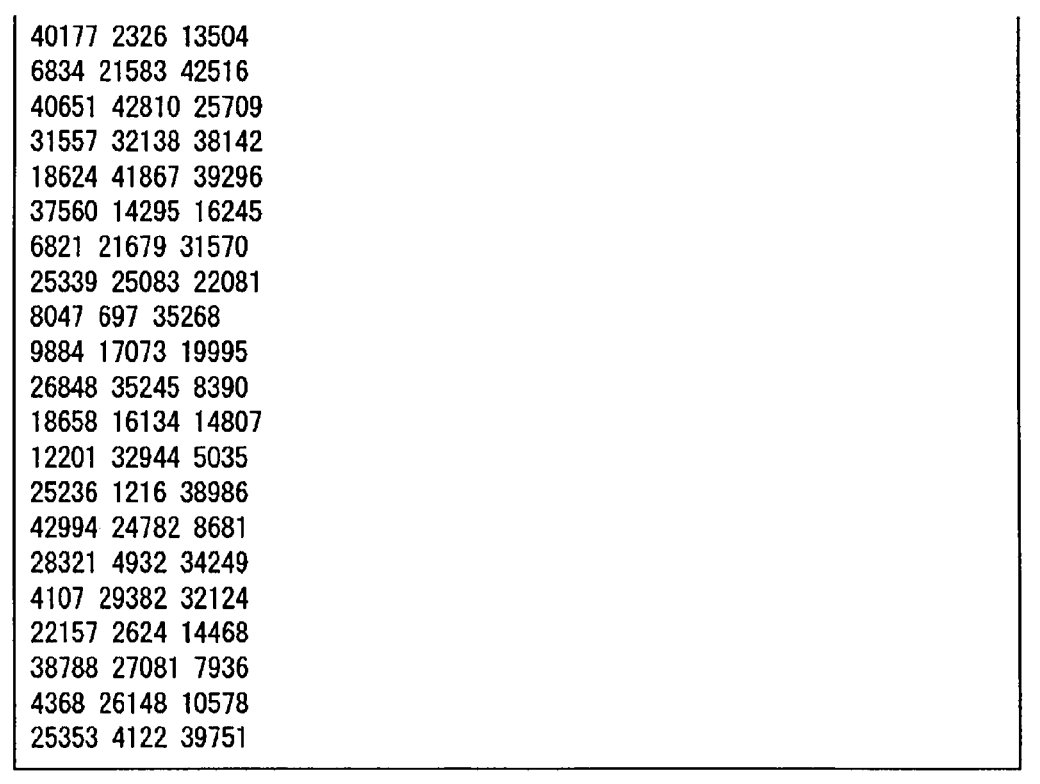

FIGS. 71 and 72 show the parity check matrix initial value table for a parity check matrix H prescribed in the DVB-S.2 standard and having a code length N of 64,800 bits and an encoding rate r of 1/3.

It is to be noted that FIG. 72 is a view continuing from FIG. 71.

Figure 73:
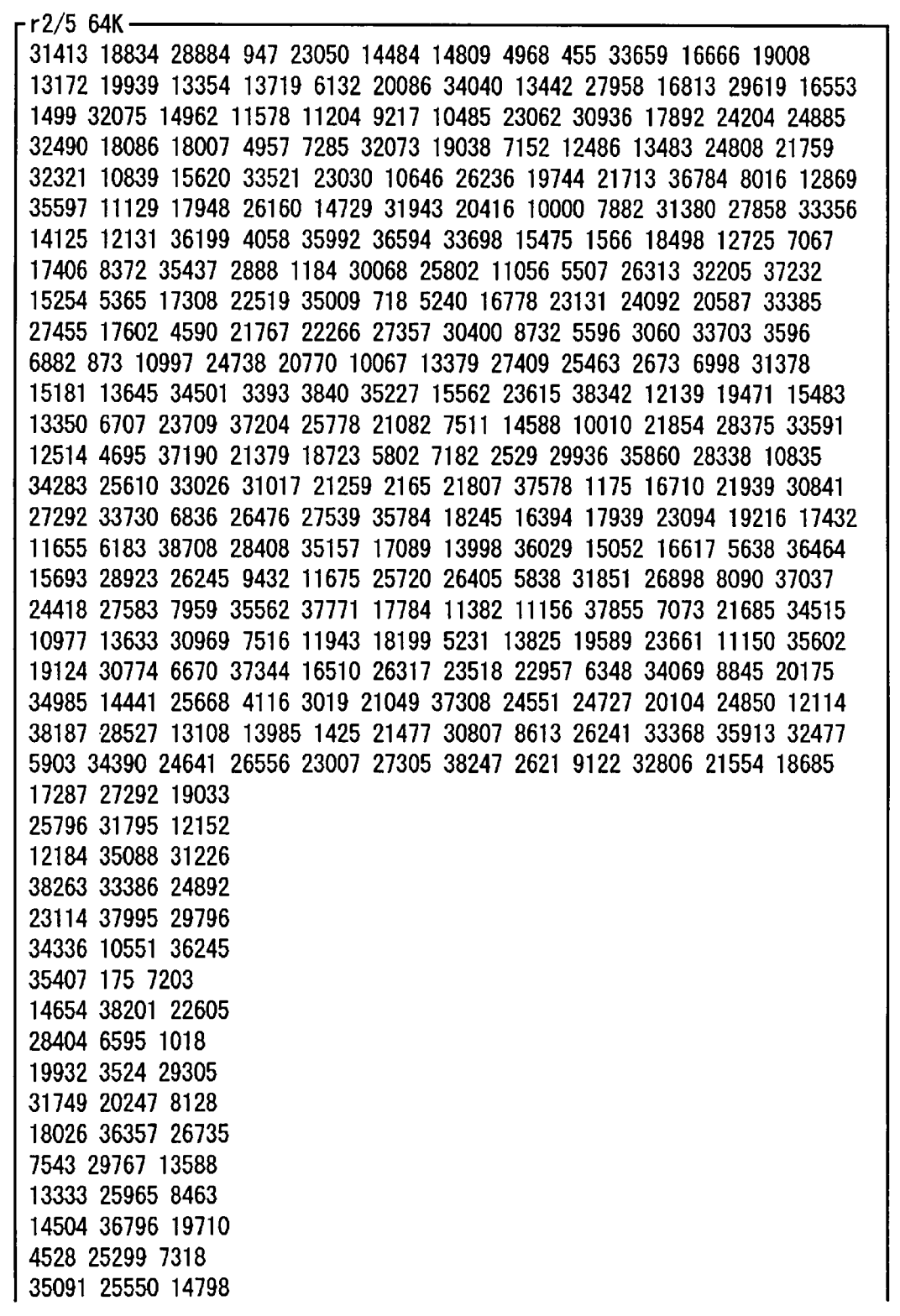
Figure 74:
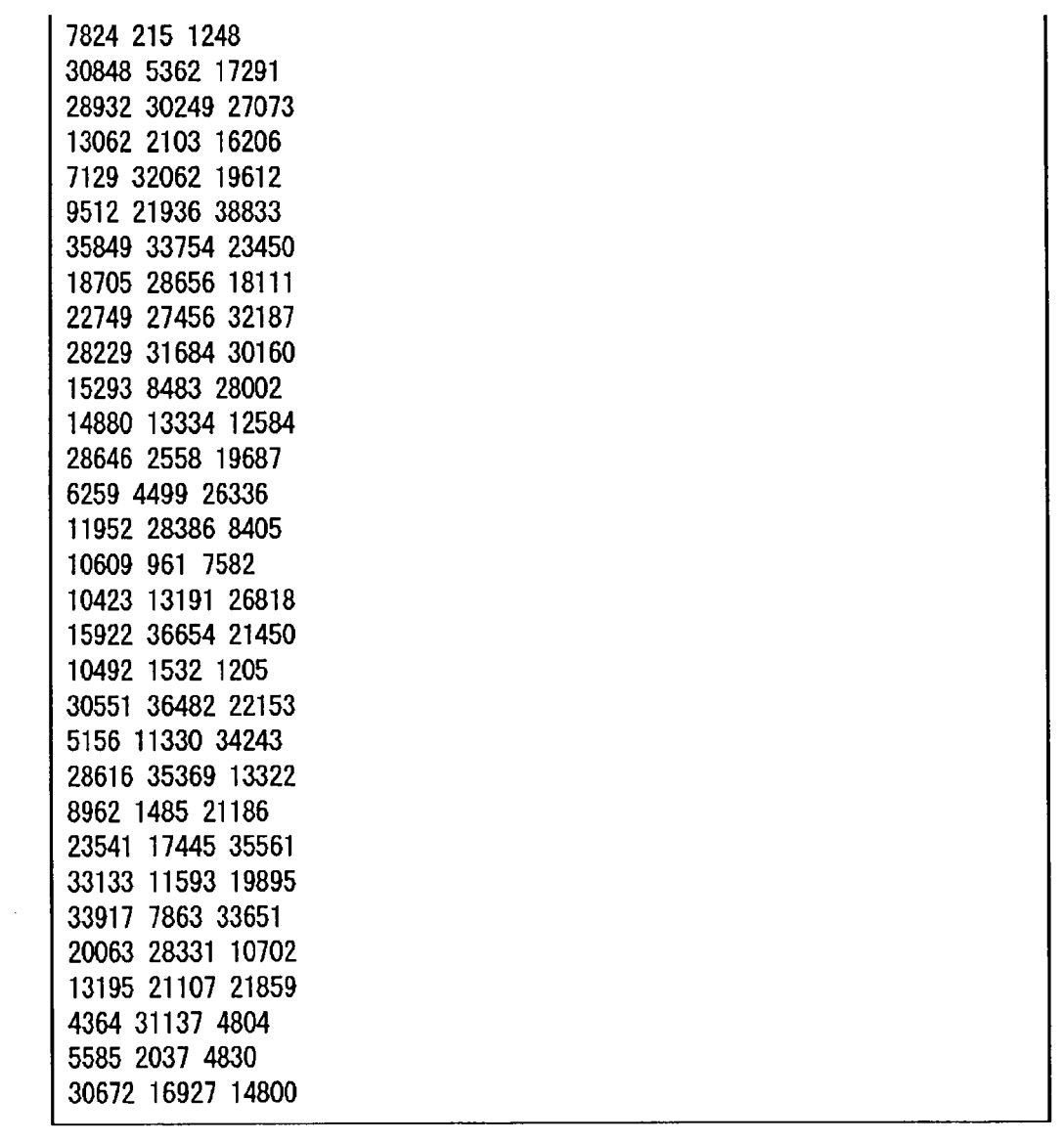

FIGS. 73 and 74 show the parity check matrix initial value table for a parity check matrix H prescribed in the DVB-S.2 standard and having a code length N of 64,800 bits and an encoding rate r of 2/5.

It is to be noted that FIG. 74 is a view continuing from FIG. 73.

Figure 75:
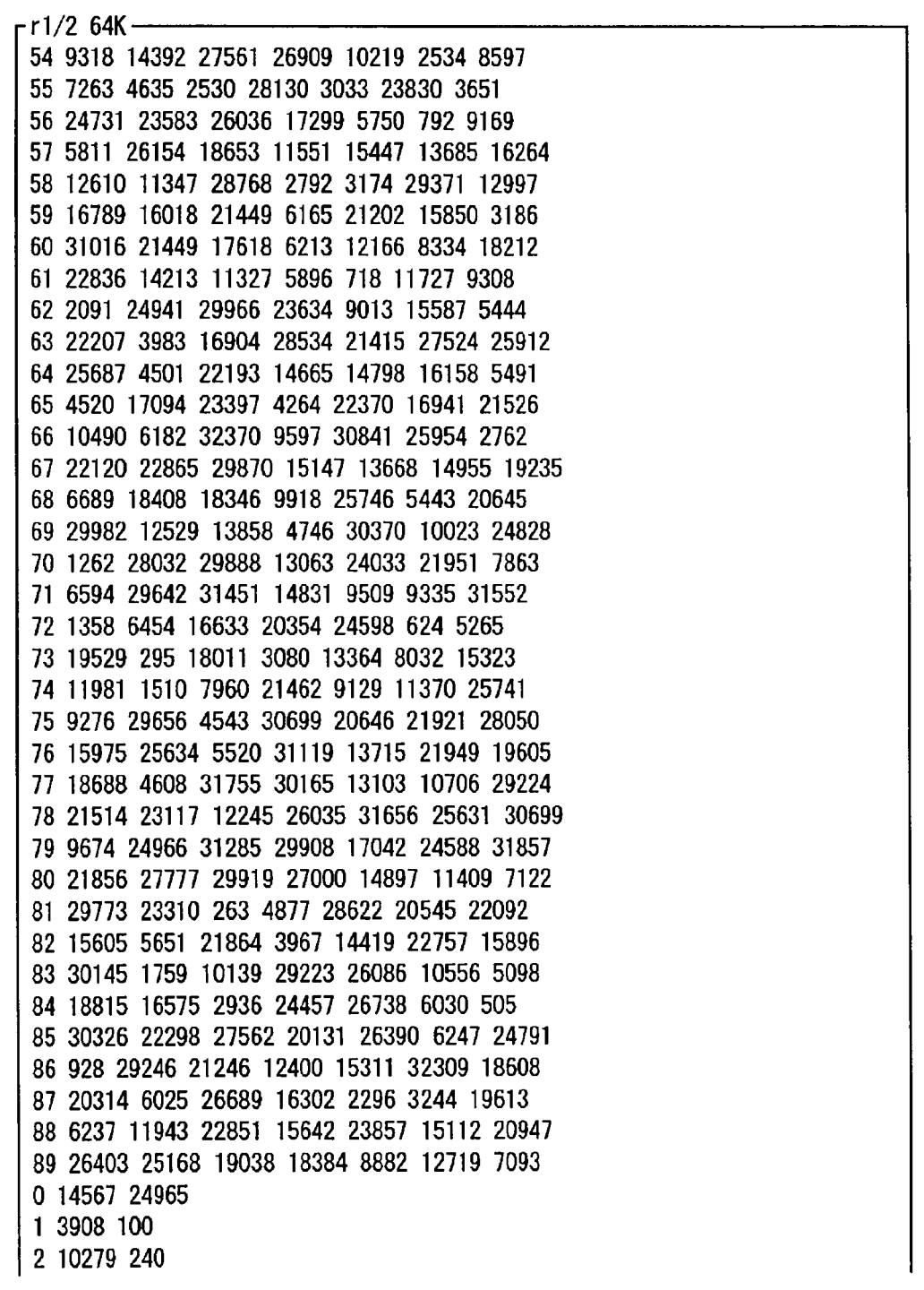
Figure 76:
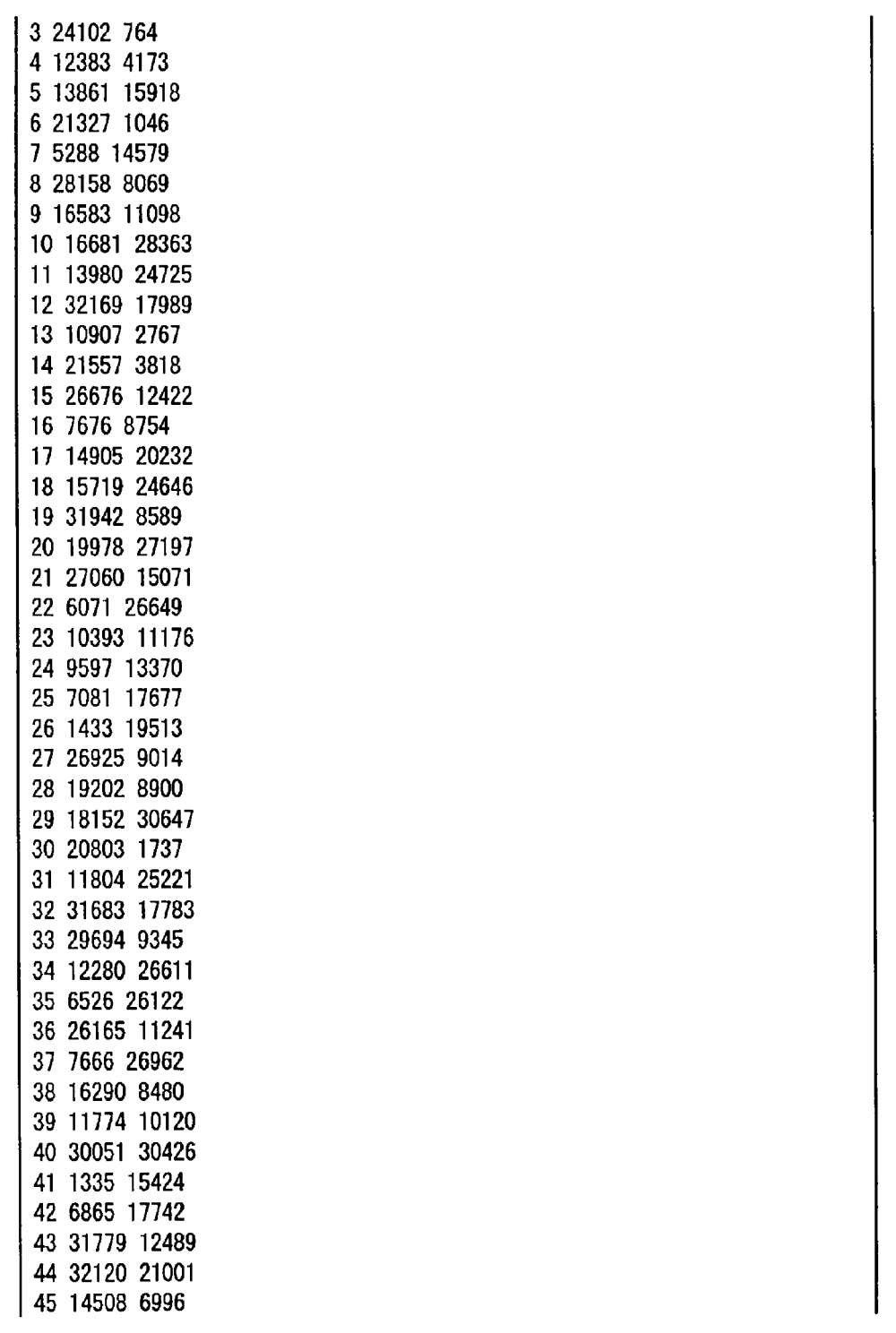

FIGS. 75 to 77 show the parity check matrix initial value table for a parity check matrix H prescribed in the DVB-S.2 standard and having a code length N of 64,800 bits and an encoding rate r of 1/2.

It is to be noted that FIG. 76 is a view continuing from FIG. 75 and FIG. 77 is a view continuing from FIG. 76.

Figure 78:
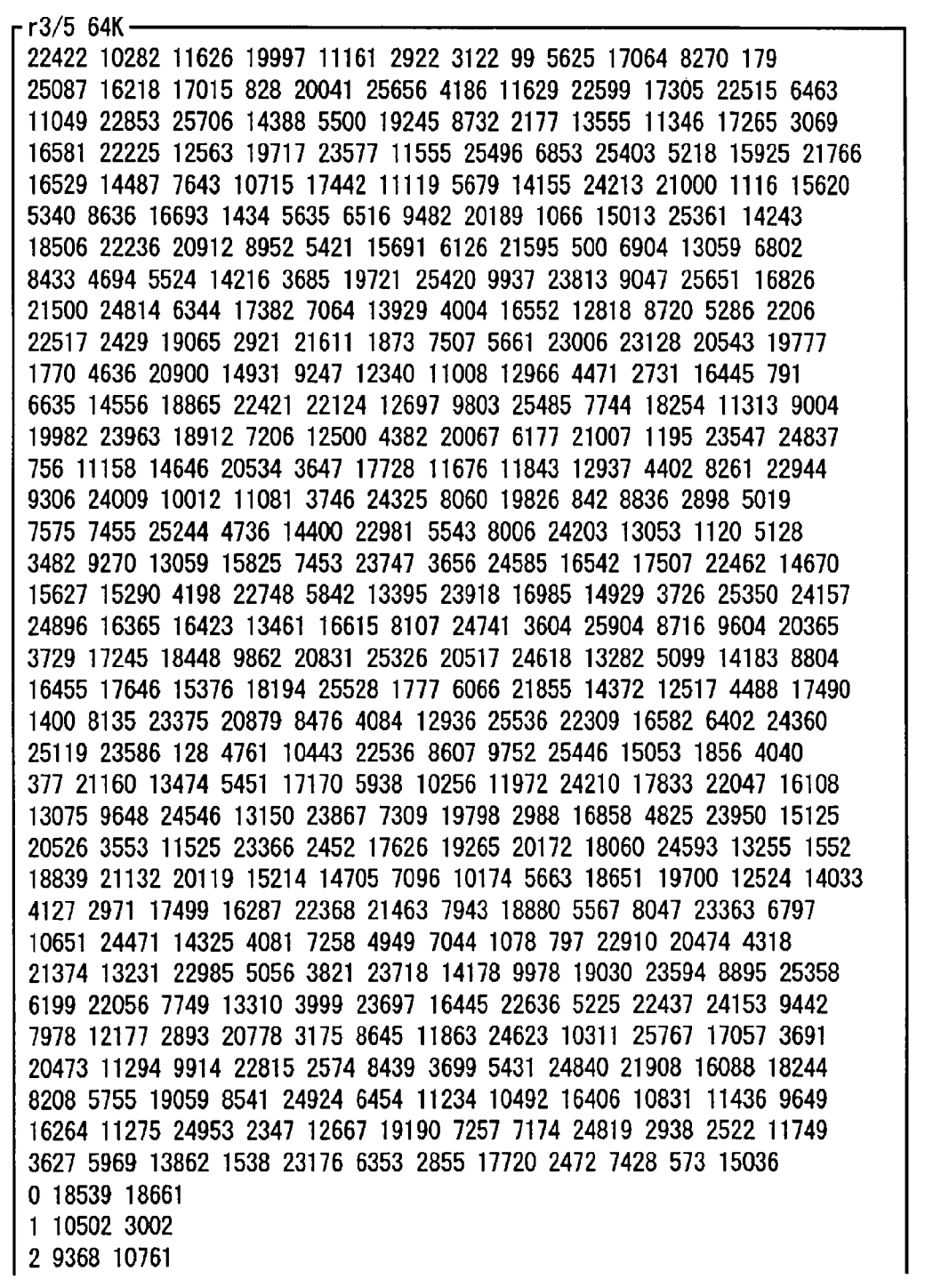
Figure 79:
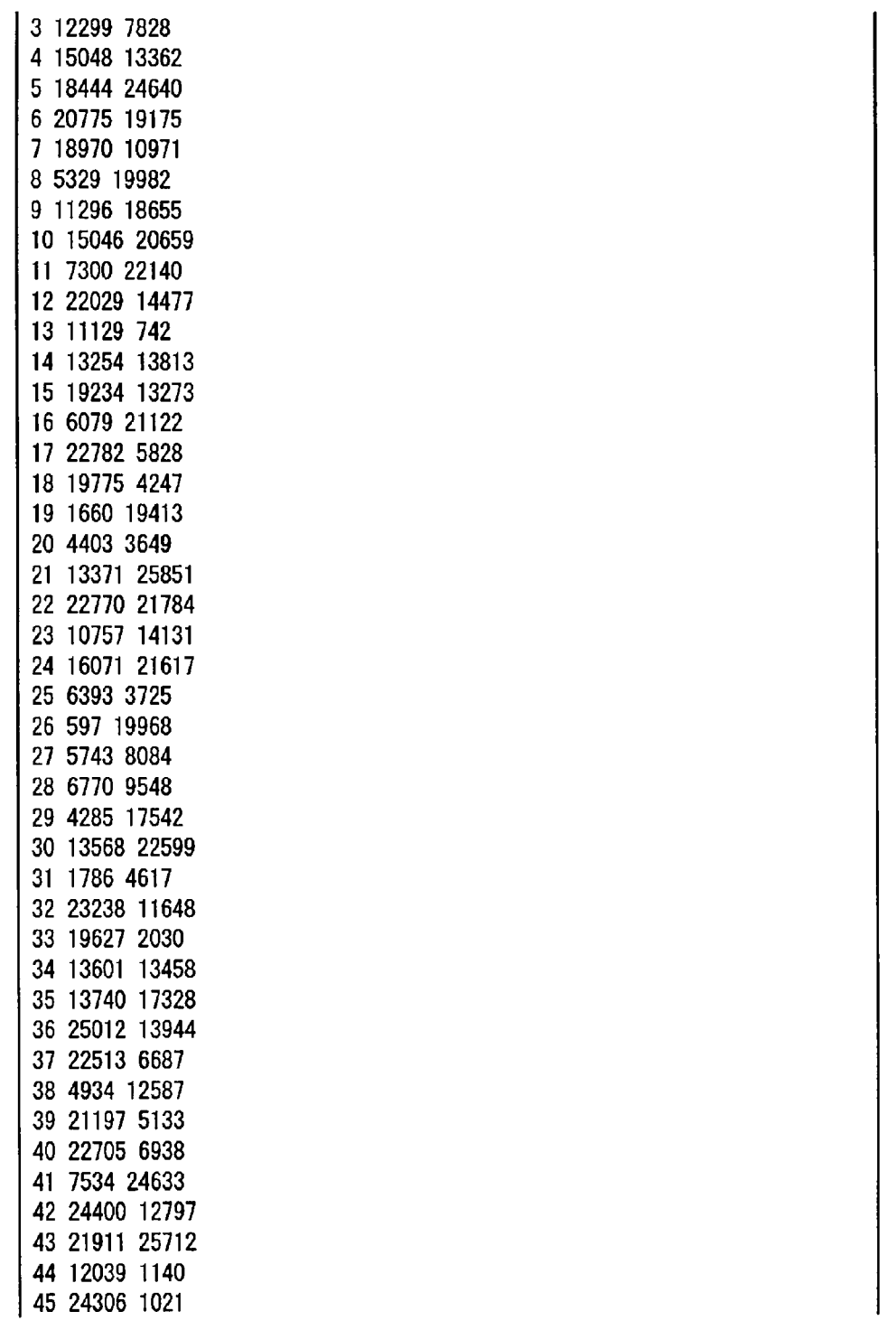
Figures 80, 81:
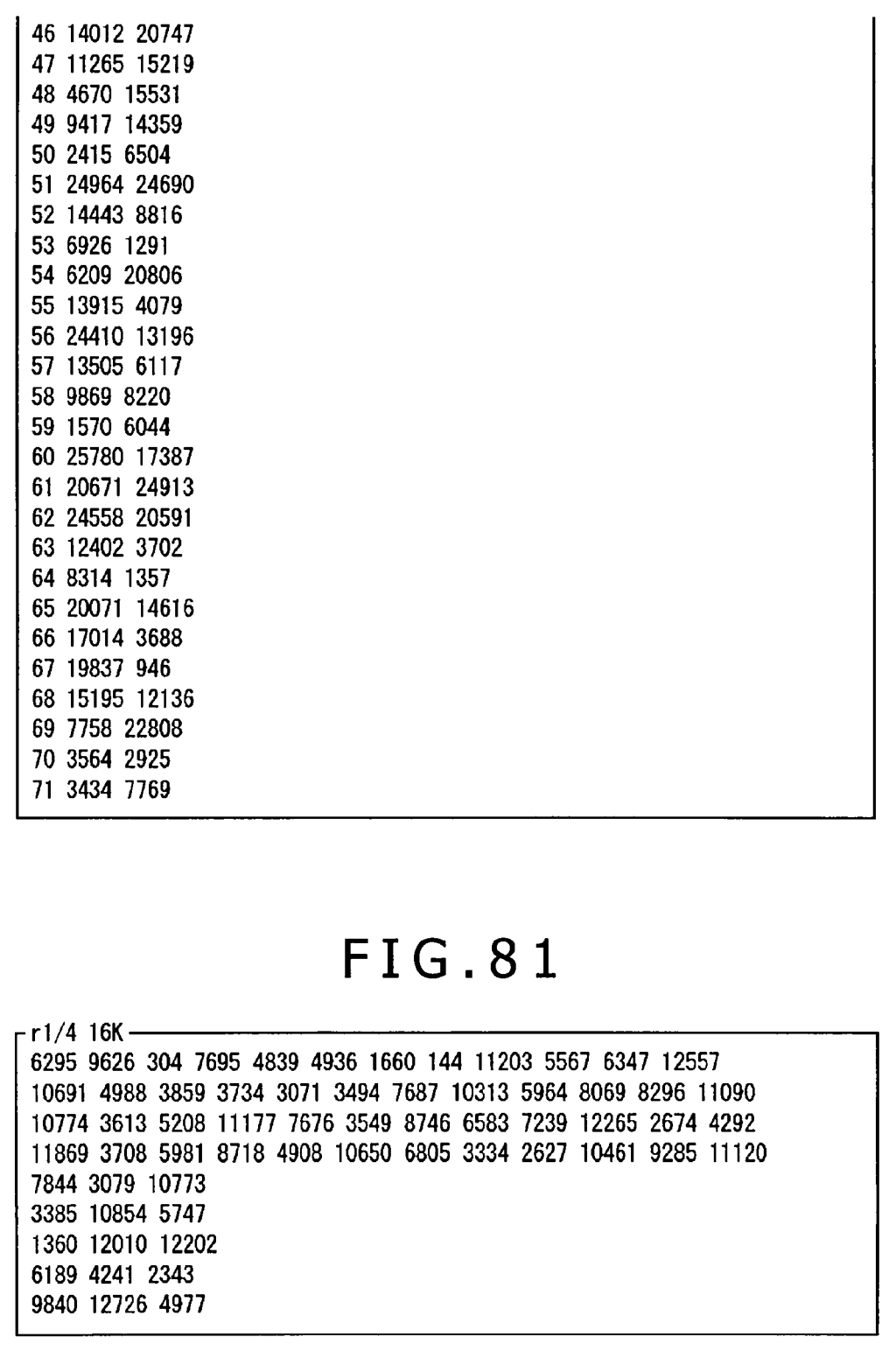

FIGS. 78 to 80 show the parity check matrix initial value table for a parity check matrix H prescribed in the DVB-S.2 standard and having a code length N of 64,800 bits and an encoding rate r of 3/5.

It is to be noted that FIG. 79 is a view continuing from FIG. 78 and FIG. 80 is a view continuing from FIG. 79.

FIG. 81 shows the parity check matrix initial value table for a parity check matrix H prescribed in the DVB-S.2 standard and having a code length N of 16,200 bits and an encoding rate r of 1/4.

Figures 82, 83:
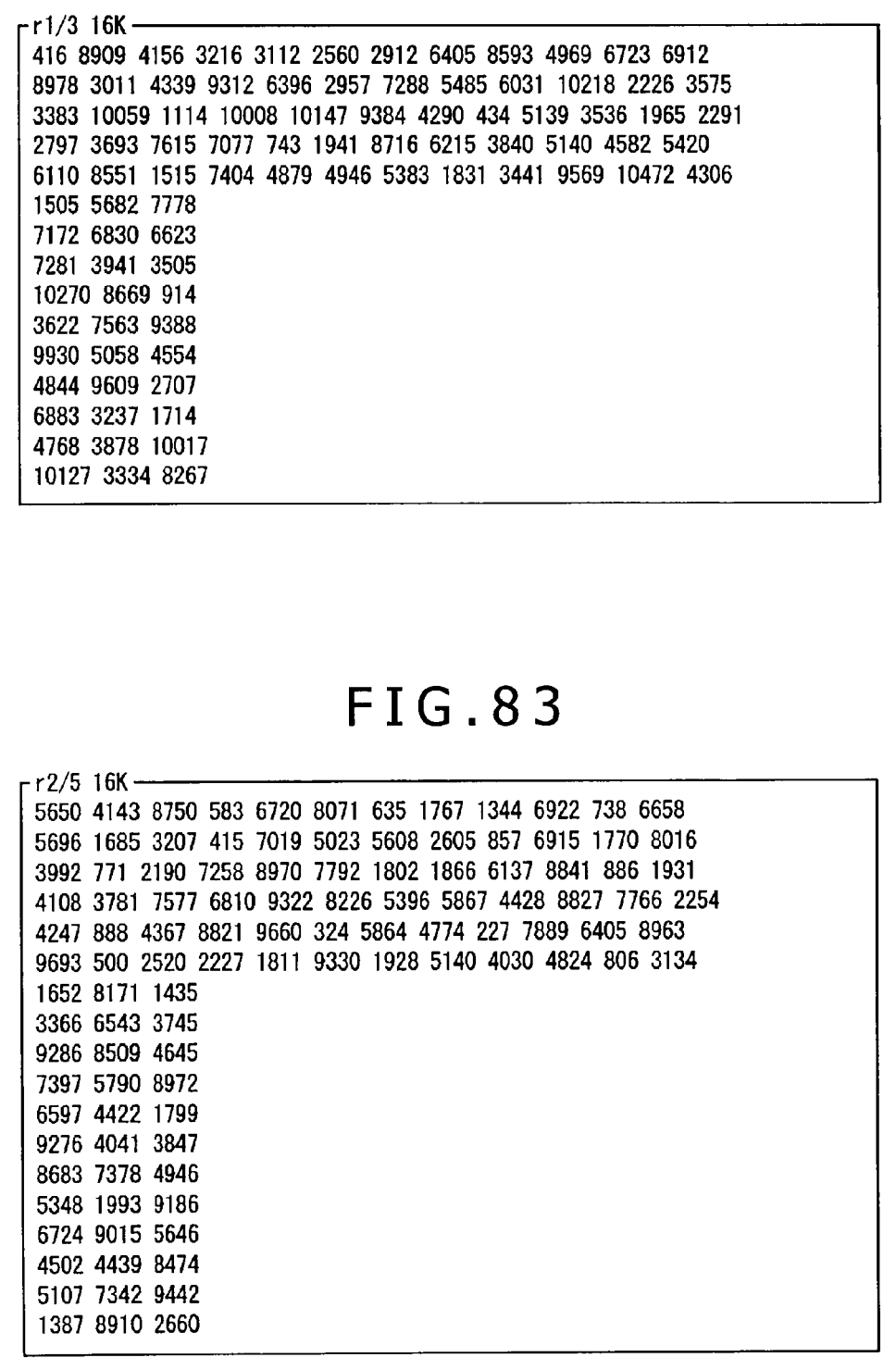

FIG. 82 shows the parity check matrix initial value table for a parity check matrix H prescribed in the DVB-S.2 standard and having a code length N of 16,200 bits and an encoding rate r of 1/3.

FIG. 83 shows the parity check matrix initial value table for a parity check matrix H prescribed in the DVB-S.2 standard and having a code length N of 16,200 bits and an encoding rate r of 2/5.

Figure 84:
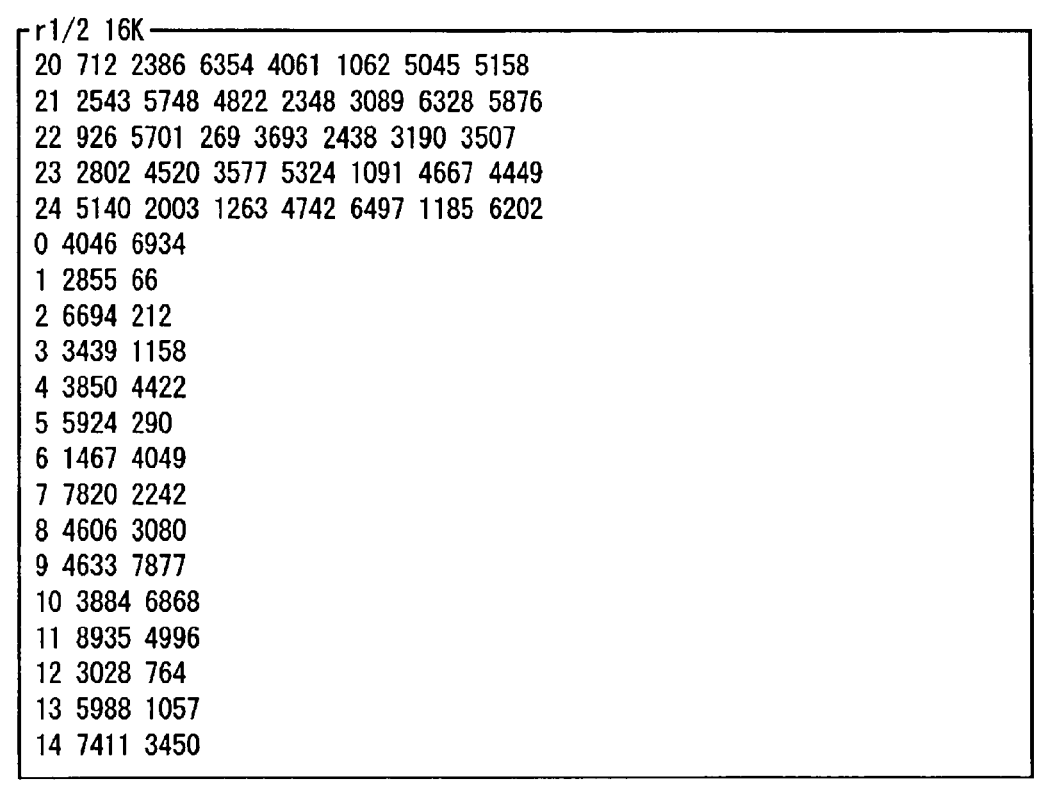

FIG. 84 shows the parity check matrix initial value table for a parity check matrix H prescribed in the DVB-S.2 standard and having a code length N of 16,200 bits and an encoding rate r of 1/2.

Figure 85:
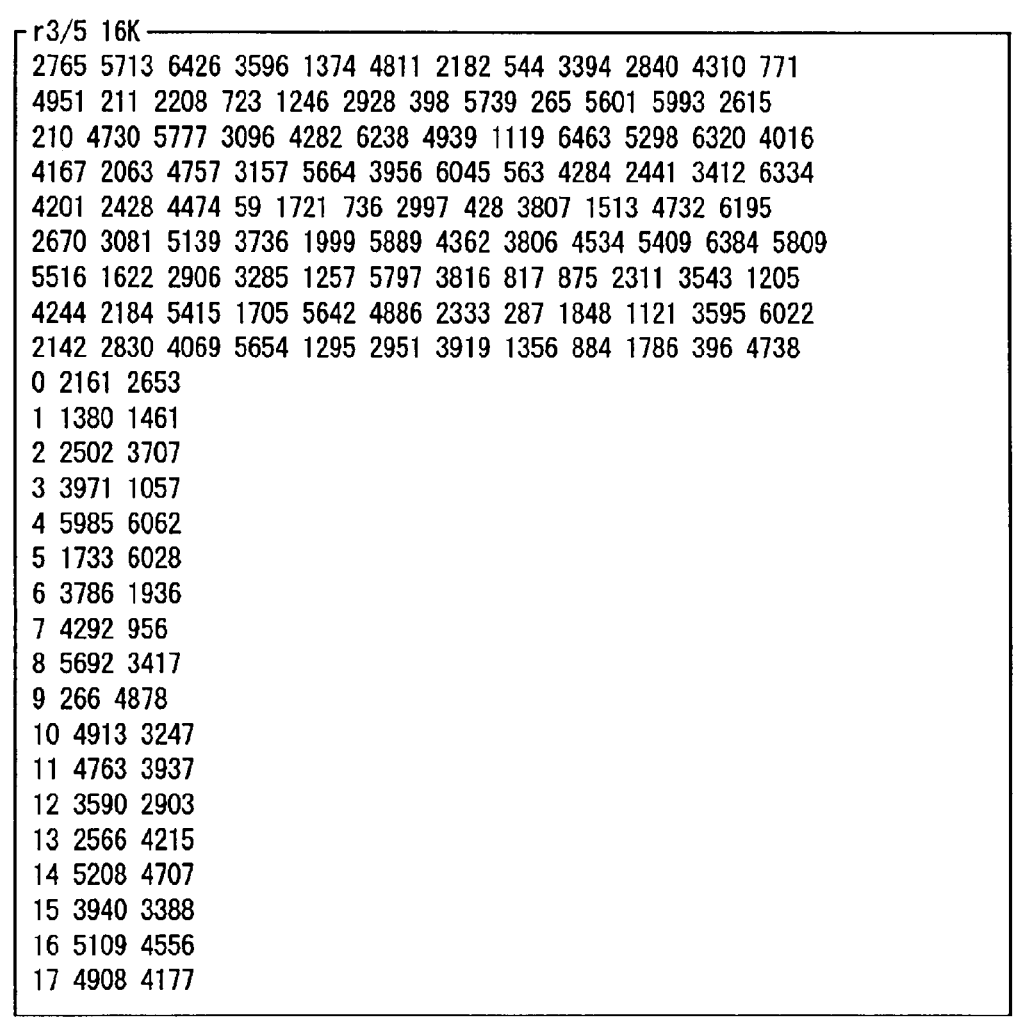

FIG. 85 shows the parity check matrix initial value table for a parity check matrix H prescribed in the DVB-S.2 standard and having a code length N of 16,200 bits and an encoding rate r of 3/5.

Figure 86:
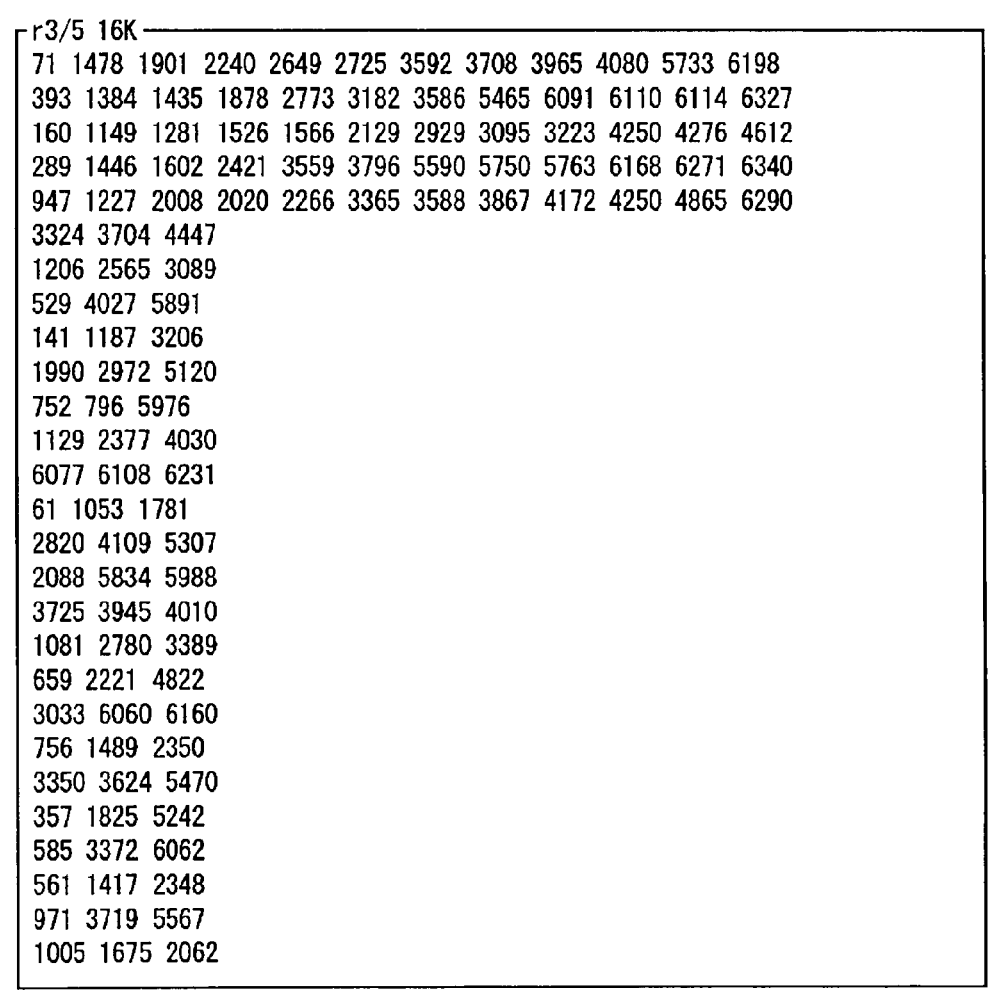

FIG. 86 shows the parity check matrix initial value table for a parity check matrix H having a code length N of 16,200 bits and an encoding rate r of 3/5, which can be used in place of the parity check matrix initial value table of FIG. 85.

The LDPC encoding section 21 of the transmission apparatus 11 determines a parity check matrix H in the following manner using the parity check matrix initial value tables.

In particular, FIG. 87 illustrates a method for determining a parity check matrix H from a parity check matrix initial value table.

It is to be noted that the parity check matrix initial value table of FIG. 87 indicates the parity check matrix initial value table for a parity check matrix H prescribed in the DVB-S.2 standard and having a code length N of 16,200 bits and an encoding rate r of 2/3 shown in FIG. 41.

As described above, the parity check matrix initial value table is a table which represents the position of elements of the value 1 of a information matrix $H_A$ corresponding to the information length K corresponding to the code length N and the encoding rate r of the LDPC code for every 360 columns (for every unit column number P of the cyclic structure), and in the first row of the parity check matrix initial value table, a number of row numbers of elements of the value 1 in the 1+360×(i−1)th column of the parity check matrix H (row numbers where the row number of the first row of the parity check matrix H is 0) equal to the number of column weights which the 1+360×(i−1)th column has.

Here, it is assumed that the parity matrix $H_T$ of the parity check matrix H corresponding to the parity length M has a staircase structure and is determined in advance. According to the parity check matrix initial value table, the information matrix $H_A$ corresponding to the information length K from within the parity check matrix H is determined.

The row number k+1 of the parity check matrix initial value table differs depending upon the information length K.

The information length K and the row number k+1 of the parity check matrix initial value table satisfy a relationship given by the following expression.

$$K = (k+1) \times 360$$

Here, 360 in the expression above is the unit column number P of the cyclic structure.

In the parity check matrix initial value table of FIG. 87, 13 numerical values are listed in the first to third rows, and three numerical values are listed in the fourth to k+1th (in FIG. 87, 30th) rows.

Accordingly, the number of column weights in the parity check matrix H determined from the parity check matrix initial value table of FIG. 87 is 13 in the first to 1+360×(3−1)−1th rows but is 3 in the 1+360×(3−1)th to Kth rows.

The first row of the parity check matrix initial value table of FIG. 87 includes 0, 2084, 1613, 1548, 1286, 1460, 3196, 4297, 2481, 3369, 3451, 4620 and 2622, and this indicates that, in the first column of the parity check matrix H, the elements in rows of the row numbers of 0, 2084, 1613, 1548, 1286, 1460, 3196, 4297, 2481, 3369, 3451, 4620 and 2622 have the value 1 (and besides the other elements have the value 0).

Meanwhile, the second row of the parity check matrix initial value table of FIG. 87 includes 1, 122, 1516, 3448, 2880, 1407, 1847, 3799, 3529, 373, 971, 4358 and 3108, and this indicates that, in the 361st (=1+360×(2−1)th) column of the parity check matrix H, the elements in rows of the row numbers of 1, 122, 1546, 3448, 2880, 1407, 1847, 3799, 3529, 373, 971, 4358 and 3108 have the value 1.

As given above, the parity check matrix initial value table represents the position of elements of the value 1 of the information matrix $H_A$ of the parity check matrix H for every 360 columns.

Each of the columns of the parity check matrix H other than the 1+360×(i−1)th column, that is, each of the columns from 2+360×(i−1)th to 360×ith columns, includes elements of the value of 1 obtained by cyclically shifting the elements of the value of 1 of the 1+360×(i−1)th column which depend upon the parity check matrix initial value table periodically in the downward direction (in the downward direction of the column) in accordance with the parity length M.

In particular, for example, the 2+360×(i−1)th column is a column obtained by cyclically shifting the 1+360×(i−1)th column in the downward direction by M/360 (=q), and the next 3+360×(i−1)th is a column obtained by cyclically shifting the 1+360×(i−1)th column in the downward direction by 2×M/360 (=2×q) and then cyclically shifting the cyclically shifted column (2+360×(i−1)th column) in the downward direction by M/360 (=q)

Now, if it is assumed that the numeral value in the jth column (jth from the left) in the ith row (ith row from above) of the parity check matrix initial value table is represented by $b_{i,j}$ and the row number of the jth element of the value 1 in the wth column of the parity check matrix H is represented by $H_{w-j}$, then the row number $H_{w-j}$ of the element of the value 1 in the wth column which is a column other than the 1+360×(i−1)th column of the parity check matrix H can be determined in accordance with the following expression.

$$H_{w-j} = \mathrm{mod}\{h_{i,j} + \mathrm{mod}((w-1),P) \times q, M\}$$

Here, mod(x,y) signifies a remainder when x is divided by y.

Meanwhile, P is a unit number of columns of the cyclic structure described hereinabove and is, for example, in the DVB-S.2 standard, 360. Further, q is a value M/360 obtained by dividing the parity length M by the unit column number P (=360) of the cyclic structure.

The LDPC encoding section 21 specifies the row number of the elements of the value 1 in the 1+360×(i−1)th column of the parity check matrix H from the parity check matrix initial value table.

Further, the LDPC encoding section 21 determines the row number $H_{w-j}$ of the element of the value 1 in the wth column which is a column other than the 1+360×(i−1)th column of the parity check matrix H and produces a parity check matrix H in which the elements of the row numbers obtained by the foregoing have the value 1.

Now, variations of the method of replacement of code bits of an LDPC code in the replacement process by the replacement section 32 of the demultiplexer 25 in the transmission apparatus 11, that is, of the allocation pattern (hereinafter referred to as bit allocation pattern) of code bits of an LDPC code and symbol bits representative of a symbol, are described.

In the demultiplexer 25, the code bits of the LDPC code are written in the column direction of the memory 31, which stores (N/(mb))×(mb) bits in the column direction×row direction. Thereafter, the code bits are read out in a unit of mb bits in the row direction. Further, in the demultiplexer 25, the replacement section 32 replaces the mb code bits read out in the row direction of the memory 31 and determines the code bits after the replacement as mb symbol bits of (successive) b symbols.

In particular, the replacement section 32 determines the i+1th bit from the most significant bit of the mb code bits read out in the row direction of the memory 31 as the code bit $b_i$ and determines the i+1th bit from the most significant bit of the mb symbol bits of the b (successive) symbols as the symbol bit $y_i$, and then replaces the mb code bits $b_0$ to $b_{mb-1}$ in accordance with a predetermined bit allocation pattern.

Figure 88:
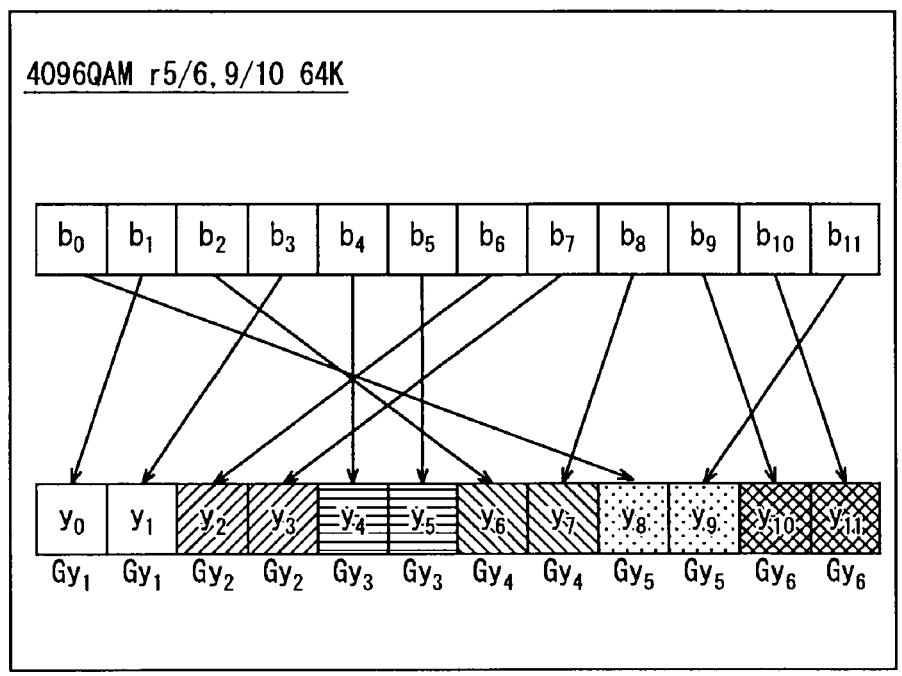
FIG. 88 is a view illustrating an example of replacement of code bits.

FIG. 88 shows an example of a bit allocation pattern which can be adopted where the LDPC code is an LDPC code whose code length N is 64,800 bits and whose encoding rate is 5/6 or 9/10 and besides the modulation method is 4096QAM and the multiple b is 1.

Where the LDPC code is an LDPC code whose code length N is 64,800 bits and whose encoding rate is 5/6 or 9/10 and besides the modulation method is 4096QAM and the multiple b is 1, in the demultiplexer 25, the code bits written in the memory 31 for storing (64,800/(12×1))×(12×1) bits in the column direction×row direction are read out in a unit of 12×1 (=mb) bits in the row direction and supplied to the replacement section 32.

The replacement section 32 replaces 12×1 (=mb) code bits $b_0$ to $b_{11}$ such that the 12×1 (=mb) code bits $b_o$ to $b_{11}$ to be read out from the memory 31 may be allocated to the 12×1 (=mb) symbol bits $y_0$ to $y_{11}$ of one (=b) symbol as seen in FIG. 88.

In particular, according to FIG. 88, the replacement section 32 carries out, with regard to both of an LDPC code having the encoding rate of 5/6 and an LDPC code having the encoding rate of 9/10 from among LDPC codes having the code length N of 64,800 bits, replacement for allocating
the code bit $b_0$ to the symbol bit $y_8$,
the code bit $b_1$ to the symbol bit $y_0$,
the code bit $b_2$ to the symbol bit $y_6$,
the code bit $b_3$ to the symbol bit $y_1$,
the code bit $b_4$ to the symbol bit $y_4$,
the code bit $b_5$ to the symbol bit $y_5$,
the code bit $b_6$ to the symbol bit $y_2$,
the code bit $b_7$ to the symbol bit $y_3$,
the code bit $b_9$ to the symbol bit $y_7$,
the code bit $b_9$ to the symbol bit $y_{10}$,
the code bit $b_{10}$ to the symbol bit $y_{11}$ and
the code bit $b_{11}$ to the symbol bit $y_9$.

Figure 89:
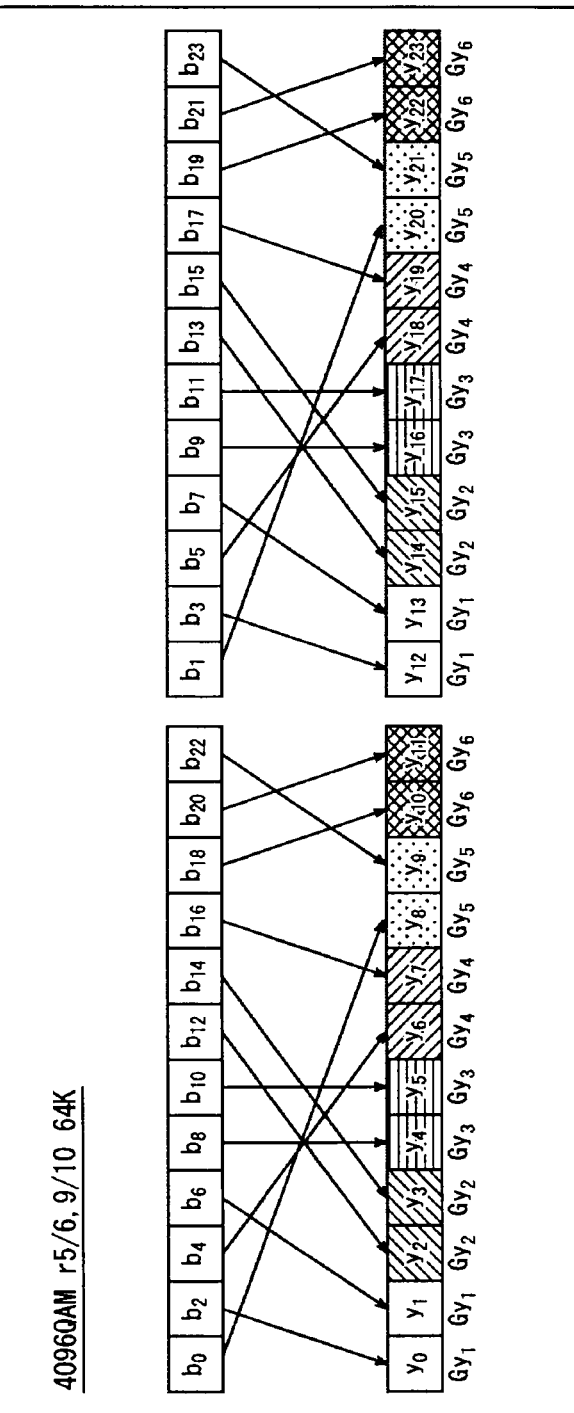
FIG. 89 is a view illustrating another example of replacement of code bits.

FIG. 89 shows an example of a bit allocation pattern which can be adopted where the LDPC code is an LDPC code whose code length N is 64,800 bits and whose modulation method is 4096QAM and the multiple b is 2.

Where the LDPC code is an LDPC code whose code length N is 64,800 bits and whose encoding rate is 5/6 or 9/10 and besides the modulation method is 4096QAM and the multiple b is 2, in the demultiplexer 25, the code bits written in the memory 31 for storing (64,800/(12×2))×(12×2) bits in the column direction×row direction are read out in a unit of 12×2 (=mb) bits in the row direction and supplied to the replacement section 32.

The replacement section 32 replaces 12×2 (=mb) code bits $b_0$ to $b_{23}$ such that the 12×2 (=mb) code bits $b_0$ to $b_{23}$ to be read out from the memory 31 may be allocated to the 12×2 (=mb) symbol bits $y_0$ to $y_{23}$ of two (=b) successive symbols as seen in FIG. 89.

In particular, according to FIG. 89, the replacement section 32 carries out, with regard to both of an LDPC code having the encoding rate of 5/6 and an LDPC code having the encoding rate of 9/10 from among LDPC codes having the code length N of 64,800 bits, replacement for allocating
the code bit $b_0$ to the symbol bit $y_8$,
the code bit $b_2$ to the symbol bit $y_0$,
the code bit $b_4$ to the symbol bit $y_6$,
the code bit $b_6$ to the symbol bit $y_1$,
the code bit $b_8$ to the symbol bit $y_4$,
the code bit $b_{10}$ to the symbol bit $y_5$,
the code bit $b_{12}$ to the symbol bit $y_2$,
the code bit $b_{14}$ to the symbol bit $y_3$,
the code bit $b_{16}$ to the symbol bit $y_7$,
the code bit $b_{18}$ to the symbol bit $y_{10}$,
the code bit $b_{20}$ to the symbol bit $y_{11}$,
the code bit $b_{22}$ to the symbol bit $y_9$,
the code bit $b_1$ to the symbol bit $y_{20}$,
the code bit $b_3$ to the symbol bit $y_{12}$,
the code bit $b_5$ to the symbol bit $y_{18}$,
the code bit $b_7$ to the symbol bit $y_{13}$,
the code bit $b_9$ to the symbol bit $y_{16}$,
the code bit $b_{11}$ to the symbol bit $y_{17}$,
the code bit $b_{13}$ to the symbol bit $y_{14}$,
the code bit $b_{15}$ to the symbol bit $y_{15}$,
the code bit $b_{17}$ to the symbol bit $y_{19}$,
the code bit $b_{19}$ to the symbol bit $y_{22}$,
the code bit $b_{21}$ to the symbol bit $y_{23}$, and
the code bit $b_{23}$ to the symbol bit $y_{21}$.

Here, the bit allocation pattern of FIG. 89 utilizes the bit allocation pattern of FIG. 88 wherein the multiple b is 1 without any modification. In particular, in FIG. 89, the allocation of the code bits $b_0, b_2, \ldots, b_{22}$ to the symbol bits $y_i$ and the allocation of the $b_1, b_3, b_{23}$ to the symbol bits $y_i$ are similar to the allocation of the code bits $b_o$ to $b_{11}$ to the symbol bits $y_i$ of FIG. 88.

Figure 90:
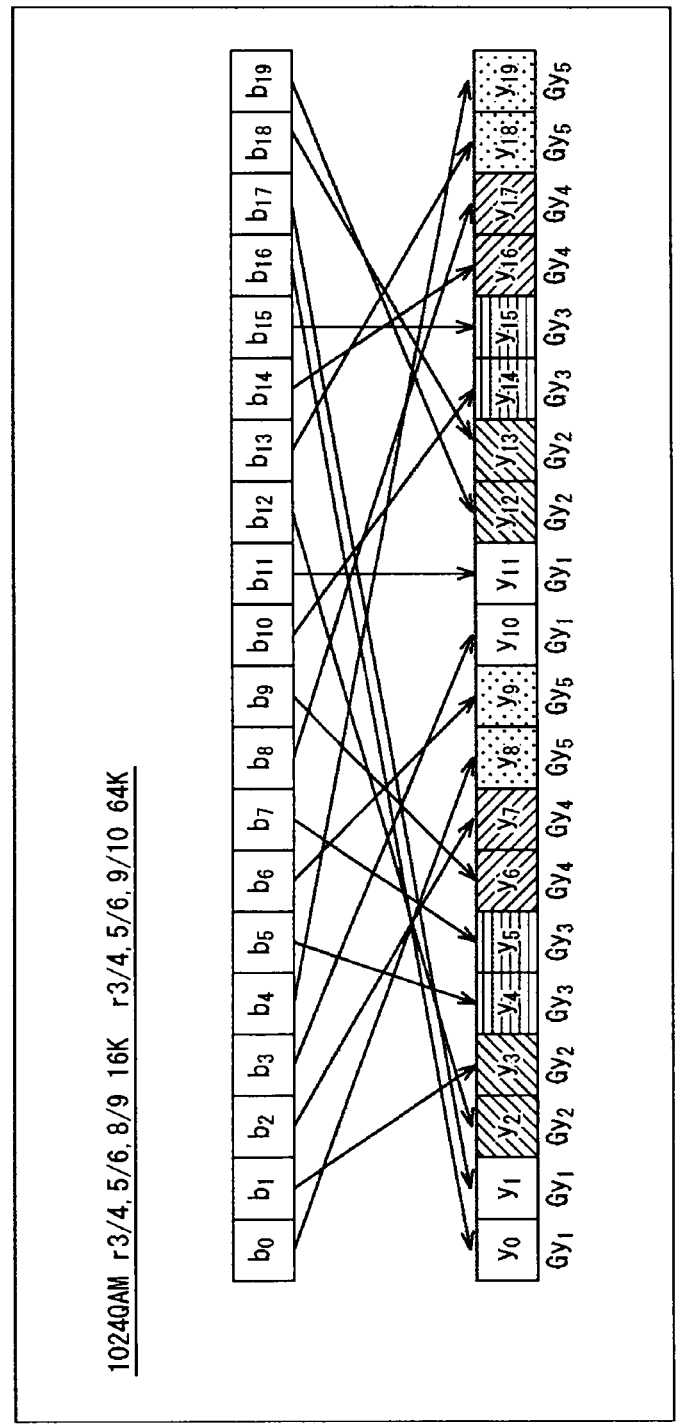
FIG. 90 is a view illustrating a further example of replacement of code bits.

FIG. 90 shows an example of a bit allocation pattern which can be adopted where the modulation method is 1024QAM and the LDPC code is an LDPC code whose code length N is 16,200 bits and whose encoding rate is 3/4, 5/6 or 8/9 and besides the multiple b is 2 and also where the modulation method is 1024QAM and the LDPC code is an LDPC code whose code length N is 64,800 bits and whose encoding length is 3/4, 5/6 or 9/10 and besides the multiple b is 2.

Where the LDPC code is an LDPC code whose code length N is 16,200 bits and whose encoding rate is 3/4, 5/6 or 8/9 and the modulation method is 1024QAM and besides the multiple b is 2, in the demultiplexer 25, the code bits written in the memory 31 for storing (16,200/(10×2))×(10×2) bits in the column direction×row direction are read out in a unit of 10×2 (=mb) bits in the row direction and supplied to the replacement section 32.

On the other hand, where the LDPC code is an LDPC code whose code length N is 64,800 bits and whose encoding rate is 3/4, 5/6 or 9/10 and the modulation method is 1024QAM and besides the multiple b is 2, in the demultiplexer 25, the code bits written in the memory 31 for storing (64,800/(10×2))×(10×2) bits in the column direction×row direction are read out in a unit of 10×2 (=mb) bits in the row direction and supplied to the replacement section 32.

The replacement section 32 replaces 10×2 (=mb) code bits $b_0$ to $b_{19}$ such that the 10×2 (=mb) code bits $b_0$ to $b_{19}$ to be read out from the memory 31 may be allocated to the 10×2 (=mb) symbol bits $y_0$ to $y_{19}$ of two (=b) successive symbols as seen in FIG. 90.

In particular, according to FIG. 90, the replacement section 32 carries out, with regard to all of the LDPC codes having the encoding rate of 3/4, LDPC codes having the encoding rate of 5/6 and LDPC codes having a further encoding rate of 8/9 from among LDPC codes having the code length of 16,200 bits as well as LDPC code having the encoding rate of 3/4, LDPC codes having the encoding rate of 5/6 and LDPC codes having a further encoding rate of 9/10 from among LDPC codes having another code length N of 64,800, replacement for allocating the code bit $b_0$ to the symbol bit $y_8$,
the code bit $b_1$ to the symbol bit $y_3$,
the code bit $b_2$ to the symbol bit $y_7$,
the code bit $b_3$ to the symbol bit $y_{10}$,
the code bit $b_4$ to the symbol bit $y_{19}$,
the code bit $b_6$ to the symbol bit $y_4$,
the code bit $b_6$ to the symbol bit $y_9$,
the code bit $b_7$ to the symbol bit $y_6$,
the code bit $b_8$ to the symbol bit $y_{17}$,
the code bit $b_9$ to the symbol bit $y_6$,
the code bit $b_{10}$ to the symbol bit $y_{14}$,
the code bit $b_{11}$ to the symbol bit $y_{11}$,
the code bit $b_{12}$ to the symbol bit $y_2$,
the code bit $b_{13}$ to the symbol bit $y_{18}$,
the code bit $b_{14}$ to the symbol bit $y_{16}$,
the code bit $b_{15}$ to the symbol bit $y_{15}$,
the code bit $b_{16}$ to the symbol bit $y_0$,
the code bit $b_{17}$ to the symbol bit $y_1$,
the code bit $b_{18}$ to the symbol bit $y_{13}$, and
the code bit $b_{19}$ to the symbol bit $y_{12}$.

Figure 91:
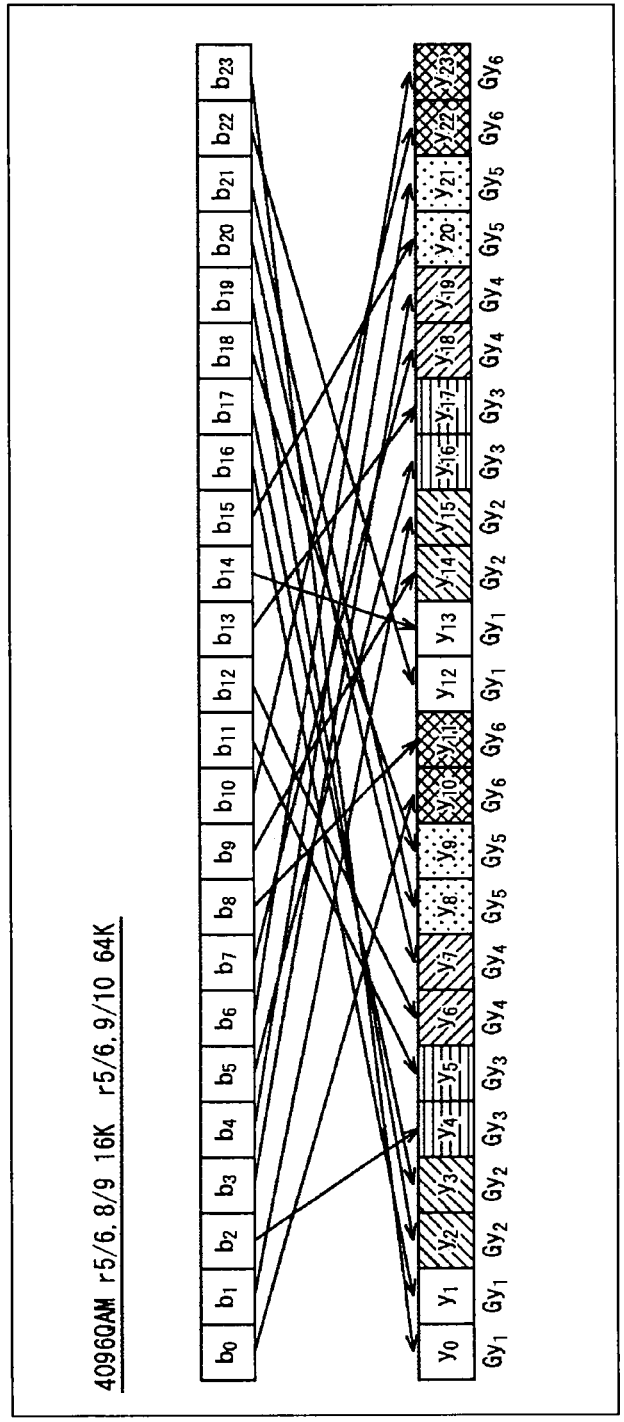
FIG. 91 is a view illustrating a still further example of replacement of code bits.

FIG. 91 shows an example of a bit allocation pattern which can be adopted where the modulation method is 4096QAM and the LDPC code is an LDPC code whose code length N is 16,200 bits and whose encoding rate is 5/6 or 8/9 and besides the multiple b is 2 and also where the modulation method is 4096QAM and the LDPC code is an LDPC code whose code length N is 64,800 bits and whose encoding rate is 5/6 or 9/10 and besides the multiple b is 2.

Where the LDPC code is an LDPC code whose code length N is 16,200 bits and whose encoding rate is 5/6 or 8/9 and the modulation method is 4096QAM and besides the multiple b is 2, in the demultiplexer 25, the code bits written in the memory 31 for storing (16,200/(12×2))×(12×2) bits in the column direction×row direction are read out in a unit of 12×2 (=mb) bits in the row direction and supplied to the replacement section 32.

On the other hand, where the LDPC code is an LDPC code whose code length N is 64,800 bits and whose encoding rate is 5/6 or 9/10 and the modulation method is 4096QAM and besides the multiple b is 2, in the demultiplexer 25, the code bits written in the memory 31 for storing (64,800/(12×2))×(12×2) bits in the column direction×row direction are read out in a unit of 12×2 (=mb) bits in the row direction and supplied to the replacement section 32.

The replacement section 32 replaces 12×2 (=mb) code bits $b_0$ to $b_{23}$ such that the 12×2 (=mb) bits to be read out from the memory 31 may be allocated to the 12×2 (=mb) symbol bits $y_0$ to $y_{23}$ of two (=b) successive symbols as seen in FIG. 91.

In particular, according to FIG. 91, the replacement section 32 carries out, with regard to all of the LDPC codes having the encoding rate of 5/6 and LDPC codes having the encoding rate of 8/9 from among LDPC codes having the code length of 16,200 bits as well as LDPC codes having the encoding rate of 5/6 and LDPC codes having the encoding rate of 9/10 from among LDPC codes having another code length N of 64,800, replacement for allocating the code bit $b_0$ to the symbol bit $y_{10}$,
the code bit $b_1$ to the symbol bit $y_{15}$,
the code bit $b_2$ to the symbol bit $y_4$,
the code bit $b_3$ to the symbol bit $y_{19}$,
the code bit $b_4$ to the symbol bit $y_{21}$,
the code bit $b_5$ to the symbol bit $y_{16}$,
the code bit $b_6$ to the symbol bit $y_{23}$,
the code bit $b_7$ to the symbol bit $y_{18}$,
the code bit $b_8$ to the symbol bit $y_{11}$,
the code bit $b_9$ to the symbol bit $y_{14}$,
the code bit $b_{10}$ to the symbol bit $y_{22}$,
the code bit $b_{11}$ to the symbol bit $y_5$,
the code bit $b_{12}$ to the symbol bit $y_6$,
the code bit $b_{13}$ to the symbol bit $y_{17}$,
the code bit $b_{14}$ to the symbol bit $y_{13}$,
the code bit $b_{15}$ to the symbol bit $y_{20}$,
the code bit $b_{16}$ to the symbol bit $y_1$,
the code bit $b_{17}$ to the symbol bit $y_3$,
the code bit $b_{18}$ to the symbol bit $y_9$,
the code bit $b_{19}$ to the symbol bit $y_2$,
the code bit $b_{20}$ to the symbol bit $y_7$,
the code bit $b_{21}$ to the symbol bit $y_8$,
the code bit $b_{22}$ to the symbol bit $y_{12}$, and
the code bit $y_{23}$ to the symbol bit $y_0$.

According to the bit allocation patterns shown in FIGS. 88 to 91, the same bit allocation pattern can be adopted for a plurality of kinds of LDPC codes, and besides, the tolerance to errors can be set to a desired performance with regard to all of the plural kinds of LDPC codes.

In particular, FIGS. 92 to 95 illustrates results of simulations of the BER (Bit Error Rate) where a replacement process is carried out in accordance with the bit allocation patterns of FIGS. 88 to 91.

It is to be noted that, in FIGS. 92 to 95, the axis of abscissa represents $E_s/N_o$ (signal power to noise power ratio per one symbol) and the axis of ordinate represents the BER.

Further, a solid line curve represents the BER where a replacement process is carried out and an alternate long and short dash line represents the BER where a replacement process is not carried out.

Figure 92:
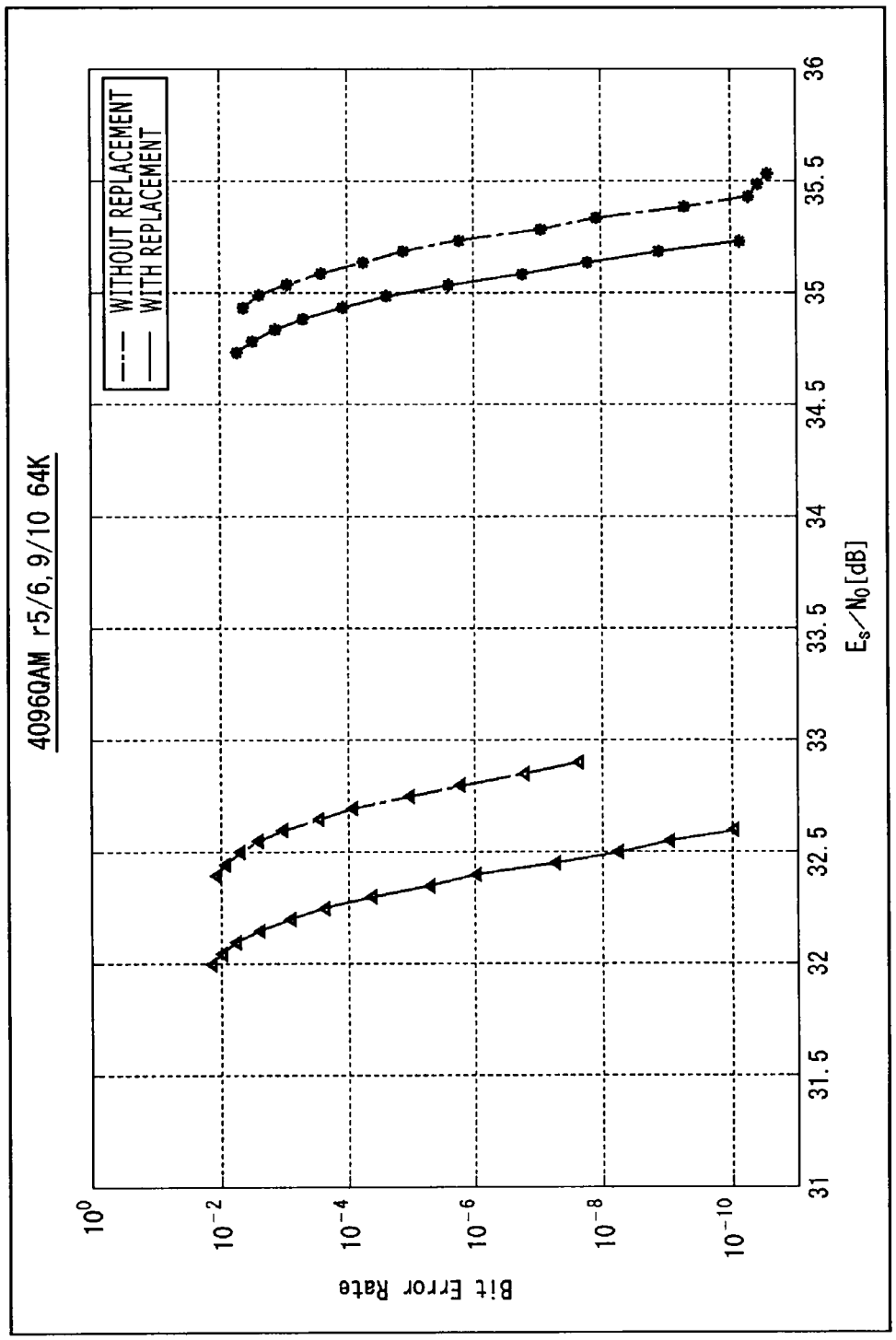
FIG. 92 is a view illustrating a simulation result of the BER.

FIG. 92 illustrates the BER where a replacement process in accordance with the bit allocation pattern of FIG. 88 is carried out for LDPC codes whose code length N is 64,800 and whose encoding rate is 5/6 and 9/10 adopting 4096QAM as the modulation method and setting the multiple b to 1.

Figure 93:
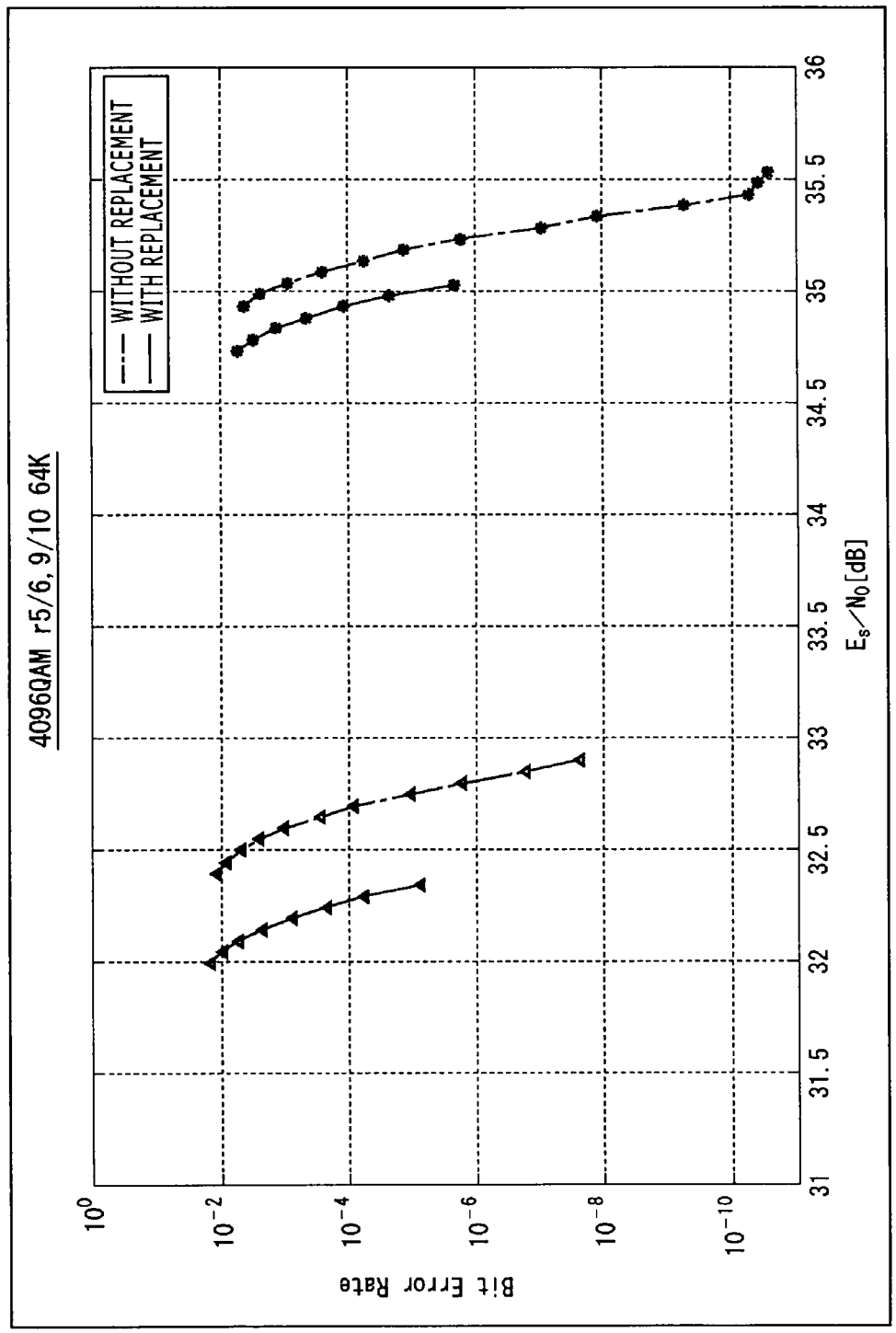
FIG. 93 is a view illustrating another simulation result of the BER.

FIG. 93 illustrates the BER where a replacement process in accordance with the bit allocation pattern of FIG. 89 is carried out for LDPC codes whose code length N is 64,800 and whose encoding rate is 5/6 and 9/10 adopting 4096QAM as the modulation method and setting the multiple b to 2.

It is to be noted that, in FIGS. 92 and 93, a graph having a triangular mark applied thereto represents the BER regarding the LDPC code having the encoding rate of 5/6, and a graph having an asterisk applied thereto represents the BER regarding the LDPC code having the encoding rate of 9/10.

Figure 94:
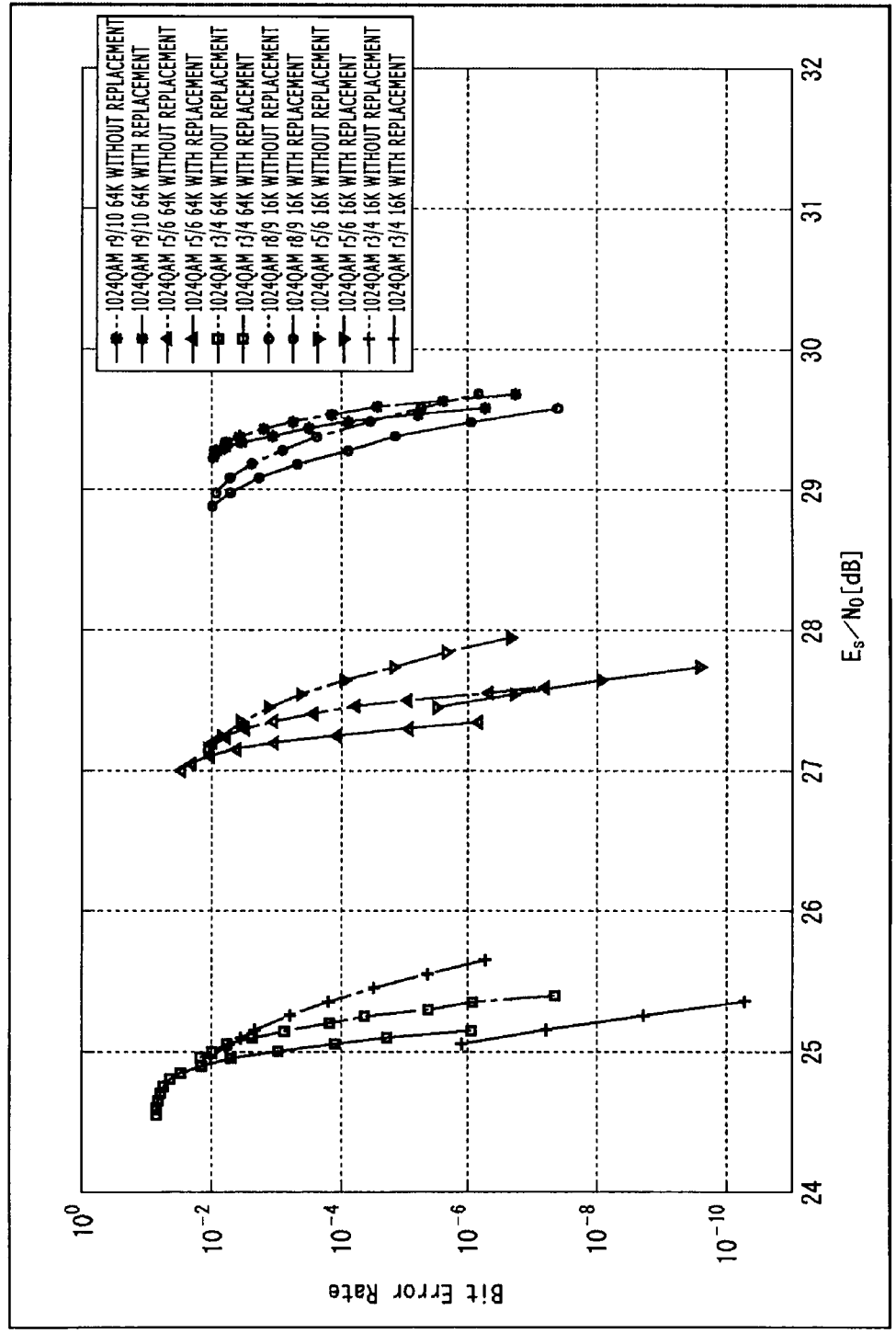
FIG. 94 is a view illustrating a further simulation result of the BER.

FIG. 94 illustrates the BER where a replacement process in accordance with the bit allocation pattern of FIG. 90 is carried out for LDPC codes whose code length N is 16,200 and whose encoding rate is 3/4, 5/6 and 8/9 and for LDPC codes whose code length N is 64,800 and whose encoding rate is 3/4, 5/6 and 9/10 adopting 1024QAM as the modulation method and setting the multiple b to 2.

It is to be noted that, in FIG. 94, a graph having an asterisk applied thereto represents the BER regarding the LDPC code having the code length N of 64,800 and the encoding rate of 9/10, and a graph having an upwardly directed triangular mark applied thereto represents the BER regarding the LDPC codes having the code length N of 64,800 and the encoding rate of 5/6. Further, a graph having a square mark applied thereto represents the BER regarding the LDPC code having the code length N of 64,800 and the encoding rate of 3/4.

Further, in FIG. 94, a graph having a round mark applied thereto represents the BER regarding the LDPC code having the code length N of 16,200 and the encoding rate of 8/9, and a graph having a downwardly directed triangular mark applied thereto represents the BER regarding the LDPC code having the code length N of 16,200 and the encoding rate of 5/6. Further, a graph having a plus mark applied thereto represents the BER regarding the LDPC code having the code length N of 16,200 and the encoding rate of 3/4.

Figure 95:
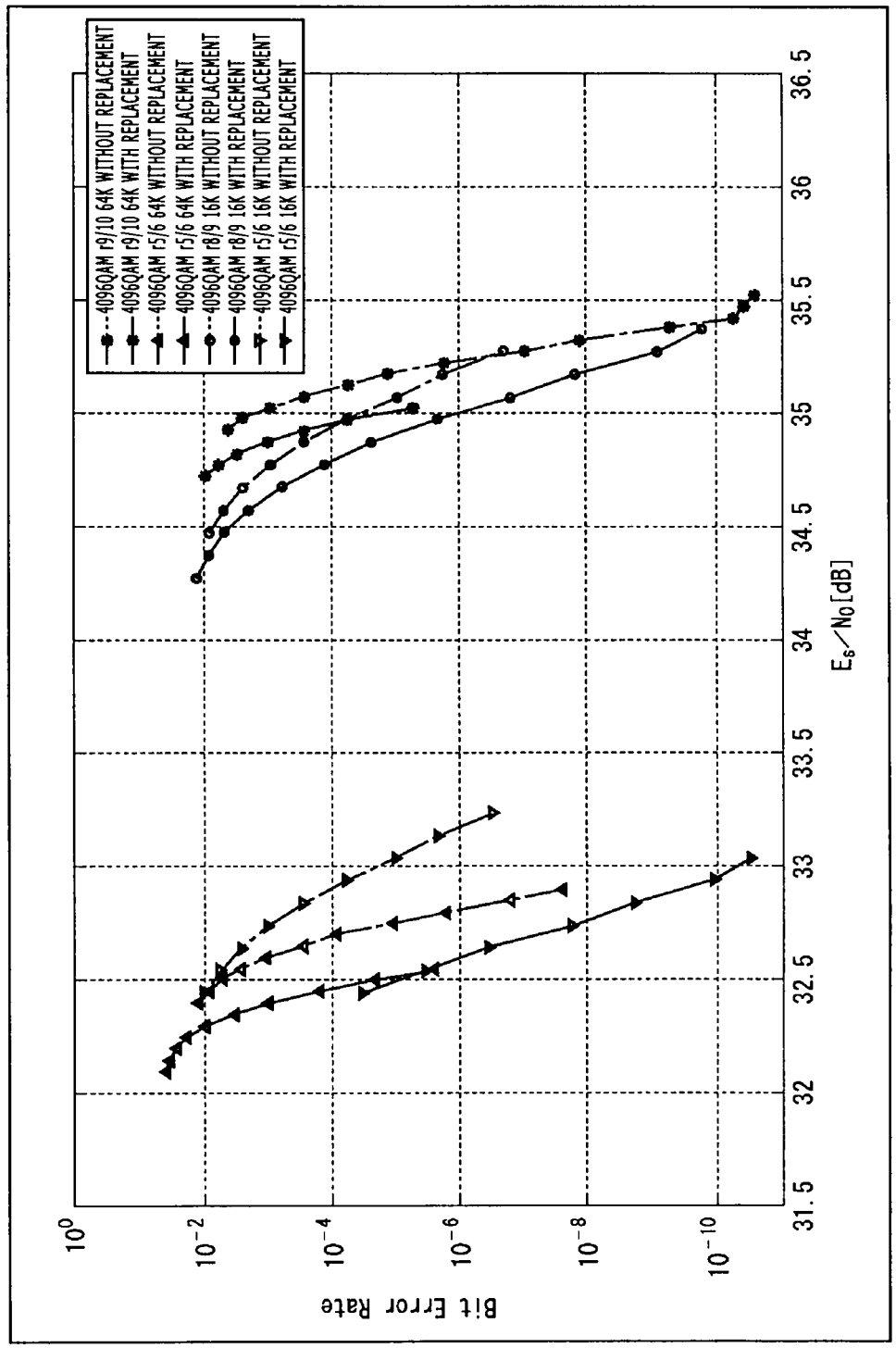
FIG. 95 is a view illustrating a still simulation result of the BER.

FIG. 95 illustrates the BER where a replacement process in accordance with the bit allocation pattern of FIG. 91 is carried out for LDPC codes whose code length N is 16,200 and whose encoding rate is 5/6 and 8/9 and for LDPC codes whose code length N is 64,800 and whose encoding rate is 5/6 and 9/10 adopting 4096QAM as the modulation method and setting the multiple b to 2.

It is to be noted that, in FIG. 95, a graph having an asterisk applied thereto represents the BER regarding the LDPC code having the code length N of 64,800 and the encoding rate of 9/10, and a graph having an upwardly directed triangular mark applied thereto represents the BER regarding the LDPC codes having the code length N of 64,800 and the encoding rate of 5/6.

Further, in FIG. 95, a graph having a round mark applied thereto represents the BER regarding the LDPC code having the code length N of 16,200 and the encoding rate of 8/9, and a graph having a downwardly directed triangular mark applied thereto represents the BER regarding the LDPC code having the code length N of 16,200 and the encoding rate of 5/6.

According to FIGS. 92 to 95, the same bit allocation pattern can be adopted with regard to a plurality of kinds of LDPC codes. Besides, the tolerance to errors can be set to a desired performance with regard to all of the plural kinds of LDPC codes.

In particular, where a bit allocation pattern for exclusive use is adopted for each of a plurality of kinds of LDPC codes which have different code lengths and different encoding rates, the tolerance to an error can be raised to a very high performance. However, it is necessary to change the bit allocation pattern for each of a plurality of kinds of LDPC codes.

On the other hand, according to the bit allocation patterns of FIGS. 88 to 91, the same bit allocation pattern can be adopted for a plurality of kinds of LDPC codes which have different code lengths and different encoding rates, and the necessity to change the bit allocation pattern for each of a plurality of kinds of LDPC codes as in a case wherein a bit allocation pattern for exclusive use is adopted for each of a plurality of kinds of LDPC codes is eliminated.

Further, according to the bit allocation patterns of FIGS. 88 to 91, the tolerance to errors can be raised to a high performance although it is a little lower than that where a bit allocation pattern for exclusive use is adopted for each of a plurality of kinds of LDPC codes.

In particular, for example, where the modulation method is 4096QAM, the same bit allocation pattern in FIG. 88 or 89 can be used for all of the LDPC codes which have the code length N of 64,800 and the encoding rate of 5/6 and 9/10. Even where the same bit allocation pattern is adopted in this manner, the tolerance to errors can be raised to a high performance.

Further, for example, where the modulation method is 1024QAM, the same bit allocation pattern of FIG. 90 can be adopted for all of the LDPC codes which have the code length N of 16,200 and the encoding rate of 3/4, 5/6 and 8/9 and the LDPC codes which have the code length N of 64,800 and the encoding rate of 3/4, 5/6 and 9/10. Then, even if the same bit allocation pattern is adopted in this manner, the tolerance to errors can be raised to a high performance.

Meanwhile, for example, where the modulation method is 4096QAM, the same bit allocation pattern of FIG. 91 can be adopted for all of the LDPC codes which have the code length N of 16,200 and the encoding rate of 5/6 and 8/9 and the LDPC codes which have the code length N of 64,800 and the encoding rate of 5/6 and 9/10. Then, even if the same bit allocation pattern is adopted in this manner, the tolerance to errors can be raised to a high performance.

Variations of the bit allocation pattern are further described.

Figure 96:
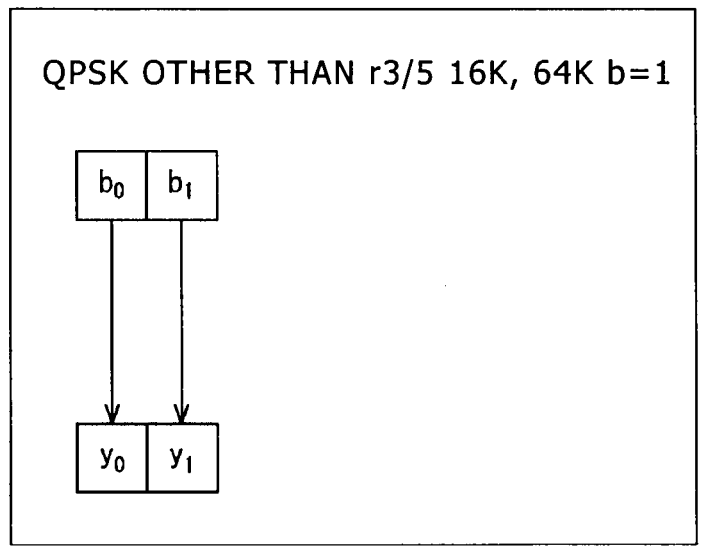
FIG. 96 is a view illustrating an example of replacement of code bits.

FIG. 96 illustrates an example of a bit allocation pattern which can be adopted where the LDPC code is any LDPC code which has the code length N of 16,200 or 64,800 bits and one of the encoding rates for the LDPC code defined by a parity check matrix H produced, for example, from any of the parity check matrix initial value tables shown in FIGS. 41 to 86 other than the encoding rate of 3/5 and besides the modulation method is QPSK and the multiple b is 1.

Where the LDPC code is an LDPC code which has the code length N of 16,200 or 64,800 bits and has the encoding rate other than 3/5 and besides the modulation method is QPSK and the multiple b is 1, the demultiplexer 25 reads out code bits written in the memory 31 for storing (N/(2×1))×(2×1) bits in the column direction×row direction in a unit of 2×1 (=mb) bits in the row direction and supplies the read out code bits to the replacement section 32.

The replacement section 32 replaces the 2×1 (=mb) code bits $b_0$ and $b_1$ read out from the memory 31 in such a manner that the 2×1 (=mb) code bits $b_0$ and $b_1$ are allocated to the 2×1 (=mb) symbol bits $y_0$ and $y_1$ of one (=b) symbol as seen in FIG. 96.

In particular, according to FIG. 96, the replacement section 32 carries out replacement for allocating the code bit $b_0$ to the symbol bit $y_0$ and the code bit $b_1$ to the symbol bit $y_1$.

It is to be noted that, in this instance, also it is possible to consider that replacement is not carried out and the code bits $b_0$ and $b_1$ are determined as they are as the symbol bits $y_0$ and $y_1$, respectively.

Figure 97:
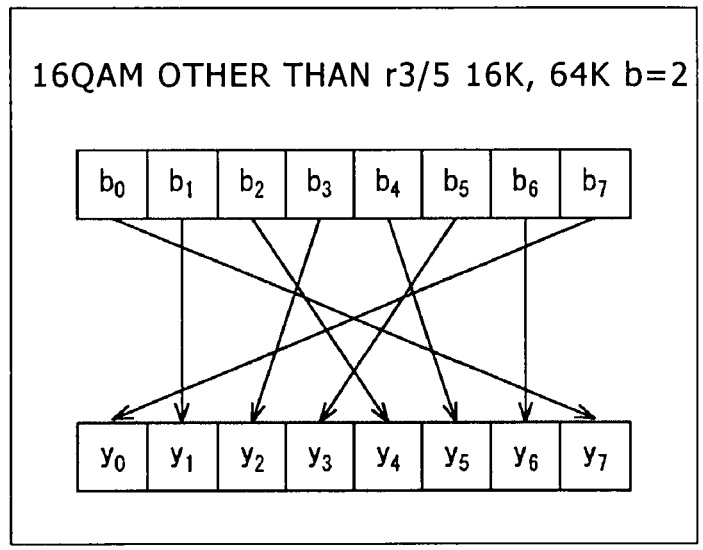
FIG. 97 is a view illustrating another example of replacement of code bits.

FIG. 97 shows an example of a bit allocation pattern which can be adopted where the LDPC code is an LDPC code which has the code length N of 16,200 or 64,800 bits and has the encoding rate other than 3/5 and besides the modulation method is 16QAM and the multiple b is 2.

Where the LDPC code is an LDPC code which has the code length N of 16,200 or 64,800 bits and has the encoding rate other than 3/5 and besides the modulation method is 16QAM and the multiple b is 2, the demultiplexer 25 reads out the code bits written in the memory 31 for storing (N/(4×2))×(4×2) bits in the column direction×row direction in a unit of 4×2 (=mb) bits in the row direction and supplies the read out code bits to the replacement section 32.

The replacement section 32 replaces the 4×2 (=mb) code bits $b_0$ to $b_7$ read out from the memory 31 in such a manner that the 4×2 (=mb) code bits are allocated to the 4×2 (=mb) symbol bits $y_0$ to $y_7$ of two (=b) successive symbols as seen in FIG. 97.

In particular, according to FIG. 97, the replacement section 32 carries out replacement for allocating the code bit $b_0$ to the symbol bit $y_7$,
the code bit $b_1$ to the symbol bit $y_1$,
the code bit $b_2$ to the symbol bit $y_4$,
the code bit $b_3$ to the symbol bit $y_2$,
the code bit $b_4$ to the symbol bit $y_5$,
the code bit $b_5$ to the symbol bit $y_3$,
the code bit $b_6$ to the symbol bit $y_6$, and
the code bit $b_7$ to the symbol bit $y_0$.

Figure 98:
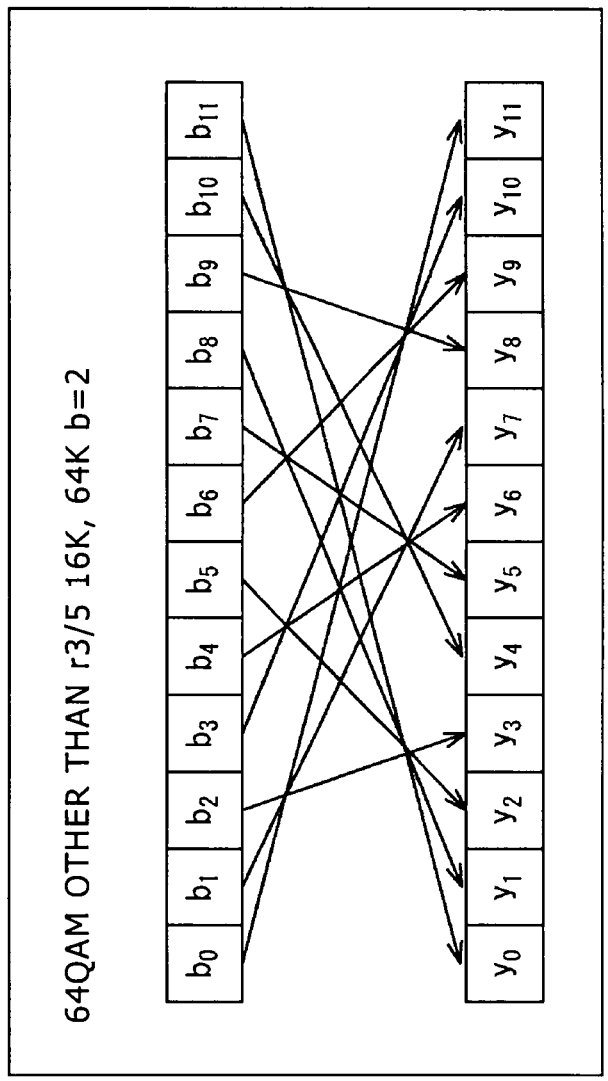
FIG. 98 is a view illustrating a further example of replacement of code bits.

FIG. 98 shows an example of a bit allocation pattern which can be adopted where the modulation method is 64QAM and the LDPC code is an LDPC code whose code length N is 16,200 or 64,800 bits and whose encoding rate is any other than 3/5 and besides the multiple b is 2.

Where the LDPC code is an LDPC code whose code length N is 16,200 or 64,800 bits and whose encoding rate is any other than 3/5 and the modulation method is 64QAM and besides the multiple b is 2, in the demultiplexer 25, the code bits written in the memory 31 for storing (N/(6×2))×(6×2) bits in the column direction×row direction are read out in a unit of 6×2 (=mb) bits in the row direction and supplied to the replacement section 32.

The replacement section 32 replaces the 6×2 (=mb) code bits $b_0$ to $b_{11}$ read out from the memory 31 such that the 6×2 (=mb) code bits $b_0$ to $b_{11}$ may be allocated to the 6×2 (=mb) symbol bits $y_0$ to $y_{11}$ of two (=b) successive symbols as seen in FIG. 98.

In particular, according to FIG. 98, the replacement section 32 carries out replacement for allocating the code bit $b_0$ to the symbol bit $y_{11}$,
the code bit $b_1$ to the symbol bit $y_7$,
the code bit $b_2$ to the symbol bit $y_3$,
the code bit $b_3$ to the symbol bit $y_{10}$,
the code bit $b_4$ to the symbol bit $y_6$,
the code bit $b_5$ to the symbol bit $y_2$,
the code bit $b_6$ to the symbol bit $y_9$,
the code bit $b_7$ to the symbol bit $y_5$,
the code bit $b_8$ to the symbol bit $y_1$,
the code bit $b_9$ to the symbol bit $y_8$,
the code bit $b_{10}$ to the symbol bit $y_4$, and
the code bit $b_{11}$ to the symbol bit $y_0$.

Figure 99:
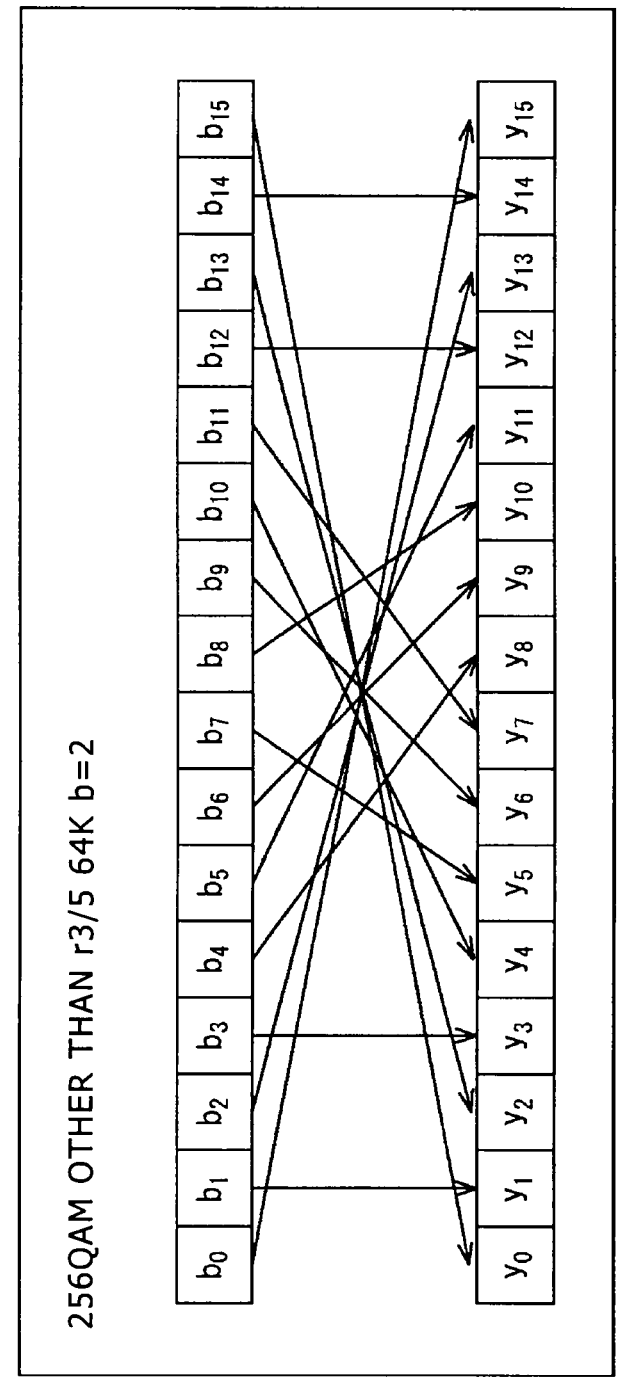
FIG. 99 is a view illustrating a still further example of replacement of code bits.

FIG. 99 shows an example of a bit allocation pattern which can be adopted where the modulation method is 256QAM and the LDPC code is an LDPC code whose code length N is 64,800 bits and whose encoding rate is any other than 3/5 and besides the multiple b is 2.

Where the LDPC code is an LDPC code whose code length N is 64,800 bits and whose encoding rate is any other than 3/5 and the modulation method is 256QAM and besides the multiple b is 2, in the demultiplexer 25, the code bits written in the memory 31 for storing (64,800/(8×2))×(8×2) bits in the column direction×row direction are read out in a unit of 8×2 (=mb) bits in the row direction and supplied to the replacement section 32.

The replacement section 32 replaces the 8×2 (=mb) code bits $b_0$ to $b_{15}$ read out from the memory 31 such that the 8×2 (=mb) code bits $b_0$ to $b_{15}$ may be allocated to the 8×2 (=mb) symbol bits $y_0$ to $y_{15}$ of two (=b) successive symbols as seen in FIG. 99.

In particular, according to FIG. 99, the replacement section 32 carries out replacement for allocating the code bit $b_0$ to the symbol bit $y_{15}$,
the code bit $b_1$ to the symbol bit $y_1$,
the code bit $b_2$ to the symbol bit $y_{13}$,
the code bit $b_3$ to the symbol bit $y_3$,
the code bit $b_4$ to the symbol bit $y_8$,
the code bit $b_5$ to the symbol bit $y_{11}$,
the code bit $b_6$ to the symbol bit $y_9$,
the code bit $b_7$ to the symbol bit $y_5$,
the code bit $b_8$ to the symbol bit $y_{10}$,
the code bit $b_9$ to the symbol bit $y_6$,
the code bit $b_{10}$ to the symbol bit $y_4$,
the code bit $b_{11}$ to the symbol bit $y_7$,
the code bit $b_{12}$ to the symbol bit $y_{12}$,
the code bit $b_{13}$ to the symbol bit $y_2$,
the code bit $b_{14}$ to the symbol bit $y_{14}$, and
the code bit $b_{15}$ to the symbol bit $y_0$.

Figure 100:
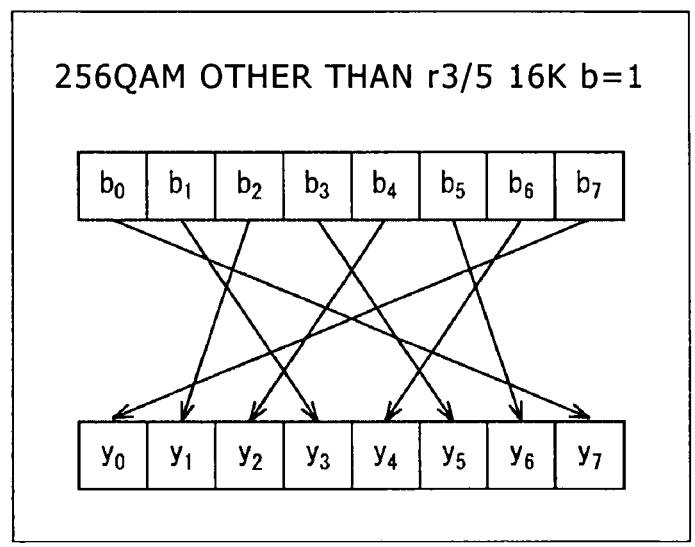
FIG. 100 is a view illustrating a yet further example of replacement of code bits.

FIG. 100 shows an example of a bit allocation pattern which can be adopted where the modulation method is 256QAM and the LDPC code is an LDPC code whose code length N is 16,200 bits and whose encoding rate is any other than 3/5 and besides the multiple b is 1.

Where the LDPC code is an LDPC code whose code length N is 16,200 bits and whose encoding rate is any other than 3/5 and the modulation method is 256QAM and besides the multiple b is 1, in the demultiplexer 25, the code bits written in the memory 31 for storing (16,200/(8×1))×(8×1) bits in the column direction×row direction are read out in a unit of 8×1 (=mb) bits in the row direction and supplied to the replacement section 32.

The replacement section 32 replaces the 8×1 (=mb) code bits $b_0$ to $b_7$ read out from the memory 31 such that the 8×1 (=mb) code bits $b_o$ to $b_7$ may be allocated to the 8×1 (=mb) symbol bits $y_0$ to $y_7$ of one (=b) symbol as seen in FIG. 100.

In particular, according to FIG. 100, the replacement section 32 carries out replacement for allocating the code bit $b_0$ to the symbol bit $y_7$,
the code bit $b_1$ to the symbol bit $y_3$,
the code bit $b_2$ to the symbol bit $y_1$,
the code bit $b_3$ to the symbol bit $y_5$,
the code bit $b_4$ to the symbol bit $y_2$,
the code bit $b_5$ to the symbol bit $y_6$,
the code bit $b_6$ to the symbol bit $y_4$, and
the code bit $b_7$ to the symbol bit $y_0$.

Figure 101:
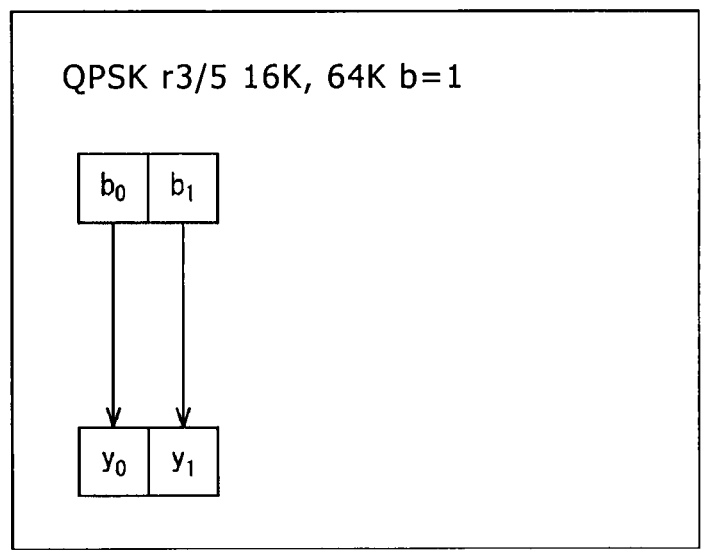
FIG. 101 is a view illustrating a yet further example of replacement of code bits.

FIG. 101 shows an example of a bit allocation pattern which can be adopted where the LDPC code is an LDPC code whose code length N is 16,200 or 64,800 bits and whose encoding rate is any other than 3/5 and besides the modulation method is QPSK and the multiple b is 1.

Where the LDPC code is an LDPC code whose code length N is 16,200 or 64,800 bits and whose encoding rate is any other than 3/5 and besides the modulation method is QPSK and the multiple b is 1, in the demultiplexer 25, the code bits written in the memory 31 for storing (N/(2×1))×(2×1) bits in the column direction×row direction are read out in a unit of 2×1 (=mb) bits in the row direction and supplied to the replacement section 32.

The replacement section 32 replaces the 2×1 (=mb) code bits $b_0$ and $b_1$ read out from the memory 31 such that the 2×1 (=mb) code bits $b_0$ and $b_1$ may be allocated to the 2×1 (=mb) symbol bits $y_0$ and $y_1$ of one (=b) symbol as seen in FIG. 101.

In particular, according to FIG. 101, the replacement section 32 carries out replacement for allocating the code bit $b_0$ to the symbol bit $y_0$, and
the code bit $b_1$ to the symbol bit $y_2$.

It is to be noted that, in this instance, also it is possible to consider that replacement is not carried out and the code bits $b_0$ and $b_1$ are determined as they are as the symbol bits $y_0$ and $y_1$, respectively.

Figure 102:
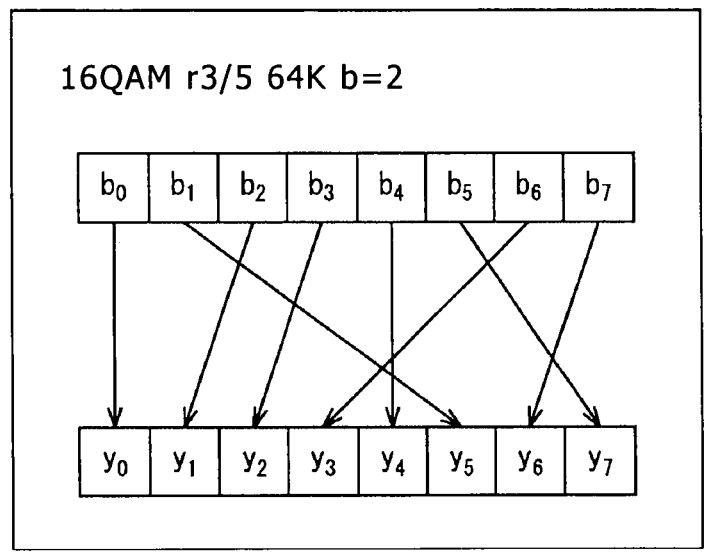
FIG. 102 is a view illustrating a yet further example of replacement of code bits.

FIG. 102 shows an example of a bit allocation pattern which can be adopted where the LDPC code is an LDPC code whose code length N is 64,800 bits and whose encoding rate is 3/5 and besides the modulation method is 16QAM and the multiple b is 2.

Where the LDPC code is an LDPC code whose code length N is 64,800 bits and whose encoding rate is 3/5 and besides the modulation method is 16QAM and the multiple b is 2, in the demultiplexer 25, the code bits written in the memory 31 for storing $(64,800/(4\times2))\times(4\times2)$ bits in the column direction×row direction are read out in a unit of 4×2 (=mb) bits in the row direction and supplied to the replacement section 32.

The replacement section 32 replaces the 4×2 (=mb) code bits $b_0$ to $b_7$ read out from the memory 31 such that the 4×2 (=mb) code bits $b_0$ to $b_7$ may be allocated to the 4×2 (=mb) symbol bits $y_0$ to $y_7$ of two (=b) successive symbols as seen in FIG. 102.

In particular, according to FIG. 102, the replacement section 32 carries out replacement for allocating
the code bit $b_0$ to the symbol bit $y_0$,
the code bit $b_1$ to the symbol bit $y_5$,
the code bit $b_2$ to the symbol bit $y_1$,
the code bit $b_3$ to the symbol bit $y_2$,
the code bit $b_4$ to the symbol bit $y_4$,
the code bit $b_5$ to the symbol bit $y_7$,
the code bit $b_6$ to the symbol bit $y_3$, and
the code bit $b_7$ to the symbol bit $y_6$.

Figure 103:
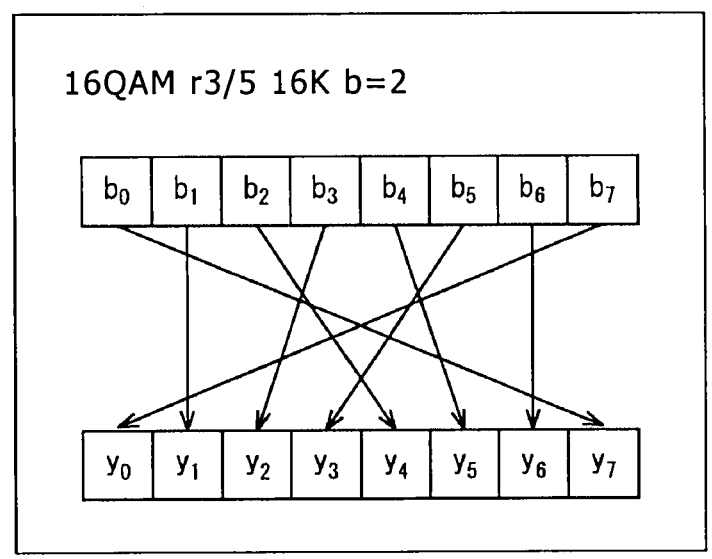
FIG. 103 is a view illustrating a yet further example of replacement of code bits.

FIG. 103 shows an example of a bit allocation pattern which can be adopted where the LDPC code is an LDPC code whose code length N is 16,200 bits and whose encoding rate is 3/5 and besides the modulation method is 16QAM and the multiple b is 2.

Where the LDPC code is an LDPC code whose code length N is 16,200 bits and whose encoding rate is 3/5 and besides the modulation method is 16QAM and the multiple b is 2, in the demultiplexer 25, the code bits written in the memory 31 for storing $(16,200/(4\times2))\times(4\times2)$ bits in the column direction×row direction are read out in a unit of 4×2 (=mb) bits in the row direction and supplied to the replacement section 32.

The replacement section 32 replaces the 4×2 (=mb) code bits $b_o$ to $b_7$ read out from the memory 31 such that the 4×2 (=mb) code bits $b_0$ to $b_7$ may be allocated to the 4×2 (=mb) symbol bits $y_0$ to $y_7$ of two (=b) successive symbols as seen in FIG. 103.

In particular, according to FIG. 103, the replacement section 32 carries out replacement for allocating
the code bit $b_0$ to the symbol bit $y_7$,
the code bit $b_1$ to the symbol bit $y_1$,
the code bit $b_2$ to the symbol bit $y_4$,
the code bit $b_3$ to the symbol bit $y_2$,
the code bit $b_4$ to the symbol bit $y_2$,
the code bit $b_5$ to the symbol bit $y_3$,
the code bit $b_6$ to the symbol bit $y_6$, and
the code bit $b_7$ to the symbol bit $y_0$.

Figure 104:
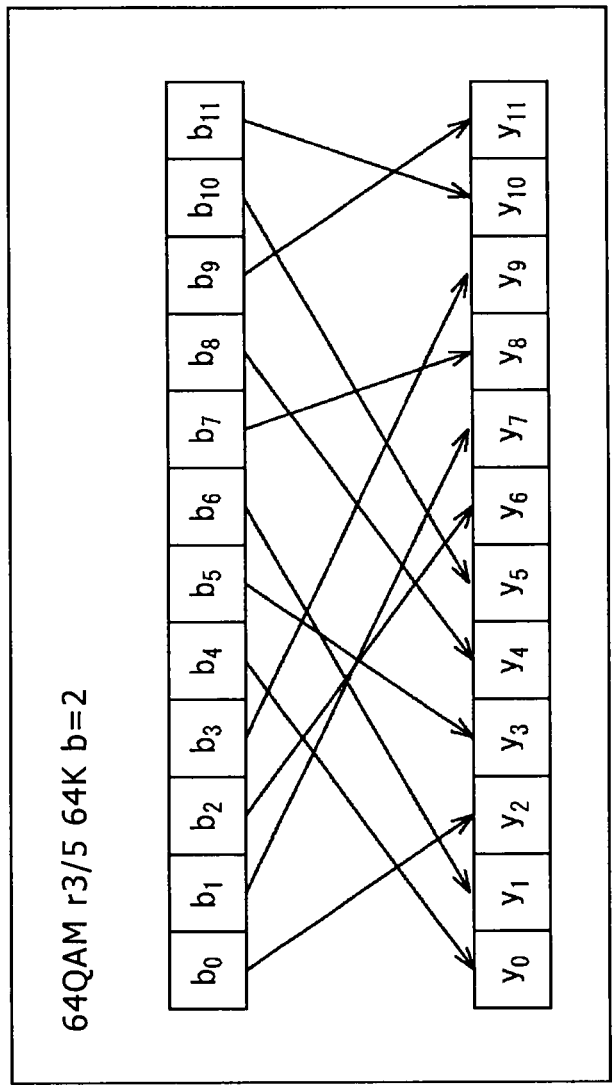
FIG. 104 is a view illustrating a yet further example of replacement of code bits.

FIG. 104 shows an example of a bit allocation pattern which can be adopted where the modulation method is 64QAM and the LDPC code is an LDPC code whose code length N is 64,800 bits and whose encoding rate is 3/5 and besides the multiple b is 2.

Where the LDPC code is an LDPC code whose code length N is 64,800 bits and whose encoding rate is 3/5 and the modulation method is 64QAM and besides the multiple b is 2, in the demultiplexer 25, the code bits written in the memory 31 for storing $(64,800/(6\times2))\times(6\times2)$ bits in the column direction×row direction are read out in a unit of 6×2 (=mb) bits in the row direction and supplied to the replacement section 32.

The replacement section 32 replaces the 6×2 (=mb) code bits $b_o$ to $b_{11}$ read out from the memory 31 such that the 6×2 (=mb) code bits $b_0$ to $b_{11}$ may be allocated to the 6×2 (=mb) symbol bits $y_0$ to $y_{11}$ of two (=b) successive symbols as seen in FIG. 104.

In particular, according to FIG. 104, the replacement section 32 carries out replacement for allocating
the code bit $b_0$ to the symbol bit $y_2$,
the code bit $b_1$ to the symbol bit $y_7$,
the code bit $b_2$ to the symbol bit $y_6$,
the code bit $b_3$ to the symbol bit $y_9$,
the code bit $b_4$ to the symbol bit $y_0$,
the code bit $b_5$ to the symbol bit $y_3$,
the code bit $b_6$ to the symbol bit $y_1$,
the code bit $b_7$ to the symbol bit $y_8$,
the code bit $b_8$ to the symbol bit $y_4$,
the code bit $b_9$ to the symbol bit $y_{11}$,
the code bit $b_{10}$ to the symbol bit $y_5$, and
the code bit $b_{11}$ to the symbol bit $y_{10}$.

Figure 105:
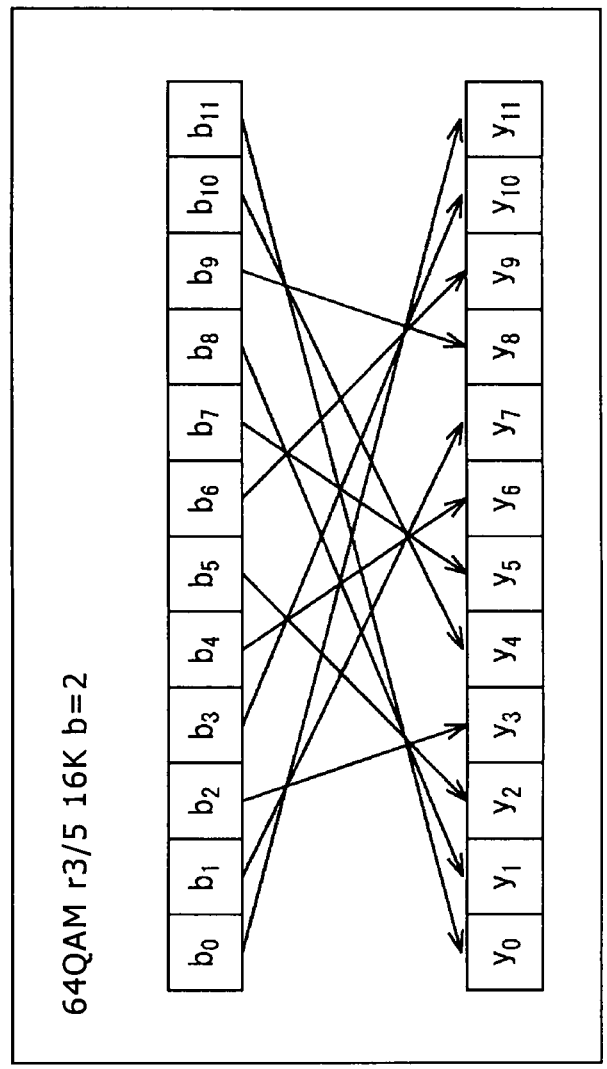
FIG. 105 is a view illustrating a yet further example of replacement of code bits.

FIG. 105 shows an example of a bit allocation pattern which can be adopted where the modulation method is 64QAM and the LDPC code is an LDPC code whose code length N is 16,200 bits and whose encoding rate is 3/5 and besides the multiple b is 2.

Where the LDPC code is an LDPC code whose code length N is 16,200 bits and whose encoding rate is 3/5 and the modulation method is 64QAM and besides the multiple b is 2, in the demultiplexer 25, the code bits written in the memory 31 for storing $(16,200/(6\times2))\times(6\times2)$ bits in the column direction×row direction are read out in a unit of 6×2 (=mb) bits in the row direction and supplied to the replacement section 32.

The replacement section 32 replaces the 6×2 (=mb) code bits $b_0$ to $b_{11}$ read out from the memory 31 such that the 6×2 (=mb) code bits $b_0$ to $b_{11}$ may be allocated to the 6×2 (=mb) symbol bits $y_0$ to $y_{11}$ of two (=b) successive symbols as seen in FIG. 105.

In particular, according to FIG. 105, the replacement section 32 carries out replacement for allocating
the code bit $b_0$ to the symbol bit $y_{11}$,
the code bit $b_1$ to the symbol bit $y_7$,
the code bit $b_2$ to the symbol bit $y_3$,
the code bit $b_3$ to the symbol bit $y_{10}$,
the code bit $b_4$ to the symbol bit $y_6$,
the code bit $b_5$ to the symbol bit $y_2$,
the code bit $b_6$ to the symbol bit $y_9$,
the code bit $b_7$ to the symbol bit $y_6$,
the code bit $b_8$ to the symbol bit $y_1$,
the code bit $b_9$ to the symbol bit $y_8$,
the code bit $b_{10}$ to the symbol bit $y_4$, and
the code bit $b_{11}$ to the symbol bit $y_0$.

Figure 106:
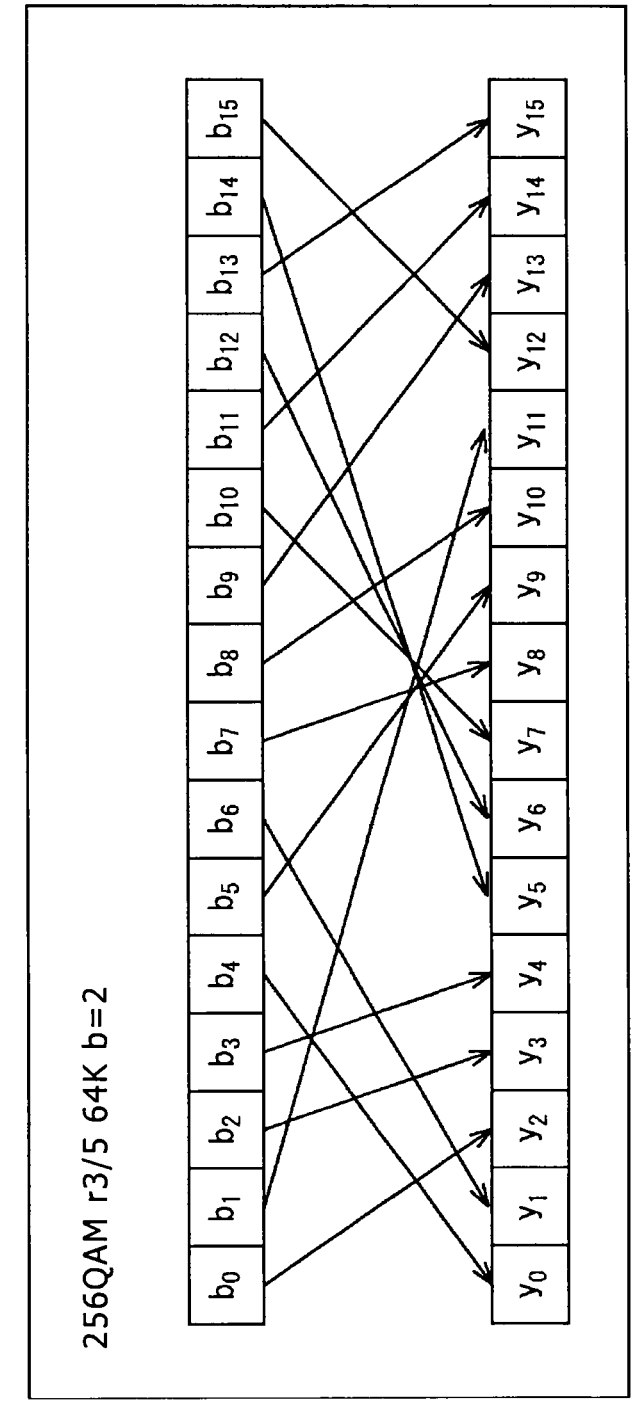
FIG. 106 is a view illustrating a yet further example of replacement of code bits.

FIG. 106 shows an example of a bit allocation pattern which can be adopted where the modulation method is 256QAM and the LDPC code is an LDPC code whose code length N is 64,800 bits and whose encoding rate is 3/5 and besides the multiple b is 2.

Where the LDPC code is an LDPC code whose code length N is 64,800 bits and whose encoding rate is 3/5 and the modulation method is 256QAM and besides the multiple b is 2, in the demultiplexer 25, the code bits written in the memory 31 for storing $(64,800/(8\times2))\times(8\times2)$ bits in the column direction×row direction are read out in a unit of 8×2 (=mb) bits in the row direction and supplied to the replacement section 32.

The replacement section 32 replaces the 8×2 (=mb) code bits $b_0$ to $b_{15}$ read out from the memory 31 such that the 8×2 (=mb) code bits $b_0$ to $b_{15}$ may be allocated to the 8×2 (=mb) symbol bits $y_0$ to $y_{15}$ of two (=b) successive symbols as seen in FIG. 106.

In particular, according to FIG. 106, the replacement section 32 carries out replacement for allocating the code bit $b_0$ to the symbol bit $y_2$,
the code bit $b_1$ to the symbol bit $y_{11}$,
the code bit $b_2$ to the symbol bit $y_3$,
the code bit $b_3$ to the symbol bit $y_4$,
the code bit $b_4$ to the symbol bit $y_0$,
the code bit $b_5$ to the symbol bit $y_9$,
the code bit $b_6$ to the symbol bit $y_1$,
the code bit $b_7$ to the symbol bit $y_8$,
the code bit $b_8$ to the symbol bit $y_{10}$,
the code bit $b_9$ to the symbol bit $y_{13}$,
the code bit $b_{10}$ to the symbol bit $y_7$,
the code bit $b_{11}$ to the symbol bit $y_{14}$,
the code bit $b_{12}$ to the symbol bit $y_6$,
the code bit $b_{13}$ to the symbol bit $y_{15}$,
the code bit $b_{14}$ to the symbol bit $y_5$, and
the code bit $b_{15}$ to the symbol bit $y_{12}$.

Figure 107:
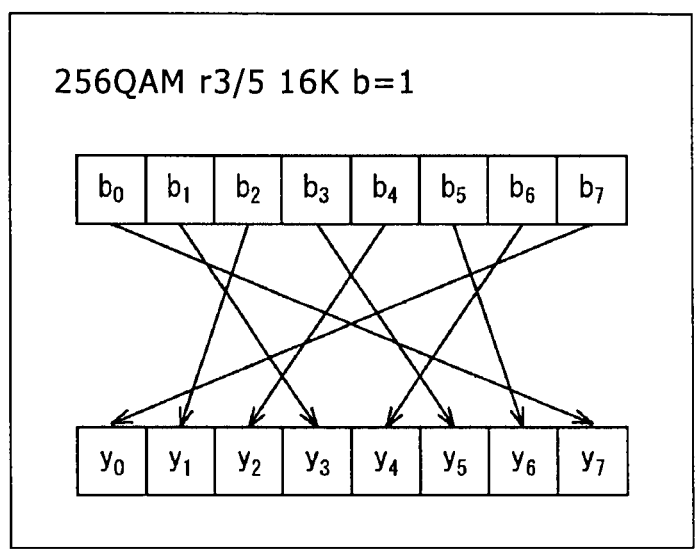
FIG. 107 is a view illustrating a yet further example of replacement of code bits.

FIG. 107 shows an example of a bit allocation pattern which can be adopted where the modulation method is 256QAM and the LDPC code is an LDPC code whose code length N is 16,200 bits and whose encoding rate is 3/5 and besides the multiple b is 1.

Where the LDPC code is an LDPC code whose code length N is 16,200 bits and whose encoding rate is 3/5 and the modulation method is 256QAM and besides the multiple b is 1, in the demultiplexer 25, the code bits written in the memory 31 for storing (16,200/(8×1))×(8×1) bits in the column direction×row direction are read out in a unit of 8×1 (=mb) bits in the row direction and supplied to the replacement section 32.

The replacement section 32 replaces the 8×1 (=mb) code bits $b_0$ to $b_7$ read out from the memory 31 such that the 8×1 (=mb) code bits $b_0$ to $b_7$ may be allocated to the 8×1 (=mb) symbol bits $y_0$ to $y_7$ of one (=b) symbol as seen in FIG. 107.

In particular, according to FIG. 107, the replacement section 32 carries out replacement for allocating the code bit $b_0$ to the symbol bit $y_7$,
the code bit $b_1$ to the symbol bit $y_3$,
the code bit $b_2$ to the symbol bit $y_1$,
the code bit $b_3$ to the symbol bit $y_5$,
the code bit $b_4$ to the symbol bit $y_2$,
the code bit $b_5$ to the symbol bit $y_6$,
the code bit $b_6$ to the symbol bit $y_4$, and
the code bit $b_7$ to the symbol bit $y_0$.

Now, the deinterleaver 53 which composes the reception apparatus 12 is described.

Figure 108:
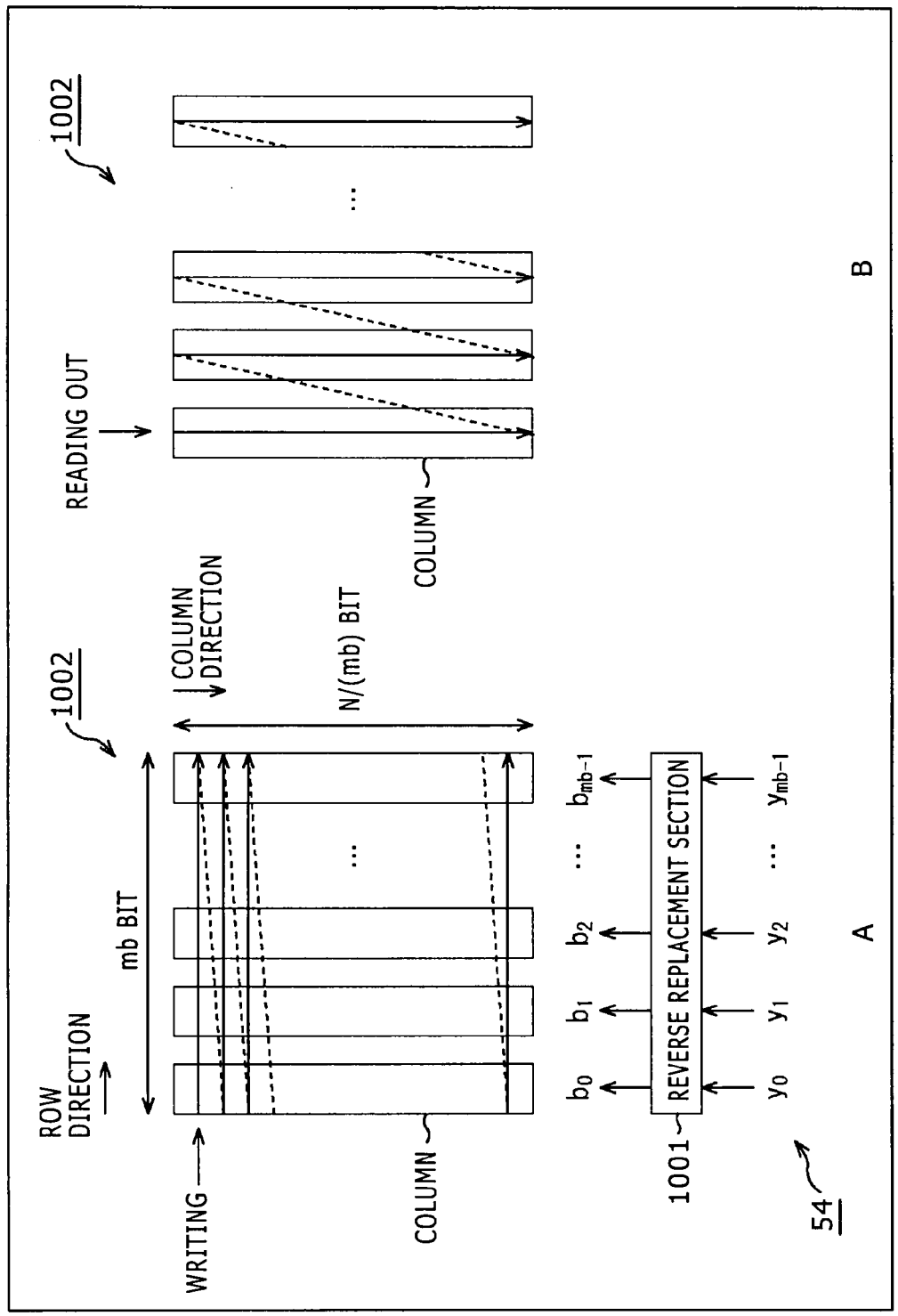
FIG. 108 is a view illustrating processing of a multiplexer 54 which composes a deinterleaver 53.

FIG. 108 is a view illustrating processing of the multiplexer 54 which composes the deinterleaver 53.

In particular, A of FIG. 108 shows an example of a functional configuration of the multiplexer 54.

The multiplexer 54 is composed of a reverse replacement section 1001 and a memory 1002.

The multiplexer 54 determines symbol bits of symbols supplied from the demapping section 52 at the preceding stage as an object of processing thereof and carries out a reverse replacement process corresponding to the replacement process carried out by the demultiplexer 25 of the transmission apparatus 11 (process reverse to the replacement process), that is, a reverse replacement process of returning the positions of the code bits (symbol bits) of the LDPC code replaced by the replacement process. Then, the multiplexer 54 supplies an LDPC code obtained as a result of the reverse replacement process to the column twist deinterleaver 55 at the succeeding stage.

In particular, in the multiplexer 54, mb symbol bits $y_0$, $y_1$, ..., $y_{mb-1}$ of b symbols are supplied in a unit of b (successive) symbols to the reverse replacement section 1001.

The reverse replacement section 1001 carries out reverse replacement of returning the arrangement of the mb symbol bits $y_0$ to $y_{mb-1}$ to the original arrangement of the mb code bits $b_0$, $b_1$, ..., $b_{mb-1}$ (arrangement of the code bits $b_0$ to $b_{mb-1}$ before the replacement by the replacement section 32 which composes the demultiplexer 25 on the transmission apparatus 11 side is carried out). The reverse replacement section 1001 outputs code bits $b_0$ to $b_{mb-1}$ obtained as a result of the reverse replacement.

The memory 1002 has a storage capacity of storing mb bits in the row (horizontal) direction and storing N/(mb) bits in the column (vertical) direction similarly to the memory 31 which composes the demultiplexer 25 of the transmission apparatus 11 side. In other words, the reverse replacement section 1001 is configured from mb columns each of which stores N/(mb) bits.

However, in the memory 1002, writing of the code bits of LDPC codes outputted from the reverse replacement section 1001 is carried out in a direction in which reading out of code bits from the memory 31 of the demultiplexer 25 of the transmission apparatus 11 is carried out, and reading out of code bits written in the memory 1002 is carried out in a direction in which writing of code bits into the memory 31 is carried out.

In particular, the multiplexer 54 of the reception apparatus 12 successively carries out writing of code bits of an LDPC code outputted from the reverse replacement section 1001 in a unit of mb bits in the row direction beginning with the first row of the memory 1002 toward a lower low as seen in A of FIG. 108.

Then, when the writing of code bits for one code length ends, the multiplexer 54 reads out the code bits in the column direction from the memory 1002 and supplies the code bits to the column twist deinterleaver 55 at the succeeding stage.

Here, B of FIG. 108 is a view illustrating reading out of the code bits from the memory 1002.

The multiplexer 54 carries out reading out of code bits of an LDPC code in a downward direction (column direction) from above of a column which composes the memory 1002 beginning with a leftmost column toward a right side column.

Now, processing of the column twist deinterleaver 55 which composes the deinterleaver 53 of the reception apparatus 12 is described with reference to FIG. 109.

Figure 109:
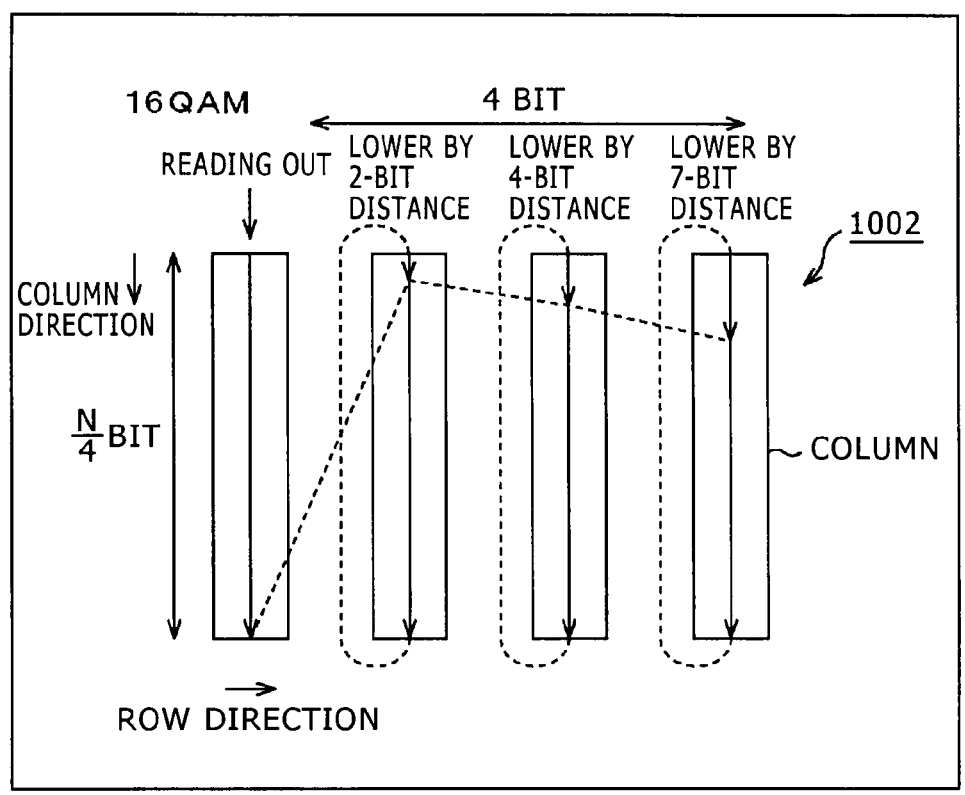
FIG. 109 is a view illustrating processing of a column twist deinterleaver 55.

FIG. 109 shows an example of a configuration of the memory 1002 of the multiplexer 54.

The memory 1002 has a storage capacity for storing mb bits in the column (vertical) direction and stores N/(mb) bits in the row (horizontal) direction and is composed of mb columns.

The column twist deinterleaver 55 writes code bits of an LDPC code in the row direction into the memory 1002 and controls the position at which reading out is started when the code bits are read out in the column direction to carry out column twist deinterleave.

In particular, the column twist deinterleaver 55 carries out a reverse re-arrangement process of suitably changing the reading out starting position at which reading out of code bits with regard to each of a plurality of columns is to be started to return the arrangement of code bits re-arranged by the column twist interleave to the original arrangement.

Here, FIG. 109 shows an example of a configuration of the memory 1002 where the modulation method is 16QAM and the multiple b is 1. Accordingly, the bit number m of one symbol is 4 bits, and the memory 1002 includes four (=mb) columns.

The column twist deinterleaver 55 carries out (in place of the multiplexer 54), writing of code bits of an LDPC code outputted from the replacement section 1001 in the row direction successively into the memory 1002 beginning with the first row toward a lowermost row.

Then, if writing of code bits for one code length ends, then the column twist deinterleaver 55 carries out reading out of code bits in the downward direction (column direction) from a top of the memory 1002 beginning with a leftmost column toward a right side column.

However, the column twist deinterleaver 55 carries out reading out of the code bits from the memory 1002 determining the writing starting position upon writing of the code bits by the column twist interleaver 24 on the transmission apparatus 11 side to a reading out starting position of the code bits.

In particular, if the address of the position of the top of each column is determined as 0 and the address of each position in the column direction is represented by an integer given in an ascending order, then where the modulation method is 16QAM and the multiple b is 1, the column twist deinterleaver 55 sets the reading out starting position for the leftmost column to the position whose address is 1, sets the reading out starting position for the second column (from the left) to the position whose address is 2, sets the reading out starting position for the third column to the position whose address is 4, and sets the reading out starting position for the fourth column to the position whose address is 7.

It is to be noted that, with regard to each of those columns whose reading out starting position has an address other than 0, reading out of code bits is carried out such that, after such reading out is carried out down to the lowermost position, the reading out position is returned to the top (position whose address is 1) of the column and the reading out is carried out downwardly to the position immediately preceding to the reading out starting position. Then, after that, reading out is carried out from the next (right) column.

By carrying out such column twist interleave as described above, the arrangement of the code bits re-arranged by the column twist interleave is returned to the original arrangement.

Figure 110:
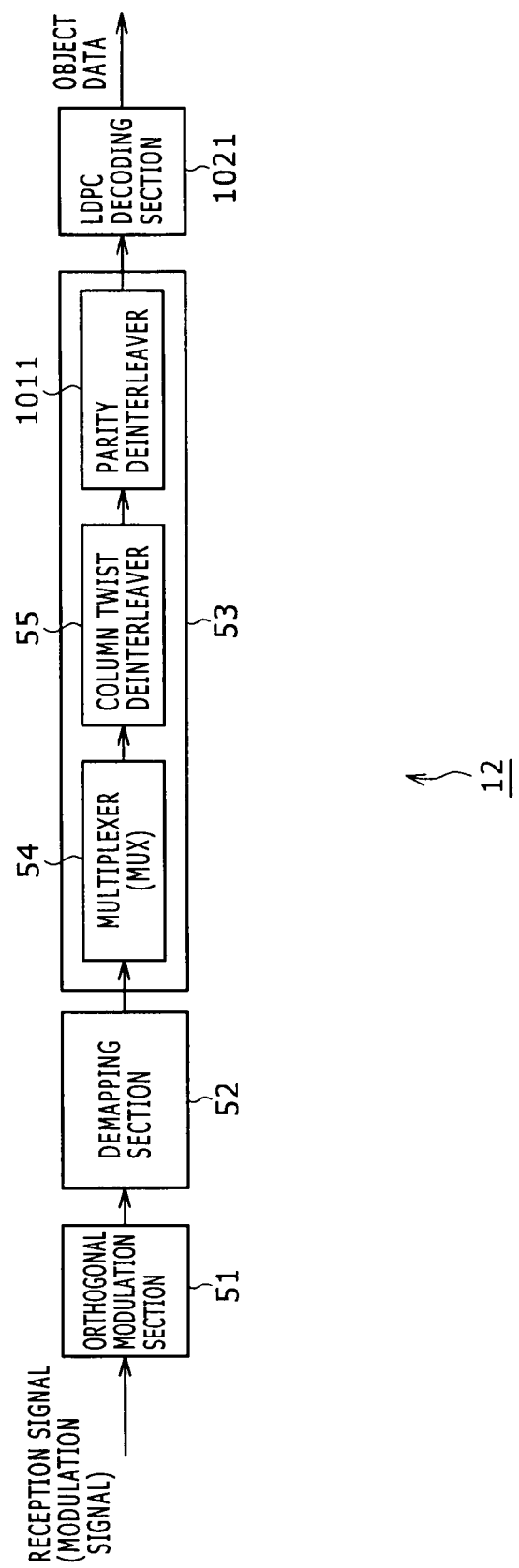
FIG. 110 is a block diagram showing another example of a configuration of the reception apparatus 12.

FIG. 110 is a block diagram showing another example of the configuration of the reception apparatus 12.

Referring to FIG. 110, the reception apparatus 12 is a data processing apparatus which receives a modulation signal from the transmission apparatus 11 and includes an orthogonal demodulation section 51, a demapping section 52, a deinterleaver 53 and an LDPC decoding section 1021.

The orthogonal demodulation section 51 receives a modulation signal from the transmission apparatus 11, carries out orthogonal demodulation and supplies symbols (values in the I and Q axis directions) obtained as a result of the orthogonal demodulation to the demapping section 52.

The demapping section 52 carries out demapping of converting the symbols from the orthogonal demodulation section 51 into code bits of an LDPC code and supplies the code bits to the deinterleaver 53.

The deinterleaver 53 includes a multiplexer (MUX) 54, a column twist deinterleaver 55 and a parity deinterleaver 1011 and carries out deinterleave of the code bits of the LDPC code from the demapping section 52.

In particular, the multiplexer 54 determines an LDPC code from the demapping section 52 as an object of processing thereof and carries out a reverse replacement process corresponding to the replacement process carried out by the demultiplexer 25 of the transmission apparatus 11 (reverse process to the replacement process), that is, a reverse replacement process of returning the positions of the code bits replaced by the replacement process to the original positions. Then, the multiplexer 54 supplies an LDPC code obtained as a result of the reverse replacement process to the column twist deinterleaver 55.

The column twist deinterleaver 55 determines the LDPC code from the multiplexer 54 as an object of processing and carries out column twist deinterleave corresponding to the column twist interleave as a re-arrangement process carried out by the column twist interleaver 24 of the transmission apparatus 11.

The LDPC code obtained as a result of the column twist deinterleave is supplied from the column twist deinterleaver 55 to the parity deinterleaver 1011.

The parity deinterleaver 1011 determines the code bits after the column twist deinterleave by the column twist deinterleaver 55 as an object of processing thereof and carries out parity deinterleave corresponding to the parity interleave carried out by the parity interleaver 23 of the transmission apparatus 11 (reverse process to the parity interleave), that is, parity deinterleave of returning the arrangement of the code bits of the LDPC code whose arrangement was changed by the parity interleave to the original arrangement.

The LDPC code obtained as a result of the parity deinterleave is supplied from the parity deinterleaver 1011 to the LDPC decoding section 1021.

Accordingly, in the reception apparatus 12 of FIG. 110, the LDPC code for which the reverse replacement process, column twist deinterleave and parity deinterleave have been carried out, that is, an LDPC code obtained by LDPC coding in accordance with the parity check matrix H, is supplied to the LDPC decoding section 1021.

The LDPC decoding section 1021 carries out LDPC decoding of the LDPC code from the deinterleaver 53 using the parity check matrix H itself used for LDPC encoding by the LDPC encoding section 21 of the transmission apparatus 11 or a conversion parity check matrix obtained by carrying out at least column conversion corresponding to the parity interleave for the parity check matrix H. Then, the LDPC decoding section 1021 outputs data obtained by the LDPC decoding as a decoding result of the object data.

Here, in the reception apparatus 12 of FIG. 110, since an LDPC code obtained by LDPC encoding in accordance with the parity check matrix H is supplied from the (parity deinterleaver 1011 of) the deinterleaver 53 to the LDPC decoding section 1021, where the LDPC decoding of the LDPC code is carried out using the parity check matrix H itself used for the LDPC encoding by the LDPC encoding section 21 of the transmission apparatus 11, the LDPC decoding section 1021 can be configured, for example, from a decoding apparatus which carries out LDPC decoding in accordance with a full serial decoding method wherein mathematical operation of messages (check node messages and variable node messages) is carried out for one by one node or another decoding apparatus wherein LDPC decoding is carried out in accordance with a full parallel decoding method wherein mathematical operation of messages are carried out simultaneously (in parallel) for all nodes.

Further, where LDPC decoding of an LDPC code is carried out using a conversion parity check matrix obtained by carrying out at least column replacement corresponding to the parity interleave for the parity check matrix H used in the LDPC encoding by the LDPC encoding section 21 of the transmission apparatus 11, the LDPC decoding section 1021 can be confirmed from a decoding apparatus of an architecture which carries out the check node mathematical operation and the variable node mathematical operation simultaneously for P (or a devisor of P other than 1) check nodes and P variable nodes and which has a reception data re-arrangement section 310 for carrying out column replacement similar to the column replacement for obtaining a conversion parity check matrix for the LDPC code to re-arrange the code bits of the LDPC codes.

It is to be noted that, while, in FIG. 110, the multiplexer 54 for carrying out the reverse replacement process, column twist deinterleaver 55 for carrying out the column twist deinterleave and parity deinterleaver 1011 for carrying out the parity deinterleave are configured separately from each other for the convenience of description, two or more of the multiplexer 54, column twist deinterleaver 55 and parity deinterleaver 1011 can be configured integrally similarly to the parity interleaver 23, column twist interleaver 24 and demultiplexer 25 of the transmission apparatus 11.

Figure 111:
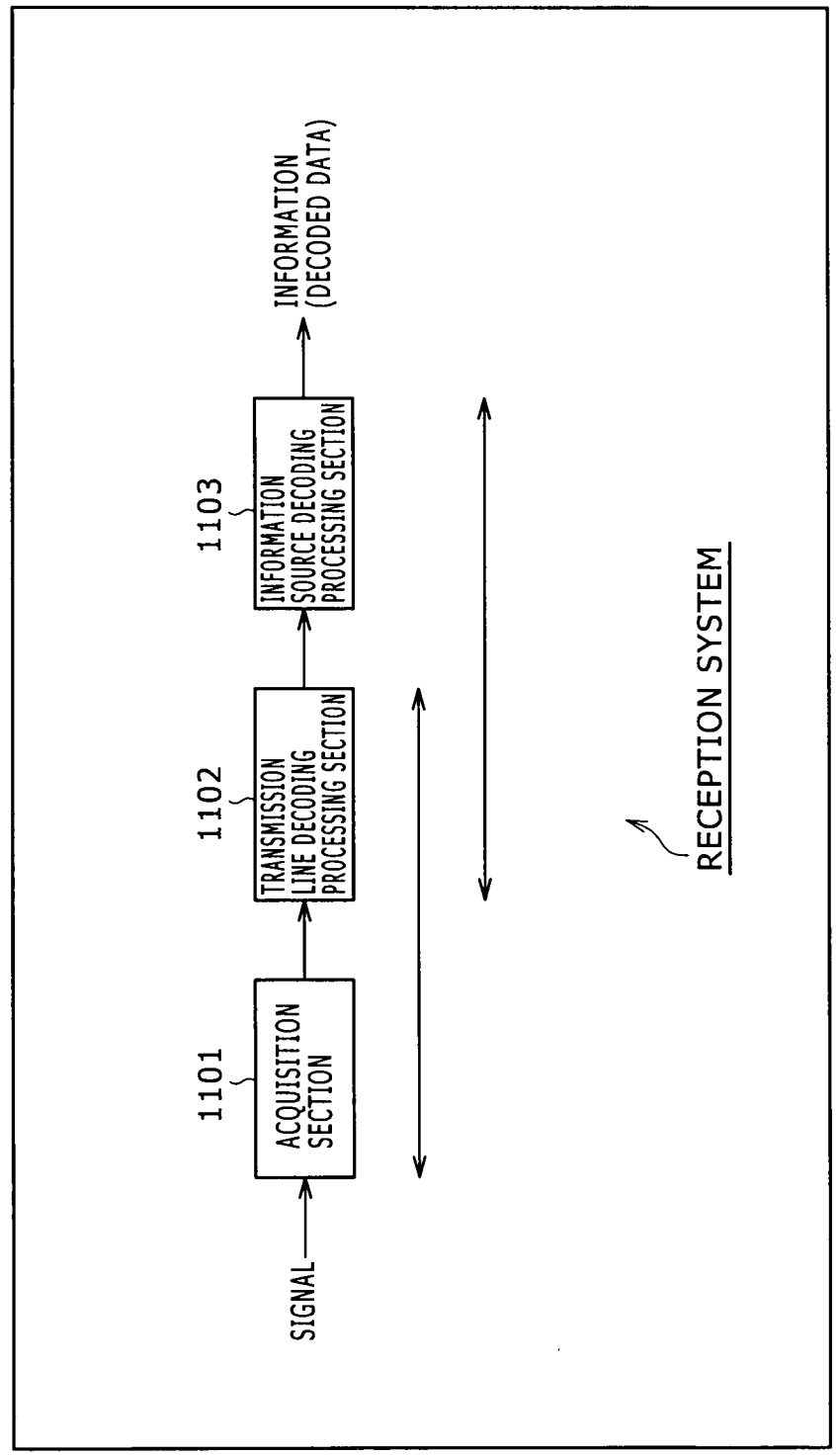
FIG. 111 is a block diagram showing a first example of a configuration of a reception system which can be applied to the reception apparatus 12.

Next, FIG. 111 is a block diagram showing a first example of a configuration of a reception system which can be applied to the reception apparatus 12.

Referring to FIG. 111, the reception system includes an acquisition section 1101, a transmission line decoding processing section 1102 and an information source decoding processing section 1103.

The acquisition section 1101 acquires a signal including an LDPC code obtained at least by LDPC encoding object data such as image data and music data of a program through a transmission line such as, for example, terrestrial digital broadcasting, satellite digital broadcasting, a CATV network, the Internet or some other network. Then, the acquisition section 1101 supplies the acquired signal to the transmission line decoding processing section 1102.

Here, where the signal acquired by the acquisition section 1101 is broadcast, for example, from a broadcasting station through ground waves, satellite waves, a CATV (Cable Television) or the like, the acquisition section 1101 is configured from a tuner, an STB (Set Top Box) or the like. On the other hand, where the signal acquired by the acquisition section 1101 is transmitted in a multicast state as in the IPTV (Internet Protocol Television), for example, from a web server, the acquisition section 11 is configured from a network I/F (Inter face) such as, for example, an NIC (Network Interface Card).

The transmission line decoding processing section 1102 carries out a transmission line decoding process including at least a process for correcting errors produced in the transmission line for the signal acquired through the transmission line by the acquisition section 1101, and supplies a signal obtained as a result of the transmission line decoding process to the information source decoding processing section 1103.

In particular, the signal acquired through the transmission line by the acquisition section 1101 is a signal obtained by carrying out at least error correction encoding for correcting errors produced in the transmission line, and for such a signal as just described, the transmission line decoding processing section 1102 carries out a transmission line decoding process such as, for example, an error correction process.

Here, as the error correction encoding, for example, LDPC encoding, Reed-Solomon encoding and so forth are available. Here, as the error correction encoding, at least LDPC encoding is carried out.

Further, the transmission line decoding process sometimes includes demodulation of a modulation signal and so forth.

The information source decoding processing section 1103 carries out an information source decoding process including at least a process for decompressing compressed information into original information for the signal for which the transmission line decoding process has been carried out.

In particular, the signal acquired through the transmission line by the acquisition section 1101 has sometimes been processed by compression encoding for compressing information in order to reduce the data amount such as images, sound and so forth as information. In this instance, the information source decoding processing section 1103 carries out an information source decoding process such as a process (decompression process) for decompressing the compressed information into original information for a signal for which the transmission line decoding process has been carried out.

It is to be noted that, where the signal acquired through the transmission line by the acquisition section 1101 has not been carried out compression encoding, the information source decoding processing section 1103 does not carry out the process of decompressing the compressed information into the original information.

Here, as the decompression process, for example, MPEG decoding and so forth are available. Further, the transmission line decoding process sometimes includes descrambling in addition to the decompression process.

In the reception system configured in such a manner as described above, the acquisition section 1101 receives a signal obtained by carrying out compression encoding such as MPEG encoding for data of, for example, images, sound and so forth and further carrying out error correction encoding such as LDPC encoding for the compression encoded data through a transmission line. The signal is supplied to the transmission line decoding processing section 1102.

In the transmission line decoding processing section 1102, processes similar to those carried out, for example, by the orthogonal demodulation section 51, demapping section 52, deinterleaver 53 and LDPC decoding section 56 (or LDPC decoding section 1021) are carried out as the transmission line decoding process for the signal from the acquisition section 1101. Then, a signal obtained as a result of the transmission line decoding process is supplied to the information source decoding processing section 1103.

In the information source decoding processing section 1103, an information source decoding process such as MPEG decoding is carried out for the signal from the transmission line decoding processing section 1102, and an image or sound obtained as a result of the information decoding process is outputted.

Such a reception system of FIG. 111 as described above can be applied, for example, to a television tuner for receiving television broadcasting as digital broadcasting and so forth.

It is to be noted that it is possible to configure the acquisition section 1101, transmission line decoding processing section 1102 and information source decoding processing section 1103 each as an independent apparatus (hardware (IC (Integrated Circuit) or the like) or a software module).

Further, as regards the acquisition section 1101, transmission line decoding processing section 1102 and information source decoding processing section 1103, a set of the acquisition section 1101 and transmission line decoding processing section 1102, another set of the transmission line decoding processing section 1102 and information source decoding processing section 1103 or a further set of the acquisition section 1101, transmission line decoding processing section 1102 and information source decoding processing section 1103 can be configured as a single independent apparatus.

Figure 112:
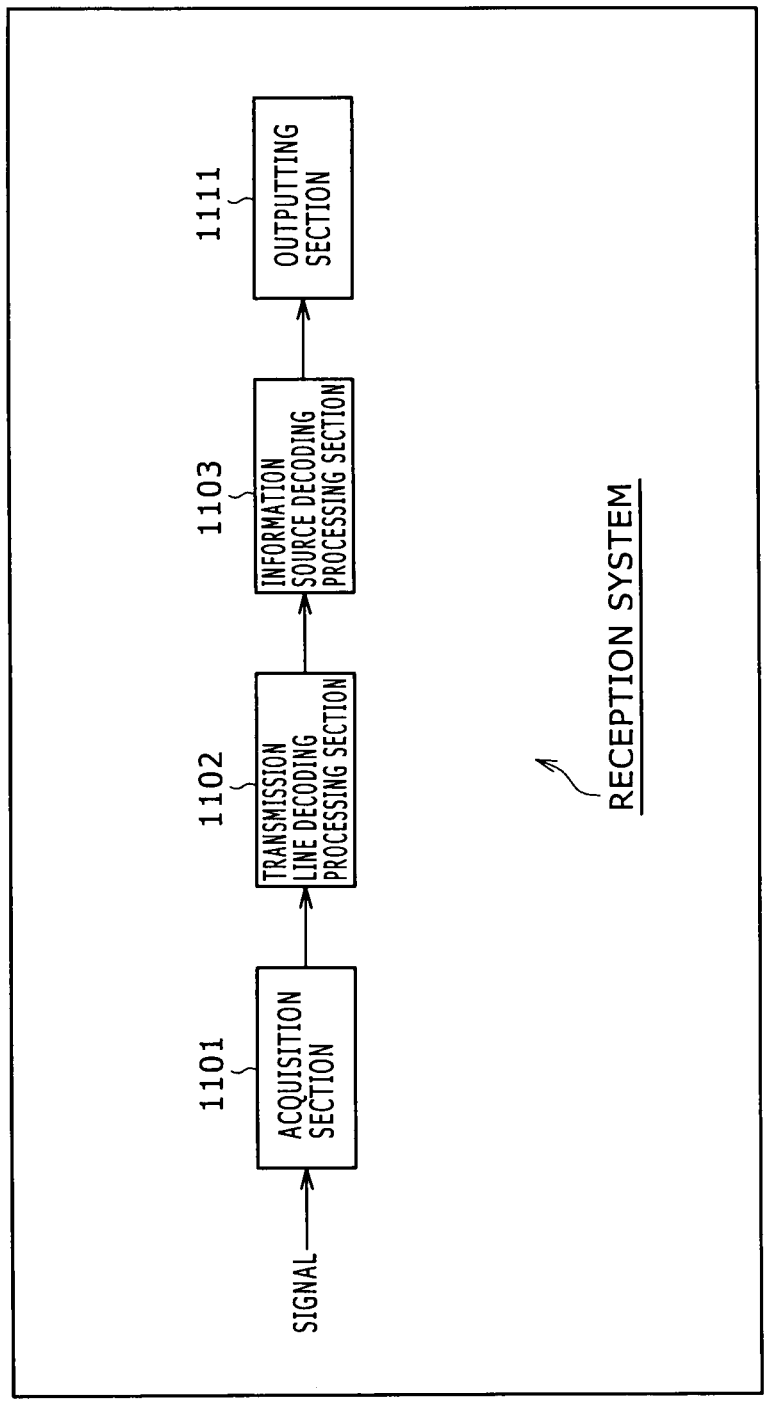
FIG. 112 is a block diagram showing a second example of the configuration of the reception system which can be applied to the reception apparatus 12.

FIG. 112 is a block diagram showing a second example of the configuration of the reception system which can be applied to the reception apparatus 12.

It is to be noted that, in FIG. 112, elements corresponding those in FIG. 111 are denoted by like reference numerals, and description of them is suitably omitted in the following description.

The reception system of FIG. 112 is common to that of FIG. 111 in that it includes an acquisition section 1101, a transmission line decoding processing section 1102 and an information source decoding processing section 1103 but is different from that of FIG. 111 in that it newly includes an outputting section 1111.

The outputting section 1111 is, for example, a display apparatus for displaying an image or a speaker for outputting sound and outputs an image, a sound of the like as a signal outputted from the information source decoding processing section 1103. In other words, the outputting section 1111 displays an image or outputs sound.

Such a reception system of FIG. 112 as described above can be applied, for example, to a TV (television receiver) for receiving a television broadcast as a digital broadcast, a radio receiver for receiving a radio broadcast and so forth.

It is to be noted that, where the signal acquired by the acquisition section 1101 is not in a form wherein compression encoding is not applied, a signal outputted from the transmission line decoding processing section 1102 is supplied to the outputting section 1111.

FIG. 113 is a block diagram showing a third example of the configuration of the reception system which can be applied to the reception apparatus 12.

It is to be noted that, in FIG. 113, corresponding elements to those of FIG. 111 are denoted by like reference numerals, and in the following description, description of them is suitably omitted.

The reception system of FIG. 113 is common to that of FIG. 111 in that it includes an acquisition section 1101 and a transmission line decoding processing section 1102.

However, the reception system of FIG. 113 is different from that of FIG. 111 in that it does not include the information source decoding processing section 1103 but newly includes a recording section 1121.

The recording section 1121 records (stores) a signal (for example, a TS packet of a TS of MPEG) outputted from the transmission line decoding processing section 1102 on or into a recording (storage) medium such as an optical disk, a hard disk (magnetic disk) or a flash memory.

Such a reception system of FIG. 113 as described above can be applied to a recorder for recording a television broadcast or the like.

It is to be noted that, in FIG. 113, the reception system may include the information source decoding processing section 1103 such that a signal after an information source decoding process has been carried out by the information source decoding processing section 1103, that is, an image or sound obtained by decoding, is recorded by the recording section 1121.

The invention claimed is:

1. A data processing apparatus, comprising:
re-arrangement means for carrying out,
where code bits of an LDPC (Low Density Parity Check) code are written in a column direction of storage means for storing the code bits of the LDPC code in a row direction and the column direction and read out in the row direction are set as a symbol whereas
m code bits equal to or more than 2 bits of the LDPC code are transmitted as one symbol,
column twist interleave of changing the writing starting position when the code bits of the LDPC code are to be written in the column direction of said storage means for each column of said storage means as a re-arrangement process for re-arranging the code bits of the LDPC code;
said storage means storing,
where the code length of the LDPC code is represented as N bits, a predetermined positive integer as b and a minimum integer equal to or greater than N/(mb) as B,
mb bits in the row direction and B bits in the column direction;
when mb bits read out in the row direction of said storage means are set as b symbols,
the LDPC code being any of LDPC codes which are prescribed in the DVB-S.2 or DVB-T.2 standard and have 11 different encoding rates and a code length N of 64,800 bits;
the m bits being 14 bits while the integer b is 1;
the 14 code bits of the LDPC code being mapped to ones of $2^{14}$ signal points prescribed in a predetermined modulation method;
said storage means having 14 columns for storing 14×1 bits in the row direction;
said re-arrangement means setting,
where the address of the top position of said storage means in the column direction is 0 and the addresses of the positions of said storage means in the column direction are represented by integers of an ascending order,
the writing starting position for the first column from among the 14 columns of said storage means to the position whose address is 0,
the writing starting position for the second column from among the 14 columns of said storage means to the position whose address is 2,
the writing starting position for the third column from among the 14 columns of said storage means to the position whose address is 4,
the writing starting position for the fourth column from among the 14 columns of said storage means to the position whose address is 5,
the writing starting position for the fifth column from among the 14 columns of said storage means to the position whose address is 5,
the writing starting position for the sixth column from among the 14 columns of said storage means to the position whose address is 6,
the writing starting position for the seventh column from among the 14 columns of said storage means to the position whose address is 11,
the writing starting position for the eighth column from among the 14 columns of said storage means to the position whose address is 14,
the writing starting position for the ninth column from among the 14 columns of said storage means to the position whose address is 14,
the writing starting position for the tenth column from among the 14 columns of said storage means to the position whose address is 14,
the writing starting position for the eleventh column from among the 14 columns of said storage means to the position whose address is 14,
the writing starting position for the twelfth column from among the 14 columns of said storage means to the position whose address is 19,
the writing starting position for the thirteenth column from among the 14 columns of said storage means to the position whose address is 23, and
the writing starting position for the fourteenth column from among the 14 columns of said storage means to the position whose address is 24.

2. The data processing apparatus according to any one of, wherein said storage means has mb columns for storing mb bits in the row direction and stores B bits in the column direction, and where the mb×B bits are greater than N bits, a storage region of the mbth column from among the mb columns which remains when N code bits are written in the column direction is set as an unused region which is not used for writing of the code bits, and for the mbth column, code bits are written into a used region which is a storage region which is not the unused region.

3. The data processing apparatus according to claim 2, wherein predetermined data other than the code bits is written into the unused region.

4. A data processing apparatus, comprising:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage means for each column of said storage means as a re-arrangement process for re-arranging the code bits of the LDPC code;

said storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage means are set as b symbols, the LDPC code being any of LDPC codes which are prescribed in the DVB-S.2 or DVB-T.2 standard and have 10 different encoding rates and a code length N of 16,200 bits;

the m bits being 14 bits while the integer b is 1;

the 14 code bits of the LDPC code being mapped to ones of $2^{14}$ signal points prescribed in a predetermined modulation method;

said storage means having 14 columns for storing 14×1 bits in the row direction;

said re-arrangement means setting, where the address of the top position of said storage means in the column direction is 0 and the addresses of the positions of said storage means in the column direction are represented by integers of an ascending order, the writing starting position for the first column from among the 14 columns of said storage means to the position whose address is 0, the writing starting position for the second column from among the 14 columns of said storage means to the position whose address is 0, the writing starting position for the third column from among the 14 columns of said storage means to the position whose address is 1, the writing starting position for the fourth column from among the 14 columns of said storage means to the position whose address is 5, the writing starting position for the fifth column from among the 14 columns of said storage means to the position whose address is 7, the writing starting position for the sixth column from among the 14 columns of said storage means to the position whose address is 8, the writing starting position for the seventh column from among the 14 columns of said storage means to the position whose address is 10, the writing starting position for the eighth column from among the 14 columns of said storage means to the position whose address is 16, the writing starting position for the ninth column from among the 14 columns of said storage means to the position whose address is 16, the writing starting position for the tenth column from among the 14 columns of said storage means to the position whose address is 25, the writing starting position for the eleventh column from among the 14 columns of said storage means to the position whose address is 30, the writing starting position for the twelfth column from among the 14 columns of said storage means to the position whose address is 32, the writing starting position for the thirteenth column from among the 14 columns of said storage means to the position whose address is 32, and the writing starting position for the fourteenth column from among the 14 columns of said storage means to the position whose address is 33.

5. A data processing apparatus, comprising:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage means for each column of said storage means as a re-arrangement process for re-arranging the code bits of the LDPC code;

said storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage means are set as b symbols, the LDPC code being any of LDPC codes which are prescribed in the DVB-S.2 or DVB-T.2 standard and have 10 different encoding rates and a code length N of 16,200 bits;

the m bits being 14 bits while the integer b is 2;

the 14 code bits of the LDPC code being mapped to ones of $2^{14}$ signal points prescribed in a predetermined modulation method;

said storage means having 28 columns for storing 14×2 bits in the row direction;

said re-arrangement means setting, where the address of the top position of said storage means in the column direction is 0 and the addresses of the positions of said storage means in the column direction are represented by integers of an ascending order, the writing starting position for the first column from among the 28 columns of said storage means to the position whose address is 0, the writing starting position for the second column from among the 28 columns of said storage means to the position whose address is 0, the writing starting position for the third column from among the 28 columns of said storage means to the position whose address is 0, the writing starting position for the fourth column from among the 28 columns of said storage means to the position whose address is 0, the writing starting position for the fifth column from among the 28 columns of said storage means to the position whose address is 1, the writing starting position for the sixth column from among the 28 columns of said storage means to the position whose address is 1, the writing starting position for the seventh column from among the 28 columns of said storage means to the position whose address is 1, the writing starting position for the eighth column from among the 28 columns of said storage means to the position whose address is 5, the writing starting position for the ninth column from among the 28 columns of said storage means to the position whose address is 5, the writing starting position for the tenth column from among the 28 columns of said storage means to the position whose address is 9, the writing starting position for the eleventh column from among the 28 columns of said storage means to the position whose address is 12, the writing starting position for the twelfth column from among the 28 columns of said storage means to the position whose address is 17, the writing starting position for the thirteenth column from among the 28 columns of said storage means to the position whose address is 17, the writing starting position for the fourteenth column from among the 28 columns of said storage means to the position whose address is 17, the writing starting position for the fifteenth column from among the 28 columns of said storage means to the position whose address is 34, the writing starting position for the sixteenth column from among the 28 columns of said storage means to the position whose address is 38, the writing starting position for the seventeenth column from among the 28 columns of said storage means to the position whose address is 40, the writing starting position for the eighteenth column from among the 28 columns of said storage means to the position whose address is 40, the writing starting position for the nineteenth column from among the 28 columns of said storage means to the position whose address is 50, the writing starting position for the twentieth column from among the 28 columns of said storage means to the position whose address is 51, the writing starting position for the twenty-first column from among the 28 columns of said storage means to the position whose address is 51, the writing starting position for the twenty-second column from among the 28 columns of said storage means to the position whose address is 51, the writing starting position for the twenty-third column from among the 28 columns of said storage means to the position whose address is 52, the writing starting position for the twenty-fourth column from among the 28 columns of said storage means to the position whose address is 62, the writing starting position for the twenty-fifth column from among the 28 columns of said storage means to the position whose address is 65, the writing starting position for the twenty-sixth column from among the 28 columns of said storage means to the position whose address is 65, the writing starting position for the twenty-seventh column from among the 28 columns of said storage means to the position whose address is 74, and the writing starting position for the twenty-eighth column from among the 28 columns of said storage means to the position whose address is 76.

6. A data processing apparatus, comprising:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage means for each column of said storage means as a re-arrangement process for re-arranging the code bits of the LDPC code;

said storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage means are set as b symbols, the LDPC code being any of LDPC codes which are prescribed in the DVB-S.2 or DVB-T.2 standard and have 11 different encoding rates and a code length N of 64,800 bits;

the m bits being 16 bits while the integer b is 1;

the 16 code bits of the LDPC code being mapped to ones of $2^{16}$ signal points prescribed in a predetermined modulation method;

said storage means having 16 columns for storing 16×1 bits in the row direction;

said re-arrangement means setting, where the address of the top position of said storage means in the column direction is 0 and the addresses of the positions of said storage means in the column direction are represented by integers of an ascending order, the writing starting position for the first column from among the 16 columns of said storage means to the position whose address is 0, the writing starting position for the second column from among the 16 columns of said storage means to the position whose address is 2, the writing starting position for the third column from among the 16 columns of said storage means to the position whose address is 2, the writing starting position for the fourth column from among the 16 columns of said storage means to the position whose address is 2, the writing starting position for the fifth column from among the 16 columns of said storage means to the position whose address is 2, the writing starting position for the sixth column from among the 16 columns of said storage means to the position whose address is 3, the writing starting position for the seventh column from among the 16 columns of said storage means to the position whose address is 7, the writing starting position for the eighth column from among the 16 columns of said storage means to the position whose address is 15, the writing starting position for the ninth column from among the 16 columns of said storage means to the position whose address is 16, the writing starting position for the tenth column from among the 16 columns of said storage means to the position whose address is 20, the writing starting position for the eleventh column from among the 16 columns of said storage means to the position whose address is 22, the writing starting position for the twelfth column from among the 16 columns of said storage means to the position whose address is 22, the writing starting position for the thirteenth column from among the 16 columns of said storage means to the position whose address is 27, the writing starting position for the fourteenth column from among the 16 columns of said storage means to the position whose address is 27, the writing starting position for the fifteenth column from among the 16 columns of said storage means to the position whose address is 28, and the writing starting position for the sixteenth column from among the 16 columns of said storage means to the position whose address is 32.

7. A data processing apparatus, comprising:

re-arrangement means for carrying out, where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage means for each column of said storage means as a re-arrangement process for re-arranging the code bits of the LDPC code;

said storage means storing, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage means are set as b symbols, the LDPC code being any of LDPC codes which are prescribed in the DVB-S.2 or DVB-T.2 standard and have 11 different encoding rates and a code length N of 64,800 bits;

the m bits being 16 bits while the integer b is 2;

the 16 code bits of the LDPC code being mapped to ones of $2^{16}$ signal points prescribed in a predetermined modulation method;

said storage means having 32 columns for storing 16×2 bits in the row direction;

said re-arrangement means setting, where the address of the top position of said storage means in the column direction is 0 and the addresses of the positions of said storage means in the column direction are represented by integers of an ascending order, the writing starting position for the first column from among the 32 columns of said storage means to the position whose address is 0, the writing starting position for the second column from among the 32 columns of said storage means to the position whose address is 2, the writing starting position for the third column from among the 32 columns of said storage means to the position whose address is 6, the writing starting position for the fourth column from among the 32 columns of said storage means to the position whose address is 7, the writing starting position for the fifth column from among the 32 columns of said storage means to the position whose address is 7, the writing starting position for the sixth column from among the 32 columns of said storage means to the position whose address is 7, the writing starting position for the seventh column from among the 32 columns of said storage means to the position whose address is 10, the writing starting position for the eighth column from among the 32 columns of said storage means to the position whose address is 11, the writing starting position for the ninth column from among the 32 columns of said storage means to the position whose address is 11, the writing starting position for the tenth column from among the 32 columns of said storage means to the position whose address is 14, the writing starting position for the eleventh column from among the 32 columns of said storage means to the position whose address is 14, the writing starting position for the twelfth column from among the 32 columns of said storage means to the position whose address is 15, the writing starting position for the thirteenth column from among the 32 columns of said storage means to the position whose address is 15, the writing starting position for the fourteenth column from among the 32 columns of said storage means to the position whose address is 16, the writing starting position for the fifteenth column from among the 32 columns of said storage means to the position whose address is 25, the writing starting position for the sixteenth column from among the 32 columns of said storage means to the position whose address is 25, the writing starting position for the seventeenth column from among the 32 columns of said storage means to the position whose address is 25, the writing starting position for the eighteenth column from among the 32 columns of said storage means to the position whose address is 25, the writing starting position for the nineteenth column from among the 32 columns of said storage means to the position whose address is 25, the writing starting position for the twentieth column from among the 32 columns of said storage means to the position whose address is 31, the writing starting position for the twenty-first column from among the 32 columns of said storage means to the position whose address is 32, the writing starting position for the twenty-second column from among the 32 columns of said storage means to the position whose address is 32, the writing starting position for the twenty-third column from among the 32 columns of said storage means to the position whose address is 47, the writing starting position for the twenty-fourth column from among the 32 columns of said storage means to the position whose address is 48, the writing starting position for the twenty-fifth column from among the 32 columns of said storage means to the position whose address is 50, the writing starting position for the twenty-sixth column from among the 32 columns of said storage means to the position whose address is 50, the writing starting position for the twenty-seventh column from among the 32 columns of said storage means to the position whose address is 54, the writing starting position for the twenty-eighth column from among the 32 columns of said storage means to the position whose address is 55, the writing starting position for the twenty-ninth column from among the 32 columns of said storage means to the position whose address is 57, the writing starting position for the thirtieth column from among the 32 columns of said storage means to the position whose address is 57, the writing starting position for the thirty-first column from among the 32 columns of said storage means to the position whose address is 58, and the writing starting position for the thirty-second column from among the 32 columns of said storage means to the position whose address is 58.

8. A data processing apparatus, comprising:
re-arrangement means for carrying out,
where code bits of an LDPC (Low Density Parity Check) code are written in a column direction of storage means for storing the code bits of the LDPC code in a row direction and the column direction and read out in the row direction are set as a symbol whereas m code bits equal to or more than 2 bits of the LDPC code are transmitted as one symbol,
column twist interleave of changing the writing starting position when the code bits of the LDPC code are to be written in the column direction of said storage means for each column of said storage means as a re-arrangement process for re-arranging the code bits of the LDPC code;
said storage means storing,
where the code length of the LDPC code is represented as N bits, a predetermined positive integer as b and a minimum integer equal to or greater than N/(mb) as B,
mb bits in the row direction and B bits in the column direction;
when mb bits read out in the row direction of said storage means are set as b symbols,
the LDPC code being any of LDPC codes which are prescribed in the DVB-S.2 or DVB-T.2 standard and have 10 different encoding rates and a code length N of 16,200 bits;
the m bits being 16 bits while the integer b is 1;
the 16 code bits of the LDPC code being mapped to ones of $2^{16}$ signal points prescribed in a predetermined modulation method;
said storage means having 16 columns for storing 16×1 bits in the row direction;
said re-arrangement means setting,
where the address of the top position of said storage means in the column direction is 0 and the addresses of the positions of said storage means in the column direction are represented by integers of an ascending order,
the writing starting position for the first column from among the 16 columns of said storage means to the position whose address is 0,
the writing starting position for the second column from among the 16 columns of said storage means to the position whose address is 1,
the writing starting position for the third column from among the 16 columns of said storage means to the position whose address is 1,
the writing starting position for the fourth column from among the 16 columns of said storage means to the position whose address is 2,
the writing starting position for the fifth column from among the 16 columns of said storage means to the position whose address is 2,
the writing starting position for the sixth column from among the 16 columns of said storage means to the position whose address is 3,
the writing starting position for the seventh column from among the 16 columns of said storage means to the position whose address is 6,
the writing starting position for the eighth column from among the 16 columns of said storage means to the position whose address is 8,
the writing starting position for the ninth column from among the 16 columns of said storage means to the position whose address is 12,
the writing starting position for the tenth column from among the 16 columns of said storage means to the position whose address is 12,
the writing starting position for the eleventh column from among the 16 columns of said storage means to the position whose address is 12,
the writing starting position for the twelfth column from among the 16 columns of said storage means to the position whose address is 12,
the writing starting position for the thirteenth column from among the 16 columns of said storage means to the position whose address is 17,
the writing starting position for the fourteenth column from among the 16 columns of said storage means to the position whose address is 17,
the writing starting position for the fifteenth column from among the 16 columns of said storage means to the position whose address is 17, and
the writing starting position for the sixteenth column from among the 16 columns of said storage means to the position whose address is 17.

9. A data processing method for the data processing apparatus for interleaving data, said data processing method including:
carrying out, where code bits of an LDPC (Low Density Parity Check) code are written in a column direction of a storage medium configured to store the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage medium for each column of said storage medium as a re-arrangement process for re-arranging the code bits of the LDPC code;

storing, by said storage medium, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage medium are set as b symbols, the LDPC code being any of LDPC codes which are prescribed in the DVB-S.2 or DVB-T.2 standard and have 11 different encoding rates and a code length N of 64,800 bits;

the m bits being 14 bits while the integer b is 1;

the 14 code bits of the LDPC code being mapped to ones of $2^{14}$ signal points prescribed in a predetermined modulation method;

said storage medium having 14 columns for storing 14×1 bits in the row direction;

setting, where the address of the top position of said storage medium in the column direction is 0 and the addresses of the positions of said storage medium in the column direction are represented by integers of an ascending order, the writing starting position for the first column from among the 14 columns of said storage medium to the position whose address is 0, the writing starting position for the second column from among the 14 columns of said storage medium to the position whose address is 2, the writing starting position for the third column from among the 14 columns of said storage medium to the position whose address is 4, the writing starting position for the fourth column from among the 14 columns of said storage medium to the position whose address is 5, the writing starting position for the fifth column from among the 14 columns of said storage medium to the position whose address is 5, the writing starting position for the sixth column from among the 14 columns of said storage medium to the position whose address is 6, the writing starting position for the seventh column from among the 14 columns of said storage medium to the position whose address is 11, the writing starting position for the eighth column from among the 14 columns of said storage medium to the position whose address is 14, the writing starting position for the ninth column from among the 14 columns of said storage medium to the position whose address is 14, the writing starting position for the tenth column from among the 14 columns of said storage medium to the position whose address is 14, the writing starting position for the eleventh column from among the 14 columns of said storage medium to the position whose address is 14, the writing starting position for the twelfth column from among the 14 columns of said storage medium to the position whose address is 19, the writing starting position for the thirteenth column from among the 14 columns of said storage medium to the position whose address is 23, and the writing starting position for the fourteenth column from among the 14 columns of said storage medium to the position whose address is 24.

10. A data processing method for the data processing apparatus for interleaving data, said data processing method including:

carrying out, where code bits of an LDPC (Low Density Parity Check) code are written in a column direction of a storage medium configured to store the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage medium for each column of said storage medium as a re-arrangement process for re-arranging the code bits of the LDPC code;

said storing, by said storage medium, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage medium are set as b symbols, the LDPC code being any of LDPC codes which are prescribed in the DVB-S.2 or DVB-T.2 standard and have 10 different encoding rates and a code length N of 16,200 bits;

the m bits being 14 bits while the integer b is 1;

the 14 code bits of the LDPC code being mapped to ones of $2^{14}$ signal points prescribed in a predetermined modulation method;

said storage medium having 14 columns for storing 14×1 bits in the row direction;

setting, where the address of the top position of said storage medium in the column direction is 0 and the addresses of the positions of said storage medium in the column direction are represented by integers of an ascending order, the writing starting position for the first column from among the 14 columns of said storage medium to the position whose address is 0, the writing starting position for the second column from among the 14 columns of said storage medium to the position whose address is 0, the writing starting position for the third column from among the 14 columns of said storage medium to the position whose address is 1, the writing starting position for the fourth column from among the 14 columns of said storage medium to the position whose address is 5, the writing starting position for the fifth column from among the 14 columns of said storage medium to the position whose address is 7, the writing starting position for the sixth column from among the 14 columns of said storage medium to the position whose address is 8, the writing starting position for the seventh column from among the 14 columns of said storage medium to the position whose address is 10, the writing starting position for the eighth column from among the 14 columns of said storage medium to the position whose address is 16, the writing starting position for the ninth column from among the 14 columns of said storage medium to the position whose address is 16, the writing starting position for the tenth column from among the 14 columns of said storage medium to the position whose address is 25, the writing starting position for the eleventh column from among the 14 columns of said storage medium to the position whose address is 30, the writing starting position for the twelfth column from among the 14 columns of said storage medium to the position whose address is 32, the writing starting position for the thirteenth column from among the 14 columns of said storage medium to the position whose address is 32, and the writing starting position for the fourteenth column from among the 14 columns of said storage medium to the position whose address is 33.

11. A data processing method for the data processing apparatus for interleaving data, said data processing method including:

carrying out, where code bits of an LDPC (Low Density Parity Check) code are written in a column direction of a storage medium configured to store the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage medium for each column of said storage medium as a re-arrangement process for re-arranging the code bits of the LDPC code;

storing, by said storage medium storing, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage medium are set as b symbols, the LDPC code being any of LDPC codes which are prescribed in the DVB-S.2 or DVB-T.2 standard and have 10 different encoding rates and a code length N of 16,200 bits;

the m bits being 14 bits while the integer b is 2;

the 14 code bits of the LDPC code being mapped to ones of $2^{14}$ signal points prescribed in a predetermined modulation method;

said storage medium having 28 columns for storing 14×2 bits in the row direction;

setting, where the address of the top position of said storage medium in the column direction is 0 and the addresses of the positions of said storage medium in the column direction are represented by integers of an ascending order, the writing starting position for the first column from among the 28 columns of said storage medium to the position whose address is 0, the writing starting position for the second column from among the 28 columns of said storage medium to the position whose address is 0, the writing starting position for the third column from among the 28 columns of said storage medium to the position whose address is 0, the writing starting position for the fourth column from among the 28 columns of said storage medium to the position whose address is 0, the writing starting position for the fifth column from among the 28 columns of said storage medium to the position whose address is 1, the writing starting position for the sixth column from among the 28 columns of said storage medium to the position whose address is 1, the writing starting position for the seventh column from among the 28 columns of said storage medium to the position whose address is 1, the writing starting position for the eighth column from among the 28 columns of said storage medium to the position whose address is 5, the writing starting position for the ninth column from among the 28 columns of said storage medium to the position whose address is 5, the writing starting position for the tenth column from among the 28 columns of said storage medium to the position whose address is 9, the writing starting position for the eleventh column from among the 28 columns of said storage medium to the position whose address is 12, the writing starting position for the twelfth column from among the 28 columns of said storage medium to the position whose address is 17, the writing starting position for the thirteenth column from among the 28 columns of said storage medium to the position whose address is 17, the writing starting position for the fourteenth column from among the 28 columns of said storage medium to the position whose address is 17, the writing starting position for the fifteenth column from among the 28 columns of said storage medium to the position whose address is 34, the writing starting position for the sixteenth column from among the 28 columns of said storage medium to the position whose address is 38, the writing starting position for the seventeenth column from among the 28 columns of said storage medium to the position whose address is 40, the writing starting position for the eighteenth column from among the 28 columns of said storage medium to the position whose address is 40, the writing starting position for the nineteenth column from among the 28 columns of said storage medium to the position whose address is 50, the writing starting position for the twentieth column from among the 28 columns of said storage medium to the position whose address is 51, the writing starting position for the twenty-first column from among the 28 columns of said storage medium to the position whose address is 51, the writing starting position for the twenty-second column from among the 28 columns of said storage medium to the position whose address is 51, the writing starting position for the twenty-third column from among the 28 columns of said storage medium to the position whose address is 52, the writing starting position for the twenty-fourth column from among the 28 columns of said storage medium to the position whose address is 62, the writing starting position for the twenty-fifth column from among the 28 columns of said storage medium to the position whose address is 65, the writing starting position for the twenty-sixth column from among the 28 columns of said storage medium to the position whose address is 65, the writing starting position for the twenty-seventh column from among the 28 columns of said storage medium to the position whose address is 74, and the writing starting position for the twenty-eighth column from among the 28 columns of said storage means to the position whose address is 76.

12. A data processing method for the data processing apparatus for interleaving data, said data processing method including:

carrying out, where code bits of an LDPC (Low Density Parity Check) code are written in a column direction of a storage medium configured to store the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage medium for each column of said storage medium as a re-arrangement process for re-arranging the code bits of the LDPC code;

storing, by said storage medium, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage medium are set as b symbols, the LDPC code being any of LDPC codes which are prescribed in the DVB-S.2 or DVB-T.2 standard and have 11 different encoding rates and a code length N of 64,800 bits;

the m bits being 16 bits while the integer b is 1;

the 16 code bits of the LDPC code being mapped to ones of $2^{16}$ signal points prescribed in a predetermined modulation method;

said storage medium having 16 columns for storing 16×1 bits in the row direction;

setting, where the address of the top position of said storage medium in the column direction is 0 and the addresses of the positions of said storage medium in the column direction are represented by integers of an ascending order, the writing starting position for the first column from among the 16 columns of said storage medium to the position whose address is 0, the writing starting position for the second column from among the 16 columns of said storage medium to the position whose address is 2, the writing starting position for the third column from among the 16 columns of said storage medium to the position whose address is 2, the writing starting position for the fourth column from among the 16 columns of said storage medium to the position whose address is 2, the writing starting position for the fifth column from among the 16 columns of said storage medium to the position whose address is 2, the writing starting position for the sixth column from among the 16 columns of said storage medium to the position whose address is 3, the writing starting position for the seventh column from among the 16 columns of said storage medium to the position whose address is 7, the writing starting position for the eighth column from among the 16 columns of said storage medium to the position whose address is 15, the writing starting position for the ninth column from among the 16 columns of said storage medium to the position whose address is 16, the writing starting position for the tenth column from among the 16 columns of said storage medium to the position whose address is 20, the writing starting position for the eleventh column from among the 16 columns of said storage medium to the position whose address is 22, the writing starting position for the twelfth column from among the 16 columns of said storage medium to the position whose address is 22, the writing starting position for the thirteenth column from among the 16 columns of said storage medium to the position whose address is 27, the writing starting position for the fourteenth column from among the 16 columns of said storage medium to the position whose address is 27, the writing starting position for the fifteenth column from among the 16 columns of said storage medium to the position whose address is 28, and the writing starting position for the sixteenth column from among the 16 columns of said storage medium to the position whose address is 32.

13. A data processing method for the data processing apparatus for interleaving data, said data processing method including:

carrying out, where code bits of an LDPC (Low Density Parity Check) code are written in a column direction of a storage medium configured to store the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage medium for each column of said storage medium as a re-arrangement process for re-arranging the code bits of the LDPC code;

storing, by said storage medium, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage medium are set as b symbols, the LDPC code being any of LDPC codes which are prescribed in the DVB-S.2 or DVB-T.2 standard and have 11 different encoding rates and a code length N of 64,800 bits;

the m bits being 16 bits while the integer b is 2;

the 16 code bits of the LDPC code being mapped to ones of $2^{16}$ signal points prescribed in a predetermined modulation method;

said storage medium having 32 columns for storing 16×2 bits in the row direction;

setting, where the address of the top position of said storage medium in the column direction is 0 and the addresses of the positions of said storage medium in the column direction are represented by integers of an ascending order, the writing starting position for the first column from among the 32 columns of said storage medium to the position whose address is 0, the writing starting position for the second column from among the 32 columns of said storage medium to the position whose address is 2, the writing starting position for the third column from among the 32 columns of said storage medium to the position whose address is 6, the writing starting position for the fourth column from among the 32 columns of said storage medium to the position whose address is 7, the writing starting position for the fifth column from among the 32 columns of said storage medium to the position whose address is 7, the writing starting position for the sixth column from among the 32 columns of said storage medium to the position whose address is 7, the writing starting position for the seventh column from among the 32 columns of said storage medium to the position whose address is 10, the writing starting position for the eighth column from among the 32 columns of said storage medium to the position whose address is 11, the writing starting position for the ninth column from among the 32 columns of said storage medium to the position whose address is 11, the writing starting position for the tenth column from among the 32 columns of said storage medium to the position whose address is 14, the writing starting position for the eleventh column from among the 32 columns of said storage medium to the position whose address is 14, the writing starting position for the twelfth column from among the 32 columns of said storage medium to the position whose address is 15, the writing starting position for the thirteenth column from among the 32 columns of said storage medium to the position whose address is 15, the writing starting position for the fourteenth column from among the 32 columns of said storage medium to the position whose address is 16, the writing starting position for the fifteenth column from among the 32 columns of said storage medium to the position whose address is 25, the writing starting position for the sixteenth column from among the 32 columns of said storage medium to the position whose address is 25, the writing starting position for the seventeenth column from among the 32 columns of said storage medium to the position whose address is 25, the writing starting position for the eighteenth column from among the 32 columns of said storage medium to the position whose address is 25, the writing starting position for the nineteenth column from among the 32 columns of said storage medium to the position whose address is 25, the writing starting position for the twentieth column from among the 32 columns of said storage medium to the position whose address is 31, the writing starting position for the twenty-first column from among the 32 columns of said storage medium to the position whose address is 32, the writing starting position for the twenty-second column from among the 32 columns of said storage medium to the position whose address is 32, the writing starting position for the twenty-third column from among the 32 columns of said storage medium to the position whose address is 47, the writing starting position for the twenty-fourth column from among the 32 columns of said storage medium to the position whose address is 48, the writing starting position for the twenty-fifth column from among the 32 columns of said storage medium to the position whose address is 50, the writing starting position for the twenty-sixth column from among the 32 columns of said storage medium to the position whose address is 50, the writing starting position for the twenty-seventh column from among the 32 columns of said storage medium to the position whose address is 54, the writing starting position for the twenty-eighth column from among the 32 columns of said storage medium to the position whose address is 55, the writing starting position for the twenty-ninth column from among the 32 columns of said storage medium to the position whose address is 57, the writing starting position for the thirtieth column from among the 32 columns of said storage medium to the position whose address is 57, the writing starting position for the thirty-first column from among the 32 columns of said storage medium to the position whose address is 58, and the writing starting position for the thirty-second column from among the 32 columns of said storage medium to the position whose address is 58.

14. A data processing method for the data processing apparatus for interleaving data, said data processing method including:

carrying out, where code bits of an LDPC (Low Density Parity Check) code are written in a column direction of a storage medium configurged to store the code bits of the LDPC code in a row direction and the column direction and read out in the row direction are set as a symbol whereas m code bits equal to or more than 2 bits of the LDPC code are transmitted as one symbol, column twist interleave of changing the writing starting position when the code bits of the LDPC code are to be written in the column direction of said storage medium for each column of said storage medium as a re-arrangement process for re-arranging the code bits of the LDPC code;

storing, by said recoding medium, where the code length of the LDPC code is represented as N bits, a predetermined positive integer as b and a minimum integer equal to or greater than N/(mb) as B, mb bits in the row direction and B bits in the column direction;

when mb bits read out in the row direction of said storage medium are set as b symbols, the LDPC code being any of LDPC codes which are prescribed in the DVB-S.2 or DVB-T.2 standard and have 10 different encoding rates and a code length N of 16,200 bits;

the m bits being 16 bits while the integer b is 1;

the 16 code bits of the LDPC code being mapped to ones of $2^{16}$ signal points prescribed in a predetermined modulation method;

said storage medium having 16 columns for storing 16×1 bits in the row direction;

setting, where the address of the top position of said storage medium in the column direction is 0 and the addresses of the positions of said storage medium in the column direction are represented by integers of an ascending order, the writing starting position for the first column from among the 16 columns of said storage medium to the position whose address is 0, the writing starting position for the second column from among the 16 columns of said storage medium to the position whose address is 1, the writing starting position for the third column from among the 16 columns of said storage medium to the position whose address is 1, the writing starting position for the fourth column from among the 16 columns of said storage medium to the position whose address is 2, the writing starting position for the fifth column from among the 16 columns of said storage medium to the position whose address is 2, the writing starting position for the sixth column from among the 16 columns of said storage medium to the position whose address is 3, the writing starting position for the seventh column from among the 16 columns of said storage medium to the position whose address is 6, the writing starting position for the eighth column from among the 16 columns of said storage medium to the position whose address is 8, the writing starting position for the ninth column from among the 16 columns of said storage medium to the position whose address is 12, the writing starting position for the tenth column from among the 16 columns of said storage medium to the position whose address is 12, the writing starting position for the eleventh column from among the 16 columns of said storage medium to the position whose address is 12, the writing starting position for the twelfth column from among the 16 columns of said storage medium to the position whose address is 12, the writing starting position for the thirteenth column from among the 16 columns of said storage medium to the position whose address is 17, the writing starting position for the fourteenth column from among the 16 columns of said storage medium to the position whose address is 17, the writing starting position for the fifteenth column from among the 16 columns of said storage medium to the position whose address is 17, and the writing starting position for the sixteenth column from among the 16 columns of said storage medium to the position whose address is 17.

* * * * *